(12) United States Patent
Itoi et al.

(10) Patent No.: US 12,516,240 B2
(45) Date of Patent: Jan. 6, 2026

(54) COMPOUND, ORGANIC ELECTROLUMINESCENCE DEVICE USING THE SAME, AND ELECTRONIC APPARATUS

(71) Applicant: IDEMITSU KOSAN CO.,LTD., Tokyo (JP)

(72) Inventors: Hiroaki Itoi, Sodegaura (JP); Yuki Nakano, Sodegaura (JP); Satomi Tasaki, Sodegaura (JP); Taro Yamaki, Sodegaura (JP)

(73) Assignee: IDEMITSU KOSAN CO., LTD., Tokyo (JP)

( * ) Notice: Subject to any disclaimer, the term of this patent is extended or adjusted under 35 U.S.C. 154(b) by 1005 days.

(21) Appl. No.: 17/632,701

(22) PCT Filed: Aug. 7, 2020

(86) PCT No.: PCT/JP2020/030492
§ 371 (c)(1),
(2) Date: Feb. 3, 2022

(87) PCT Pub. No.: WO2021/025162
PCT Pub. Date: Feb. 11, 2021

(65) Prior Publication Data
US 2022/0289726 A1 Sep. 15, 2022

(30) Foreign Application Priority Data

Aug. 8, 2019 (JP) .................. 2019-146848
Aug. 8, 2019 (JP) .................. 2019-146849
May 20, 2020 (JP) .................. 2020-088409
May 20, 2020 (JP) .................. 2020-088410

(51) Int. Cl.
*H01L 51/54* (2006.01)
*C07C 13/62* (2006.01)
(Continued)

(52) U.S. Cl.
CPC .............. *C09K 11/06* (2013.01); *C07C 13/62* (2013.01); *C07C 15/62* (2013.01); *C07C 49/76* (2013.01); *C07C 211/54* (2013.01); *C07C 255/50* (2013.01); *C07C 321/26* (2013.01); *C07D 209/86* (2013.01); *C07D 213/16* (2013.01); *C07D 215/06* (2013.01); *C07D 223/24* (2013.01); *C07D 235/08* (2013.01); *C07D 277/66* (2013.01); *C07D 279/22* (2013.01); *C07D 311/82* (2013.01); *C07D 333/54* (2013.01); *C07D 335/12* (2013.01); *C07D 405/10* (2013.01); *C07D 405/14* (2013.01); *C07D 407/10* (2013.01); *C07D 409/04* (2013.01); *C07D 409/10* (2013.01); *C07D 487/22* (2013.01); *C07D 493/04* (2013.01); *C07F 5/027* (2013.01); *C07F 7/081* (2013.01);
(Continued)

(58) Field of Classification Search
None
See application file for complete search history.

(56) References Cited

U.S. PATENT DOCUMENTS

2015/0001479 A1   1/2015   Lee et al.
2015/0069344 A1   3/2015   Kim et al.
(Continued)

FOREIGN PATENT DOCUMENTS

JP    2010-059147 A    3/2010
KR    2017-0120767 A   11/2017
(Continued)

OTHER PUBLICATIONS

International Preliminary Report on Patentability and Written Opinion issued in corresponding International Patent Application No. PCT/JP2020/030492 dated Feb. 17, 2022.
(Continued)

*Primary Examiner* — Andrew K Bohaty
(74) *Attorney, Agent, or Firm* — Foley & Lardner LLP

(57) ABSTRACT

A compound represented by the following formula (1), wherein in the formula, $L_1$ and $L_2$ are predetermined linking groups, and $Ar_1$ is a monovalent group having a structure represented by the following formula (2).

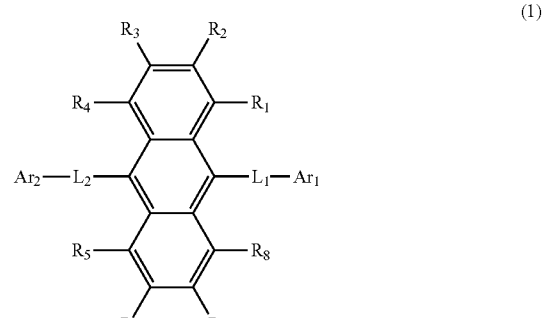

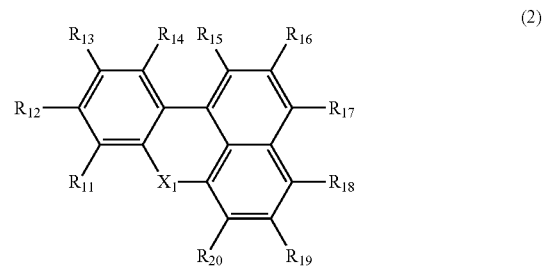

12 Claims, 1 Drawing Sheet

(51) Int. Cl.

| | | |
|---|---|---|
| C07C 15/62 | (2006.01) | |
| C07C 49/76 | (2006.01) | |
| C07C 211/54 | (2006.01) | |
| C07C 255/50 | (2006.01) | |
| C07C 321/26 | (2006.01) | |
| C07D 209/86 | (2006.01) | |
| C07D 213/16 | (2006.01) | |
| C07D 215/06 | (2006.01) | |
| C07D 223/24 | (2006.01) | |
| C07D 235/08 | (2006.01) | |
| C07D 277/66 | (2006.01) | |
| C07D 279/22 | (2006.01) | |
| C07D 311/82 | (2006.01) | |
| C07D 333/54 | (2006.01) | |
| C07D 335/12 | (2006.01) | |
| C07D 405/10 | (2006.01) | |
| C07D 405/14 | (2006.01) | |
| C07D 407/10 | (2006.01) | |
| C07D 409/04 | (2006.01) | |
| C07D 409/10 | (2006.01) | |
| C07D 487/22 | (2006.01) | |
| C07D 493/04 | (2006.01) | |
| C07F 5/02 | (2006.01) | |
| C07F 7/08 | (2006.01) | |
| C07F 9/28 | (2006.01) | |
| C09K 11/06 | (2006.01) | |
| H10K 50/11 | (2023.01) | |
| H10K 85/40 | (2023.01) | |
| H10K 85/60 | (2023.01) | |

(52) U.S. Cl.
CPC .............. *C07F 7/0812* (2013.01); *C07F 9/28* (2013.01); *H10K 50/11* (2023.02); *H10K 85/40* (2023.02); *H10K 85/60* (2023.02); *H10K 85/615* (2023.02); *H10K 85/621* (2023.02); *H10K 85/622* (2023.02); *H10K 85/623* (2023.02); *H10K 85/624* (2023.02); *H10K 85/625* (2023.02); *H10K 85/631* (2023.02); *H10K 85/649* (2023.02); *H10K 85/652* (2023.02); *H10K 85/653* (2023.02); *H10K 85/654* (2023.02); *H10K 85/655* (2023.02); *H10K 85/656* (2023.02); *H10K 85/6572* (2023.02); *H10K 85/6574* (2023.02); *H10K 85/6576* (2023.02); *H10K 85/658* (2023.02); *C07B 2200/05* (2013.01)

(56) References Cited

U.S. PATENT DOCUMENTS

| | | |
|---|---|---|
| 2015/0236274 A1 | 8/2015 | Hatakeyama et al. |
| 2015/0333268 A1 | 11/2015 | Han et al. |
| 2016/0190481 A1 | 6/2016 | Han et al. |
| 2017/0331051 A1 | 11/2017 | Han et al. |
| 2017/0352820 A1 | 12/2017 | Kim et al. |

FOREIGN PATENT DOCUMENTS

| | | |
|---|---|---|
| KR | 2017-0126081 A | 11/2017 |
| KR | 2019-0055685 A | 5/2019 |
| KR | 2019-0118514 A | 10/2019 |
| WO | WO-2018/066536 A1 | 4/2018 |
| WO | WO-2018/088472 A1 | 5/2018 |
| WO | WO-2019/035268 A1 | 2/2019 |
| WO | WO-2019/111971 A1 | 6/2019 |

OTHER PUBLICATIONS

International Preliminary Report on Patentability and Written Opinion issued in corresponding International Patent Application No. PCT/JP2020/030495 dated Feb. 17, 2022.
International Search Report issued in corresponding International Patent Application No. PCT/JP2020/030492 dated Oct. 13, 2020.
International Search Report issued in corresponding International Patent Application No. PCT/JP2020/030495 dated Nov. 2, 2020.

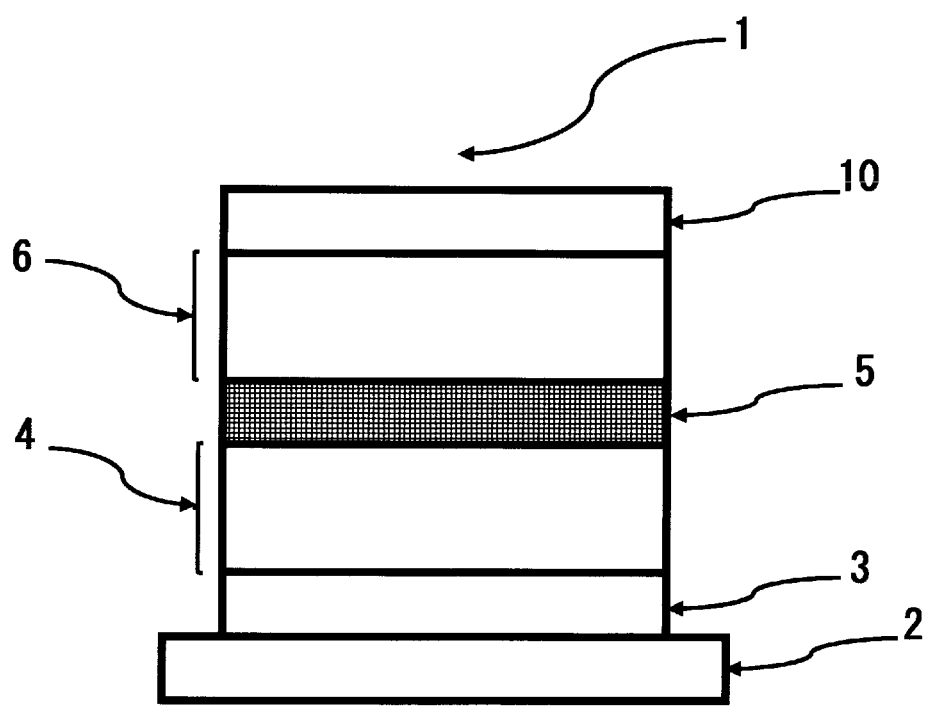

COMPOUND, ORGANIC ELECTROLUMINESCENCE DEVICE USING THE SAME, AND ELECTRONIC APPARATUS

CROSS-REFERENCE TO RELATED APPLICATIONS

The present application claims priority under 37 U.S.C. § 371 to International Patent Application No. PCT/JP2020/030492, filed Aug. 7, 2020, which claims priority to and the benefit of Japanese Patent Application Nos. 2019-146848 and 2019-146849, both filed on Aug. 8, 2019, 2020-088409 and 2020-088410, both filed on May 20, 2020. The contents of these applications are hereby incorporated by reference in their entireties.

TECHNICAL FIELD

The invention relates to a novel compound, an organic electroluminescence device using the same, and an electronic apparatus.

BACKGROUND ART

When voltage is applied to an organic electroluminescence device (hereinafter, referred to as an organic EL device in several cases), holes and electrons are injected into an emitting layer from an anode and a cathode, respectively Then, thus injected holes and electrons are recombined in the emitting layer, and excitons are formed therein.

Patent Documents 1 and 2 disclose that a compound having a benzoxanthene structure is used as a material of an emitting layer of an organic EL device.

RELATED ART DOCUMENTS

Patent Documents

[Patent Document 1] US 2015/0001479 A1
[Patent Document 2] US 2015/0693441 A1

SUMMARY OF THE INVENTION

It is an object of the invention to provide a novel compound useful as a material of an organic EL device, an organic EL device having a long lifetime, and an electronic apparatus using the organic EL device.

According to the invention, the following compound, the organic EL device, and the electronic apparatus are provided.

1. A compound represented by the following formula (1):

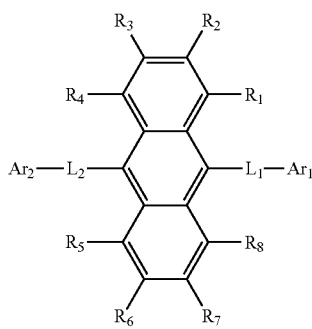

(1)

wherein in the formula (1), one or more sets of adjacent two or more of $R_1$ to $R_8$ form a substituted or unsubstituted, saturated or unsaturated ring by bonding with each other, or do not form a substituted or unsubstituted, saturated or unsaturated ring;

$R_1$ to $R_8$ which do not form the substituted or unsubstituted, saturated or unsaturated ring are independently a hydrogen atom or a substituent R;

the substituent R is a halogen atom, a cyano group, a nitro group, a substituted or unsubstituted alkyl group including 1 to 50 carbon atoms, a substituted or unsubstituted alkenyl group including 2 to 50 carbon atoms, a substituted or unsubstituted alkynyl group including 2 to 50 carbon atoms, a substituted or unsubstituted cycloalkyl group including 3 to 50 ring carbon atoms, —Si($R_{901}$)($R_{902}$)($R_{903}$),

—O—($R_{904}$),

—S—($R_{905}$),

—N($R_{906}$)($R_{907}$), a substituted or unsubstituted aryl group including 6 to 50 ring carbon atoms, or a substituted or unsubstituted monovalent heterocylic group including 5 to 50 ring atoms;

$R_{901}$ to $R_{907}$ are independently a hydrogen atom, a substituted or unsubstituted alkyl group including 1 to 50 carbon atoms, a substituted or unsubstituted cycloalkyl group including 3 to 50 ring carbon atoms, a substituted or unsubstituted aryl group including 6 to 50 ring carbon atoms, or a substituted or unsubstituted monovalent heterocylic group including 5 to 50 ring atoms; when two or more of each of $R_{901}$ to $R_{907}$ are present, the two or more of each of $R_{901}$ to $R_{907}$ may be the same as or different from each other, $L_1$ and $L_2$ are independently a single bond, or a linking group having a structure represented by any one of the following formulas (L-1) to (L-9):

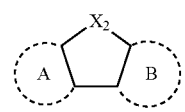

(L-1)

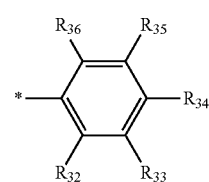

(L-2)

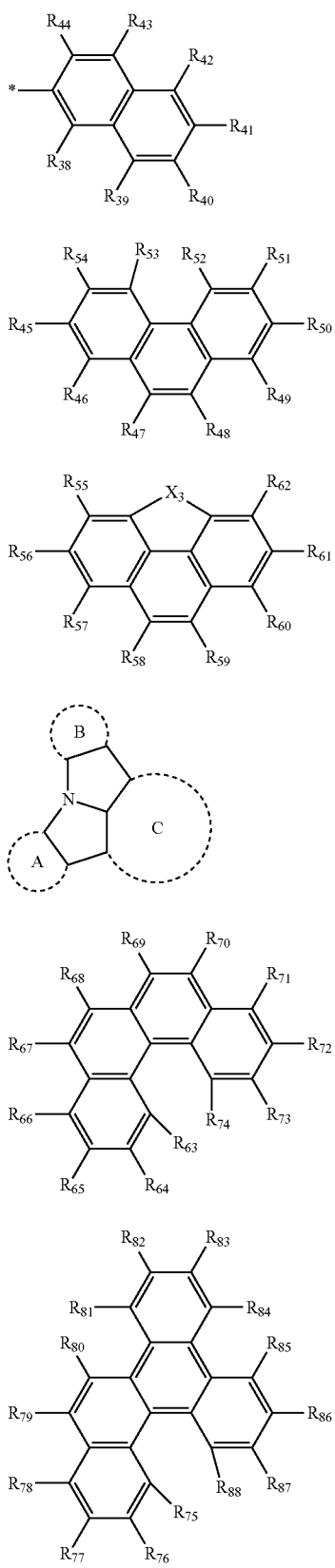

wherein in the formula (L-1),
a ring A and a ring B are independently
a substituted or unsubstituted aromatic hydrocarbon ring including 6 to 14 ring carbon atoms, or
a substituted or unsubstituted heterocycle including 5 to 50 ring atoms;
$X_2$ is O, S, $N(R_{1a})$, or $C(R_{2a})(R_{3a})$;
one of $R_{1a}$ to $R_{3a}$ and an atom which constitutes the aromatic hydrocarbon ring or the heterocycle of the ring A and the ring B and which may form a single bond is a single bond bonding with an anthracene skeleton, or is bonded with the anthracene skeleton by a single bond, and one of the remaining is a single bond bonding with $Ar_1$ or $Ar_2$, or is bonded with $Ar_1$ or $Ar_2$ by a single bond;
atoms which are not single-bonded with the anthracene skeleton and $Ar_1$ or $Ar_2$, which constitute the aromatic hydrocarbon ring or the heterocycle of a ring A and a ring B, and which may form a single bond are independently bonded with a hydrogen atom or a substituent R;
$R_{1a}$ to $R_{3a}$ which are not the single bond are independently a hydrogen atom or a substituent R;
the substituent R is as defined above;
wherein in the formula (L-2),
* is a single bond bonding with an anthracene skeleton;
one of $R_{32}$ to $R_{36}$ is a single bond bonding with $Ar_1$ or $Ar_2$;
$R_{32}$ to $R_{36}$ which are not single bonds bonding with $Ar_1$ or $Ar_2$ are independently a hydrogen atom or a substituent R;
the substituent R is as defined above;
wherein in the formula (L-3),
* is a single bond bonding with an anthracene skeleton;
one of $R_{38}$ to $R_{44}$ is a single bond bonding with $Ar_1$ or $Ar_2$;
$R_{38}$ to $R_{44}$ which are not single bonds bonding with the anthracene skeleton and $Ar_1$ or $Ar_2$ are independently a hydrogen atom or a substituent R;
the substituent R is as defined above;
wherein in the formula (L-4),
one of $R_{45}$ to $R_{54}$ is a single bond bonding with the anthracene skeleton, and one of the remaining is a single bond bonding with $Ar_1$ or $Ar_2$;
$R_{45}$ to $R_{54}$ which are not single bonds bonding with an anthracene skeleton and $Ar_1$ or $Ar_2$ are independently a hydrogen atom or a substituent R;
the substituent R is as defined above;
wherein in the formula (L-5),
$X_3$ is O, S, $N(R_{1a})$, or $C(R_{2a})(R_{3a})$;

one of $R_{1a}$ to $R_{3a}$ and $R_{55}$ to $R_{62}$ is a single bond bonding with an anthracene skeleton, and one of the remaining is a single bond bonding with $Ar_1$ or $Ar_2$;

$R_{1a}$ to $R_{3a}$ and $R_{55}$ to $R_{62}$ which are not single bond bonding with the anthracene skeleton and $Ar_1$ or $Ar_2$ are independently a hydrogen atom or a substituent R;

the substituent R is as defined above;

wherein in the formula (L-6), a ring A, a ring B, and a ring C are independently a substituted or unsubstituted aromatic hydrocarbon ring including 6 to 14 ring carbon atoms, or a substituted or unsubstituted heterocycle including 5 to 50 ring atoms;

one of the atoms which constitute the aromatic hydrocarbon ring or heterocycle of a ring A, a ring B, and a ring C and which may form a single bond is bonded with an anthracene skeleton by a single bond, and one of the remaining is bonded with $Ar_1$ or $Ar_2$ by a single bond;

atoms which are not single-bonded with the anthracene skeleton and $Ar_1$ or $Ar_2$, which constitute the aromatic hydrocarbon ring or the heterocycle of a ring A, a ring B, and a ring C, and which may form a single bond are independently bonding with a hydrogen atom or a substituent R;

the substituent R is as defined above;

wherein in the formula (L-7), one of $R_{63}$ to $R_{74}$ is a single bond bonding with an anthracene skeleton, and one of the remaining is a single bond bonding with $Ar_1$ or $Ar_2$;

$R_{63}$ to $R_{74}$ which are not single bonds bonding with the anthracene skeleton and $Ar_1$ or $Ar_2$ are independently a hydrogen atom or a substituent R;

the substituent R is as defined above;

wherein in the formula (L-8), one of $R_{75}$ to $R_{88}$ is a single bond bonding with the anthracene skeleton, and one of the remaining is a single bond bonding with $Ar_1$ or $Ar_2$;

$R_{75}$ to $R_{88}$ which are not single bonds bonding with the anthracene skeleton and $Ar_1$ or $Ar_2$ are independently a hydrogen atom or a substituent R;

the substituent R is as defined above;

wherein in the formula (L-9), one of $R_{89}$ to $R_{100}$ is a single bond bonding with the anthracene skeleton, and one of the remaining is a single bond bonding with $Ar_1$ or $Ar_2$;

$R_{89}$ to $R_{100}$ which are not single bonds bonding with the anthracene skeleton and $Ar_1$ or $Ar_2$ are independently a hydrogen atom or a substituent R;

the substituent R is as defined above;

$Ar_1$ is a monovalent group having a structure represented by the following formula (2):

(2)

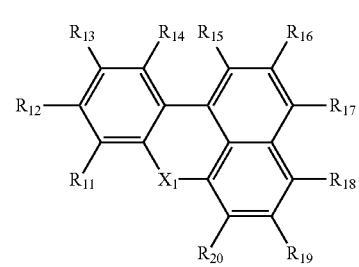

wherein in the formula (2), $X_1$ is O or S;

one of $R_{11}$ to $R_{20}$ is a single bond bonding with $L_1$;

one or more sets of adjacent two or more of $R_{11}$ to $R_{1a}$ and one or more sets of adjacent two or more of $R_{15}$ to $R_{20}$ which are not single bonds bonding with $L_1$ form a substituted or unsubstituted, saturated or unsaturated ring by bonding with each other, or do not form a substituted or unsubstituted, saturated or unsaturated ring;

$R_{11}$ to $R_{20}$ which are not single bonds bonding with $L_1$ and do not form the substituted or unsubstituted, saturated or unsaturated ring are independently a hydrogen atom or a substituent R;

the substituent R is as defined above;

$Ar_2$ is a monovalent group having a structure represented by any one of the following formulas ($Ar_2$-1) to ($Ar_2$-10); provided that, when $L_2$ is a single bond, $Ar_2$ is not a group represented by the following formula ($Ar_2$-10);

($Ar_2$-1)

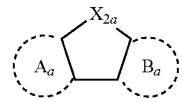

($Ar_2$-2)

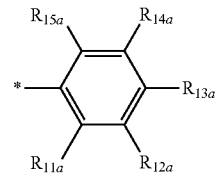

($Ar_2$-3)

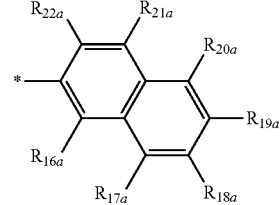

($Ar_2$-4)

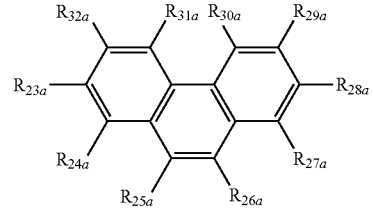

($Ar_2$-5)

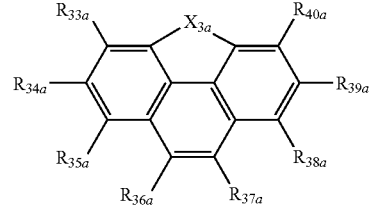

-continued (Ar₂-6)

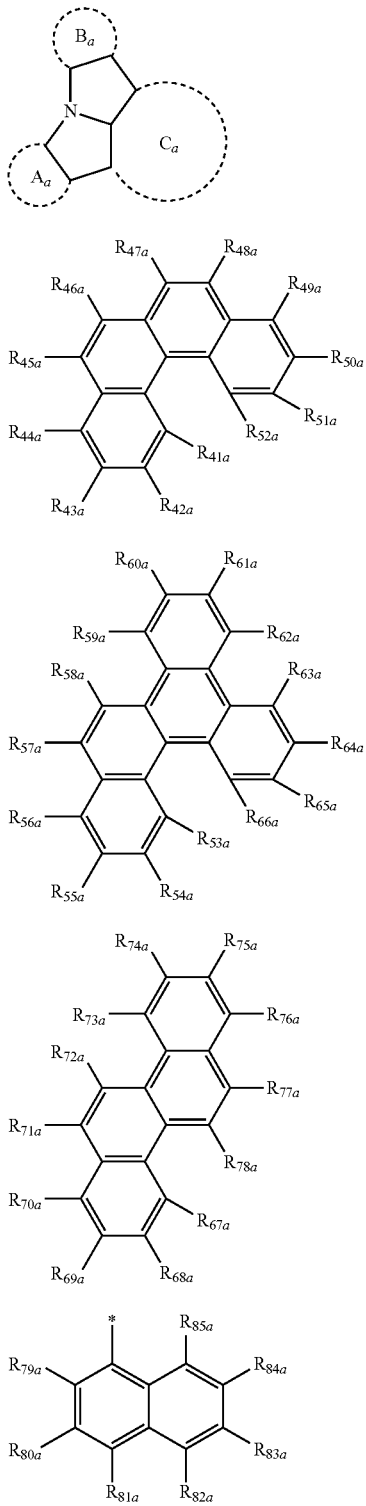

(Ar₂-7)

(Ar₂-8)

(Ar₂-9)

(Ar₂-10)

wherein in the formula (Ar₂-1),
a ring $A_a$ and a ring $B_a$ are independently
a substituted or unsubstituted aromatic hydrocarbon ring including 6 to 14 ring carbon atoms, or
a substituted or unsubstituted heterocycle including 5 to 50 ring atoms;
$X_{2a}$ is O, S, N($R_{1a}$), or C($R_{2a}$)($R_{3a}$);
one of $R_{1a}$ to $R_{3a}$ and the atoms which constitute the aromatic hydrocarbon ring or the heterocycle of a ring $A_a$ and a ring $B_a$ and which may form a single bond are a single bond bonding with $L_2$ or bonded with $L_2$ by a single bond;
$R_{1a}$ to $R_{3a}$ which are not single bonds bonding with $L_2$ and atoms which are not single-bonded with $L_2$, which constitute the aromatic hydrocarbon ring or the heterocycle of a ring $A_a$ and a ring $B_a$, and which may form a single bond are independently a hydrogen atom or substituent R, or are independently bonded with a hydrogen atom or a substituent R;
the substituent R is as defined above;
wherein in the formula (Ar₂-2),
* is a single bond bonding with $L_2$;
$R_{11a}$ to $R_{15a}$ are independently a hydrogen atom or a substituent R;
the substituent R is as defined above;
wherein in the formula (Ar₂-3),
* is a single bond bonding with $L_2$;
$R_{16a}$ to $R_{22a}$ are independently a hydrogen atom or a substituent R;
the substituent R is as defined above;
wherein in the formula (Ar₂-4),
one of $R_{23a}$ to $R_{32a}$ is a single bond bonding with $L_2$;
$R_{23a}$ to $R_{32a}$ which are not single bonds bonding with $L_2$ are independently a hydrogen atom or a substituent R;
the substituent R is as defined above;
wherein in the formula (Ar₂-5),
$X_{3a}$ is O, S, N($R_{1a}$), or C($R_{2a}$)($R_{3a}$);
one of $R_{1a}$ to $R_{3a}$ and $R_{33a}$ to $R_{40a}$ is a single bond bonding with $L_2$;
$R_{1a}$ to $R_{3a}$ and $R_{33a}$ to $R_{40a}$ which are not single binds bonding with $L_2$ are independently a hydrogen atom or a substituent R;
the substituent R is as defined above;
wherein in the formula (Ar₂-6),
a ring $A_a$, a ring $B_a$, and a ring $C_a$ are independently
a substituted or unsubstituted aromatic hydrocarbon ring including 6 to 14 ring carbon atoms, or
a substituted or unsubstituted heterocycle including 5 to 50 ring atoms;
one of the atoms which constitutes the aromatic hydrocarbon ring or the heterocycle of a ring $A_a$, a ring $B_a$, and a ring $C_a$ and which may form a single bond is bonded with $L_2$ by a single bond;
atoms which are not single-bonded with $L_2$, which constitute the aromatic hydrocarbon ring or the heterocycle of a ring $A_a$, a ring $B_a$, and a ring $C_a$, and which may form a single bond are independently bonded with a hydrogen atom or a substituent R;
the substituent R is as defined above;
wherein in the formula (Ar₂-7),
one of $R_{41a}$ to $R_{52a}$ is a single bond bonding with $L_2$;
$R_{41a}$ to $R_{52a}$ which are not single bonds bonding with $L_2$ are independently a hydrogen atom or a substituent R;
the substituent R is as defined above;
wherein in the formula (Ar₂-8),
one of $R_{53a}$ to $R_{66a}$ is a single bond bonding with $L_2$;
$R_{53a}$ to $R_{66a}$ which are not single bonds bonding with $L_2$ are independently a hydrogen atom or a substituent R;
the substituent R is as defined above;
wherein in the formula (Ar₂-9),
one of $R_{67a}$ to $R_{78a}$ is a single bond bonding with $L_2$;

$R_{67a}$ to $R_{78a}$ which are not single bond bonding with $L_2$ are independently a hydrogen atom or a substituent R;

the substituent R is as defined above;

wherein in the formula (Ar$_2$-10),

* is a single bond bonding with $L_2$;

$R_{79a}$ to $R_{85a}$ are independently a hydrogen atom or a substituent R; the substituent R is as defined above.]

2. A material for an organic electroluminescence device, comprising a compound represented by 1.

3. An organic electroluminescence device comprising: a cathode;
an anode; and
one or two or more organic layers disposed between the cathode and the anode, wherein at least one of the organic layers comprises a compound according to 1.

4. An electronic apparatus, comprising the organic electroluminescence device according to 3.

According to the invention, it is possible to provide a novel compound useful as a material of an organic EL device, an organic EL device having a long lifetime, and an electronic apparatus using the organic EL device.

BRIEF DESCRIPTION OF THE DRAWINGS

The FIGURE is a diagram showing a schematic configuration of an organic EL device according to an aspect of the invention.

MODE FOR CARRYING OUT THE INVENTION

Hereinafter, each aspect for carrying out the invention will be described. It should be noted that an embodiment in which two or more of the individual embodiments of the invention described below are combined is also an embodiment of the invention.

[Definition]

In this specification, a hydrogen atom includes its isotopes different in the number of neutrons, namely, a protium, a deuterium and a tritium.

In this specification, at a bondable position in a chemical formula where a symbol such as "R", or "D" representing a deuterium atom is not indicated, a hydrogen atom, that is, a protium atom, a deuterium atom or a tritium atom is bonded.

In this specification, the number of ring carbon atoms represents the number of carbon atoms forming a subject ring itself among the carbon atoms of a compound having a structure in which atoms are bonded in a ring form (for example, a monocyclic compound, a fused ring compound, a cross-linked compound, a carbocyclic compound, or a heterocyclic compound). When the subject ring is substituted by a substituent, the carbon contained in the substituent is not included in the number of ring carbon atoms. The same shall apply to "the number of ring carbon atoms" described below, unless otherwise specified. For example, a benzene ring has 6 ring carbon atoms, a naphthalene ring includes 10 ring carbon atoms, a pyridine ring includes 5 ring carbon atoms, and a furan ring includes 4 ring carbon atoms. Further, for example, a 9,9-diphenylfluorenyl group includes 13 ring carbon atoms, and a 9,9'-spirobifluorenyl group includes 25 ring carbon atoms.

When a benzene ring is substituted by, for example, an alkyl group as a substituent, the number of carbon atoms of the alkyl group is not included in the number of ring carbon atoms of the benzene ring. Therefore, the number of ring carbon atoms of the benzene ring substituted by the alkyl group is 6. When a naphthalene ring is substituted by, for example, an alkyl group as a substituent, the number of carbon atoms of the alkyl group is not included in the number of ring carbon atoms of the naphthalene ring. Therefore, the number of ring carbon atoms of the naphthalene ring substituted by the alkyl group is 10.

In this specification, the number of ring atoms represents the number of atoms forming a subject ring itself among the atoms of a compound having a structure in which atoms are bonded in a ring form (for example, the structure includes a monocyclic ring, a fused ring and a ring assembly) (for example, a monocyclic compound, a fused ring compound, a cross-linked compound, a carbocyclic compound and a heterocyclic compound). The number of ring atoms does not include atoms which do not form the ring (for example, a hydrogen atom which terminates a bond of the atoms forming the ring), or atoms contained in a substituent when the ring is substituted by the substituent. The same shall apply to "the number of ring atoms" described below, unless otherwise specified. For example, the number of atoms of a pyridine ring is 6, the number of atoms of a quinazoline ring is 10, and the number of a furan ring is 5. For example, hydrogen atoms bonded to a pyridine ring and atoms constituting a substituent substituted on the pyridine ring are not included in the number of ring atoms of the pyridine ring. Therefore, the number of ring atoms of a pyridine ring with which a hydrogen atom or a substituent is bonded is 6. For example, hydrogen atoms and atoms constituting a substituent which are bonded with a quinazoline ring is not included in the number of ring atoms of the quinazoline ring. Therefore, the number of ring atoms of a quinazoline ring with which a hydrogen atom or a substituent is bonded is 10.

In this specification, "XX to YY carbon atoms" in the expression "a substituted or unsubstituted ZZ group including XX to YY carbon atoms" represents the number of carbon atoms in the case where the ZZ group is unsubstituted by a substituent, and does not include the number of carbon atoms of a substituent in the case where the ZZ group is substituted by the substituent. Here, "YY" is larger than "XX", and "XX" means an integer of 1 or more and "YY" means an integer of 2 or more.

In this specification, "XX to YY atoms" in the expression "a substituted or unsubstituted ZZ group including XX to YY atoms" represents the number of atoms in the case where the ZZ group is unsubstituted by a substituent, and does not include the number of atoms of a substituent in the case where the ZZ group is substituted by the substituent. Here, "YY" is larger than "XX", and "XX" means an integer of 1 or more and "YY" means an integer of 2 or more.

In this specification, the unsubstituted ZZ group represents the case where the "substituted or unsubstituted ZZ group" is a "ZZ group unsubstituted by a substituent", and the substituted ZZ group represents the case where the "substituted or unsubstituted ZZ group" is a "ZZ group substituted by a substituent".

In this specification, a term "unsubstituted" in the case of "a substituted or unsubstituted ZZ group" means that hydrogen atoms in the ZZ group are not substituted by a substituent. Hydrogen atoms in a term "unsubstituted ZZ group" are a protium atom, a deuterium atom, or a tritium atom.

In this specification, a term "substituted" in the case of "a substituted or unsubstituted ZZ group" means that one or more hydrogen atoms in the ZZ group are substituted by a substituent. Similarly, a term "substituted" in the case of "a BB group substituted by an AA group" means that one or more hydrogen atoms in the BB group are substituted by the AA group.

"Substituent as Described in this Specification"

Hereinafter, the substituent described in this specification will be explained.

The number of ring carbon atoms of the "unsubstituted aryl group" described in this specification is 6 to 50, preferably 6 to 30, and more preferably 6 to 18, unless otherwise specified.

The number of ring atoms of the "unsubstituted heterocyclic group" described in this specification is 5 to 50, preferably 5 to 30, and more preferably 5 to 18, unless otherwise specified.

The number of carbon atoms of the "unsubstituted alkyl group" described in this specification is 1 to 50, preferably 1 to 20, and more preferably 1 to 6, unless otherwise specified.

The number of carbon atoms of the "unsubstituted alkenyl group" described in this specification is 2 to 50, preferably 2 to 20, and more preferably 2 to 6, unless otherwise specified.

The number of carbon atoms of the "unsubstituted alkynyl group" described in this specification is 2 to 50, preferably 2 to 20, and more preferably 2 to 6, unless otherwise specified.

The number of ring carbon atoms of the "unsubstituted cycloalkyl group" described in this specification is 3 to 50, preferably 3 to 20, and more preferably 3 to 6, unless otherwise specified.

The number of ring carbon atoms of the "unsubstituted arylene group" described in this specification is 6 to 50, preferably 6 to 30, and more preferably 6 to 18, unless otherwise specified.

The number of ring atoms of the "unsubstituted divalent heterocyclic group" described in this specification is 5 to 50, preferably 5 to 30, and more preferably 5 to 18, unless otherwise specified.

The number of carbon atoms of the "unsubstituted alkylene group" described in this specification is 1 to 50, preferably 1 to 20, and more preferably 1 to 6, unless otherwise specified.

"Substituted or Unsubstituted Aryl Group"

Specific examples of the "substituted or unsubstituted aryl group" described in this specification (specific example group G1) include the following unsubstituted aryl groups (specific example group G1A), substituted aryl groups (specific example group G1B), and the like. (Here, the unsubstituted aryl group refers to the case where the "substituted or unsubstituted aryl group" is an "aryl group unsubstituted by a substituent", and the substituted aryl group refers to the case where the "substituted or unsubstituted aryl group" is an "aryl group substituted by a substituent".) In this specification, in the case where simply referred as an "aryl group", it includes both a "unsubstituted aryl group" and a "substituted aryl group."

The "substituted aryl group" means a group in which one or more hydrogen atoms of the "unsubstituted aryl group" are substituted by a substituent. Specific examples of the "substituted aryl group" include, for example, groups in which one or more hydrogen atoms of the "unsubstituted aryl group" of the following specific example group G1A are substituted by a substituent, the substituted aryl groups of the following specific example group G1B, and the like. It should be noted that the examples of the "unsubstituted aryl group" and the examples of the "substituted aryl group" enumerated in this specification are mere examples, and the "substituted aryl group" described in this specification also includes a group in which a hydrogen atom bonded with a carbon atom of the aryl group itself in the "substituted aryl group" of the following specific group G1B is further substituted by a substituent, and a group in which a hydrogen atom of a substituent in the "substituted aryl group" of the following specific group G1B is further substituted by a substituent.

Unsubstituted Aryl Group (Specific Example Group G1a):
a phenyl group,
a p-biphenyl group,
a m-biphenyl group,
an o-biphenyl group,
a p-terphenyl-4-yl group,
a p-terphenyl-3-yl group,
a p-terphenyl-2-yl group,
a m-terphenyl-4-yl group,
a m-terphenyl-3-yl group,
a m-terphenyl-2-yl group,
an o-terphenyl-4-yl group,
an o-terphenyl-3-yl group,
an o-terphenyl-2-yl group,
a 1-naphthyl group,
a 2-naphthyl group,
an anthryl group,
a benzanthryl group,
a phenanthryl group,
a benzophenanthryl group,
a phenalenyl group,
a pyrenyl group,
a chrysenyl group,
a benzochrysenyl group,
a triphenylenyl group,
a benzotriphenylenyl group,
a tetracenyl group,
a pentacenyl group,
a fluorenyl group,
a 9,9'-spirobifluorenyl group,
a benzofluorenyl group,
a dibenzofluorenyl group,
a fluoranthenyl group,
a benzofluoranthenyl group,
a perylenyl group, and
a monovalent aryl group derived by removing one hydrogen atom from the ring structures represented by any of the following general formulas (TEMP-1) to (TEMP-15).

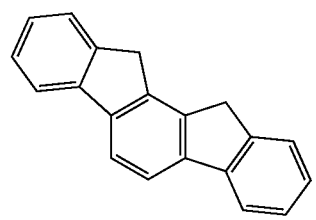

(TEMP-1)

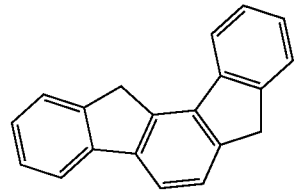

(TEMP-2)

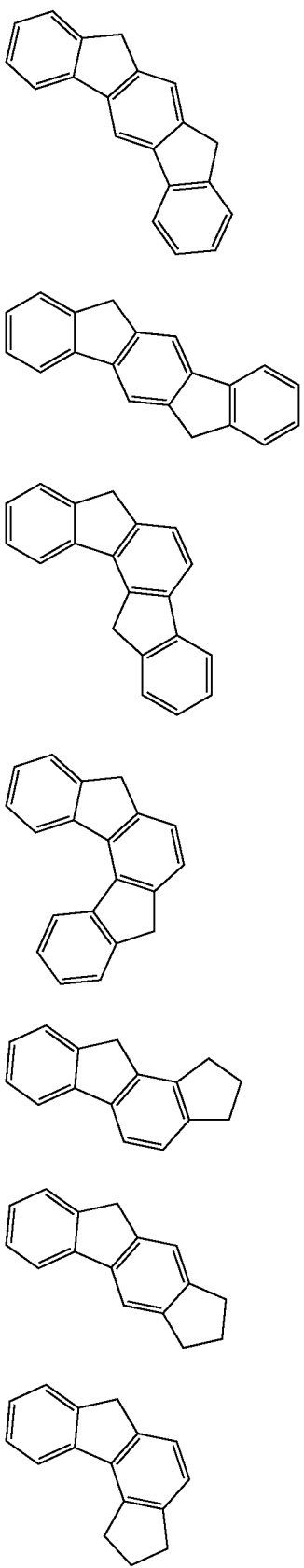
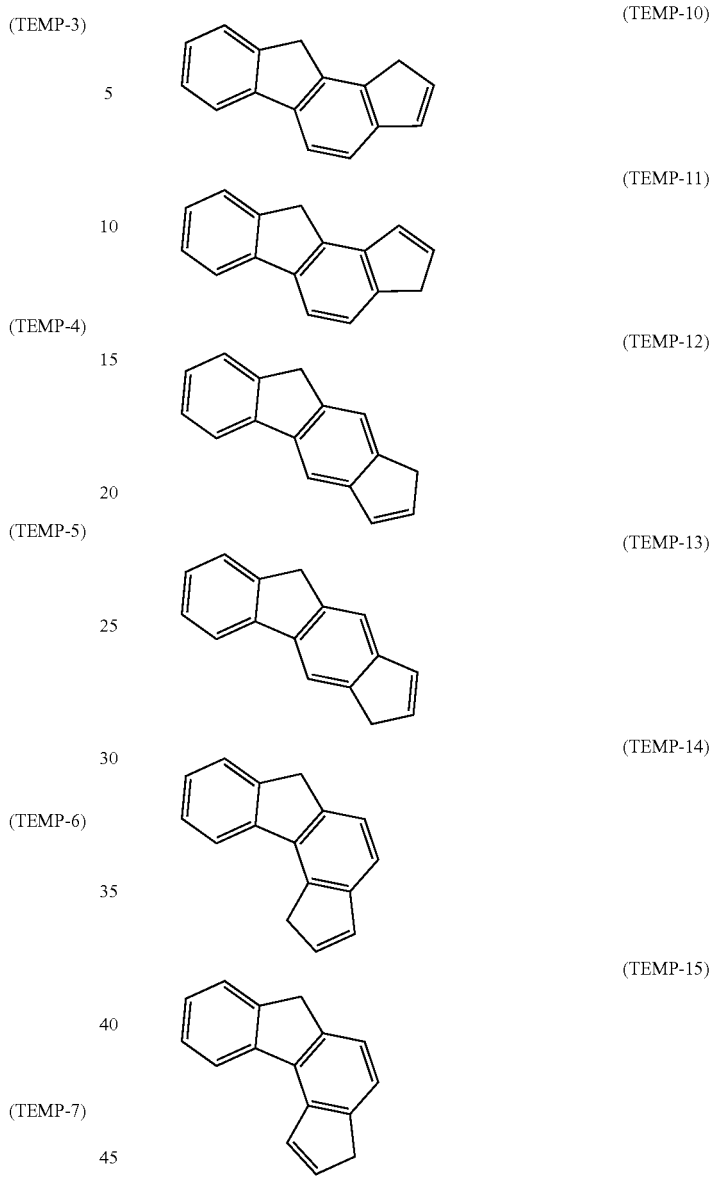

Substituted aryl group (specific example group G1B):
an o-tolyl group,
a m-tolyl group,
a p-tolyl group,
a p-xylyl group,
a m-xylyl group,
an o-xylyl group,
a p-isopropylphenyl group,
a m-isopropylphenyl group,
an o-isopropylphenyl group,
a p-t-butylphenyl group,
a m-t-butylphenyl group,
an o-t-butylphenyl group,
a 3,4,5-trimethylphenyl group,
a 9,9-dimethylfluorenyl group,
a 9,9-diphenylfluorenyl group,
a 9,9-bis(4-methylphenyl)fluorenyl group,
a 9,9-bis(4-isopropylphenyl)fluorenyl group,
a 9,9-bis(4-t-butylphenyl)fluorenyl group,
a cyanophenyl group, a triphenylsilylphenyl group,
a trimethylsilylphenyl group,
a phenylnaphthyl group,
a naphthylphenyl group, and
a group in which one or more hydrogen atoms of a monovalent group derived from the ring structures represented by any of the general formulas (TEMP-1) to (TEMP-15) are substituted by a substituent.

"Substituted or unsubstituted heterocyclic group"

The "heterocyclic group" described in this specification is a ring group having at least one hetero atom in the ring atom. Specific examples of the hetero atom include a nitrogen atom, an oxygen atom, a sulfur atom, a silicon atom, a phosphorus atom, and a boron atom.

The "heterocyclic group" in this specification is a monocyclic group or a fused ring group.

The "heterocyclic group" in this specification is an aromatic heterocyclic group or a non-aromatic heterocyclic group.

Specific examples of the "substituted or unsubstituted heterocyclic group" (specific example group G2) described in this specification include the following unsubstituted heterocyclic group (specific example group G2A), the following substituted heterocyclic group (specific example group G2B), and the like. (Here, the unsubstituted heterocyclic group refers to the case where the "substituted or unsubstituted heterocyclic group" is a "heterocyclic group unsubstituted by a substituent", and the substituted heterocyclic group refers to the case where the "substituted or unsubstituted heterocyclic group" is a "heterocyclic group substituted by a substituent".) In this specification, in the case where simply referred as a "heterocyclic group", it includes both the "unsubstituted heterocyclic group" and the "substituted heterocyclic group."

The "substituted heterocyclic group" means a group in which one or more hydrogen atom of the "unsubstituted heterocyclic group" are substituted by a substituent. Specific examples of the "substituted heterocyclic group" include a group in which a hydrogen atom of "unsubstituted heterocyclic group" of the following specific example group G2A is substituted by a substituent, the substituted heterocyclic groups of the following specific example group G2B, and the like. It should be noted that the examples of the "unsubstituted heterocyclic group" and the examples of the "substituted heterocyclic group" enumerated in this specification are mere examples, and the "substituted heterocyclic group" described in this specification includes groups in which hydrogen atom bonded with a ring atom of the heterocyclic group itself in the "substituted heterocyclic group" of the specific example group G2B is further substituted by a substituent, and a group in which hydrogen atom of a substituent in the "substituted heterocyclic group" of the specific example group G2B is further substituted by a substituent.

Specific example group G2A includes, for example, the following unsubstituted heterocyclic group containing a nitrogen atom (specific example group G2A1), the following unsubstituted heterocyclic group containing an oxygen atom (specific example group G2A2), the following unsubstituted heterocyclic group containing a sulfur atom (specific example group G2A3), and the monovalent heterocyclic group derived by removing one hydrogen atom from the ring structures represented by any of the following general formulas (TEMP-16) to (TEMP-33) (specific example group G2A4).

Specific example group G2B includes, for example, the following substituted heterocyclic group containing a nitrogen atom (specific example group G2B1), the following substituted heterocyclic group containing an oxygen atom (specific example group G2B2), the following substituted heterocyclic group containing a sulfur atom (specific example group G2B3), and the following group in which one or more hydrogen atoms of the monovalent heterocyclic group derived from the ring structures represented by any of the following general formulas (TEMP-16) to (TEMP-33) are substituted by a substituent (specific example group G2B4).

Unsubstituted Heterocyclic Group Containing a Nitrogen Atom (Specific Example Group G2A1):
a pyrrolyl group,
an imidazolyl group,
a pyrazolyl group,
a triazolyl group,
a tetrazolyl group,
an oxazolyl group,
an isoxazolyl group,
an oxadiazolyl group,
a thiazolyl group,
an isothiazolyl group,
a thiadiazolyl group,
a pyridyl group,
a pyridazinyl group,
a pyrimidinyl group,
a pyrazinyl group,
a triazinyl group,
an indolyl group,
an isoindolyl group,
an indolizinyl group,
a quinolizinyl group,
a quinolyl group,
an isoquinolyl group,
a cinnolyl group,
a phthalazinyl group,
a quinazolinyl group,
a quinoxalinyl group,
a benzimidazolyl group,
an indazolyl group,
a phenanthrolinyl group,
a phenanthridinyl group,
an acridinyl group,
a phenazinyl group,
a carbazolyl group,
a benzocarbazolyl group,
a morpholino group,
a phenoxazinyl group,
a phenothiazinyl group,
an azacarbazolyl group, and a diazacarbazolyl group.

Unsubstituted Heterocyclic Group Containing an Oxygen Atom (Specific Example Group G2A2):
a furyl group,
an oxazolyl group,
an isoxazolyl group,
an oxadiazolyl group,
a xanthenyl group,
a benzofuranyl group,
an isobenzofuranyl group,
a dibenzofuranyl group,
a naphthobenzofuranyl group,
a benzoxazolyl group,
a benzisoxazolyl group,
a phenoxazinyl group,
a morpholino group,
a dinaphthofuranyl group,
an azadibenzofuranyl group, a diazadibenzofuranyl group,
an azanaphthobenzofuranyl group, and
a diazanaphthobenzofuranyl group.

Unsubstituted Heterocyclic Group Containing a Sulfur Atom (Specific Example Group G2A3):
- a thienyl group,
- a thiazolyl group,
- an isothiazolyl group,
- a thiadiazolyl group,
- a benzothiophenyl group (benzothienyl group),
- an isobenzothiophenyl group (isobenzothienyl group),
- a dibenzothiophenyl group (dibenzothienyl group),
- a naphthobenzothiophenyl group (naphthobenzothienyl group),
- a benzothiazolyl group,
- a benzisothiazolyl group,
- a phenothiazinyl group,
- a dinaphthothiophenyl group (dinaphthothienyl group),
- an azadibenzothiophenyl group (azadibenzothienyl group),
- a diazadibenzothiophenyl group (diazadibenzothienyl group),
- an azanaphthobenzothiophenyl group (azanaphthobenzothienyl group), and
- a diazanaphthobenzothiophenyl group (diazanaphthobenzothienyl group).

Monovalent Heterocyclic Group Derived by Removing One Hydrogen Atom from the Ring Structures Represented by any of the Following General Formulas (TEMP-16) to (TEMP-33) (Specific Example Group G2A4):

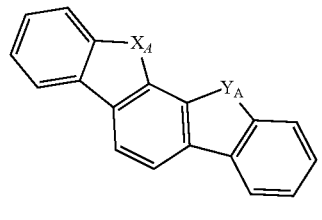

(TEMP-16)

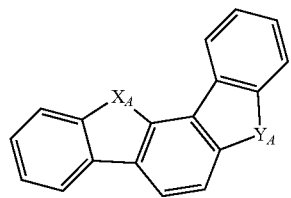

(TEMP-17)

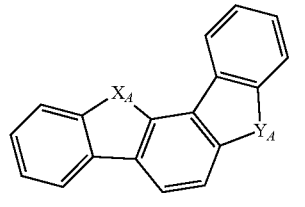

(TEMP-18)

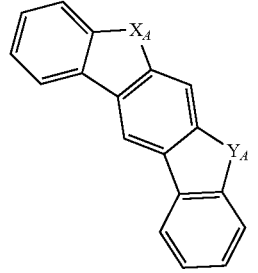

(TEMP-19)

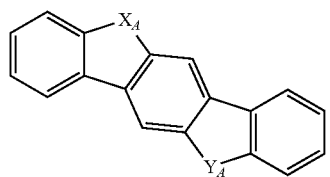

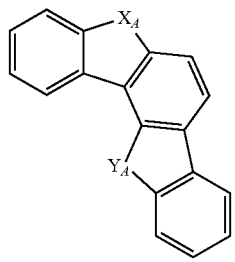

(TEMP-20)

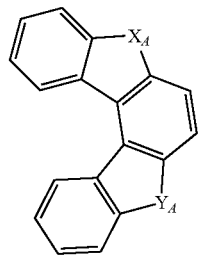

(TEMP-21)

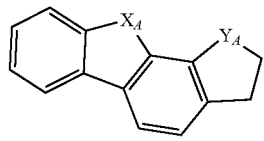

(TEMP-22)

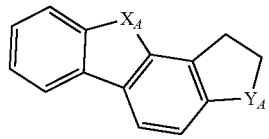

(TEMP-23)

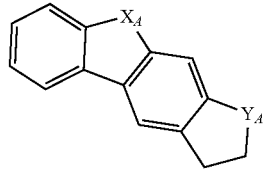

(TEMP-24)

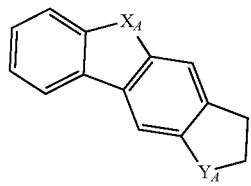

(TEMP-25)

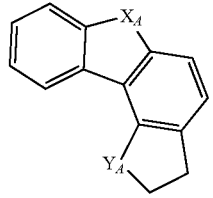

(TEMP-26)

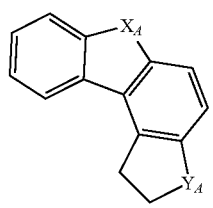

(TEMP-27)

-continued

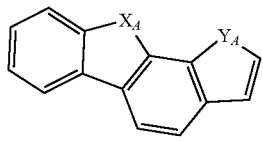
(TEMP-28)

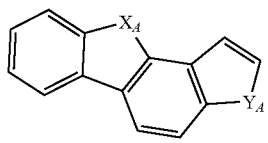
(TEMP-29)

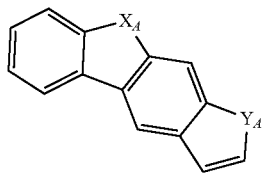
(TEMP-30)

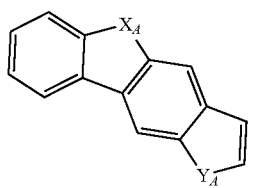
(TEMP-31)

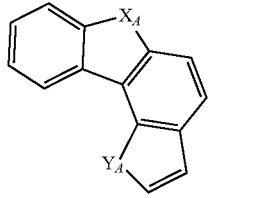
(TEMP-32)

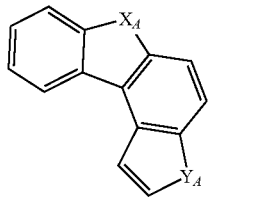
(TEMP-33)

In the general formulas (TEMP-16) to (TEMP-33), $X_A$ and $Y_A$ are independently an oxygen atom, a sulfur atom, NH, or $CH_2$. Provided that at least one of $X_A$ and $Y_A$ is an oxygen atom, a sulfur atom, or NH.

In the general formulas (TEMP-16) to (TEMP-33), when at least one of $X_A$ and $Y_A$ is NH or $CH_2$, the monovalent heterocyclic group derived from the ring structures represented by any of the general formulas (TEMP-16) to (TEMP-33) includes a monovalent group derived by removing one hydrogen atom from these NH or $CH_2$.

Substituted Heterocyclic Group Containing a Nitrogen Atom (Specific Example Group G2B1):
 a (9-phenyl)carbazolyl group,
 a (9-biphenylyl)carbazolyl group,
 a (9-phenyl)phenylcarbazolyl group,
 a (9-naphthyl)carbazolyl group,
 a diphenylcarbazol-9-yl group,
 a phenylcarbazol-9-yl group,
 a methylbenzimidazolyl group,
 an ethylbenzimidazolyl group,
 a phenyltriazinyl group,
 a biphenylyltriazinyl group,
 a diphenyltriazinyl group,
 a phenylquinazolinyl group, and
 a biphenylylquinazolinyl group.

Substituted Heterocyclic Group Containing an Oxygen Atom (Specific Example Group G2B2):
 a phenyldibenzofuranyl group,
 a methyldibenzofuranyl group,
 a t-butyldibenzofuranyl group, and
 a monovalent residue of spiro[9H-xanthene-9,9'-[9H]fluorene].

Substituted Heterocyclic Group Containing a Sulfur Atom (Specific Example Group G2B3):
 a phenyldibenzothiophenyl group,
 a methyldibenzothiophenyl group,
 a t-butyldibenzothiophenyl group, and
 a monovalent residue of spiro[9H-thioxanthene-9,9'-[9H]fluorene].

Group in which One or More Hydrogen Atoms of the Monovalent Heterocyclic Group Derived from the Ring Structures Represented by any of the Following General Formulas (TEMP-16) to (TEMP-33) are Substituted by a Substituent (Specific Example Group G2B4):

The "one or more hydrogen atoms of the monovalent heterocyclic group" means one or more hydrogen atoms selected from hydrogen atoms bonded with ring carbon atoms of the monovalent heterocyclic group, a hydrogen atom bonded with a nitrogen atom when at least one of $X_A$ and $Y_A$ is NH, and hydrogen atoms of a methylene group when one of $X_A$ and $Y_A$ is $CH_2$.

"Substituted or Unsubstituted Alkyl Group"

Specific examples of the "substituted or unsubstituted alkyl group" (specific example group G3) described in this specification include the following unsubstituted alkyl groups (specific example group G3A) and the following substituted alkyl groups (specific example group G3B). (Here, the unsubstituted alkyl group refers to the case where the "substituted or unsubstituted alkyl group" is an "alkyl group unsubstituted by a substituent", and the substituted alkyl group refers to the case where the "substituted or unsubstituted alkyl group" is an "alkyl group substituted by a substituent".) In this specification, in the case where simply referred as an "alkyl group" includes both the "unsubstituted alkyl group" and the "substituted alkyl group."

The "substituted alkyl group" means a group in which one or more hydrogen atoms in the "unsubstituted alkyl group" are substituted by a substituent. Specific examples of the "substituted alkyl group" include groups in which one or more hydrogen atoms in the following "unsubstituted alkyl group" (specific example group G3A) are substituted by a substituent, the following substituted alkyl group (specific example group G3B), and the like. In this specification, the alkyl group in the "unsubstituted alkyl group" means a linear alkyl group. Thus, the "unsubstituted alkyl group" includes a straight-chain "unsubstituted alkyl group" and a branched-chain "unsubstituted alkyl group". It should be noted that the examples of the "unsubstituted alkyl group" and the examples of the "substituted alkyl group" enumerated in this specification are mere examples, and the "substituted alkyl group" described in this specification includes a group in which hydrogen atom of the alkyl group itself in the "substituted alkyl group" of the specific example group G3B is further substituted by a substituent, and a group in which hydrogen atom of a substituent in the "substituted alkyl group" of the specific example group G3B is further substituted by a substituent.

Unsubstituted Alkyl Group (Specific Example Group G3a):
a methyl group,
an ethyl group,
a n-propyl group,
an isopropyl group,
a n-butyl group,
an isobutyl group,
a s-butyl group, and
a t-butyl group.

Substituted Alkyl Group (Specific Example Group G3B):
a heptafluoropropyl group (including isomers),
a pentafluoroethyl group,
a 2,2,2-trifluoroethyl group, and
a trifluoromethyl group.

"Substituted or Unsubstituted Alkenyl Group"

Specific examples of the "substituted or unsubstituted alkenyl group" described in this specification (specific example group G4) include the following unsubstituted alkenyl group (specific example group G4A), the following substituted alkenyl group (specific example group G4B), and the like. (Here, the unsubstituted alkenyl group refers to the case where the "substituted or unsubstituted alkenyl group" is a "alkenyl group unsubstituted by a substituent", and the "substituted alkenyl group" refers to the case where the "substituted or unsubstituted alkenyl group" is a "alkenyl group substituted by a substituent") In this specification, in the case where simply referred as an "alkenyl group" includes both the "unsubstituted alkenyl group" and the "substituted alkenyl group."

The "substituted alkenyl group" means a group in which one or more hydrogen atoms in the "unsubstituted alkenyl group" are substituted by a substituent. Specific examples of the "substituted alkenyl group" include a group in which the following "unsubstituted alkenyl group" (specific example group G4A) has a substituent, the following substituted alkenyl group (specific example group G4B), and the like. It should be noted that the examples of the "unsubstituted alkenyl group" and the examples of the "substituted alkenyl group" enumerated in this specification are mere examples, and the "substituted alkenyl group" described in this specification includes a group in which a hydrogen atom of the alkenyl group itself in the "substituted alkenyl group" of the specific example group G4B is further substituted by a substituent, and a group in which a hydrogen atom of a substituent in the "substituted alkenyl group" of the specific example group G4B is further substituted by a substituent.

Unsubstituted Alkenyl Group (Specific Example Group G4a):
a vinyl group,
an allyl group,
a 1-butenyl group,
a 2-butenyl group, and
a 3-butenyl group.

Substituted Alkenyl Group (Specific Example Group G4B):
a 1,3-butanedienyl group,
a 1-methylvinyl group,
a 1-methylallyl group,
a 1,1-dimethylallyl group,
a 2-methylally group, and
a 1,2-dimethylallyl group.

"Substituted or Unsubstituted Alkynyl Group"

Specific examples of the "substituted or unsubstituted alkynyl group" described in this specification (specific example group G5) include the following unsubstituted alkynyl group (specific example group G5A) and the like. (Here, the unsubstituted alkynyl group refers to the case where the "substituted or unsubstituted alkynyl group" is an "alkynyl group unsubstituted by a substituent".) In this specification, in the case where simply referred as an "alkynyl group" includes both the "unsubstituted alkynyl group" and the "substituted alkynyl group."

The "substituted alkynyl group" means a group in which one or more hydrogen atoms in the "unsubstituted alkynyl group" are substituted by a substituent. Specific examples of the "substituted alkynyl group" include a group in which one or more hydrogen atoms in the following "unsubstituted alkynyl group" (specific example group G5A) are substituted by a substituent, and the like.

Unsubstituted Alkynyl Group (Specific Example Group G5a):
an ethynyl group.

"Substituted or Unsubstituted Cycloalkyl Group"

Specific examples of the "substituted or unsubstituted cycloalkyl group" described in this specification (specific example group G6) include the following unsubstituted cycloalkyl group (specific example group G6A), the following substituted cycloalkyl group (specific example group G6B), and the like. (Here, the unsubstituted cycloalkyl group refers to the case where the "substituted or unsubstituted cycloalkyl group" is a "cycloalkyl group unsubstituted by a substituent", and the substituted cycloalkyl group refers to the case where the "substituted or unsubstituted cycloalkyl group" is a "cycloalkyl group substituted by a substituent".) In this specification, in the case where simply referred as a "cycloalkyl group" includes both the "unsubstituted cycloalkyl group" and the "substituted cycloalkyl group."

The "substituted cycloalkyl group" means a group in which one or more hydrogen atoms in the "unsubstituted cycloalkyl group" are substituted by a substituent. Specific examples of the "substituted cycloalkyl group" include a group in which one or more hydrogen atoms in the following "unsubstituted cycloalkyl group" (specific example group G6A) are substituted by a substituent, and examples of the following substituted cycloalkyl group (specific example group G6B), and the like. It should be noted that the examples of the "unsubstituted cycloalkyl group" and the examples of the "substituted cycloalkyl group" enumerated in this specification are mere examples, and the "substituted cycloalkyl group" in this specification includes a group in which one or more hydrogen atoms bonded with the carbon atom of the cycloalkyl group itself in the "substituted cycloalkyl group" of the specific example group G6B are substituted by a substituent, and a group in which a hydrogen atom of a substituent in the "substituted cycloalkyl group" of specific example group G6B is further substituted by a substituent.

Unsubstituted Cycloalkyl Group (Specific Example Group G6a):
a cyclopropyl group,
a cyclobutyl group,
a cyclopentyl group,
a cyclohexyl group,
a 1-adamantyl group,
a 2-adamantyl group,
a 1-norbomyl group, and
a 2-norbomyl group.

Substituted Cycloalkyl Group (Specific Example Group G6B):
a 4-methylcyclohexyl group.

"Group Represented by —Si($R_{901}$)($R_{902}$)($R_{903}$)"

Specific examples of the group represented by —Si($R_{901}$)($R_{902}$)($R_{903}$) described in this specification (specific example group G7) include:

—Si(G1)(G1)(G1),
—Si(G1)(G2)(G2),
—Si(G1)(G1)(G2),
—Si(G2)(G2)(G2),
—Si(G3)(G3)(G3), and
—Si(G6)(G6)(G6).

G1 is the "substituted or unsubstituted aryl group" described in the specific example group G1.

G2 is the "substituted or unsubstituted heterocyclic group" described in the specific example group G2.

G3 is the "substituted or unsubstituted alkyl group" described in the specific example group G3.

G6 is the "substituted or unsubstituted cycloalkyl group" described in the specific example group G6.

Plural G1's in —Si(G1)(G1)(G1) are the same or different.

Plural G2's in —Si(G1)(G2)(G2) are the same or different.

Plural G1's in —Si(G1)(G1)(G2) are the same or different.

Plural G2's in —Si(G2)(G2)(G2) are be the same or different.

Plural G3's in —Si(G3)(G3)(G3) are the same or different.

Plural G6's in —Si(G6)(G6)(G6) are be the same or different.

"Group Represented by —O—(R$_{904}$)"

Specific examples of the group represented by —O—(R$_{904}$) in this specification (specific example group G8) include:
—O(G1),
—O(G2),
—O(G3), and
—O(G6).

G1 is the "substituted or unsubstituted aryl group" described in the specific example group G1.

G2 is the "substituted or unsubstituted heterocyclic group" described in the specific example group G2.

G3 is the "substituted or unsubstituted alkyl group" described in the specific example group G3.

G6 is the "substituted or unsubstituted cycloalkyl group" described in the specific example group G6.

"Group Represented by —S—(R$_{905}$)"

Specific examples of the group represented by —S—(R$_{905}$) in this specification (specific example group G9) include:
—S(G1),
—S(G2),
—S(G3), and
—S(G6).

G1 is the "substituted or unsubstituted aryl group" described in the specific example group G1.

G2 is the "substituted or unsubstituted heterocyclic group" described in the specific example group G2.

G3 is the "substituted or unsubstituted alkyl group" described in the specific example group G3.

G6 is the "substituted or unsubstituted cycloalkyl group" described in the specific example group G6.

"Group Represented by —N(R$_{906}$)(R$_{907}$)"

Specific examples of the group represented by —N(R$_{906}$)(R$_{907}$) in this specification (specific example group G10) include:
—N(G1)(G1),
—N(G2)(G2),
—N(G1)(G2),
—N(G3)(G3), and
—N(G6)(G6).

G1 is the "substituted or unsubstituted aryl group" described in the specific example group G1.

G2 is the "substituted or unsubstituted heterocyclic group" described in the specific example group G2.

G3 is the "substituted or unsubstituted alkyl group" described in the specific example group G3.

G6 is the "substituted or unsubstituted cycloalkyl group" described in the specific example group G6.

Plural G1's in —N(G1)(G1) are the same or different.
Plural G2's in —N(G2)(G2) are the same or different.
Plural G3's in —N(G3)(G3) are the same or different.
Plural G6's in —N(G6)(G6) are the same or different.

"Halogen Atom"

Specific examples of the "halogen atom" described in this specification (specific example group G11) include a fluorine atom, a chlorine atom, a bromine atom, an iodine atom, and the like.

"Substituted or Unsubstituted Fluoroalkyl Group"

The "substituted or unsubstituted fluoroalkyl group" described in this specification is a group in which at least one hydrogen atom bonded with a carbon atom constituting the alkyl group in the "substituted or unsubstituted alkyl group" is substituted by a fluorine atom, and includes a group in which all hydrogen atoms bonded with a carbon atom constituting the alkyl group in the "substituted or unsubstituted alkyl group" are substituted by a fluorine atom (a perfluoro group). The number of carbon atoms of the "unsubstituted fluoroalkyl group" is 1 to 50, preferably 1 to 30, more preferably 1 to 18, unless otherwise specified in this specification. The "substituted fluoroalkyl group" means a group in which one or more hydrogen atoms of the "fluoroalkyl group" are substituted by a substituent. The "substituted fluoroalkyl group" described in this specification also includes a group in which one or more hydrogen atoms bonded with a carbon atom of the alkyl chains in the "substituted fluoroalkyl group" are further substituted by a substituent, and a group in which one or more hydrogen atom of a substituent in the "substituted fluoroalkyl group" are further substituted by a substituent. Specific examples of the "unsubstituted fluoroalkyl group" include a group in which one or more hydrogen atoms in the "alkyl group" (specific group G3) are substituted by a fluorine atom, and the like.

"Substituted or Unsubstituted Haloalkyl Group"

The "substituted or unsubstituted haloalkyl group" described in this specification is a group in which at least one hydrogen atom bonded with a carbon atom constituting the alkyl group in the "substituted or unsubstituted alkyl group" is substituted by a halogen atom, and also includes a group in which all hydrogen atoms bonded with a carbon atom constituting the alkyl group in the "substituted or unsubstituted alkyl group" are substituted by a halogen atom. The number of carbon atoms of the "unsubstituted haloalkyl group" is 1 to 50, preferably 1 to 30, more preferably 1 to 18, unless otherwise specified in this specification. The "substituted haloalkyl group" means a group in which one or more hydrogen atoms of the "haloalkyl group" are substituted by a substituent. The "substituted haloalkyl group" described in this specification also includes a group in which one or more hydrogen atoms bonded with a carbon atom of the alkyl chain in the "substituted haloalkyl group" are further substituted by a substituent, and a group in which one or more hydrogen atoms of a substituent in the "substituted haloalkyl group" are further substituted by a substituent. Specific examples of the "unsubstituted haloalkyl group" include a group in which one or more hydrogen atoms in the "alkyl group" (specific example group G3) are substituted by a halogen atom, and the like. A haloalkyl group is sometimes referred to as an alkyl halide group.

"Substituted or Unsubstituted Alkoxy Group"

Specific examples of the "substituted or unsubstituted alkoxy group" described in this specification include a group represented by —O(G3), wherein G3 is the "substituted or unsubstituted alkyl group" described in the specific example group G3. The number of carbon atoms of the "unsubstituted alkoxy group" is 1 to 50, preferably 1 to 30, more preferably 1 to 18, unless otherwise specified in this specification.

"Substituted or Unsubstituted Alkylthio Group"

Specific examples of the "substituted or unsubstituted alkylthio group" described in this specification include a group represented by —S(G3), wherein G3 is the "substituted or unsubstituted alkyl group" described in the specific example group G3. The number of carbon atoms of the "unsubstituted alkylthio group" is 1 to 50, preferably 1 to 30, more preferably 1 to 18, unless otherwise specified in this specification.

"Substituted or Unsubstituted Aryloxy Group"

Specific examples of the "substituted or unsubstituted aryloxy group" described in this specification include a group represented by —O(G1), wherein G1 is the "substituted or unsubstituted aryl group" described in the specific example group G1. The number of ring carbon atoms of the "unsubstituted aryloxy group" is 6 to 50, preferably 6 to 30, more preferably 6 to 18, unless otherwise specified in this specification.

"Substituted or Unsubstituted Arylthio Group"

Specific examples of the "substituted or unsubstituted arylthio group" described in this specification include a group represented by —S(G1), wherein G1 is a "substituted or unsubstituted aryl group" described in the specific example group G1. The number of ring carbon atoms of the "unsubstituted arylthio group" is 6 to 50, preferably 6 to 30, more preferably 6 to 18, unless otherwise specified in this specification.

"Substituted or Unsubstituted Trialkylsilyl Group"

Specific examples of the "trialkylsilyl group" described in this specification include a group represented by —Si(G3)(G3)(G3), where G3 is the "substituted or unsubstituted alkyl group" described in the specific example group G3. Plural G3's in —Si(G3)(G3)(G3) are the same or different. The number of carbon atoms in each alkyl group of the "trialkylsilyl group" is 1 to 50, preferably 1 to 20, more preferably 1 to 6, unless otherwise specified in this specification.

"Substituted or Unsubstituted Aralkyl Group"

Specific examples of the "substituted or unsubstituted aralkyl group" described in this specification is a group represented by -(G3)-(G1), wherein G3 is the "substituted or unsubstituted alkyl group" described in the specific example group G3, and G1 is the "substituted or unsubstituted aryl group" described in the specific example group G1. Therefore, the "aralkyl group" is a group in which a hydrogen atom of the "alkyl group" is substituted by an "aryl group" as a substituent, and is one form of the "substituted alkyl group." The "unsubstituted aralkyl group" is the "unsubstituted alkyl group" substituted by the "unsubstituted aryl group", and the number of carbon atoms of the "unsubstituted aralkyl group" is 7 to 50, preferably 7 to 30, more preferably 7 to 18, unless otherwise specified in this specification.

Specific examples of the "substituted or unsubstituted aralkyl group" include a benzyl group, a 1-phenylethyl group, a 2-phenylethyl group, a 1-phenylisopropyl group, a 2-phenylisopropyl group, a phenyl-t-butyl group, an α-naph- thylmethyl group, a 1-α-naphthylethyl group, a 2-α-naphthylethyl group, a 1-α-naphthylisopropyl group, a 2-α-naphthylisopropyl group, a β-naphthylmethyl group, a 1-β-naphthylethyl group, a 2-β-naphthylethyl group, a 1-β-naphthylisopropyl group, a 2-β-naphthylisopropyl group, and the like.

Unless otherwise specified in this specification, examples of the substituted or unsubstituted aryl group described in this specification preferably include a phenyl group, a p-biphenyl group, a m-biphenyl group, an o-biphenyl group, a p-terphenyl-4-yl group, a p-terphenyl-3-yl group, a p-terphenyl-2-yl group, a m-terphenyl-4-yl group, a m-terphenyl-3-yl group, a m-terphenyl-2-yl group, an o-terphenyl-4-yl group, an o-terphenyl-3-yl group, an o-terphenyl-2-yl group, a 1-naphthyl group, a 2-naphthyl group, an anthryl group, a phenanthryl group, a pyrenyl group, a chrysenyl group, a triphenylenyl group, a fluorenyl group, a 9,9'-spirobifluorenyl group, 9,9-dimethylfluorenyl group, 9,9-diphenylfluorenyl group, and the like.

Unless otherwise specified in this specification, examples of the substituted or unsubstituted heterocyclic groups described in this specification preferably include a pyridyl group, a pyrimidinyl group, a triazinyl group, a quinolyl group, an isoquinolyl group, a quinazolinyl group, a benzimidazolyl group, a phenanthrolinyl group, a carbazolyl group (a 1-carbazolyl group, a 2-carbazolyl group, a 3-carbazolyl group, a 4-carbazolyl group, or a 9-carbazolyl group), a benzocarbazolyl group, an azacarbazolyl group, a diazacarbazolyl group, a dibenzofuranyl group, a naphthobenzofuranyl group, an azadibenzofuranyl group, a diazadibenzofuranyl group, a dibenzothiophenyl group, a naphthobenzothiophenyl group, an azadibenzothiophenyl group, a diazadibenzothiophenyl group, a (9-phenyl)carbazolyl group (a (9-phenyl)carbazol-1-yl group, a (9-phenyl)carbazol-2-yl group, a (9-phenyl)carbazol-3-yl group, or a (9-phenyl)carbazol-4-yl group), a (9-biphenylyl)carbazolyl group, a (9-phenyl)phenylcarbazolyl group, a diphenylcarbazol-9-yl group, a phenylcarbazol-9-yl group, a phenyltriazinyl group, a biphenylyltriazinyl group, a diphenyltriazinyl group, a phenyldibenzofuranyl group, a phenyldibenzothiophenyl group, and the like.

In this specification, the carbazolyl group is specifically any of the following groups, unless otherwise specified in this specification.

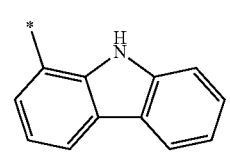

(TEMP-Cz1)

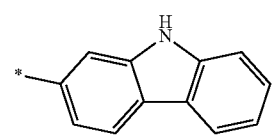

(TEMP-Cz2)

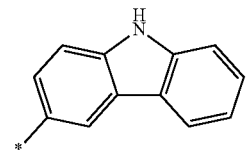

(TEMP-Cz3)

-continued (TEMP-Cz4)
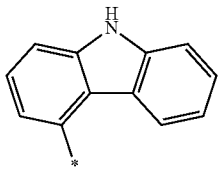

(TEMP-Cz5)
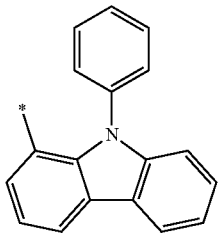

In this specification, the (9-phenyl)carbazolyl group is specifically any of the following groups, unless otherwise specified in this specification.

(TEMP-Cz6)
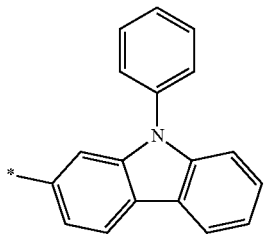

(TEMP-Cz7)
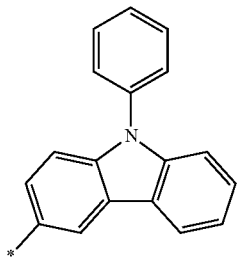

(TEMP-Cz8)
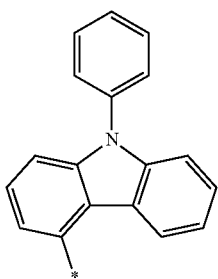

(TEMP-Cz9)

In the general formulas (TEMP-Cz1) to (TEMP-Cz9), * represents a bonding position.

In this specification, the dibenzofuranyl group and the dibenzothiophenyl group are specifically any of the following groups, unless otherwise specified in this specification.

(TEMP-34)
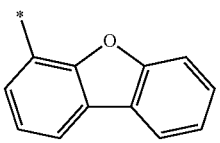

(TEMP-35)
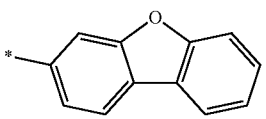

(TEMP-36)
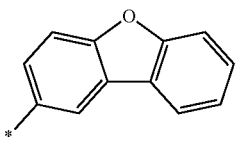

(TEMP-37)
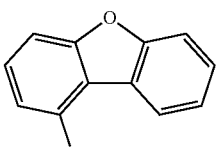

(TEMP-38)
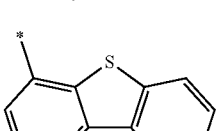

(TEMP-39)
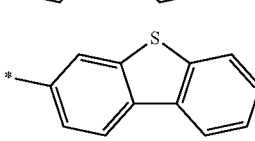

(TEMP-40)
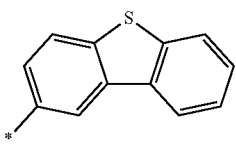

(TEMP-41)
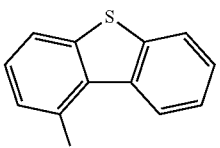

In the general formulas (TEMP-34) to (TEMP-41), * represents a bonding position.

The substituted or unsubstituted alkyl group described in this specification is preferably a methyl group, an ethyl group, a propyl group, an isopropyl group, a n-butyl group, an isobutyl group, a t-butyl group, or the like, unless otherwise specified in this specification.

"Substituted or Unsubstituted Arylene Group"

The "substituted or unsubstituted arylene group" described in this specification is a divalent group derived by removing one hydrogen atom on the aryl ring of the "substituted or unsubstituted aryl group", unless otherwise specified. Specific examples of the "substituted or unsubstituted arylene group" (specific example group G12) include a divalent group derived by removing one hydrogen atom on the aryl ring of the "substituted or unsubstituted aryl group" described in the specific example group G1, and the like.

"Substituted or Unsubstituted Divalent Heterocyclic Group"

The "substituted or unsubstituted divalent heterocyclic group" described in this specification is a divalent group derived by removing one hydrogen atom on the heterocyclic ring of the "substituted or unsubstituted heterocyclic group", unless otherwise specified. Specific examples of the "substituted or unsubstituted divalent heterocyclic group" (specific example group G13) include a divalent group derived by removing one hydrogen atom on the heterocyclic ring of the "substituted or unsubstituted heterocyclic group" described in the specific example group G2, and the like.

"Substituted or Unsubstituted Alkylene Group"

The "substituted or unsubstituted alkylene group" described in this specification is a divalent group derived by removing one hydrogen atom on the alkyl chain of the "substituted or unsubstituted alkyl group", unless otherwise specified. Specific examples of the "substituted or unsubstituted alkylene group" (specific example group G14) include a divalent group derived by removing one hydrogen atom on the alkyl chain of the "substituted or unsubstituted alkyl group" described in the specific example group G3, and the like.

The substituted or unsubstituted arylene group described in this specification is preferably any group of the following general formulas (TEMP-42) to (TEMP-68), unless otherwise specified in this specification.

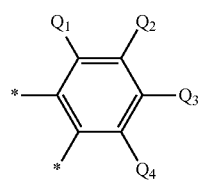
(TEMP-42)

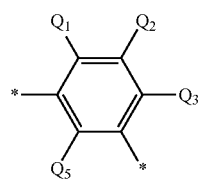
(TEMP-43)

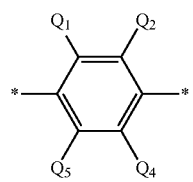
(TEMP-44)

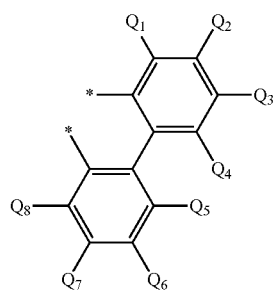
(TEMP-45)

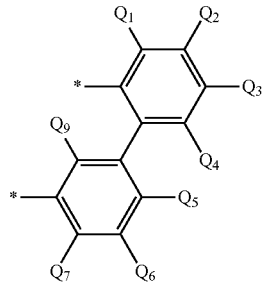
(TEMP-46)

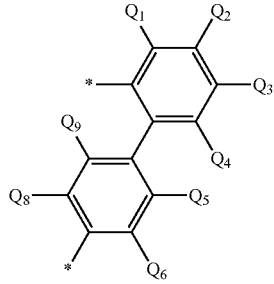
(TEMP-47)

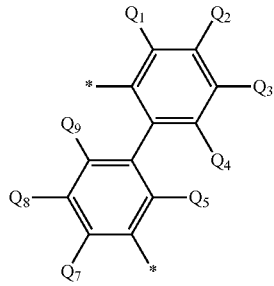
(TEMP-48)

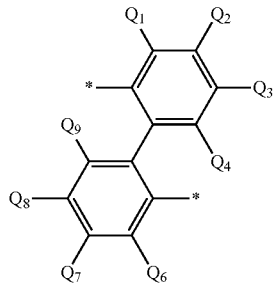
(TEMP-49)

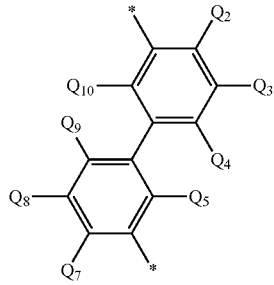
(TEMP-50)

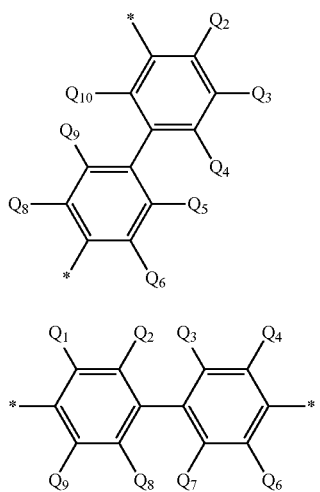

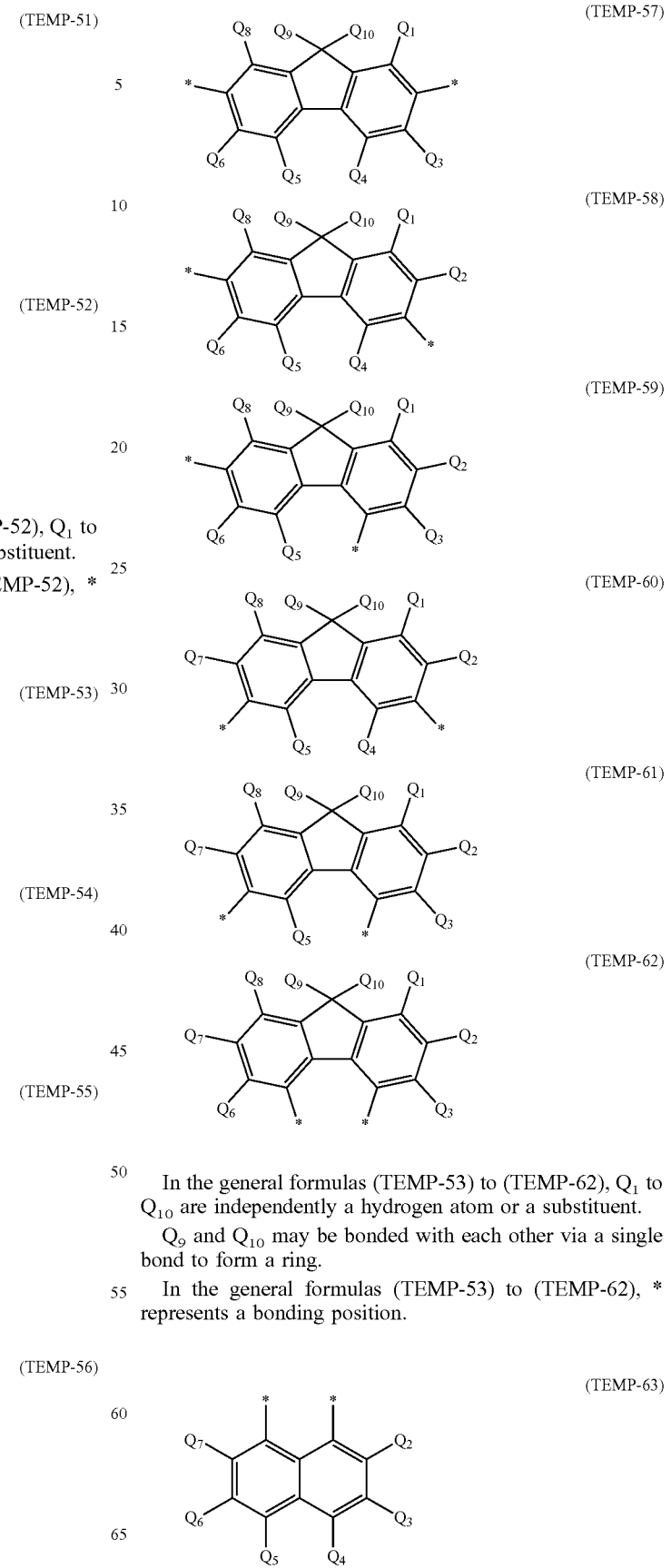

In the general formulas (TEMP-42) to (TEMP-52), $Q_1$ to $Q_{10}$ are independently a hydrogen atom or a substituent.

In the general formulas (TEMP-42) to (TEMP-52), * represents a bonding position.

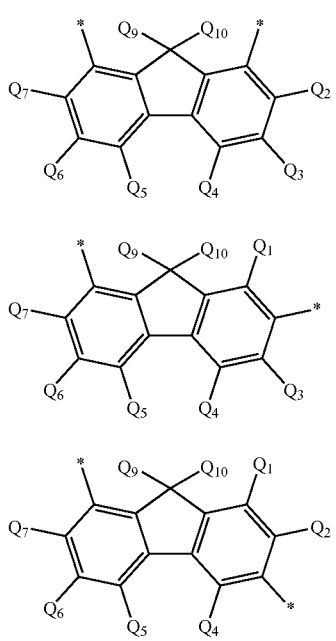

In the general formulas (TEMP-53) to (TEMP-62), $Q_1$ to $Q_{10}$ are independently a hydrogen atom or a substituent.

$Q_9$ and $Q_{10}$ may be bonded with each other via a single bond to form a ring.

In the general formulas (TEMP-53) to (TEMP-62), * represents a bonding position.

(TEMP-64)
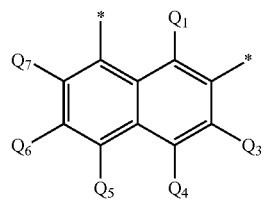

(TEMP-65)
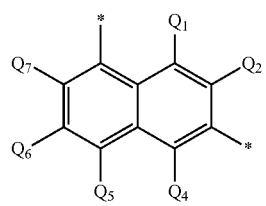

(TEMP-66)
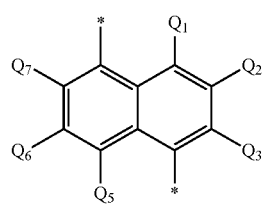

(TEMP-67)
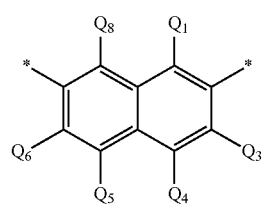

(TEMP-68)
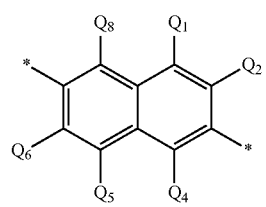

In the general formulas (TEMP-63) to (TEMP-68), $Q_1$ to $Q_8$ are independently a hydrogen atom or a substituent.

In the general formulas (TEMP-63) to (TEMP-68), * represents a bonding position.

The substituted or unsubstituted divalent heterocyclic group described in this specification is preferably any group of the following general formulas (TEMP-69) to (TEMP-102), unless otherwise specified in this specification.

(TEMP-69)
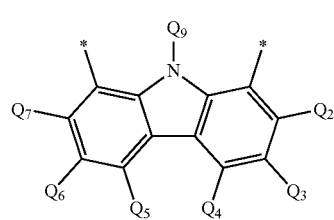

(TEMP-70)
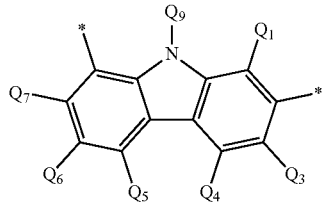

(TEMP-71)
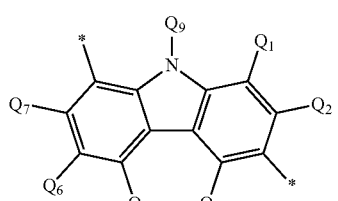

(TEMP-72)
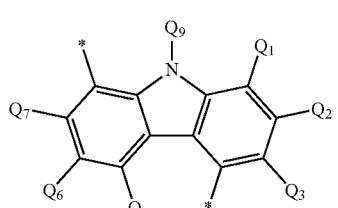

(TEMP-73)
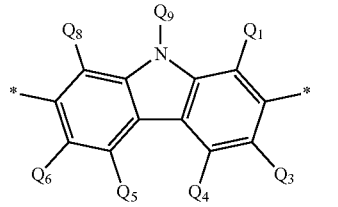

(TEMP-74)
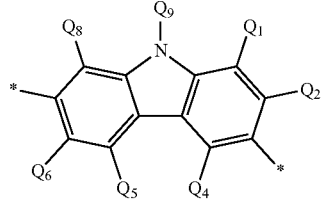

(TEMP-75)
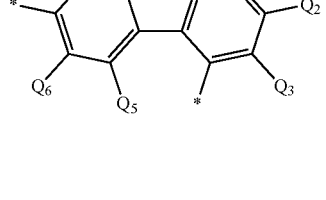

(TEMP-76)
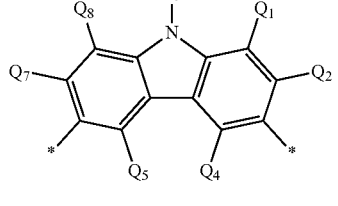

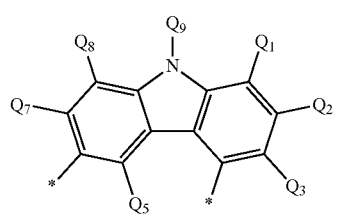 (TEMP-77)
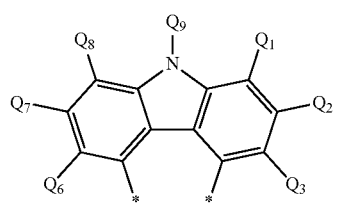 (TEMP-78)
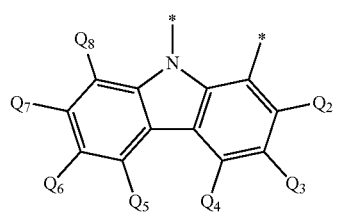 (TEMP-79)
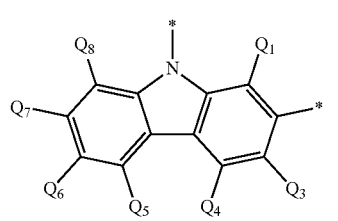 (TEMP-80)
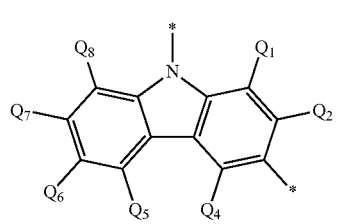 (TEMP-81)
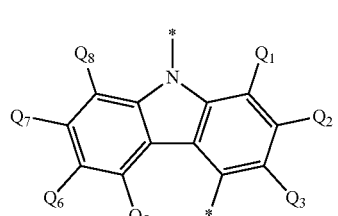 (TEMP-82)
In the general formulas (TEMP-69) to (TEMP-82), $Q_1$ to $Q_9$ are independently a hydrogen atom or a substituent.
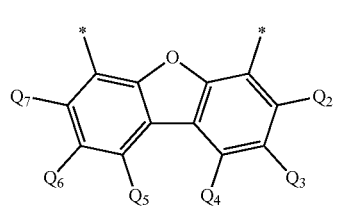 (TEMP-83)
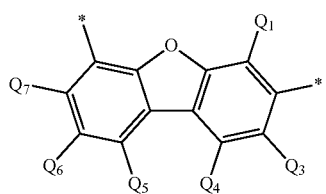 (TEMP-84)
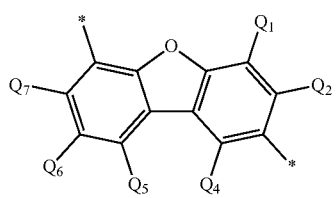 (TEMP-85)
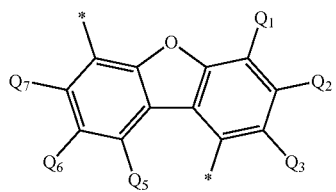 (TEMP-86)
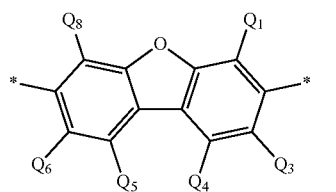 (TEMP-87)
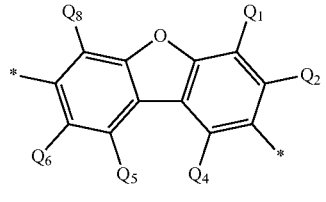 (TEMP-88)
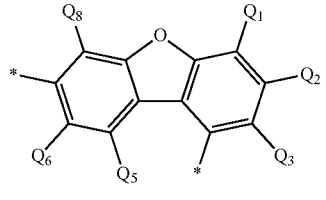 (TEMP-89)
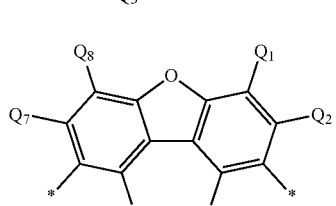 (TEMP-90)
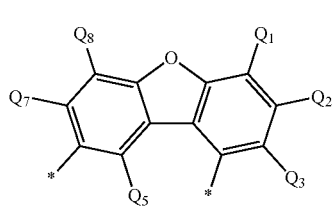 (TEMP-91)

(TEMP-92) 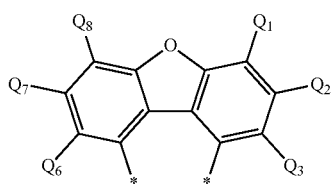

(TEMP-93) 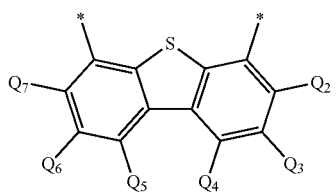

(TEMP-94) 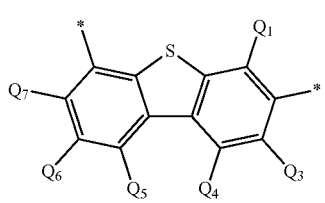

(TEMP-95) 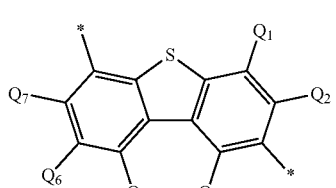

(TEMP-96) 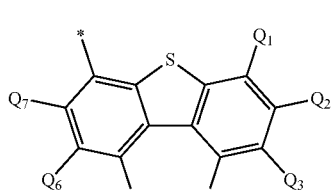

(TEMP-97) 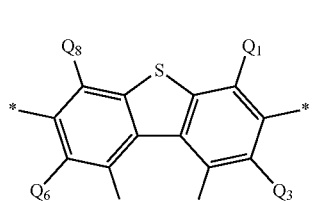

(TEMP-98) 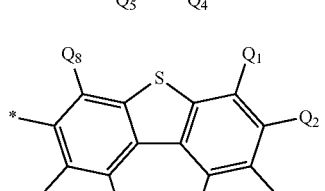

(TEMP-99) 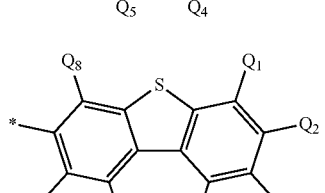

(TEMP-100) 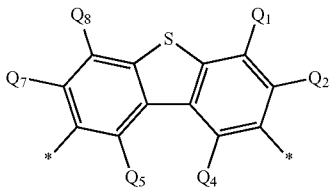

(TEMP-101) 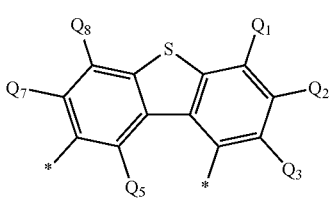

(TEMP-102) 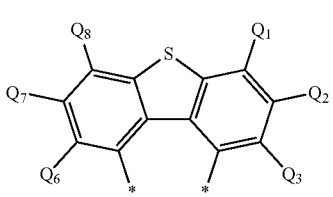

In the general formulas (TEMP-83) to (TEMP-102), $Q_1$ to $Q_8$ are independently a hydrogen atom or a substituent.

The above is the explanation of the "Substituent described in this specification."

"The Case where Bonded with Each Other to Form a Ring"

In this specification, the case where "one or more sets of adjacent two or more form a substituted or unsubstituted monocycle by bonding with each other, form a substituted or unsubstituted fused ring by bonding with each other, or do not bond with each other" means the case where "one or more sets of adjacent two or more form a substituted or unsubstituted monocycle by bonding with each other"; the case where "one or more sets of adjacent two or more form a substituted or unsubstituted fused ring by bonding with each other"; and the case where "one or more sets of adjacent two or more do not bond with each other."

The case where "one or more sets of adjacent two or more form a substituted or unsubstituted monocycle by bonding with each other" and the case where "one or more sets of adjacent two or more form a substituted or unsubstituted fused ring by bonding with each other" in this specification (these cases may be collectively referred to as "the case where forming a ring by bonding with each other") will be described below. The case of an anthracene compound represented by the following general formula (TEMP-103) in which the mother skeleton is an anthracene ring will be described as an example.

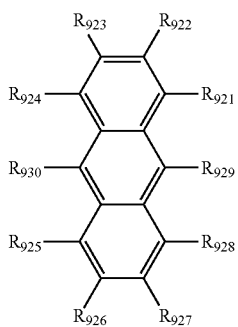

(TEMP-103)

For example, in the case where "one or more sets of adjacent two or more among $R_{921}$ to $R_{930}$ form a ring by bonding with each other", the one set of adjacent two includes a pair of $R_{921}$ and $R_{922}$, a pair of $R_{922}$ and $R_{923}$, a pair of $R_{923}$ and $R_{924}$, a pair of $R_{924}$ and $R_{930}$, a pair of $R_{930}$ and $R_{925}$, a pair of $R_{925}$ and $R_{926}$, a pair of $R_{926}$ and $R_{927}$, a pair of $R_{927}$ and $R_{928}$, a pair of $R_{928}$ and $R_{929}$, and a pair of $R_{929}$ and $R_{921}$.

The "one or more sets" means that two or more sets of the adjacent two or more sets may form a ring at the same time. For example, $R_{921}$ and $R_{922}$ form a ring $Q_A$ by bonding with each other, and at the same, time $R_{925}$ and $R_{926}$ form a ring $Q_B$ by bonding with each other, the anthracene compound represented by the general formula (TEMP-103) is represented by the following general formula (TEMP-104).

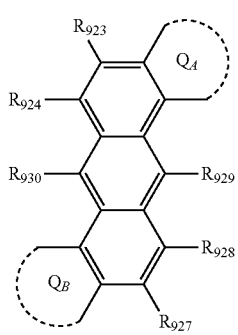

(TEMP-104)

The case where the "set of adjacent two or more" form a ring includes not only the case where the set (pair) of adjacent "two" is bonded with as in the above-mentioned examples, but also the case where the set of adjacent "three or more" are bonded with each other. For example, it means the case where $R_{921}$ and $R_{922}$ form a ring $Q_A$ by bonding with each other, and $R_{922}$ and $R_{923}$ form a ring $Q_C$ by bonding with each other, and adjacent three ($R_{921}$, $R_{922}$ and $R_{923}$) form rings by bonding with each other and together fused to the anthracene mother skeleton. In this case, the anthracene compound represented by the general formula (TEMP-103) is represented by the following general formula (TEMP-105). In the following general formula (TEMP-105), the ring $Q_A$ and the ring $Q_C$ share $R_{922}$.

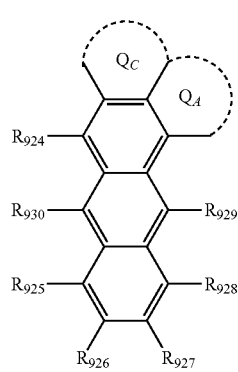

(TEMP-105)

The "monocycle" or "fused ring" formed may be a saturated ring or an unsaturated ring, as a structure of the formed ring alone. Even when the "one pair of adjacent two" forms a "monocycle" or a "fused ring", the "monocycle" or the "fused ring" may form a saturated ring or an unsaturated ring. For example, the ring $Q_A$ and the ring $Q_B$ formed in the general formula (TEMP-104) are independently a "monocycle" or a "fused ring." The ring $Q_A$ and the ring $Q_C$ formed in the general formula (TEMP-105) are "fused ring." The ring $Q_A$ and ring $Q_C$ of the general formula (TEMP-105) are fused ring by fusing the ring $Q_A$ and the ring $Q_C$ together. When the ring $Q_A$ of the general formula (TMEP-104) is a benzene ring, the ring $Q_A$ is a monocycle. When the ring $Q_A$ of the general formula (TMEP-104) is a naphthalene ring, the ring $Q_A$ is a fused ring.

The "unsaturated ring" means an aromatic hydrocarbon ring or an aromatic heterocyclic ring. The "saturated ring" means an aliphatic hydrocarbon ring, or a non-aromatic heterocyclic ring.

Specific examples of the aromatic hydrocarbon ring include a structure in which the group listed as a specific example in the specific example group G1 is terminated by a hydrogen atom.

Specific examples of the aromatic heterocyclic ring include a structure in which the aromatic heterocyclic group listed as a specific example in the example group G2 is terminated by a hydrogen atom.

Specific examples of the aliphatic hydrocarbon ring include a structure in which the group listed as a specific example in the specific example group G6 is terminated by a hydrogen atom.

The term "to form a ring" means forming a ring only with plural atoms of the mother skeleton, or with plural atoms of the mother skeleton and one or more arbitrary elements in addition. For example, the ring $Q_A$ shown in the general formula (TEMP-104), which is formed by bonding $R_{921}$ and $R_{922}$ with each other, is a ring formed from the carbon atom of the anthracene skeleton with which $R_{921}$ is bonded, the carbon atom of the anthracene skeleton with which $R_{922}$ is bonded, and one or more arbitrary elements. For example, in the case where the ring $Q_A$ is formed with $R_{921}$ and $R_{922}$, when a monocyclic unsaturated ring is formed with the carbon atom of the anthracene skeleton with which $R_{921}$ is bonded, the carbon atom of the anthracene skeleton with which $R_{922}$ is bonded, and four carbon atoms, the ring formed with $R_{921}$ and $R_{922}$ is a benzene ring.

Here, the "arbitrary element" is preferably at least one element selected from the group consisting of a carbon element, a nitrogen element, an oxygen element, and a sulfur element, unless otherwise specified in this specification. In the arbitrary element (for example, a carbon element or a nitrogen element), a bond which does not form a ring may be terminated with a hydrogen atom or the like, or may be substituted with "arbitrary substituent" described below. When an arbitrary element other than a carbon element is contained, the ring formed is a heterocyclic ring.

The number of "one or more arbitrary element(s)" constituting a monocycle or a fused ring is preferably 2 or more and 15 or less, more preferably 3 or more and 12 or less, and still more preferably 3 or more and 5 or less, unless otherwise specified in this specification.

The "monocycle" is preferable among the "monocycle" and the "fused ring", unless otherwise specified in this specification.

The "unsaturated ring" is preferable among the "saturated ring" and the "unsaturated ring", unless otherwise specified in this specification.

Unless otherwise specified in this specification, the "monocycle" is preferably a benzene ring.

Unless otherwise specified in this specification, the "unsaturated ring" is preferably a benzene ring.

Unless otherwise specified in this specification, when "one or more sets of adjacent two or more" are "bonded with each other to form a substituted or unsubstituted monocycle" or "bonded with each other to form a substituted or unsubstituted fused ring", this specification, one or more sets of adjacent two or more are preferably bonded with each other to form a substituted or unsubstituted "unsaturated ring" from plural atoms of the mother skeleton and one or more and 15 or less elements which is at least one kind selected from a carbon elements, a nitrogen element, an oxygen element, and a sulfur element The substituent in the case where the above-mentioned "monocycle" or "fused ring" has a substituent is, for example, an "arbitrary substituent" described below. Specific examples of the substituent which the above-mentioned "monocycle" or "fused ring" has include the substituent described above in the "Substituent described in this specification" section.

The substituent in the case where the above-mentioned "saturated ring" or "unsaturated ring" has a substituent is, for example, an "arbitrary substituent" described below. Specific examples of the substituent which the above-mentioned "monocycle" or "fused ring" has include the substituent described above in the "Substituent described in this specification" section.

The foregoing describes the case where "one or more sets of adjacent two or more form a substituted or unsubstituted monocycle by bonding with each other" and the case where "one or more sets of adjacent two or more form a substituted or unsubstituted fused ring by bonding with each other" (the case where "forming a ring by bonding with each other").

Substituent in the Case of "Substituted or Unsubstituted"

In one embodiment, the substituent in this specification, the substituent (in this specification, sometimes referred to as an "arbitrary substituent") in the case of "substituted or unsubstituted" is, for example, a group selected from the group consisting of:
an unsubstituted alkyl group including 1 to 50 carbon atoms,
an unsubstituted alkenyl group including 2 to 50 carbon atoms,
an unsubstituted alkynyl group including 2 to 50 carbon atoms,
an unsubstituted cycloalkyl group including 3 to 50 ring carbon atoms,
—Si($R_{901}$)($R_{902}$)($R_{903}$),
—O—($R_{904}$),
—S—($R_{905}$),
—N($R_{906}$)($R_{907}$),
a halogen atom, a cyano group, a nitro group,
an unsubstituted aryl group including 6 to 50 ring carbon atoms, and
an unsubstituted heterocyclic group including 5 to 50 ring atoms,
wherein, $R_{901}$ to $R_{907}$ are independently
a hydrogen atom,
a substituted or unsubstituted alkyl group including 1 to 50 carbon atoms,
a substituted or unsubstituted cycloalkyl group including 3 to 50 ring carbon atoms,
a substituted or unsubstituted aryl group including 6 to 50 ring carbon atoms, or
a substituted or unsubstituted heterocyclic group including 5 to 50 ring atoms.

When two or more $R_{901}$'s are present, the two or more $R_{901}$'s may be the same or different.

When two or more $R_{902}$'s are present, the two or more $R_{902}$'s may be the same or different.

When two or more $R_{903}$'s are present, the two or more $R_{903}$'s may be the same or different.

When two or more $R_{904}$'s are present, the two or more $R_{904}$'s may be the same or different.

When two or more $R_{905}$'S are present, the two or more $R_{905}$'S may be the same or different.

When two or more $R_{906}$'s are present, the two or more $R_{906}$'s may be the same or different.

When two or more $R_{907}$s are present, the two or more $R_{907}$s may be the same or different.

In one embodiment, the substituent in the case of "substituted or unsubstituted" is a group selected from the group consisting of:
an alkyl group including 1 to 50 carbon atoms,
an aryl group including 6 to 50 ring carbon atoms, and
a heterocyclic group including 5 to 50 ring atoms.

In one embodiment, the substituent in the case of "substituted or unsubstituted" is a group selected from the group consisting of:
an alkyl group including 1 to 18 carbon atoms,
an aryl group including 6 to 18 ring carbon atoms, and
a heterocyclic group including 5 to 18 ring atoms.

Specific examples of each of the arbitrary substituents include specific examples of substituent described in the section "Substituent described in this specification" above.

Unless otherwise specified in this specification, adjacent arbitrary substituents may form a "saturated ring" or an "unsaturated ring", preferably form a substituted or unsubstituted saturated 5-membered ring, a substituted or unsubstituted saturated 6-membered ring, a substituted or unsubstituted unsaturated 5-membered ring, or a substituted or unsubstituted unsaturated 6-membered ring, more preferably form a benzene ring.

Unless otherwise specified in this specification, the arbitrary substituent may further have a substituent. The substituent which the arbitrary substituent further has is the same as that of the above-mentioned arbitrary substituent.

In this specification, the numerical range represented by "AA to BB" means the range including the numerical value AA described on the front side of "AA to BB" as the lower limit and the numerical value BB described on the rear side of "AA to BB" as the upper limit.

[Compound represented by the formula (1)]

An aspect of the invention is a compound represented by the formula (1).

The compound represented by the formula (1) is useful as a material for an organic EL device, and improves the lifetime of an organic EL device having an organic layer fabricated using the same.

The reason why the compound represented by the formula (1) improves the lifetime of an organic EL device is considered to be that the molecular skeleton has high durability and low excited energies because the group $Ar_1$ bonded with the anthracene skeleton via the linking group $L_1$ does not have a five-membered ring structure and thus the strain in the molecule is small.

Hereinafter, a compound represented by the formula (1) will be described.

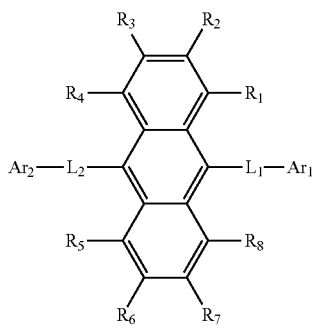

(1)

In the formula (1), one or more sets of adjacent two or more of $R_1$ to $R_8$ form a substituted or unsubstituted, saturated or unsaturated ring by bonding with each other, or do not form a substituted or unsubstituted, saturated or unsaturated ring;

$R_1$ to $R_8$ which do not form the substituted or unsubstituted, saturated or unsaturated ring are independently a hydrogen atom or a substituent R;

the substituent R is a halogen atom, a cyano group, a nitro group, a substituted or unsubstituted alkyl group including 1 to 50 carbon atoms, a substituted or unsubstituted alkenyl group including 2 to 50 carbon atoms, a substituted or unsubstituted alkynyl group including 2 to 50 carbon atoms, a substituted or unsubstituted cycloalkyl group including 3 to 50 ring carbon atoms, —Si($R_{901}$)($R_{902}$)($R_{903}$),

—O—($R_{904}$),

—S—($R_{905}$),

—N($R_{906}$)($R_{907}$), a substituted or unsubstituted aryl group including 6 to 50 ring carbon atoms, or a substituted or unsubstituted monovalent heterocyclic group including 5 to 50 ring atoms;

$R_{901}$ to $R_{907}$ are independently a hydrogen atom, a substituted or unsubstituted alkyl group including 1 to 50 carbon atoms, a substituted or unsubstituted cycloalkyl group including 3 to 50 ring carbon atoms, a substituted or unsubstituted aryl group including 6 to 50 ring carbon atoms, or a substituted or unsubstituted monovalent heterocyclic group including 5 to 50 ring atoms; when two or more of each of $R_{901}$ to $R_{907}$ are present, the two or more of each of $R_{901}$ to $R_{907}$ may be the same as or different from each other, $L_1$ and $L_2$ are independently a single bond, or a linking group having a structure represented by any one of the following formulas (L-1) to (L-9).

(L-1)

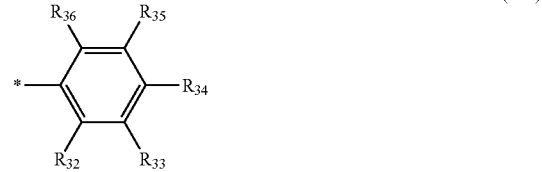

(L-2)

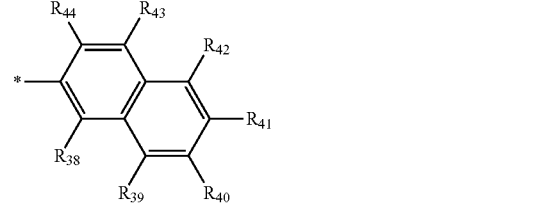

(L-3)

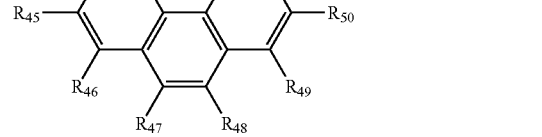

(L-4)

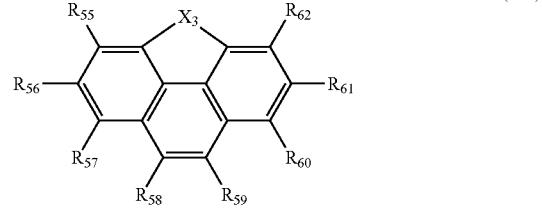

(L-5)

(L-6)

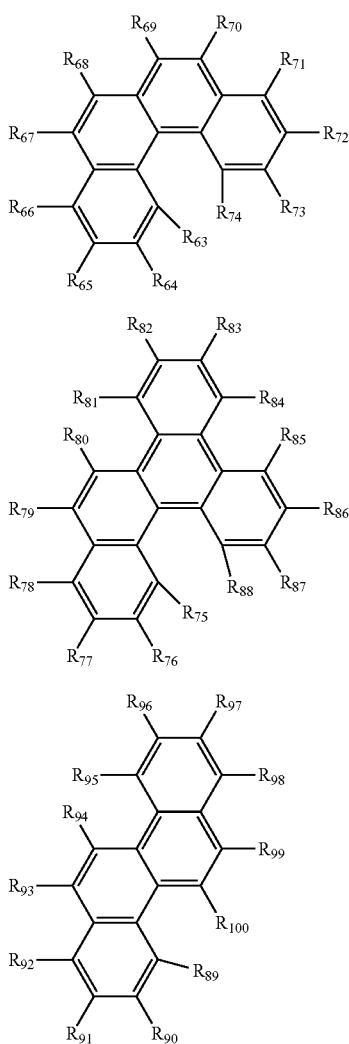

In the formula (L-1),
a ring A and a ring B are independently
a substituted or unsubstituted aromatic hydrocarbon ring including 6 to 14 ring carbon atoms, or
a substituted or unsubstituted heterocycle including 5 to 50 ring atoms;
$X_2$ is O, S, $N(R_{1a})$, or $C(R_{2a})(R_{3a})$;
one of $R_{1a}$ to $R_{3a}$ and an atom which constitutes the aromatic hydrocarbon ring or the heterocycle of the ring A and the ring B and which may form a single bond is a single bond bonding with an anthracene skeleton, or is bonded with the anthracene skeleton by a single bond, and one of the remaining is a single bond bonding with $Ar_1$ or $Ar_2$, or is bonded with $Ar_1$ or $Ar_2$ by a single bond;
atoms which are not single-bonded with the anthracene skeleton and $Ar_1$ or $Ar_2$, which constitute the aromatic hydrocarbon ring or the heterocycle of a ring A and a ring B, and which may form a single bond are independently bonded with a hydrogen atom or a substituent R;
$R_{1a}$ to $R_{3a}$ which are not the single bond are independently a hydrogen atom or a substituent R;
the substituent R is as defined above.

In the formula (L-2),
* is a single bond bonding with an anthracene skeleton;
one of $R_{32}$ to $R_{36}$ is a single bond bonding with $Ar_1$ or $Ar_2$;
$R_{32}$ to $R_{36}$ which are not single bonds bonding with $Ar_1$ or $Ar_2$ are independently a hydrogen atom or a substituent R;
the substituent R is as defined above.

In the formula (L-3),
* is a single bond bonding with an anthracene skeleton;
one of Ras to $R_{44}$ is a single bond bonding with $Ar_1$ or $Ar_2$;
$R_{38}$ to $R_{44}$ which are not single bonds bonding with the anthracene skeleton and $Ar_1$ or $Ar_2$ are independently a hydrogen atom or a substituent R;
the substituent R is as defined above.

In the formula (L-4),
one of $R_{45}$ to $R_{54}$ is a single bond bonding with the anthracene skeleton, and one of the remaining is a single bond bonding with $Ar_1$ or $Ar_2$;
$R_{45}$ to $R_{54}$ which are not single bonds bonding with an anthracene skeleton and $Ar_1$ or $Ar_2$ are independently a hydrogen atom or a substituent R;
the substituent R is as defined above.

In the formula (L-5),
$X_3$ is O, S, $N(R_{1a})$, or $C(R_{2a})(R_{3a})$;
one of $R_{1a}$ to $R_{3a}$ and $R_{55}$ to $R_{62}$ is a single bond bonding with an anthracene skeleton, and one of the remaining is a single bond bonding with $Ar_1$ or $Ar_2$;
$R_{1a}$ to $R_{3a}$ and $R_{55}$ to $R_{62}$ which are not single bond bonding with the anthracene skeleton and $Ar_1$ or $Ar_2$ are independently a hydrogen atom or a substituent R;
the substituent R is as defined above.

In the formula (L-6),
a ring A, a ring B, and a ring C are independently
a substituted or unsubstituted aromatic hydrocarbon ring including 6 to 14 ring carbon atoms, or
a substituted or unsubstituted heterocycle including 5 to 50 ring atoms;
one of the atoms which constitute the aromatic hydrocarbon ring or heterocycle of a ring A, a ring B, and a ring C and which may form a single bond is bonded with an anthracene skeleton by a single bond, and one of the remaining is bonded with $Ar_1$ or $Ar_2$ by a single bond;
atoms which are not single-bonded with the anthracene skeleton and $Ar_1$ or $Ar_2$, which constitute the aromatic hydrocarbon ring or the heterocycle of a ring A, a ring B, and a ring C, and which may form a single bond are independently bonding with a hydrogen atom or a substituent R;
the substituent R is as defined above.

In the formula (L-7),
one of $R_{63}$ to $R_{74}$ is a single bond bonding with an anthracene skeleton, and one of the remaining is a single bond bonding with $Ar_1$ or $Ar_2$;
$R_{63}$ to $R_{74}$ which are not single bonds bonding with the anthracene skeleton and $Ar_1$ or $Ar_2$ are independently a hydrogen atom or a substituent R;
the substituent R is as defined above.

In the formula (L-8),
one of $R_{75}$ to $R_{88}$ is a single bond bonding with the anthracene skeleton, and one of the remaining is a single bond bonding with $Ar_1$ or $Ar_2$;
$R_{75}$ to $R_{88}$ which are not single bonds bonding with the anthracene skeleton and $Ar_1$ or $Ar_2$ are independently a hydrogen atom or a substituent R;
the substituent R is as defined above.

In the formula (L-9),
one of $R_{89}$ to $R_{100}$ is a single bond bonding with the anthracene skeleton, and one of the remaining is a single bond bonding with $Ar_1$ or $Ar_2$;
$R_{89}$ to $R_{100}$ which are not single bonds bonding with the anthracene skeleton and $Ar_1$ or $Ar_2$ are independently a hydrogen atom or a substituent R;
the substituent R is as defined above.
$Ar_1$ is a monovalent group having a structure represented by the following formula (2).

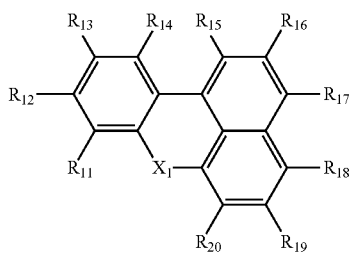

(2)

In the formula (2),
$X_1$ is O or S;
one of $R_{11}$ to $R_{20}$ is a single bond bonding with $L_1$;
one or more sets of adjacent two or more of Rug to $R_{1a}$ and one or more sets of adjacent two or more of $R_{15}$ to $R_{20}$ which are not single bonds bonding with $L_1$ form a substituted or unsubstituted, saturated or unsaturated ring by bonding with each other, or do not form a substituted or unsubstituted, saturated or unsaturated ring;
$R_{11}$ to $R_{20}$ which are not single bonds bonding with $L_1$ and do not form the substituted or unsubstituted, saturated or unsaturated ring are independently a hydrogen atom or a substituent R;
the substituent R is as defined above.
$Ar_2$ is a monovalent group having a structure represented by any one of the following formulas ($Ar_2$-1) to ($Ar_2$-10); provided that, when $L_2$ is a single bond, $Ar_2$ is not a group represented by the following formula ($Ar_2$-10).

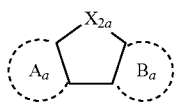
($Ar_2$-1)

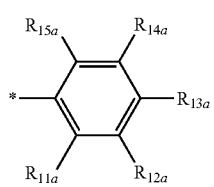
($Ar_2$-2)

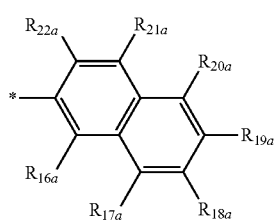
($Ar_2$-3)

-continued

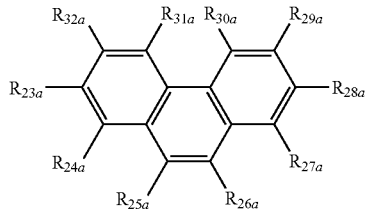
($Ar_2$-4)

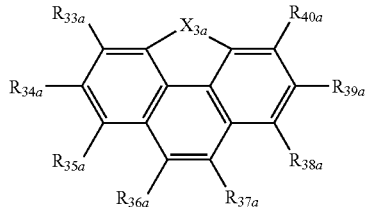
($Ar_2$-5)

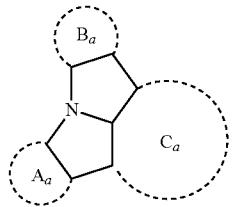
($Ar_2$-6)

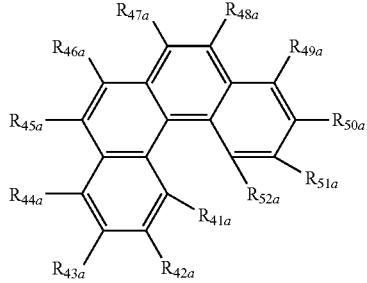
($Ar_2$-7)

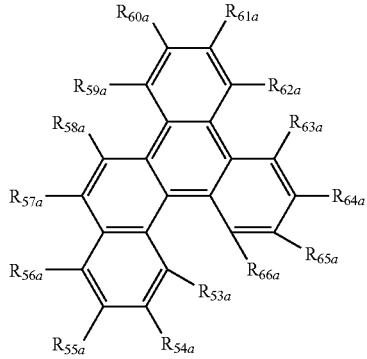
($Ar_2$-8)

(Ar₂-9)

[Structure with labels R$_{74a}$, R$_{75a}$, R$_{73a}$, R$_{76a}$, R$_{72a}$, R$_{77a}$, R$_{71a}$, R$_{78a}$, R$_{70a}$, R$_{67a}$, R$_{69a}$, R$_{68a}$]

(Ar₂-10)

[Structure with labels *, R$_{85a}$, R$_{79a}$, R$_{84a}$, R$_{80a}$, R$_{83a}$, R$_{81a}$, R$_{82a}$]

In the formula (Ar₂-1),
a ring A$_a$ and a ring B$_a$ are independently
a substituted or unsubstituted aromatic hydrocarbon ring including 6 to 14 ring carbon atoms, or
a substituted or unsubstituted heterocycle including 5 to 50 ring atoms;
X$_{2a}$ is O, S, N(R$_{1a}$), or C(R$_{2a}$)(R$_{3a}$);
one of R$_{1a}$ to R$_{3a}$ and the atoms which constitute the aromatic hydrocarbon ring or the heterocycle of a ring A$_a$ and a ring B$_a$ and which may form a single bond are a single bond bonding with L$_2$ or bonded with L$_2$ by a single bond;
R$_{1a}$ to R$_{3a}$ which are not single bonds bonding with L$_2$ and atoms which are not single-bonded with L$_2$, which constitute the aromatic hydrocarbon ring or the heterocycle of a ring A$_a$ and a ring B$_a$, and which may form a single bond are independently bonded with a hydrogen atom or a substituent R;
the substituent R is as defined above.
In the formula (Ar₂-2),
* is a single bond bonding with L$_2$;
R$_{11a}$ to R$_{15a}$ are independently a hydrogen atom or a substituent R;
the substituent R is as defined above.
In the formula (Ar₂-3),
* is a single bond bonding with L$_2$;
R$_{16a}$ to R$_{22a}$ are independently a hydrogen atom or a substituent R;
the substituent R is as defined above.
In the formula (Ar₂-4),
one of R$_{23a}$ to R$_{32a}$ is a single bond bonding with L$_2$;
R$_{23a}$ to R$_{32a}$ which are not single bonds bonding with L$_2$ are independently a hydrogen atom or a substituent R;
the substituent R is as defined above.
In the formula (Ar₂-5),
X$_{3a}$ is O, S, N(R$_{1a}$), or C(R$_{2a}$)(R$_{3a}$);
one of R$_{1a}$ to R$_{3a}$ and R$_{33a}$ to R$_{40a}$ is a single bond bonding with L$_2$;
R$_{1a}$ to R$_{3a}$ and R$_{33a}$ to R$_{40a}$ which are not single binds bonding with L$_2$ are independently a hydrogen atom or a substituent R;
the substituent R is as defined above.

In the formula (Ar₂-6),
a ring A$_a$, a ring B$_a$, and a ring C$_a$ are independently
a substituted or unsubstituted aromatic hydrocarbon ring including 6 to 14 ring carbon atoms, or
a substituted or unsubstituted heterocycle including 5 to 50 ring atoms;
one of the atoms which constitutes the aromatic hydrocarbon ring or the heterocycle of a ring A$_a$, a ring B$_a$, and a ring C$_a$ and which may form a single bond is bonded with L$_2$ by a single bond;
atoms which are not single-bonded with L$_2$, which constitute the aromatic hydrocarbon ring or the heterocycle of a ring A$_a$, a ring B$_a$, and a ring C$_a$, and which may form a single bond are independently bonded with a hydrogen atom or a substituent R;
the substituent R is as defined above.
In the formula (Ar₂-7),
one of Rata to R$_{52a}$ is a single bond bonding with L$_2$;
R$_{41a}$ to R$_{52a}$ which are not single bonds bonding with L$_2$ are independently a hydrogen atom or a substituent R;
the substituent R is as defined above.
In the formula (Ar₂-8),
one of R$_{53a}$ to R$_{66a}$ is a single bond bonding with L$_2$;
R$_{53a}$ to R$_{66a}$ which are not single bonds bonding with L$_2$ are independently a hydrogen atom or a substituent R;
the substituent R is as defined above.
In the formula (Ar₂-9),
one of R$_{67a}$ to R$_{78a}$ is a single bond bonding with L$_2$;
R$_{67a}$ to R$_{78a}$ which are not single bond bonding with L$_2$ are independently a hydrogen atom or a substituent R;
the substituent R is as defined above.
In the formula (Ar₂-10),
* is a single bond bonding with L$_2$;
R$_{79a}$ to R$_{85a}$ are independently a hydrogen atom or a substituent R;
the substituent R is as defined above.
The compound represented by the formula (1) is characterized by having a monovalent group having a benzoxanthene structure represented by the formula (2) as Ar$_1$.
In the monovalent group having the structure represented by the formula (2), one of R$_{12}$ to R$_{20}$ is bonded with L$_1$ in the formula (1) by a single bond. Any of R$_{11}$ to R$_{20}$ may be a single bond bonding with L$_1$.
L$_1$ and L$_2$ in the formula (1) are single bonds or linking groups having a structure represented by any one of the formulas (L-1) to (L-9).
When L$_1$ and L$_2$ are substituted or unsubstituted naphthylene groups, neither is a substituted or unsubstituted 1,4-naphthylene group. This is represented by the fact that in the formula (L-3), where L$_1$ and L$_2$ are substituted or unsubstituted naphthylene groups, * is a single bond bonded with an anthracene skeleton.
Ar$_2$ in the formula (1) is a monovalent group having a structure represented by any of the formulas (Ar$_2$-1) to (Ar$_2$-10), and when L$_2$ is a single bond, Ar$_2$ is not a monovalent group having a structure represented by the formula (Ar$_2$-10), that is, not a substituted or unsubstituted 1-naphthyl group. This means that Ar$_2$-L$_2$- is not a substituted or unsubstituted 1-naphthyl group.
Preferred embodiments of the formulas (1) and (2) and each group will be described below.
In one embodiment, one of R$_{11}$ to R$_{20}$ in the formula (2) is a single bond bonded with L$_1$.
In one embodiment, Ar$_1$ is a monovalent group having a structure represented by the following formula (2-R$_{12}$), (2-R$_{13}$), (2-R$_{14}$), (2-R$_{17}$), or (2-R$_{18}$).

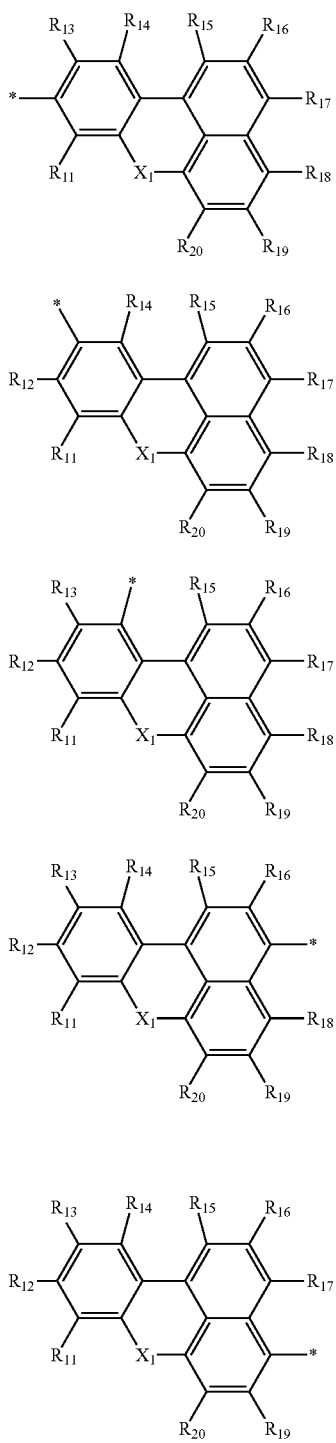

(2-R₁₂)

(2-R₁₃)

(2-R₁₄)

(2-R₁₇)

(2-R₁₈)

In the formulas (2-R₁₂), (2-R₁₃), (2-R₁₄), (2-R₁₇), and (2-R₁₈), $X_1$ and $R_{11}$ to $R_{23}$ are as defined in the formula (2);

* is bonded with $L_1$.

In one embodiment, the compound represented by the formula (1) is one or more compounds selected from the group consisting of a compound represented by the following formula (1-1) and a compound represented by the following formula (1-2).

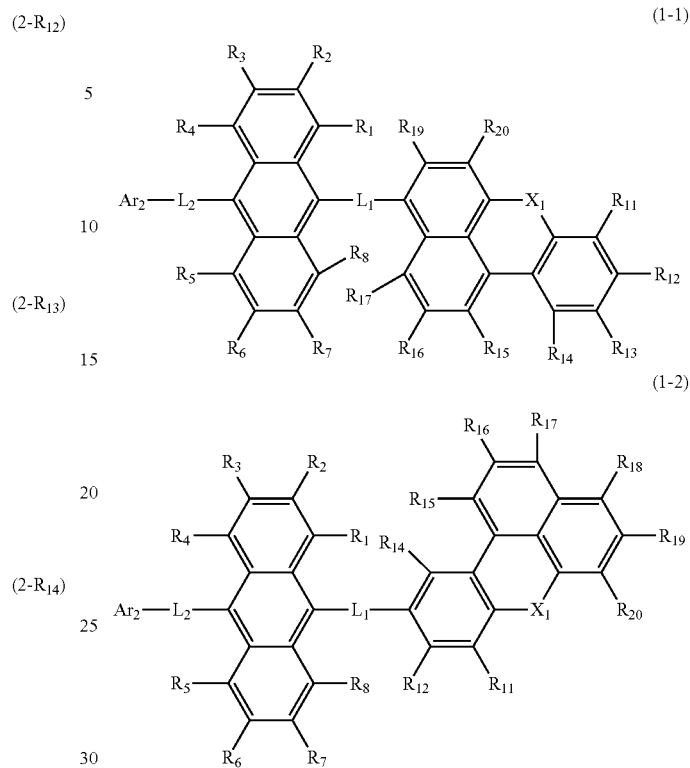

In the formulas (1-1) and (1-2), $R_1$ to $R_8$, $L_1$, $L_2$, $Ar_2$, $X_1$, and $R_{11}$ to $R_{20}$ are each as defined in the formula (1) or (2).

In one embodiment, $L_1$ is
a single bond, or
a linking group having a structure represented by the formula (L-1), (L-2), (L-3), or (L-4).

In one embodiment, $L_1$ is
a single bond,
a substituted or unsubstituted phenylene group,
a substituted or unsubstituted naphthylene group,
a substituted or unsubstituted fluorenylene group,
a substituted or unsubstituted phenanthrylene group, or
a substituted or unsubstituted biphenyldiyl group.

In one embodiment, $L_1$ is a single bond.

In one embodiment, the compound represented by the formula (1) is a compound represented by the following formula (1-1-1).

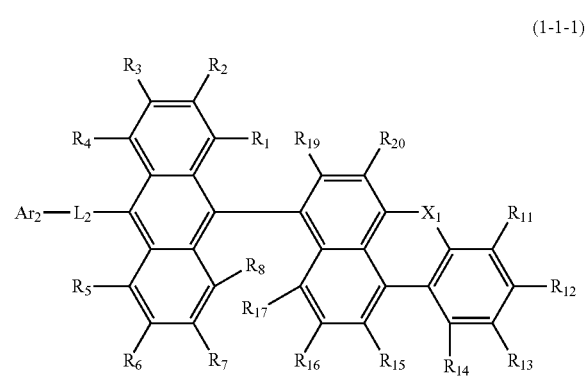

In the formula (1-1-1), $R_1$ to $R_8$, $L_2$, $Ar_2$, $X_1$, $R_{11}$ to $R_{17}$, $R_{19}$, and $R_{20}$ are each as defined in the formula (1) or (2).

In one embodiment, L₂ is a single bond, or
a linking group having a structure represented by the formula (L-1), (L-2), or (L-4).

In one embodiment, L₂ is
a single bond,
a substituted or unsubstituted phenylene group,
a substituted or unsubstituted naphthylene group,
a substituted or unsubstituted fluorenylene group,
a substituted or unsubstituted phenanthrylene group, or
a substituted or unsubstituted biphenyldiyl group.

In one embodiment, L₂ is a single bond.

In one embodiment, the compound represented by the formula (1) is a compound represented by the following formula (1-1-2).

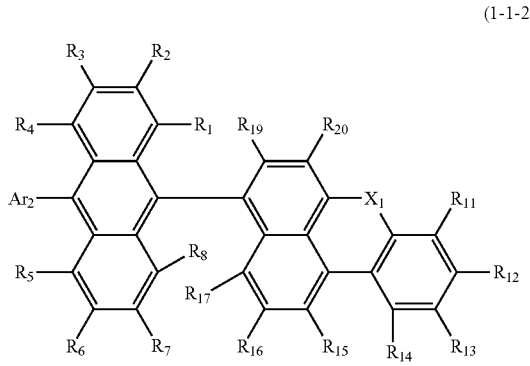

(1-1-2)

In the formula (1-1-2), $R_1$ to $R_8$, $Ar_2$, $X_1$, $R_{11}$ to $R_{17}$, $R_{19}$, and $R_{20}$ are each as defined in the formula (1) or (2).

In one embodiment, $Ar_2$ is a monovalent group having a structure represented by the formula ($Ar_2$-1), ($Ar_2$-2), ($Ar_2$-3), ($Ar_2$-4), ($Ar_2$-5), ($Ar_2$-7), ($Ar_2$-8), or ($Ar_2$-9).

In one embodiment, $Ar_2$ is
a substituted or unsubstituted phenyl group,
a substituted or unsubstituted 2-naphthyl group,
a substituted or unsubstituted fluorenyl group,
a substituted or unsubstituted phenanthryl group,
a substituted or unsubstituted biphenyl group,
a substituted or unsubstituted chrysenyl group,
a substituted or unsubstituted benzophenanthrenyl group,
a substituted or unsubstituted benzotriphenylenyl group,
a substituted or unsubstituted dibenzofuranyl group,
a substituted or unsubstituted naphthobenzofuranyl group,
a substituted or unsubstituted carbazolyl group, or
a substituted or unsubstituted benzo[def]carbazolyl group.

In one embodiment, $Ar_2$ is a group represented by any one of the following formulas ($Ar_2$-11) to ($Ar_2$-13).

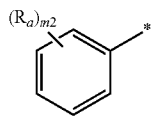

($Ar_2$-11)

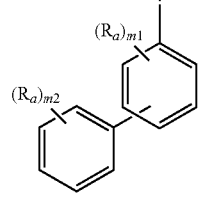

($Ar_2$-12)

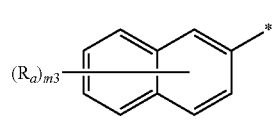

($Ar_2$-13)

In the formula ($Ar_2$-11) to ($Ar_2$-13),
* is bonded with $L_2$.
$R_a$ is a substituent.
The substituent $R_a$ is
a halogen atom,
a cyano group,
a nitro group,
a substituted or unsubstituted alkyl group including 1 to 50 carbon atoms,
a substituted or unsubstituted alkenyl group including 2 to 50 carbon atoms,
a substituted or unsubstituted alkynyl group including 2 to 50 carbon atoms,
a substituted or unsubstituted cycloalkyl group including 3 to 50 ring carbon atoms,
—Si($R_{901}$)($R_{902}$)($R_{903}$),
—O—($R_{904}$),
—S—($R_{905}$),
—N($R_{906}$)($R_{907}$),
a substituted or unsubstituted aryl group including 6 to 50 ring carbon atoms, or
a substituted or unsubstituted monovalent heterocyclic group including 5 to 50 ring atoms.
$R_{901}$ to $R_{907}$ are as defined in the formula (1).
m1 is an integer of 0 to 4.
m2 is an integer of 0 to 5.
m3 is an integer of 0 to 7.
When m1 to m3 are each 2 or more, a plurality of $R_a$'s may be the same as or different from each other.
When m1 to m3 are each 2 or more, a plurality of adjacent $R_a$'s form a substituted or unsubstituted, saturated or unsaturated ring by bonding with each other, or do not form a substituted or unsubstituted, saturated or unsaturated ring.

In one embodiment, $Ar_2$-$L_2$- is selected from the following groups:
a substituted or unsubstituted phenyl group in which $L_2$ is a single bond and $Ar_2$ is a substituted or unsubstituted phenyl group;
a substituted or unsubstituted 2-naphthyl group in which $L_2$ is a single bond and $Ar_2$ is a substituted or unsubstituted 2-naphthyl group;
a substituted or unsubstituted phenylnaphthyl group in which $L_2$ is a substituted or unsubstituted naphthyl group and $Ar_2$ is a phenyl group;
a substituted or unsubstituted biphenyl group in which $L_2$ is a single bond and $Ar_2$ is a substituted or unsubstituted biphenyl group, or a substituted or unsubstituted biphenyl group in which $L_2$ is a substituted or unsubstituted phenylene group and $Ar_2$ is a substituted or unsubstituted phenyl group;

a substituted or unsubstituted naphthylphenyl group in which $L_2$ is a substituted or unsubstituted phenyl group and $Ar_2$ is a substituted or unsubstituted naphthyl group;

a substituted or unsubstituted fluorenyl group in which $L_2$ is a single bond and $Ar_2$ is a substituted or unsubstituted fluorenyl group;

a substituted or unsubstituted phenanthryl group in which $L_2$ is a single bond and $Ar_2$ is a substituted or unsubstituted phenanthryl group;

a substituted or unsubstituted phenylphenanthryl group in which $L_2$ is a substituted or unsubstituted phenanthryl group and $Ar_2$ is a substituted or unsubstituted phenyl group;

a substituted or unsubstituted benzophenanthryl group in which $L_2$ is a single bond and $Ar_2$ is a substituted or unsubstituted benzophenanthryl group;

a substituted or unsubstituted benzotriphenylenyl group in which $L_2$ is a single bond and $Ar_2$ is a substituted or unsubstituted benzotriphenylenyl group;

a substituted or unsubstituted chrysenyl group in which $L_2$ is a single bond and $Ar_2$ is a substituted or unsubstituted chrysenyl group;

a substituted or unsubstituted dibenzofuranyl group in which $L_2$ is a single bond and $Ar_2$ is a substituted or unsubstituted dibenzofuranyl group;

a substituted or unsubstituted phenyldibenzofuranyl group in which $L_2$ is a substituted or unsubstituted dibenzofuranyl group and $Ar_2$ is a substituted or unsubstituted phenyl group;

a substituted or unsubstituted naphthobenzofuranyl group in which $L_2$ is a single bond and $Ar_2$ is a substituted or unsubstituted naphthobenzofuranyl group;

a substituted or unsubstituted carbazolyl group in which $L_2$ is a single bond and $Ar_2$ is a substituted or unsubstituted carbazolyl group;

a substituted or unsubstituted carbazolyl-phenyl group in which $L_2$ is a substituted or unsubstituted phenyl group and $Ar_2$ is a substituted or unsubstituted carbazolyl group; or a substituted or unsubstituted benzo[def]carbazolyl-phenyl group in which $L_2$ is a substituted or unsubstituted phenyl group and $Ar_2$ is a substituted or unsubstituted benzo[def]carbazolyl group.

In one embodiment, $R_1$ to $R_8$, and $R_{11}$ to $R_{20}$ which are not single bonds bonding with $L_1$ and which does not form the substituted or unsubstituted, saturated or unsaturated ring are hydrogen atoms.

In one embodiment, the compound represented by the formula (1) is a compound represented by the following formula (1-4).

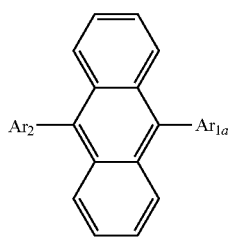

(1-4)

In the formula (1-4), Are is as defined in the formula (1).
$Ar_{1a}$ is a monovalent group having a structure represented by the following formula (2-1).

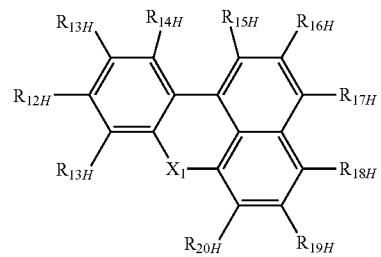

(2-1)

In the formula (2-1), $X_1$ is as defined in the formula (2).

One of $R_{11H}$ to $R_{20H}$ is a single bond bonding with an anthracene skeleton.

$R_{11H}$ to $R_{20H}$ which are not single bonds bonding with the anthracene skeleton are hydrogen atoms.

In one embodiment,
one or more of $R_1$ to $R_8$ which are hydrogen atoms,
$R_{11}$ to $R_{20}$ which are hydrogen atoms,
hydrogen atoms possessed by the substituted or unsubstituted, saturated or unsaturated ring formed by bonding one or more sets of adjacent two or more of $R_1$ to $R_8$,
hydrogen atoms possessed by $R_1$ to $R_8$ which are substituents R,
hydrogen atoms possessed by the substituted or unsubstituted, saturated or unsaturated ring formed by bonding one or more sets of adjacent two or more of $R_{11}$ to $R_{20}$,
hydrogen atoms possessed by $R_{11}$ to $R_{20}$ which are substituents R,
hydrogen atoms possessed by $L_1$,
hydrogen atoms possessed by $L_2$, and
hydrogen atoms possessed by $Ar_2$
are deuterium atoms.

In one embodiment, the compound represented by the formula (1) is a material for an organic electroluminescence device.

Details of each substituent in the formula (1) are as described in the column of [Definition] of this specification.

In one embodiment, in the compound represented by the formula (1), the substituent in the case of "substituted or unsubstituted" is a group selected from the group consisting of:
an unsubstituted alkyl group including 1 to 50 carbon atoms,
an unsubstituted alkenyl group including 2 to 50 carbon atoms,
an unsubstituted alkynyl group including 2 to 50 carbon atoms,
an unsubstituted cycloalkyl group including 3 to 50 ring carbon atoms,
—Si($R_{901}$)($R_{902}$)($R_{903}$),
—O—($R_{904}$),
—S—($R_{905}$),
—N($R_{906}$)($R_{907}$),
(wherein
$R_{901}$ to $R_{907}$ are independently
a hydrogen atom,
a substituted or unsubstituted alkyl group including 1 to 50 carbon atoms,
a substituted or unsubstituted cycloalkyl group including 3 to 50 ring carbon atoms,
a substituted or unsubstituted aryl group including 6 to 50 ring carbon atoms, or a substituted or unsubstituted monovalent heterocyclic group including 5 to 50 ring atoms; and when two or more of each of $R_{901}$ to $R_{907}$ are present, the two or more of each of $R_{901}$ to $R_{907}$ may be the same as or different from each other), a halogen atom, a cyano group, a nitro group, an unsubstituted aryl group including 6 to 50 ring carbon atoms, and an unsubstituted monovalent heterocyclic group including 5 to 50 ring atoms.

In one embodiment, in the compound represented by the formula (1), the substituent in the case of "substituted or unsubstituted" is a group selected from the group consisting of:

an alkyl group including 1 to 50 carbon atoms, an aryl group including 6 to 50 ring carbon atoms, and a monovalent heterocyclic group including 5 to 50 ring atoms.

In one embodiment, in the compound represented by the formula (1), the substituent in the case of "substituted or unsubstituted" is a group selected from the group consisting of:

an alkyl group including 1 to 18 carbon atoms, an aryl group including 6 to 18 ring carbon atoms, and a monovalent heterocyclic group including 5 to 18 ring atoms.

Specific examples of the above groups are as described in the section of [Definitions] of this specification.

Specific examples of the compound represented by the formula (1) will be described below, but these are merely examples, and the compound represented by the formula (1) is not limited to the following specific examples.

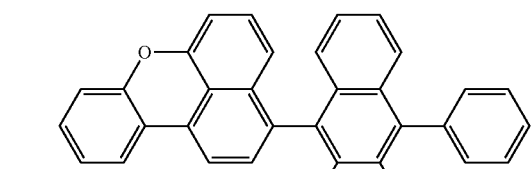

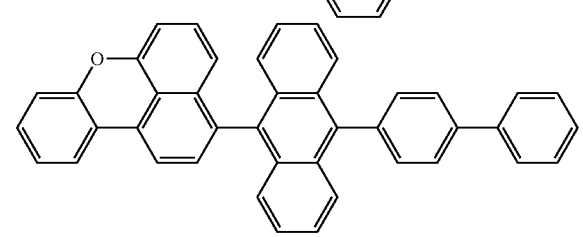

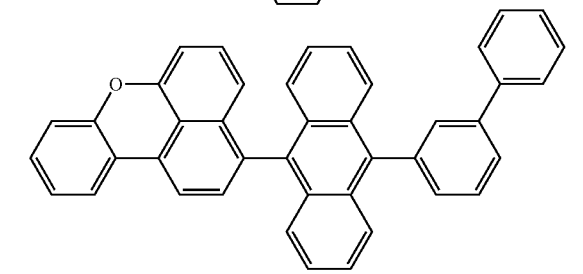

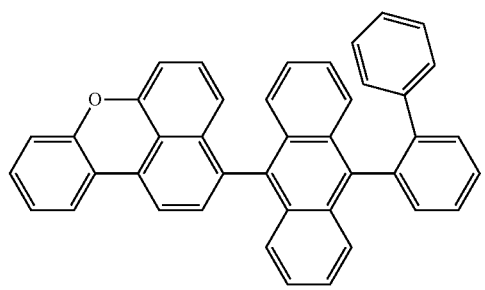

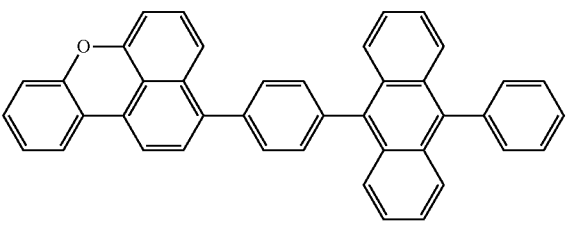

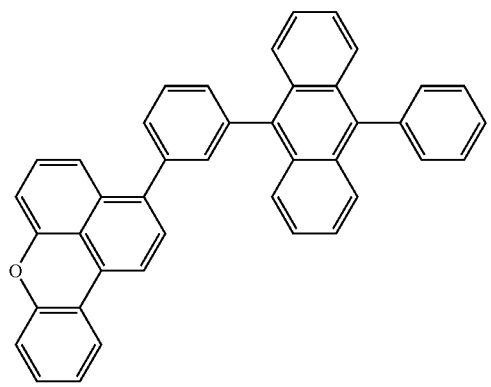

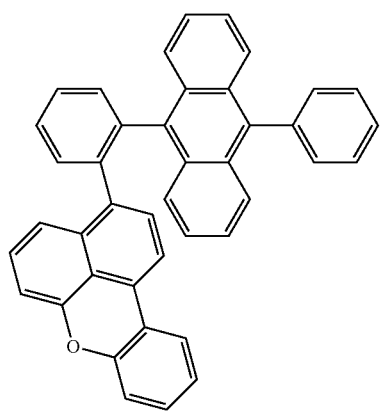

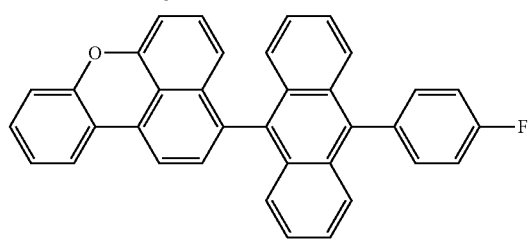

59
-continued
60
-continued
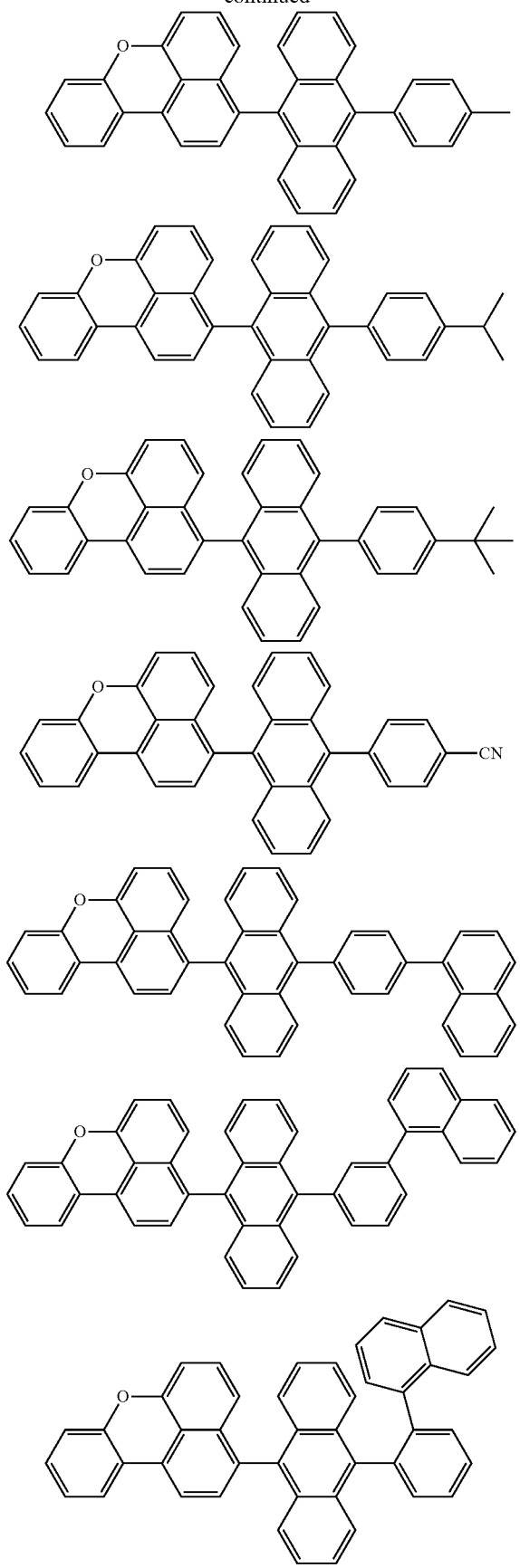
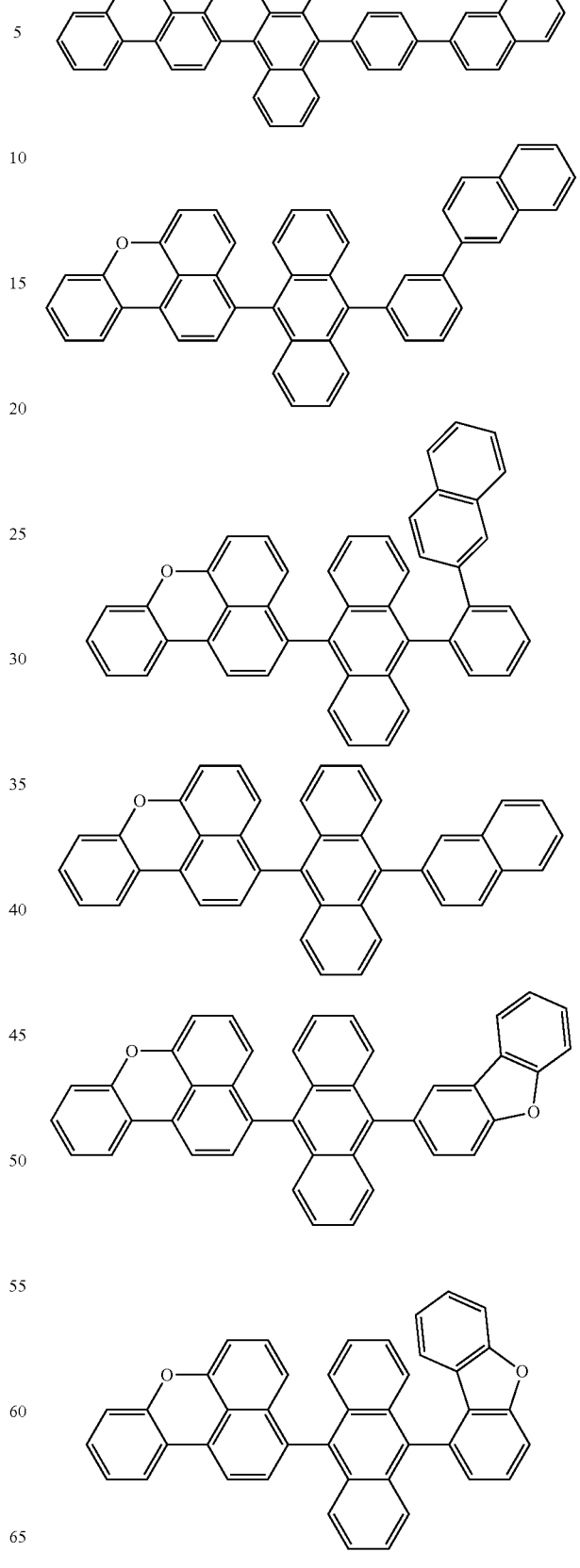

61
-continued
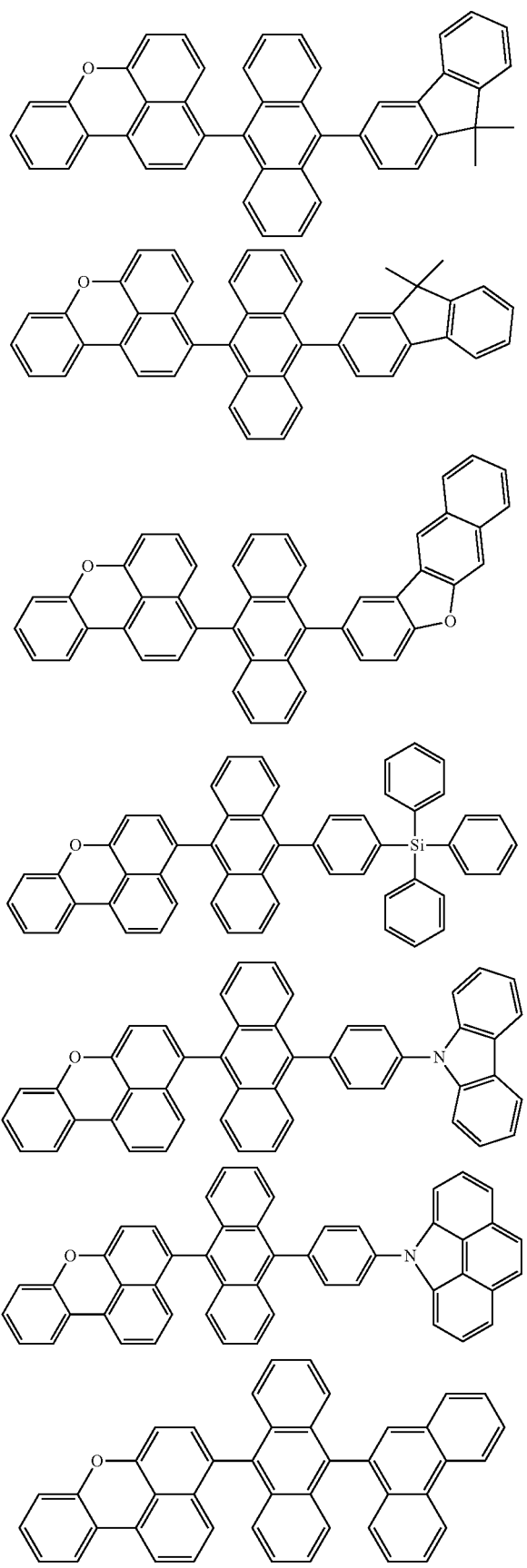
62
-continued
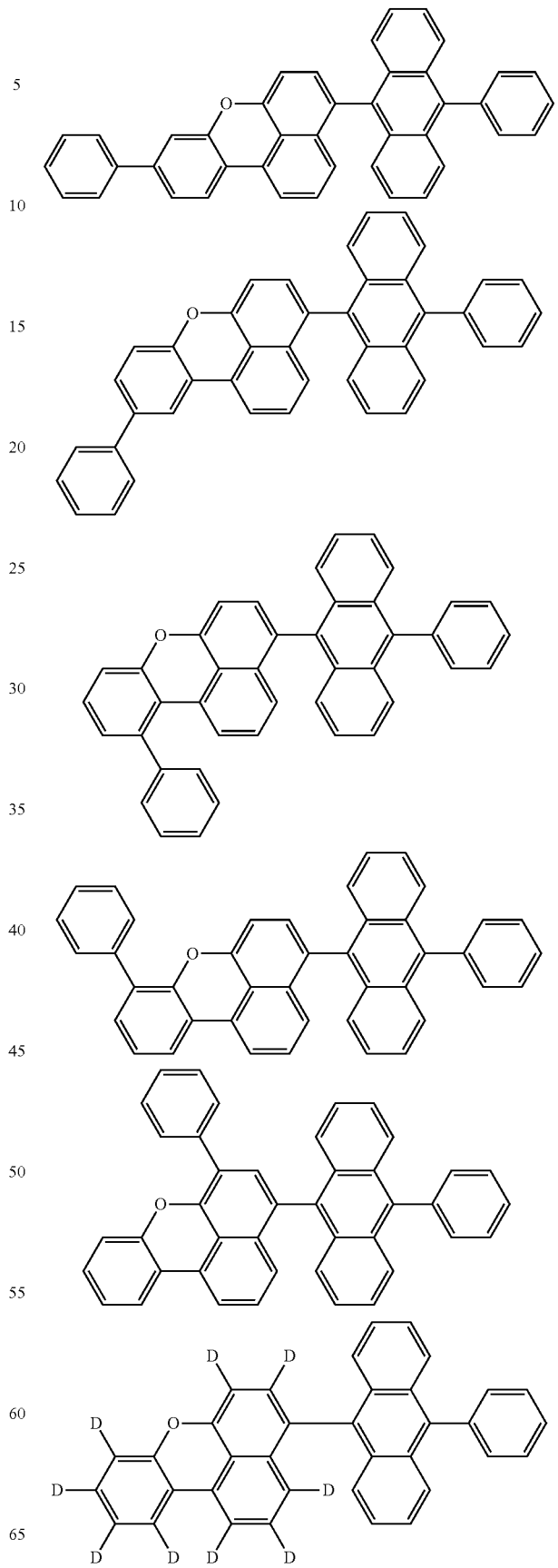

-continued
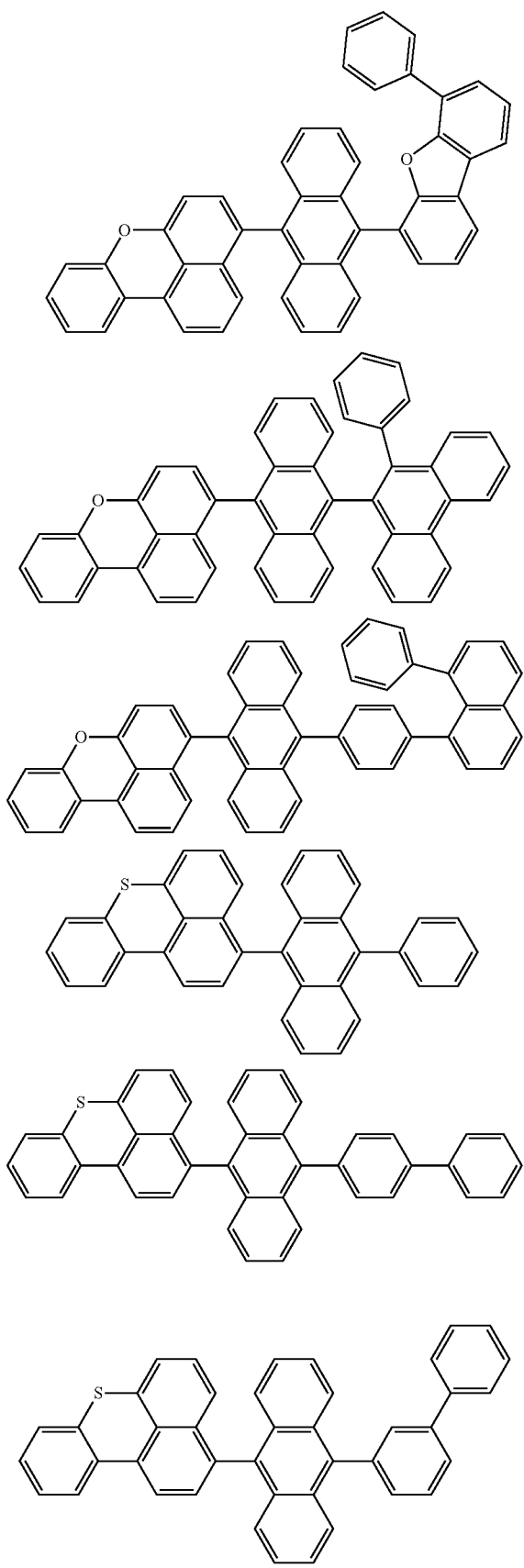
-continued
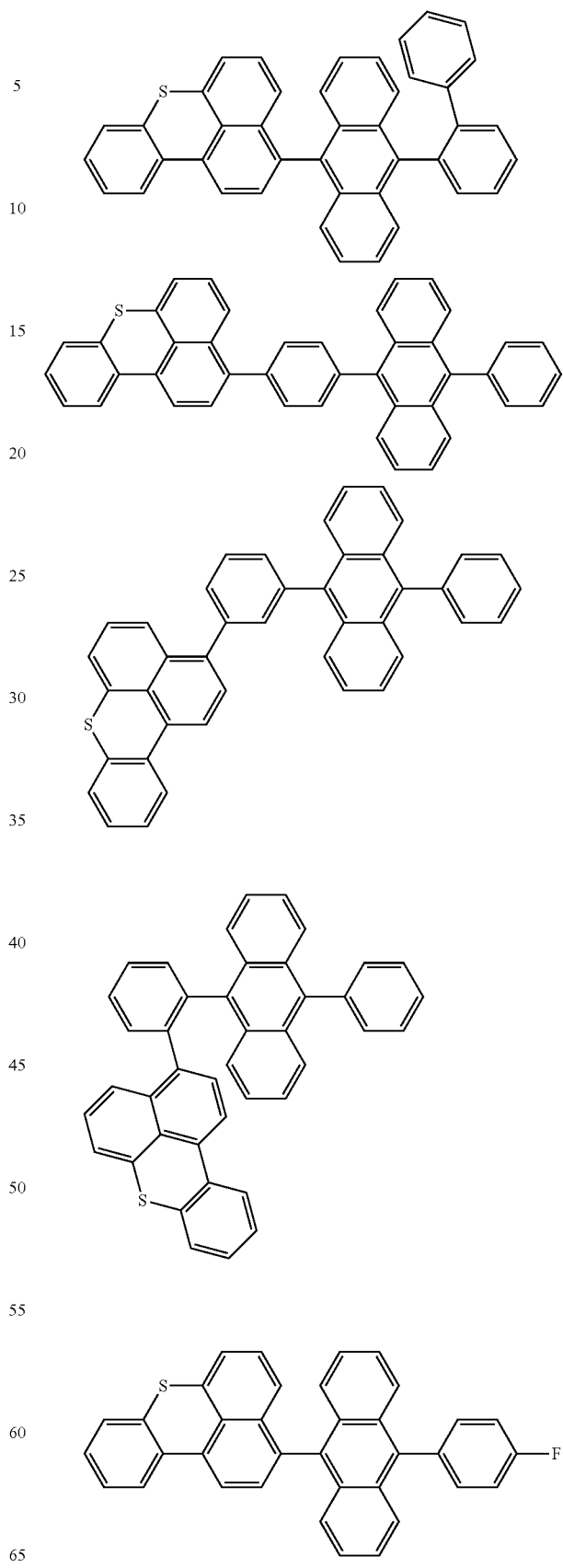

-continued
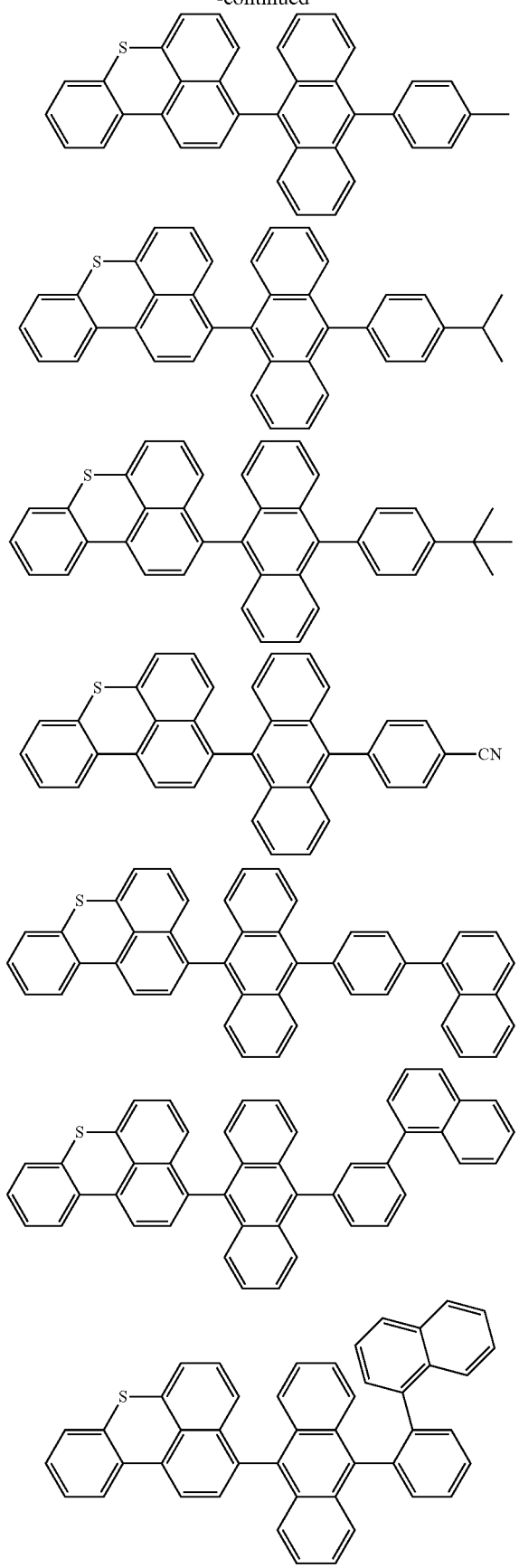
-continued
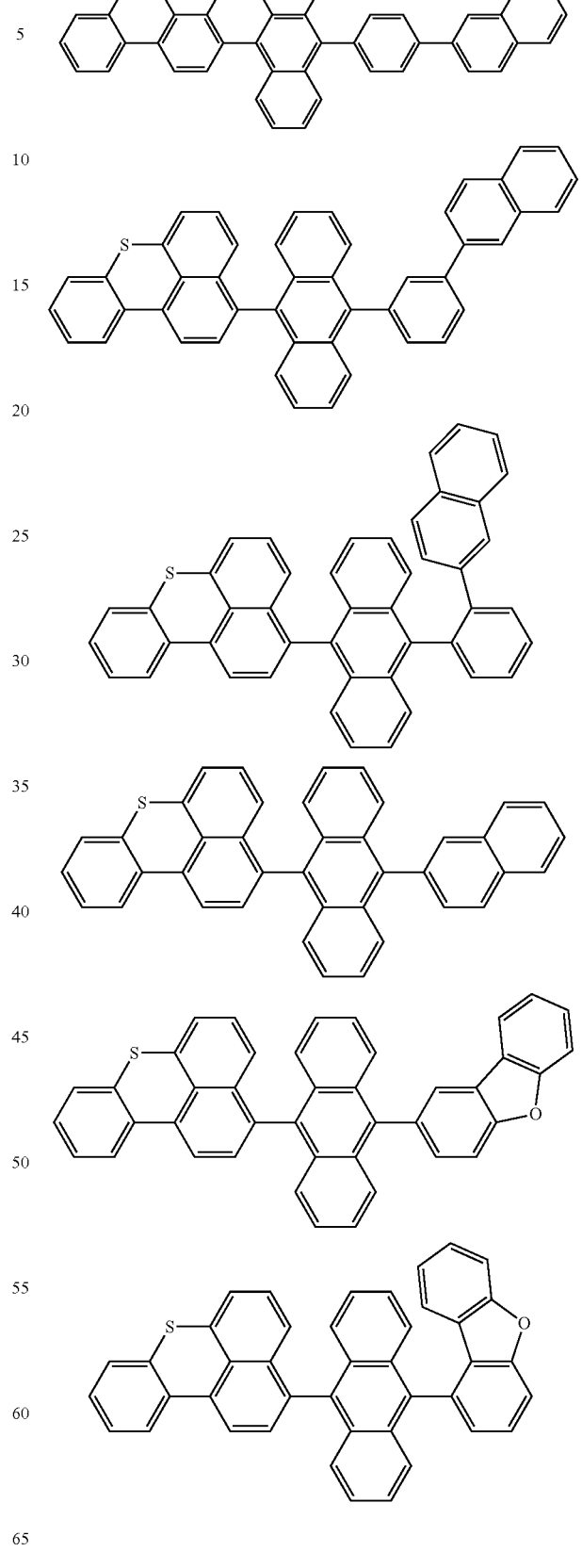

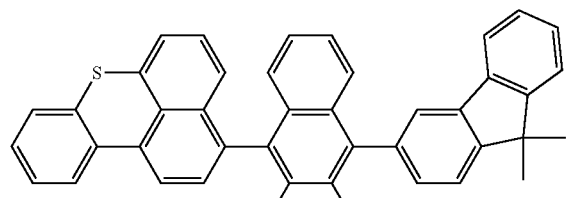
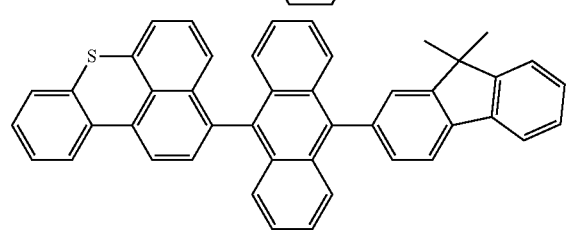
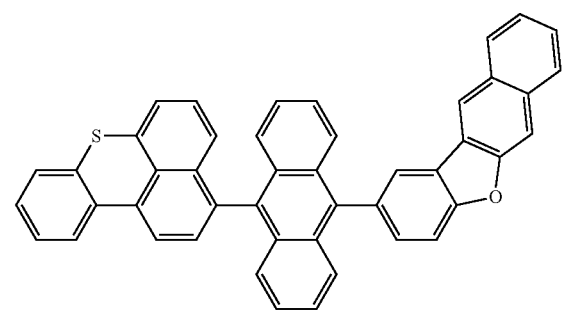
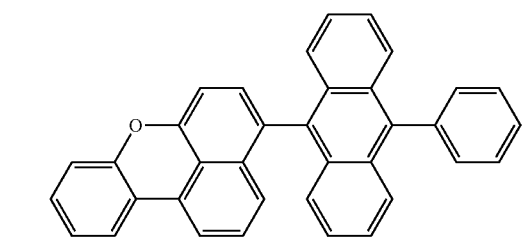
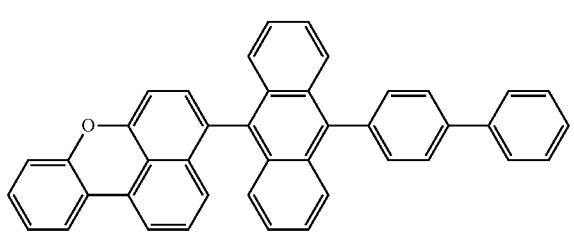
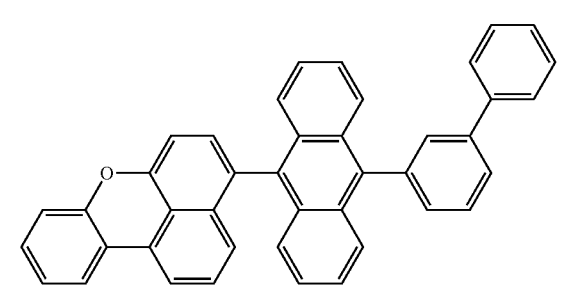
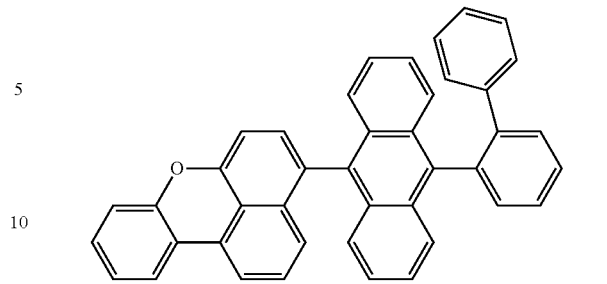
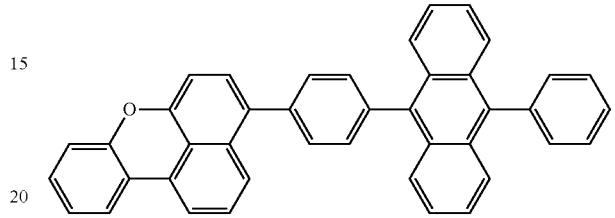
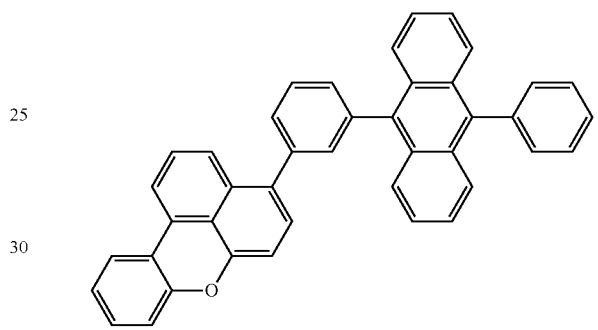
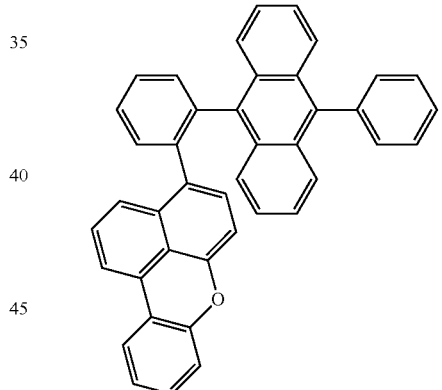
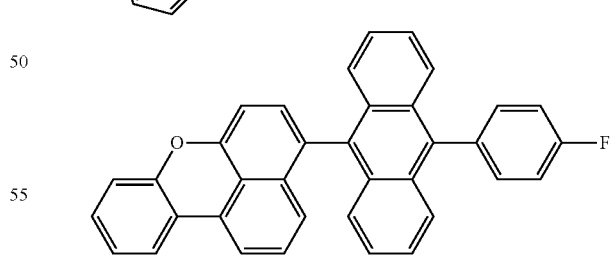
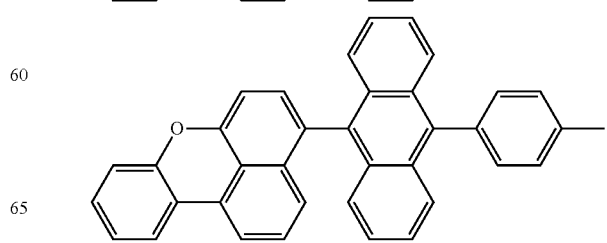

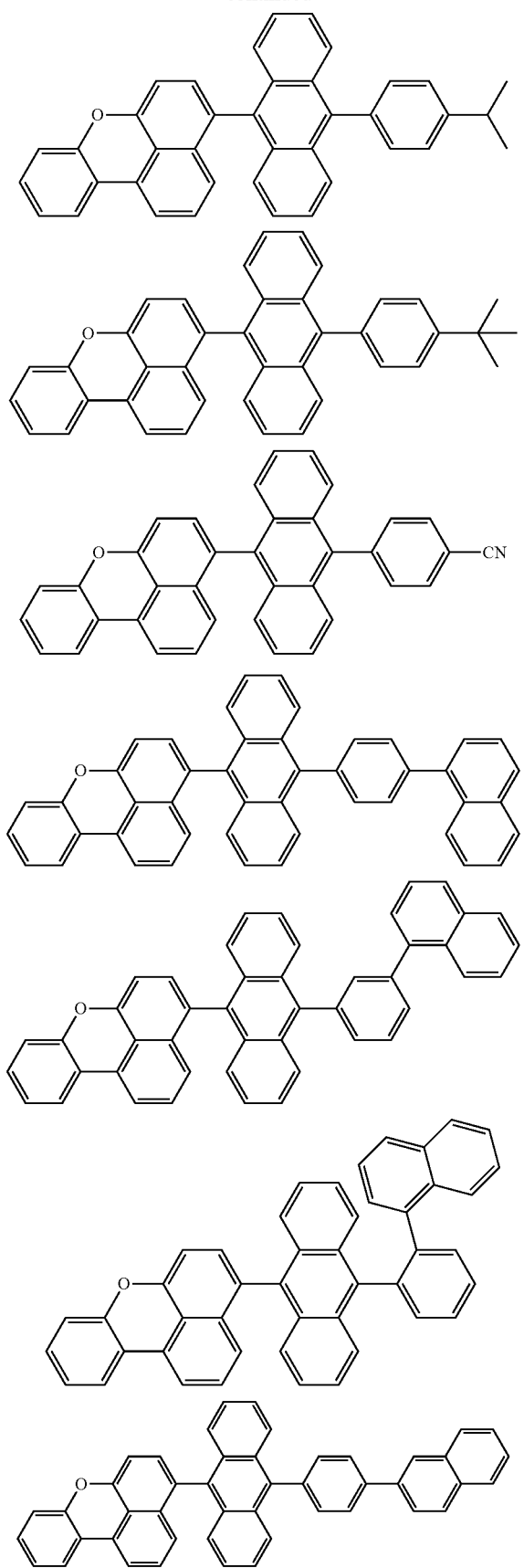
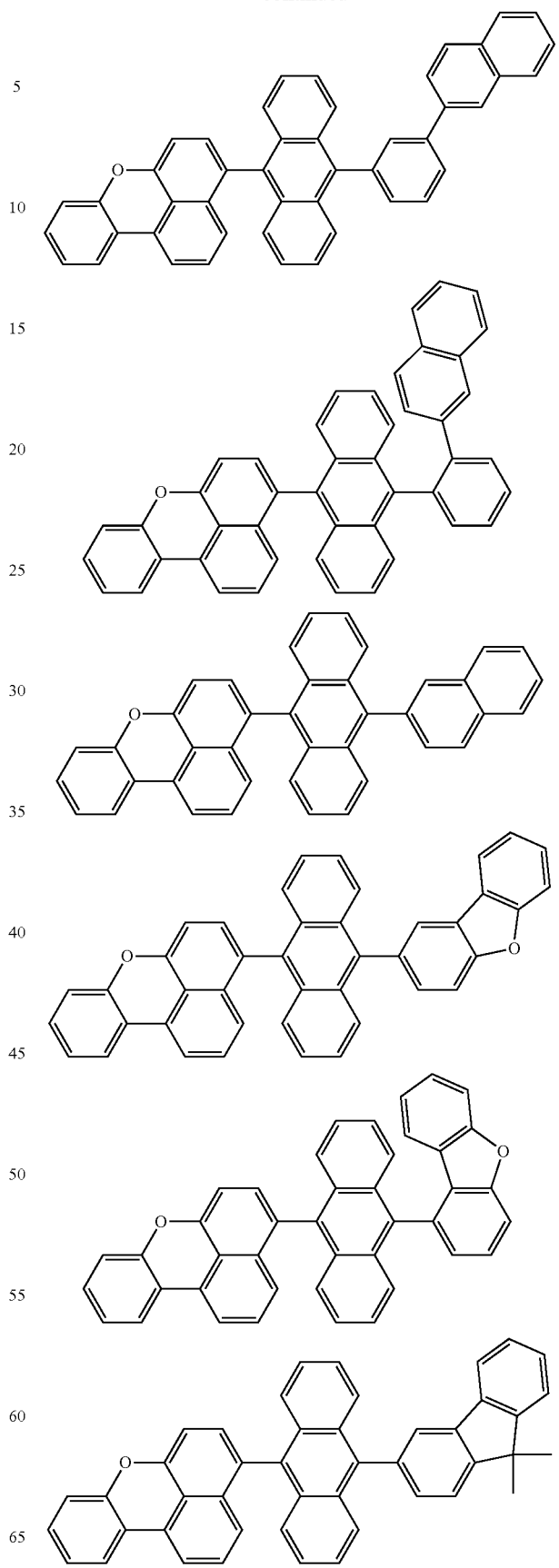

71
-continued
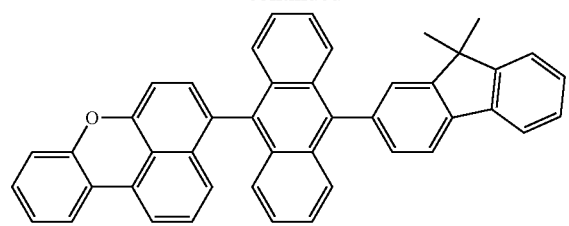
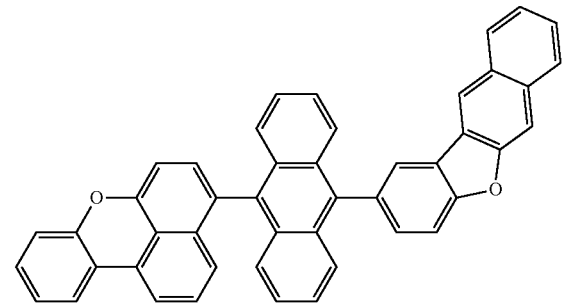
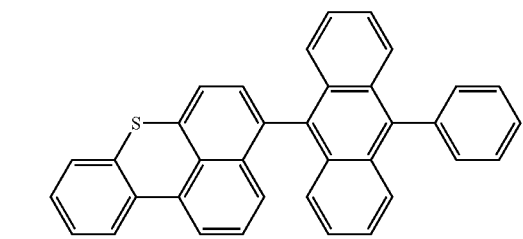
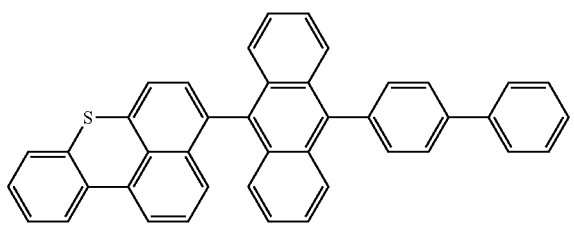
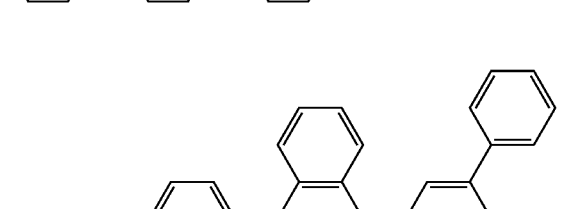
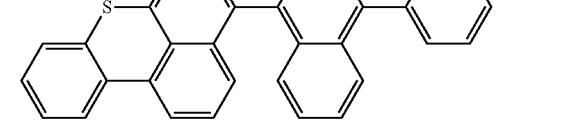
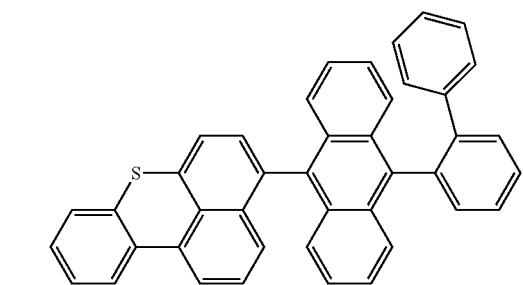
72
-continued
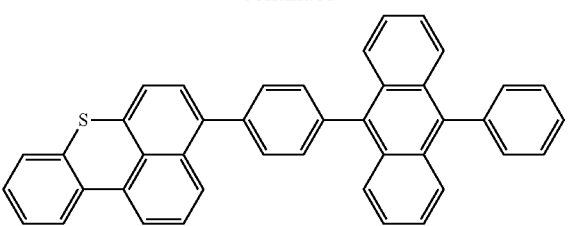
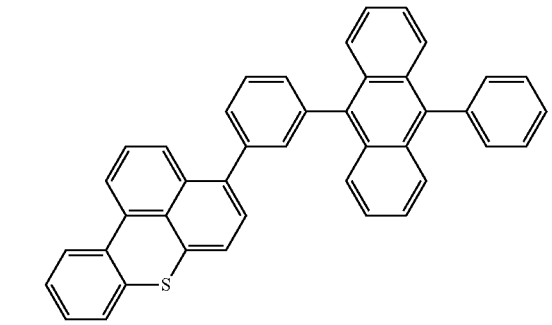
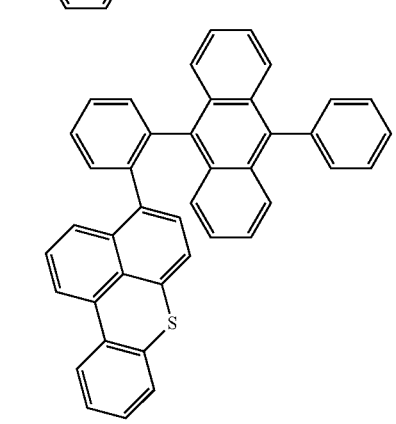
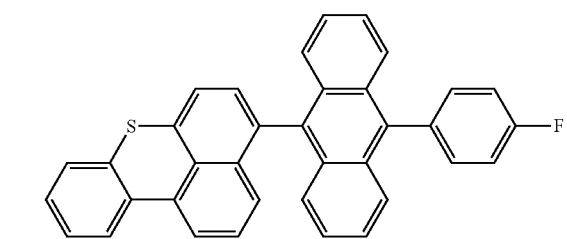
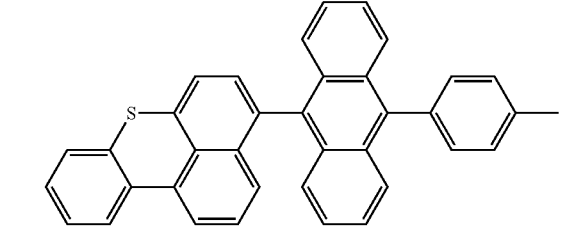
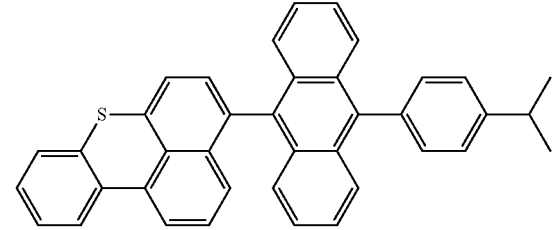

-continued
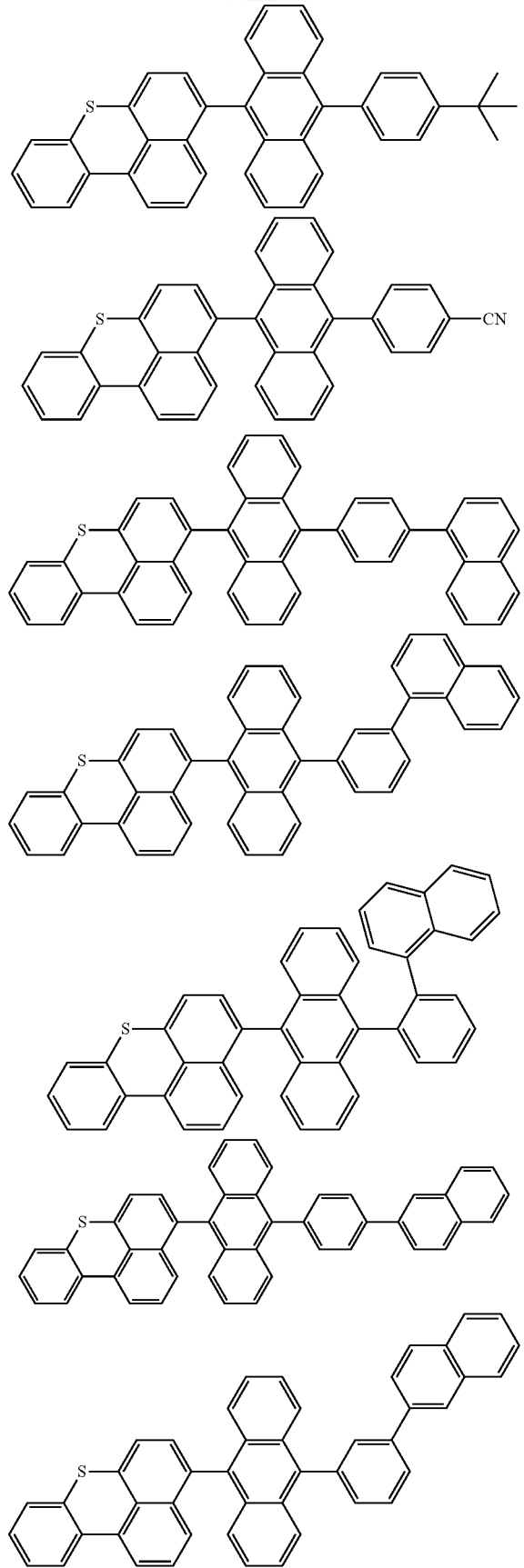
-continued
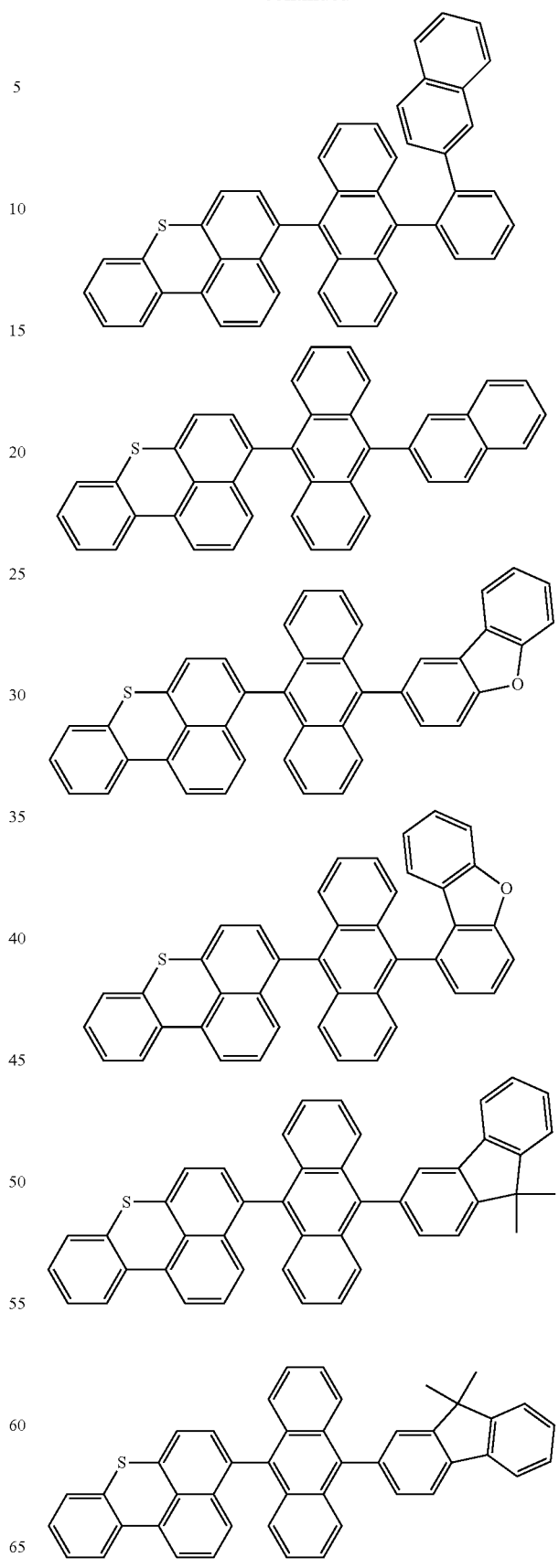

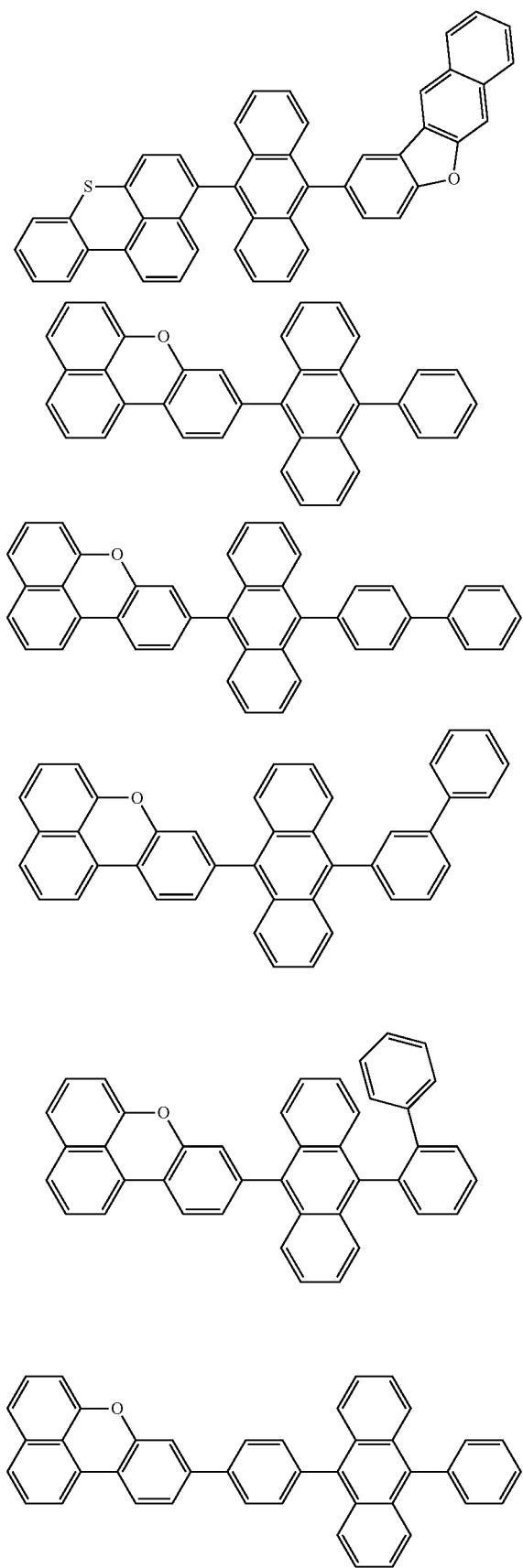
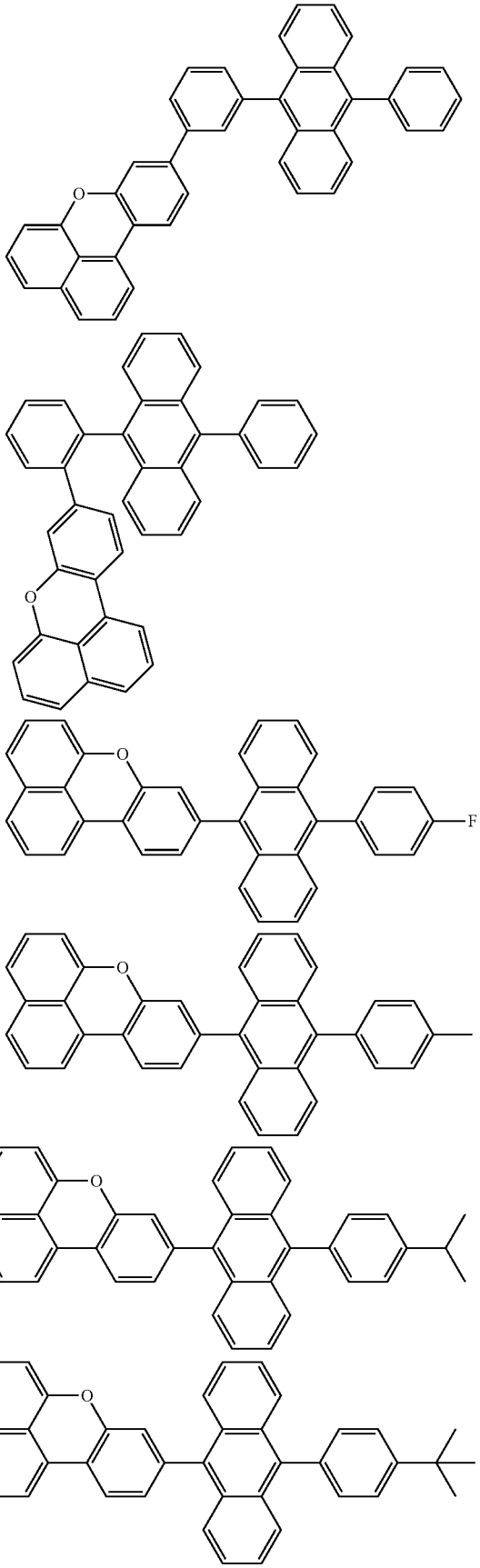

77
-continued
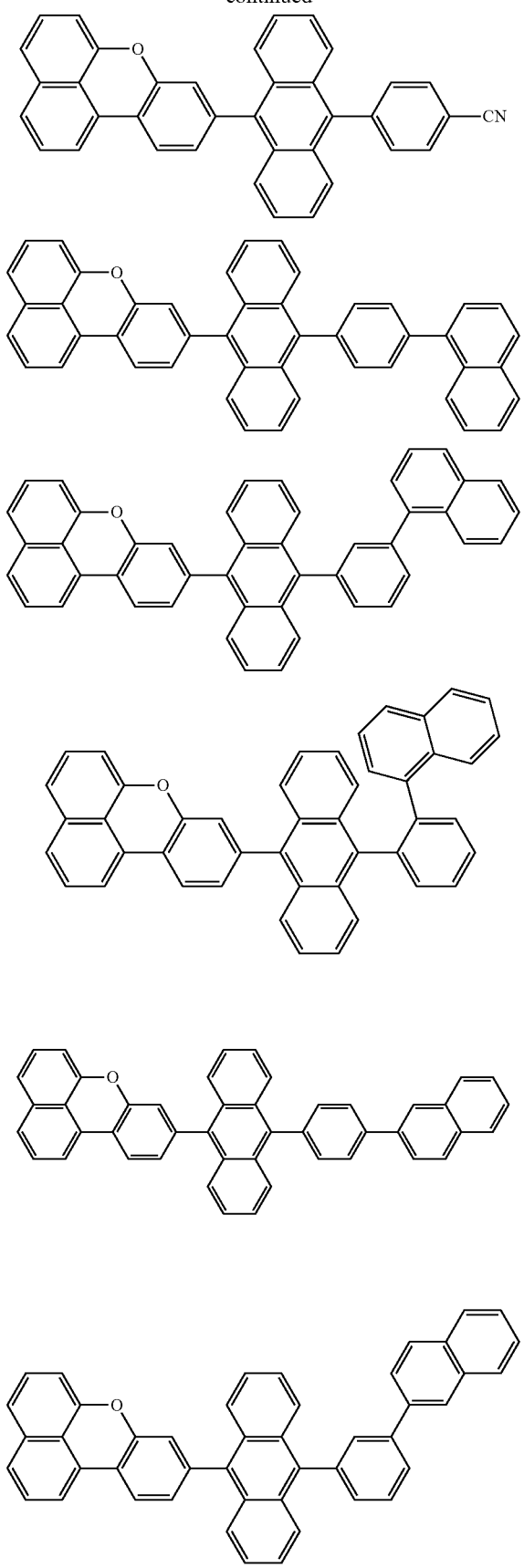
78
-continued
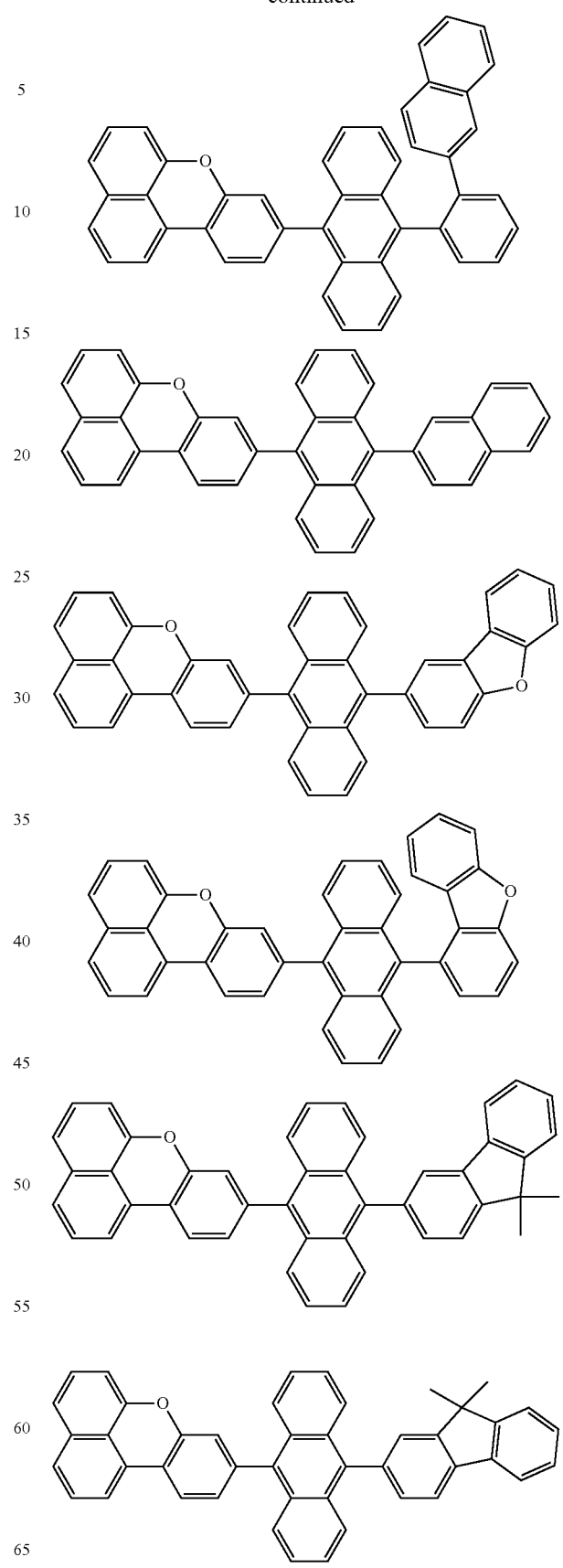

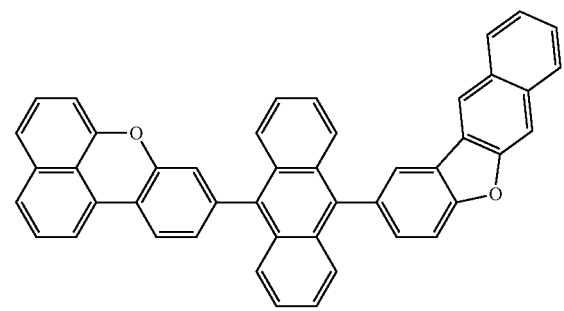
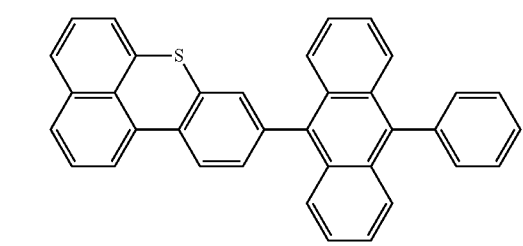
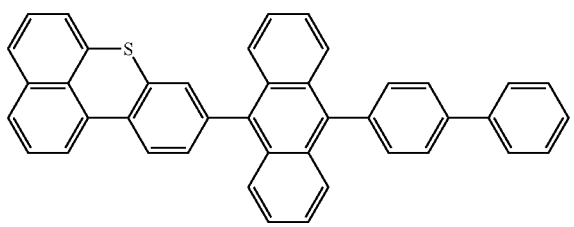
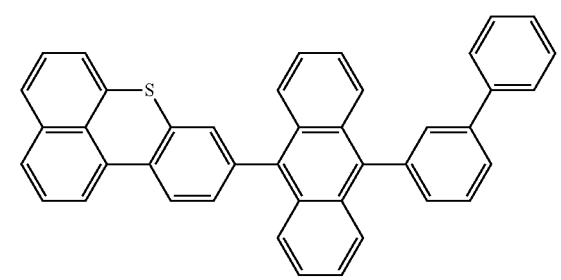
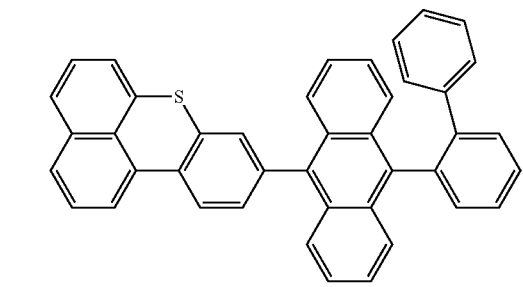
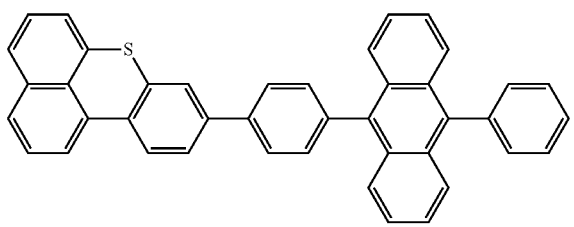
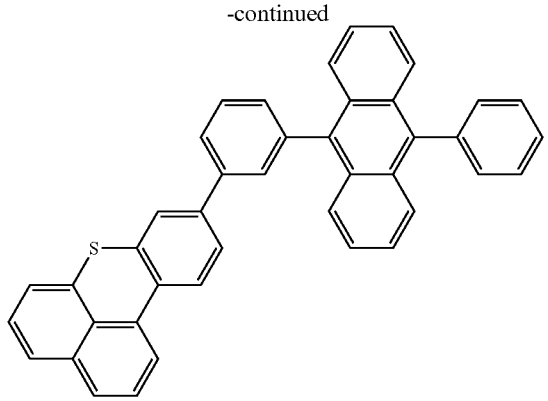
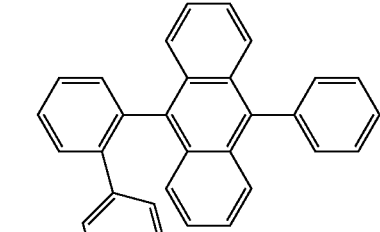
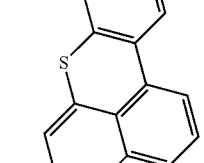
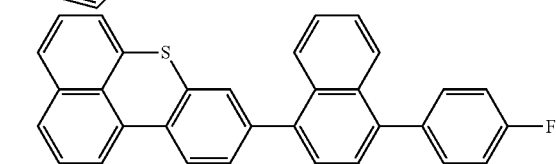
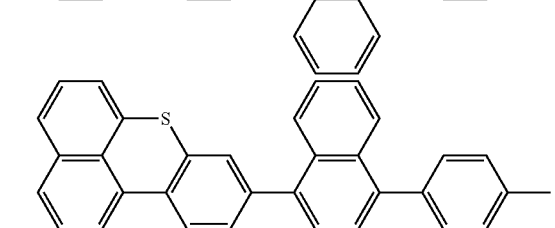
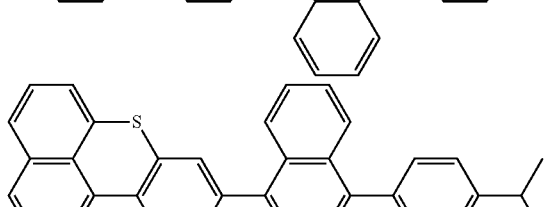
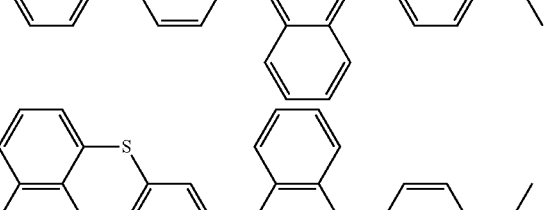
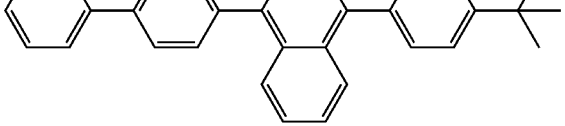

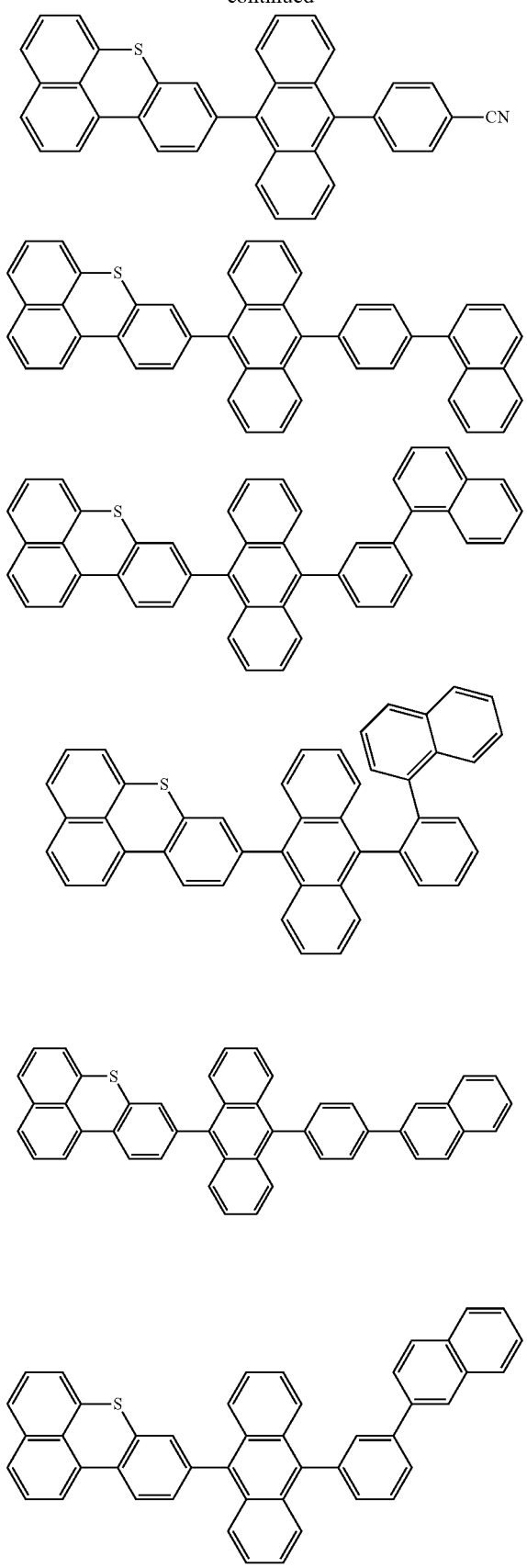
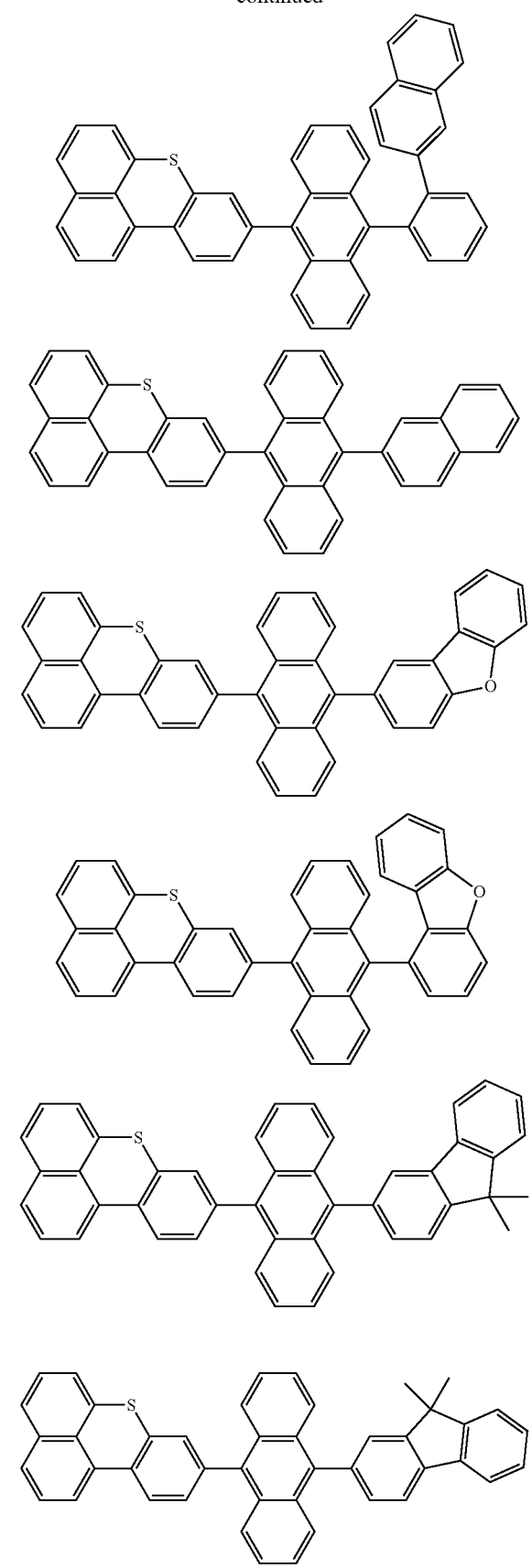

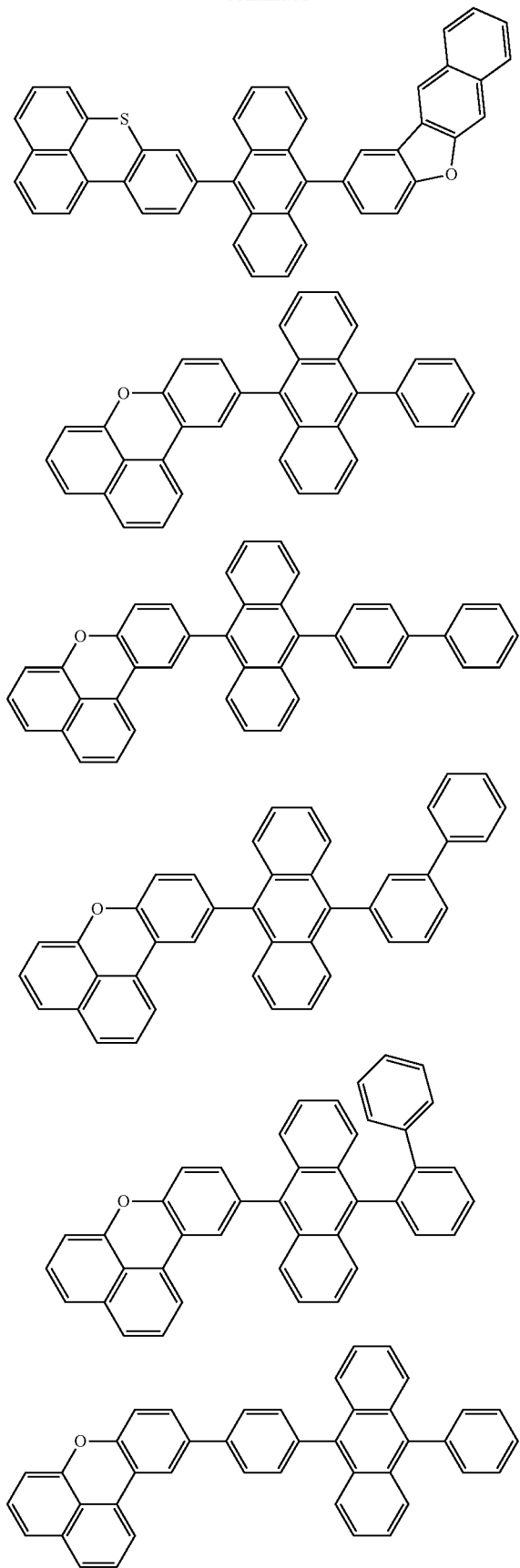
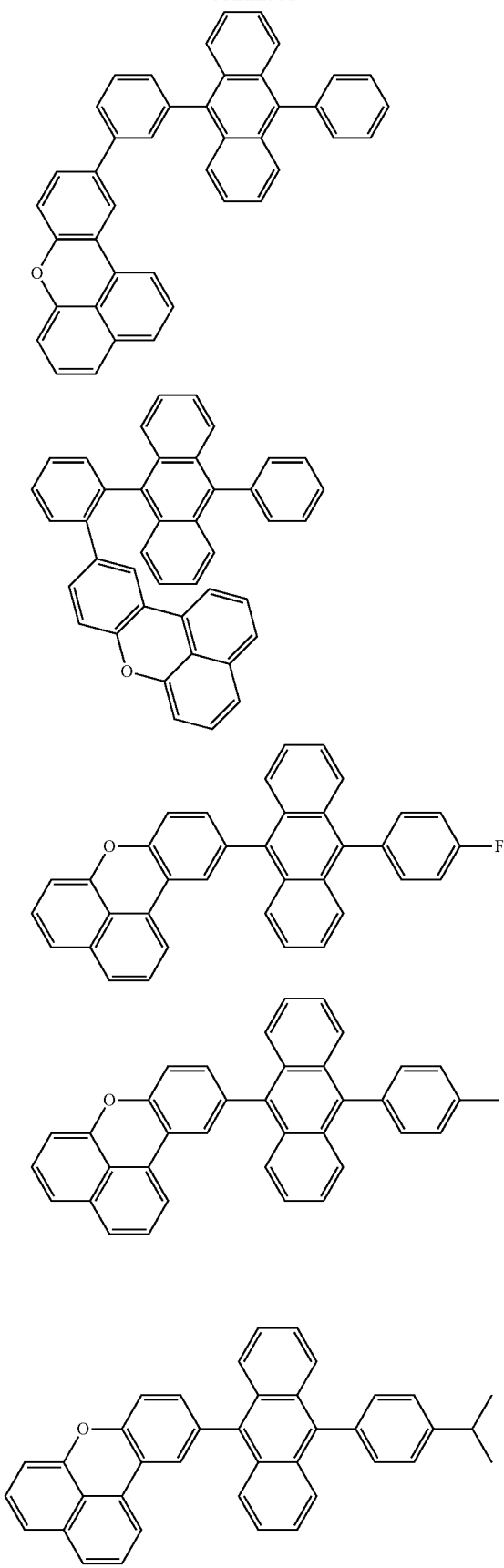

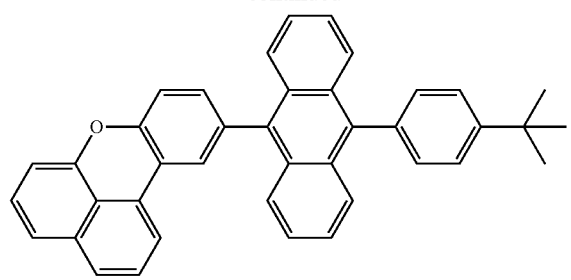
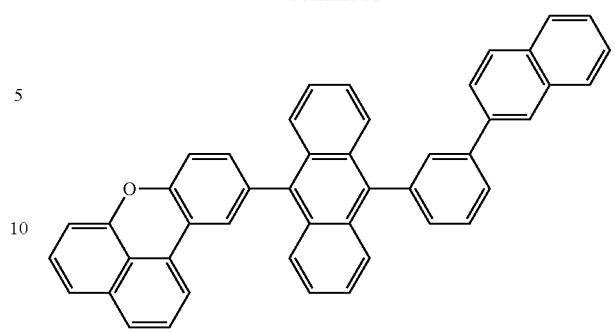
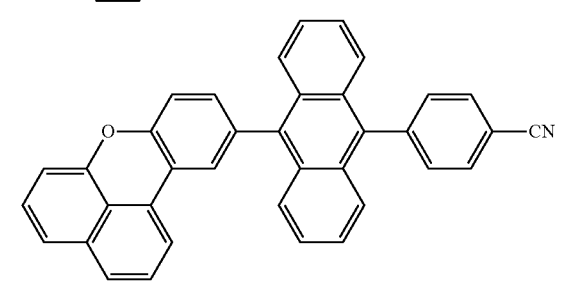
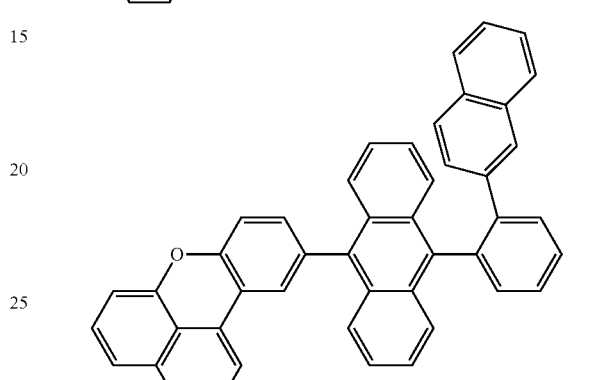
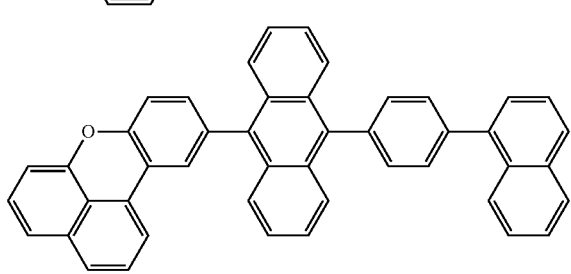
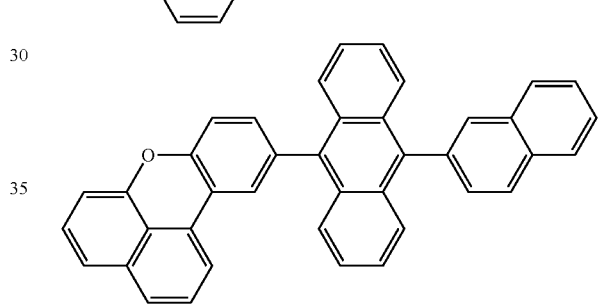
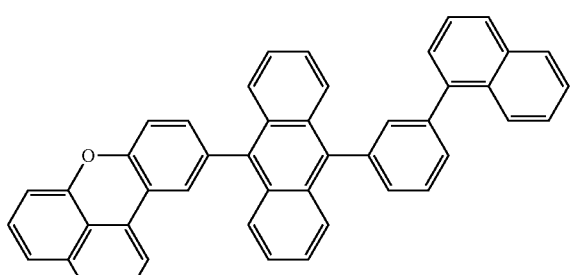
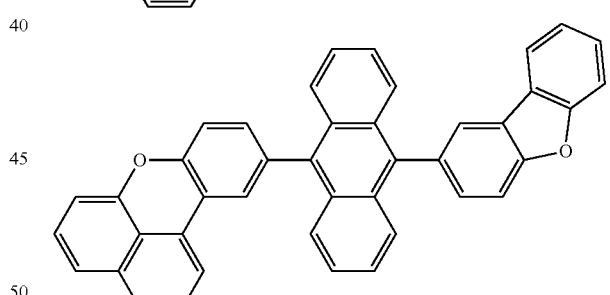
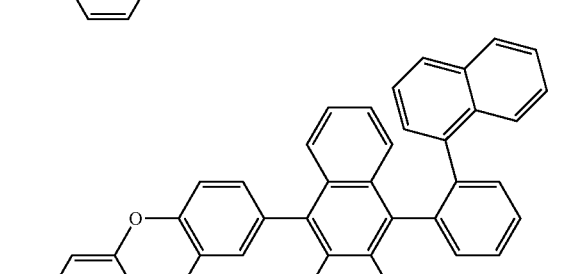
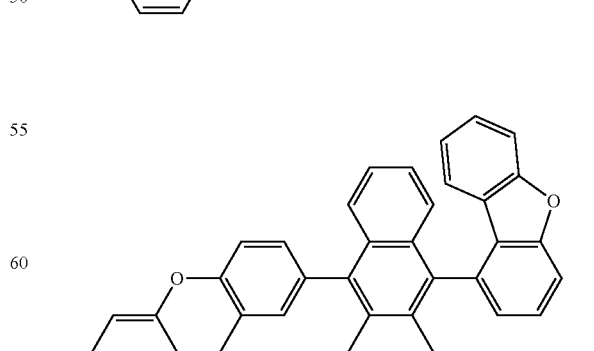
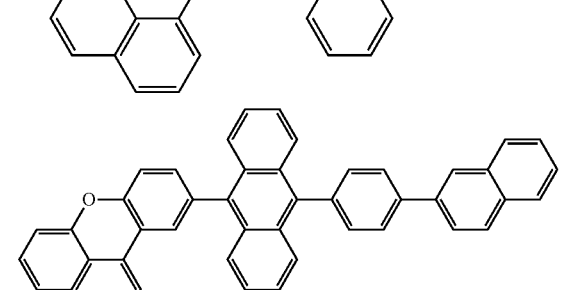

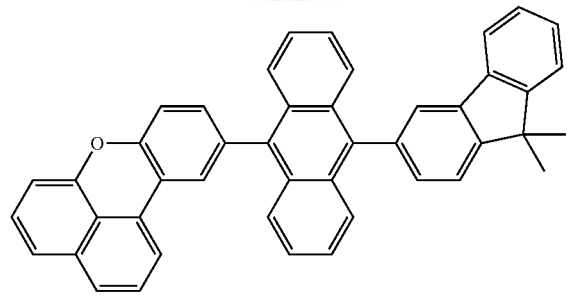
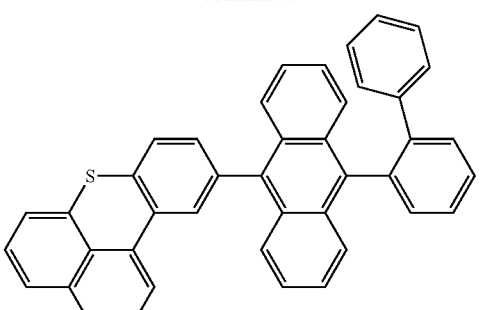
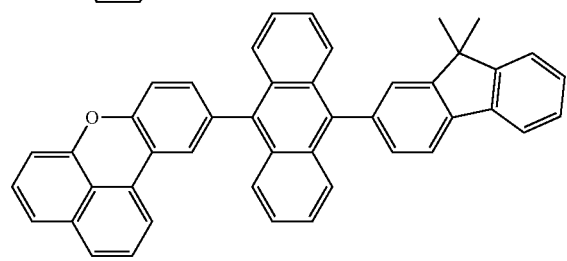
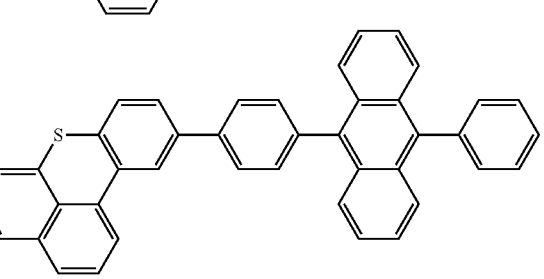
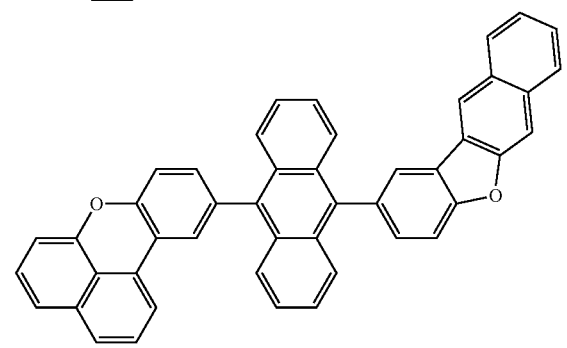
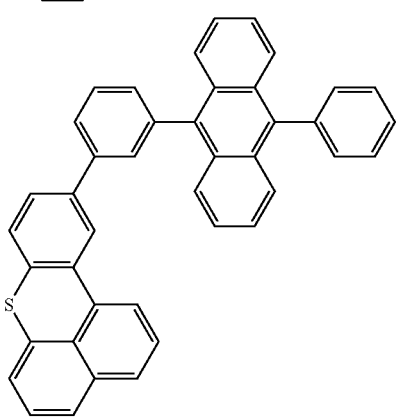
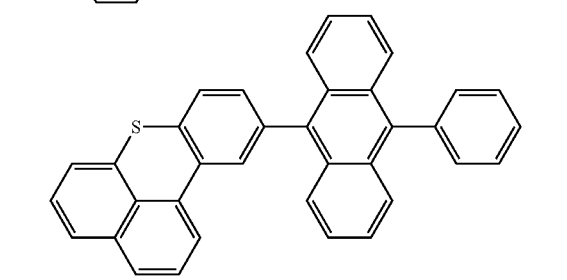
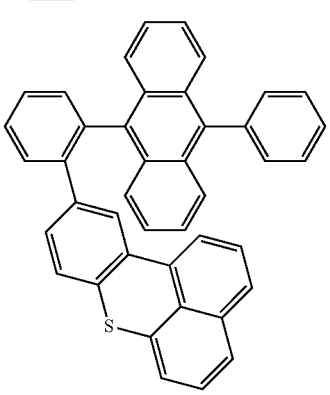
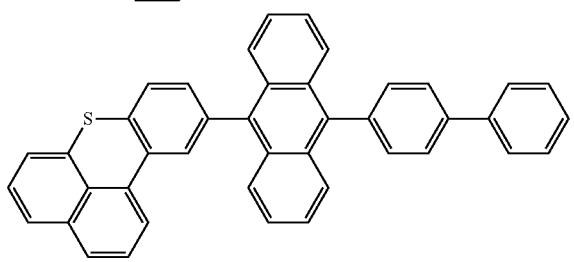
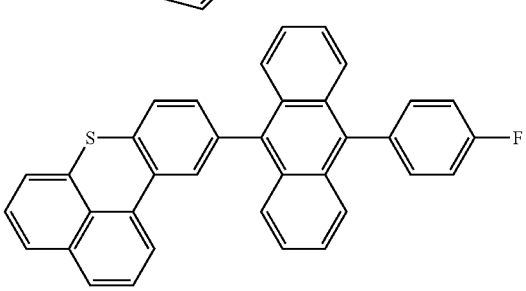
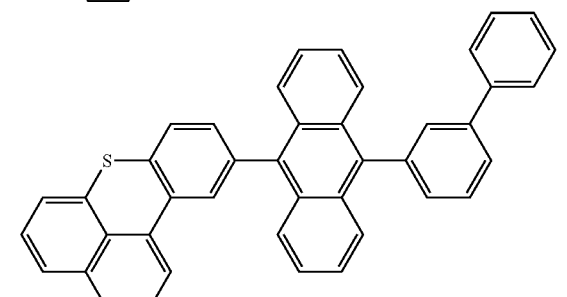

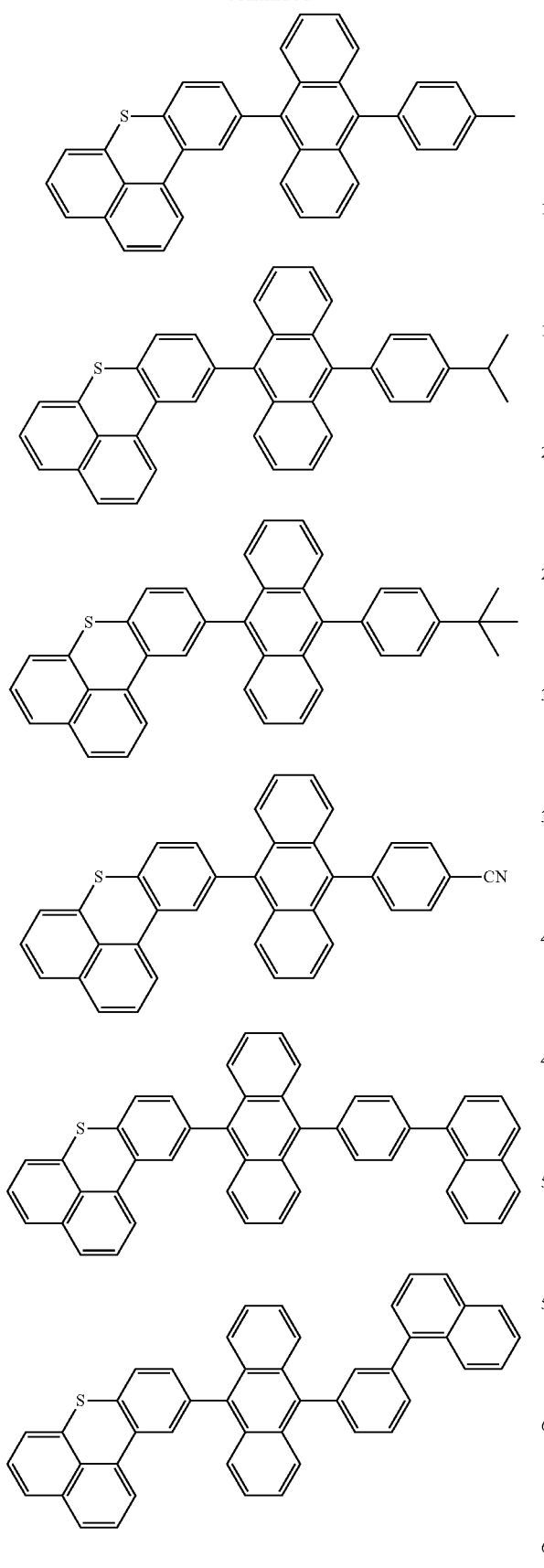
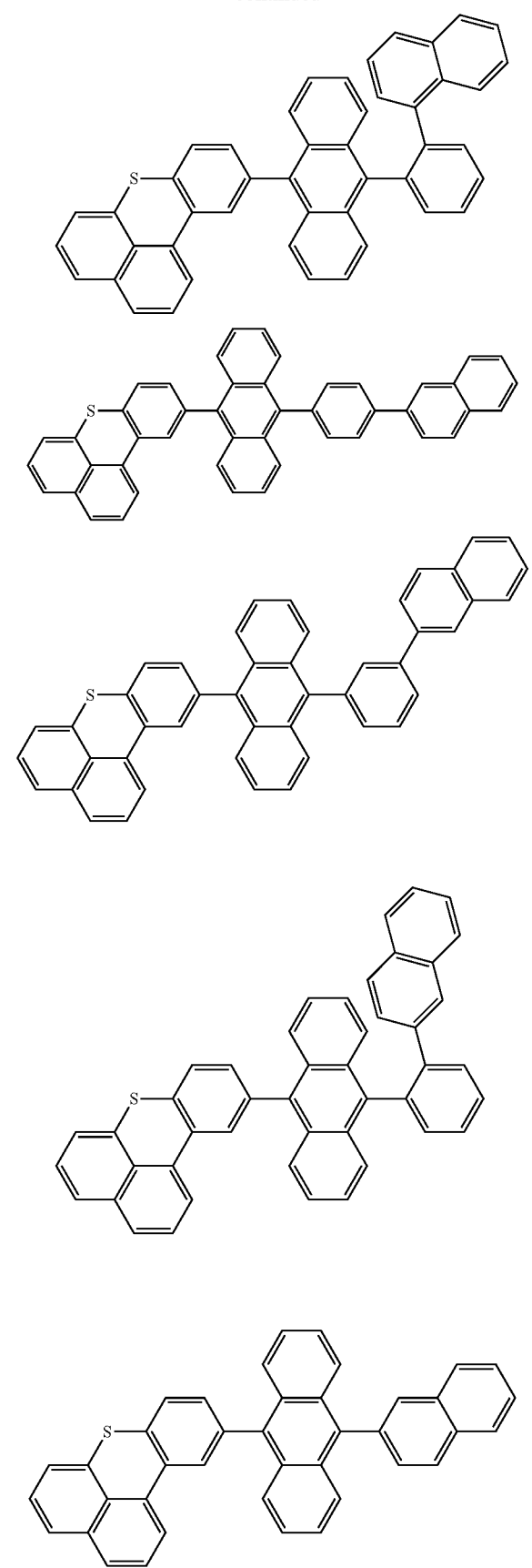

91
-continued
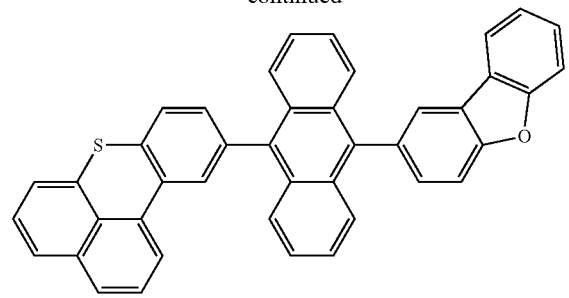
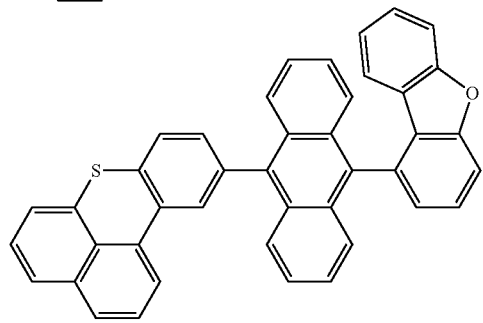
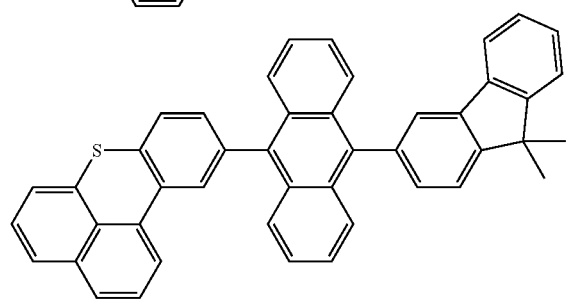
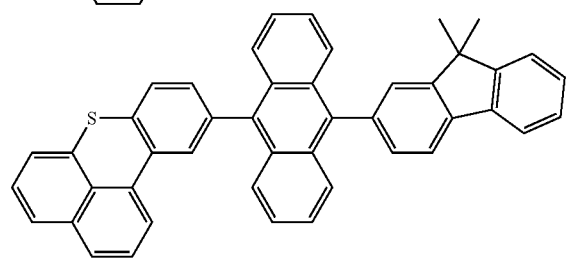
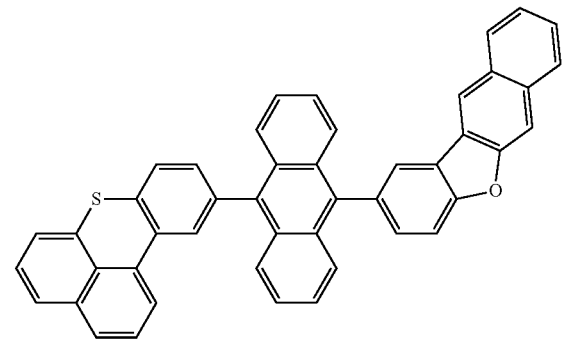
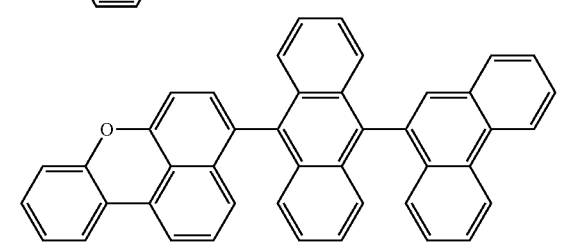
92
-continued
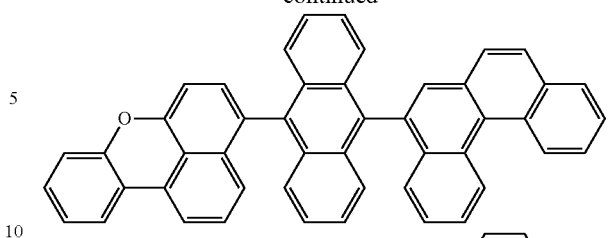
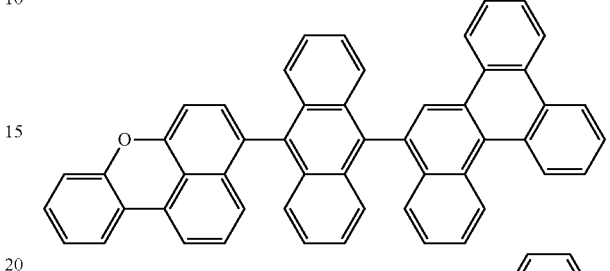
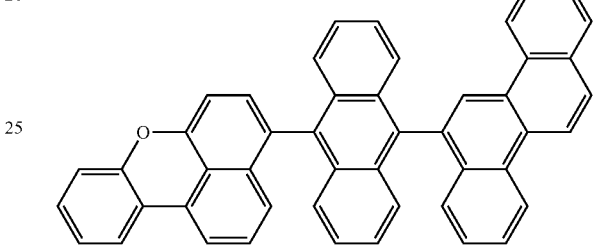
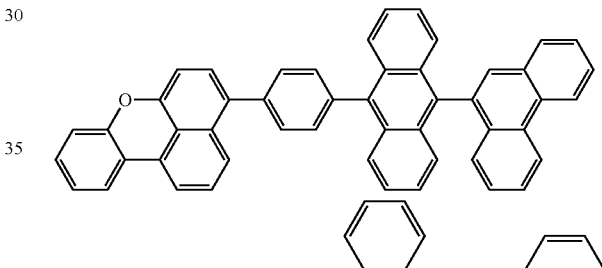
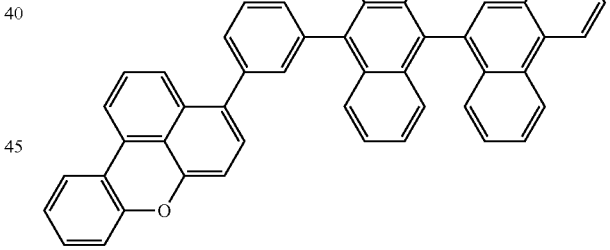
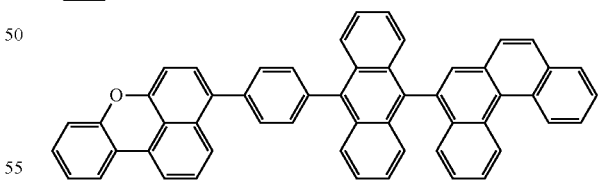
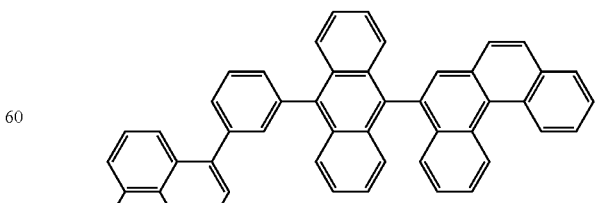

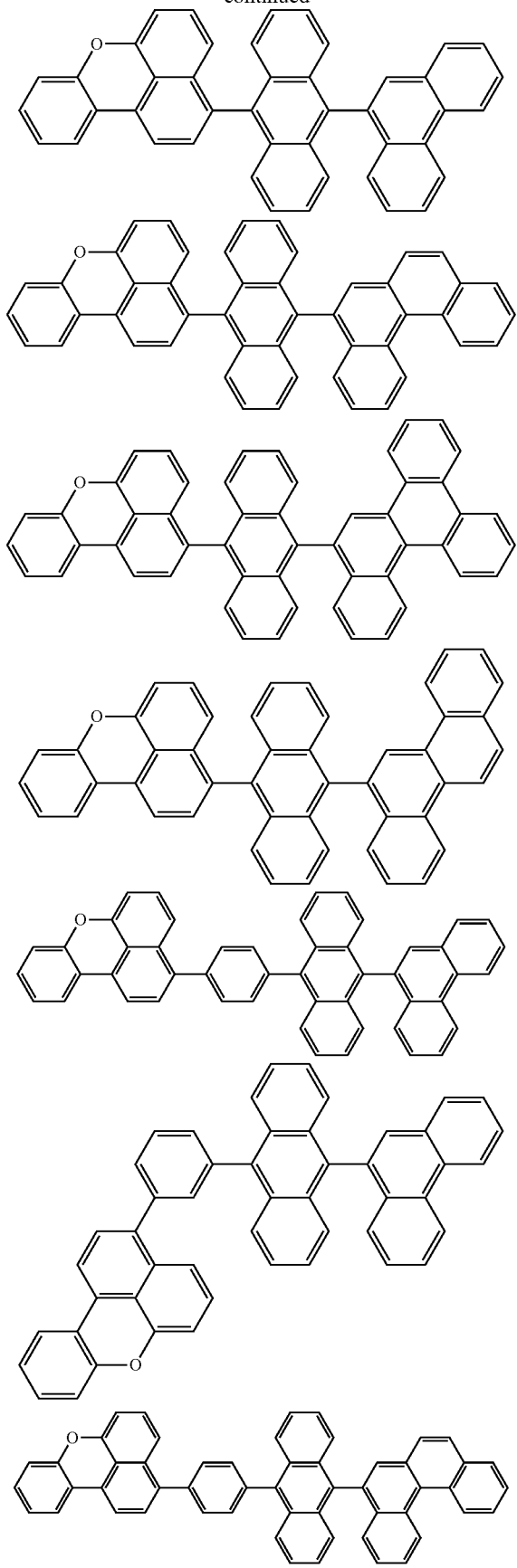

95
-continued
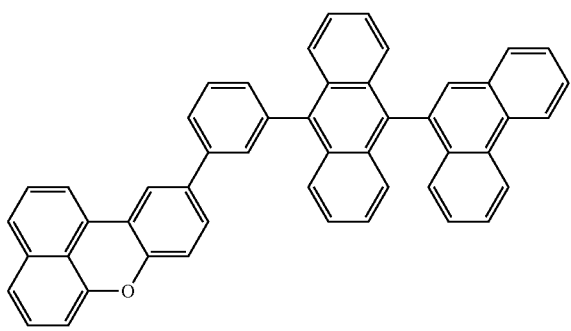
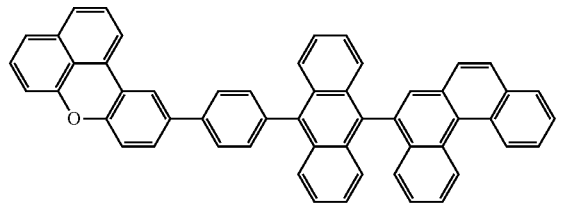
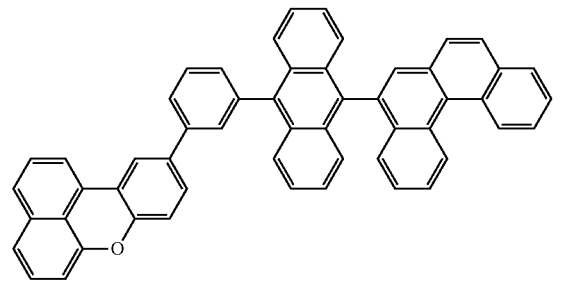
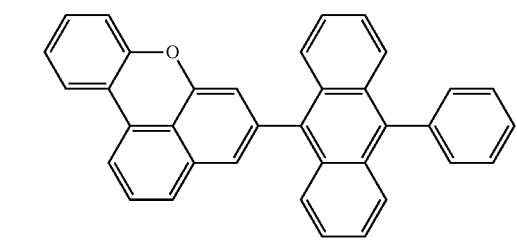
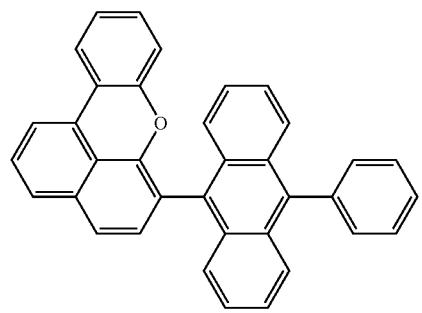
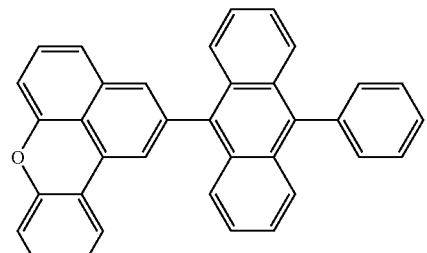
96
-continued
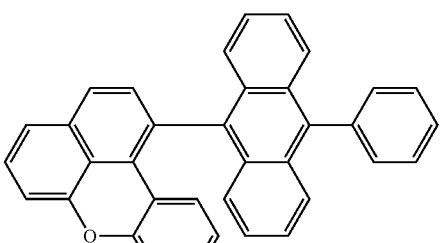
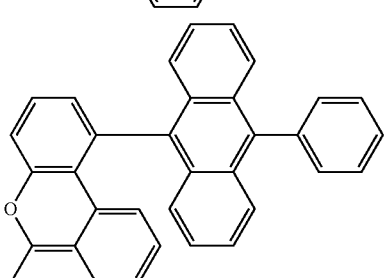
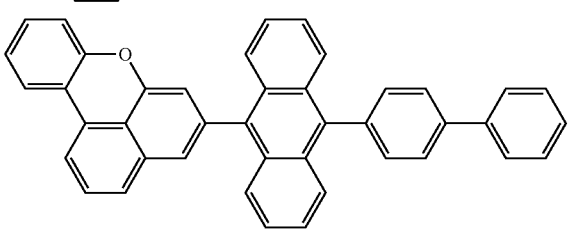
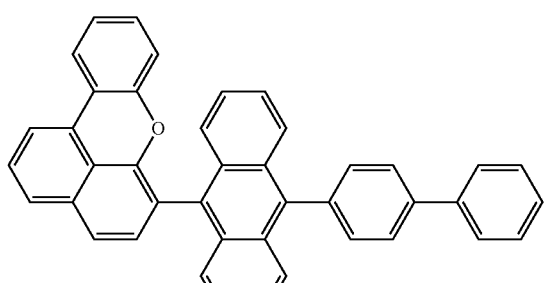
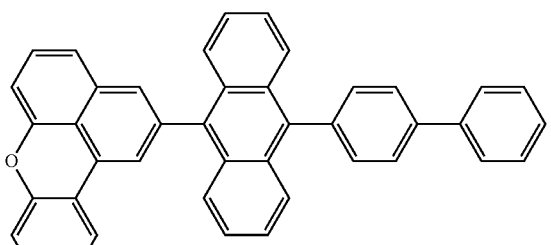
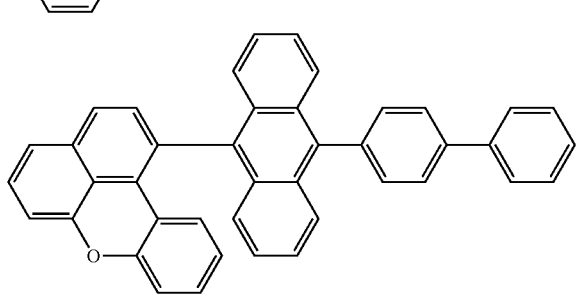

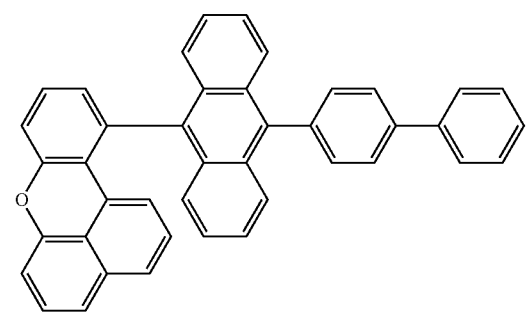
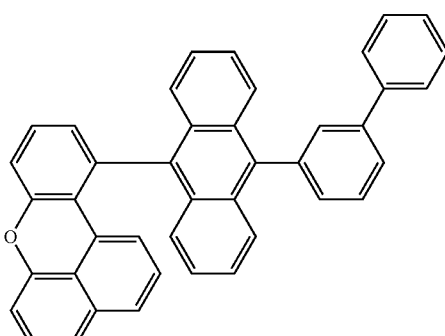
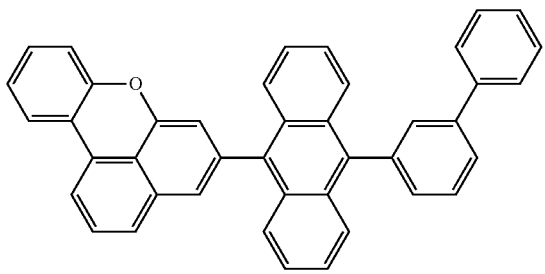
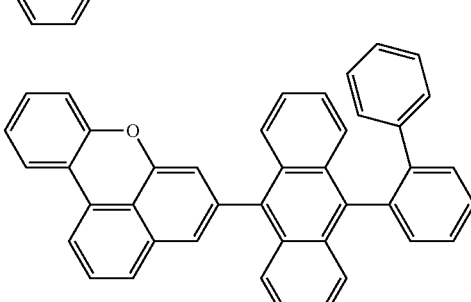
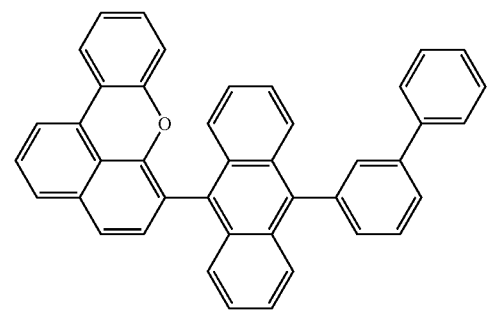
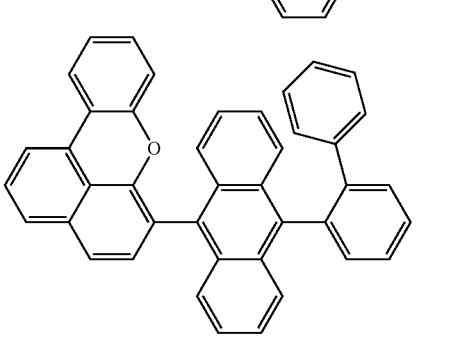
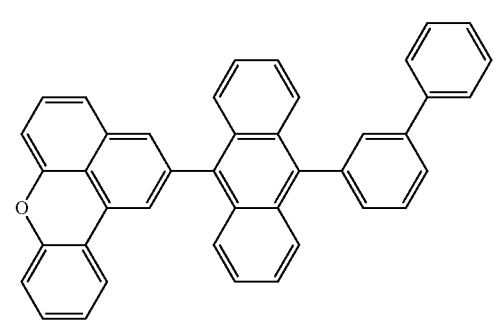
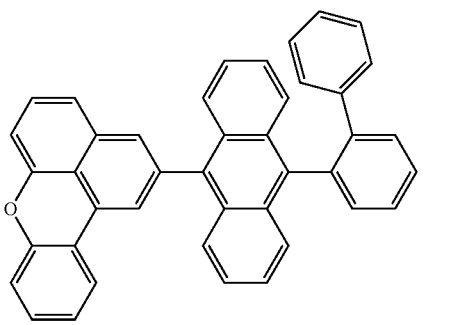
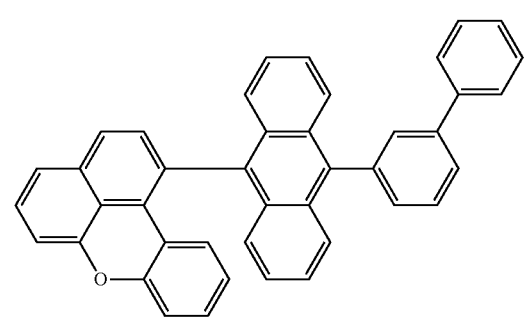
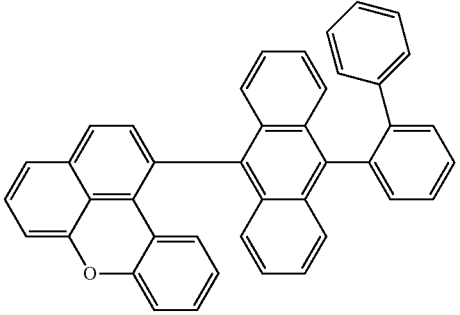

99
-continued
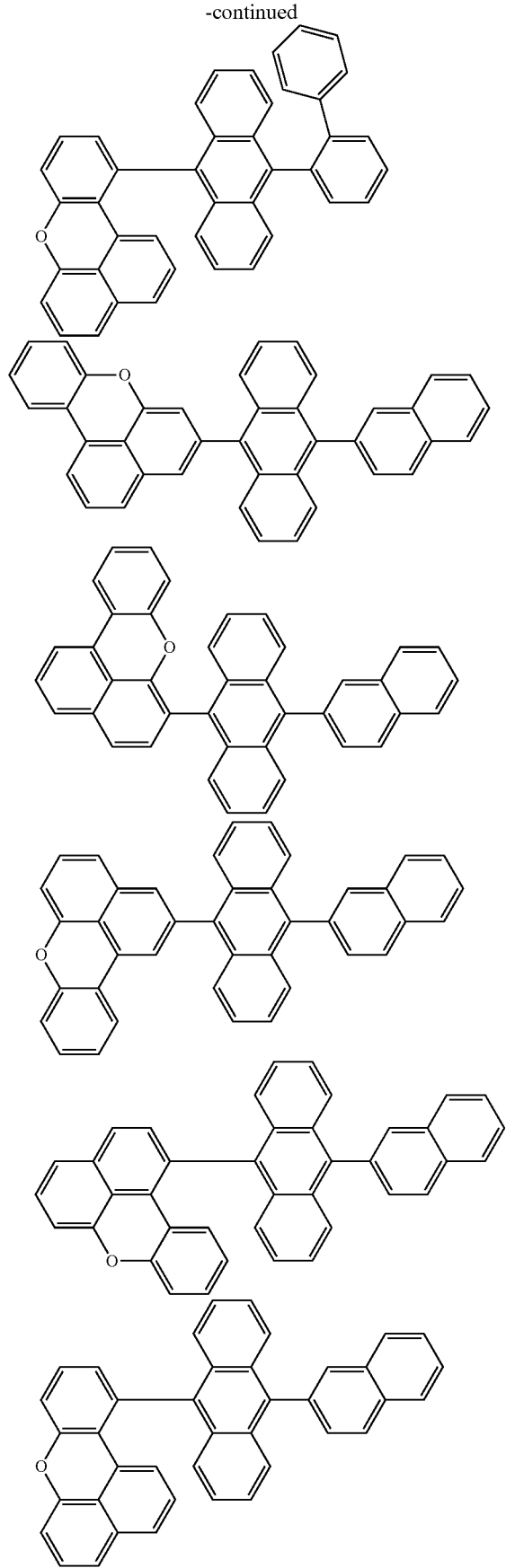
100
-continued
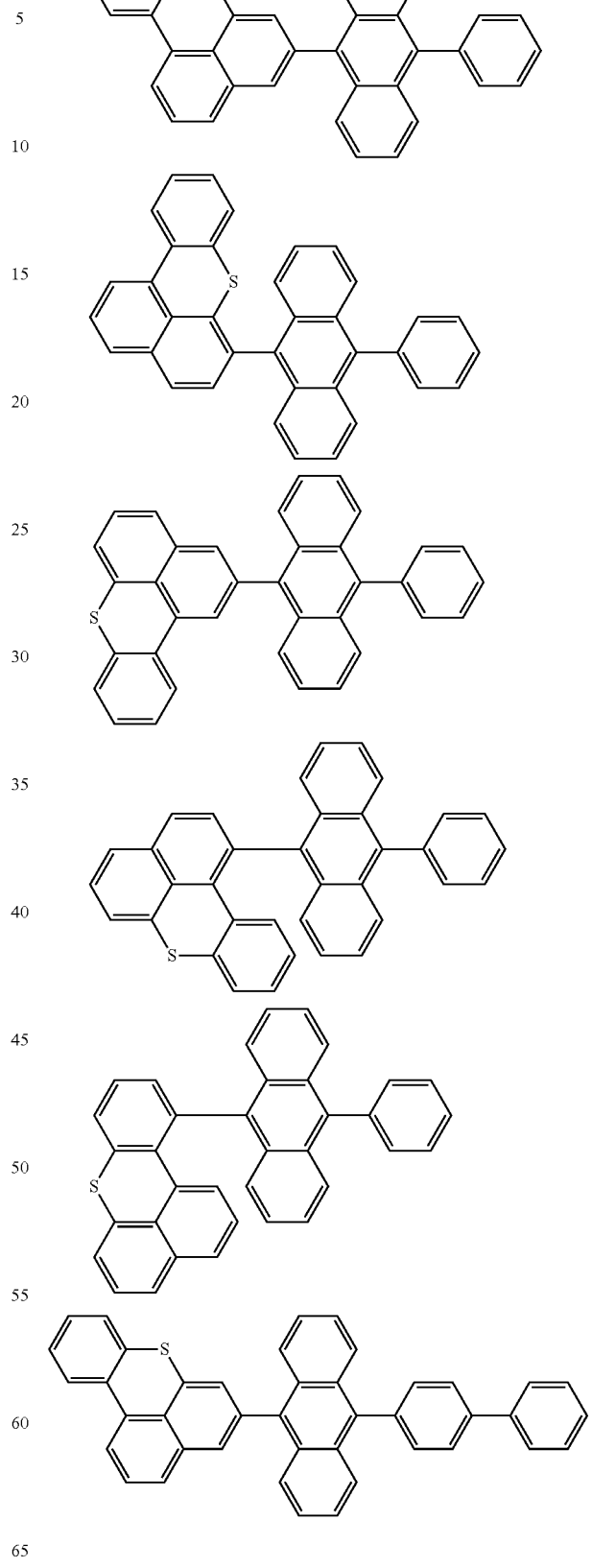

101
-continued
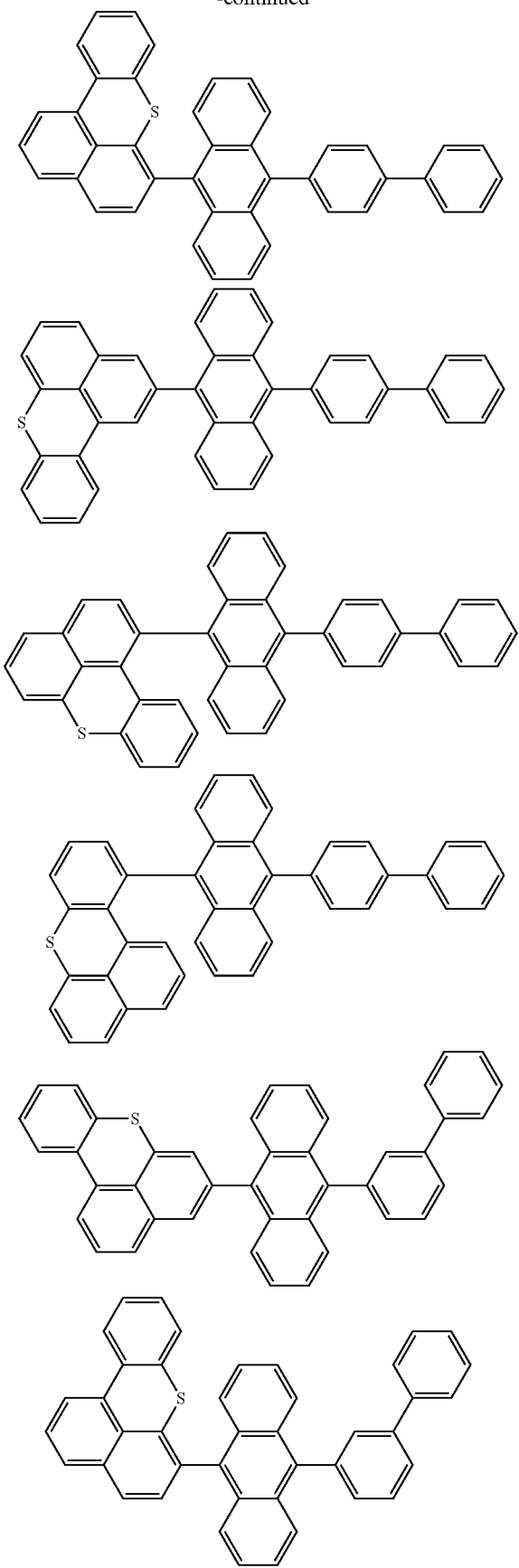
102
-continued
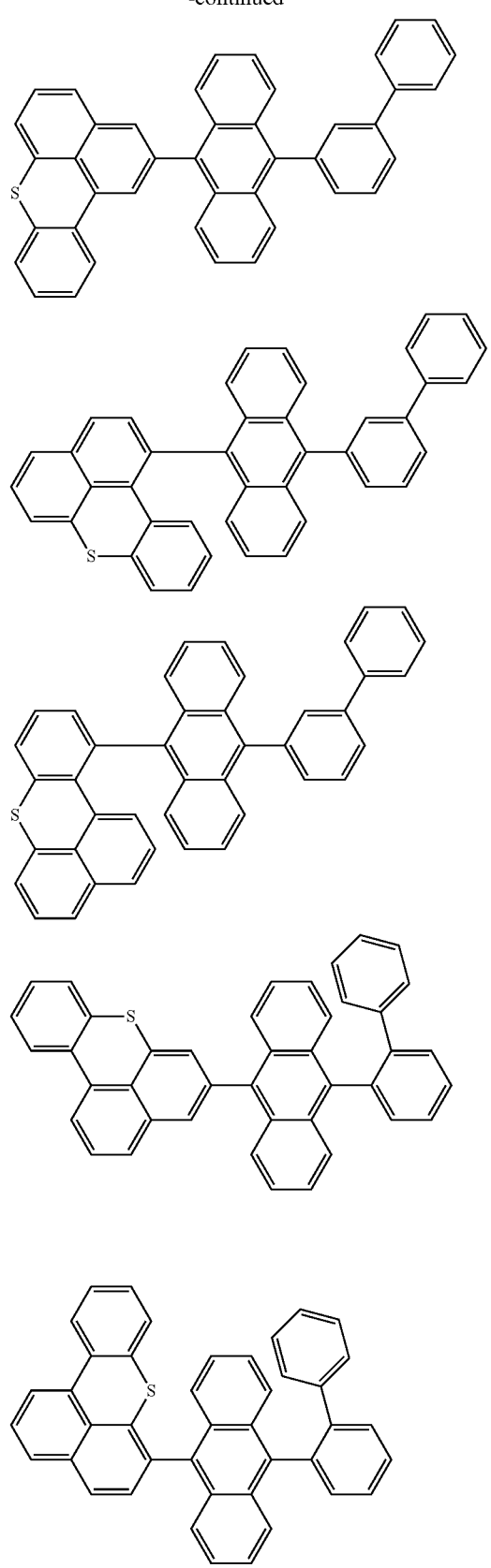

103
-continued
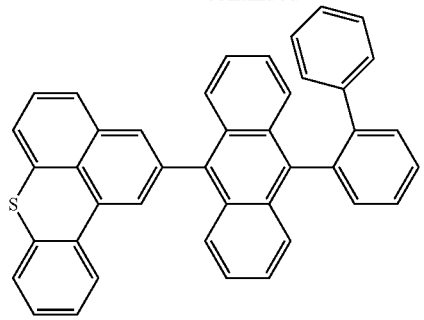
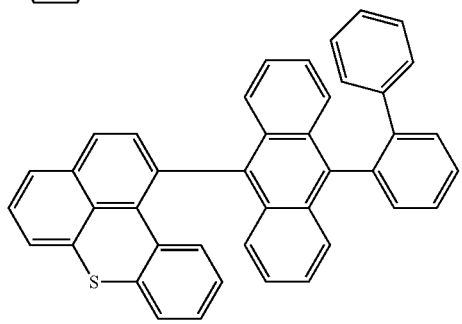
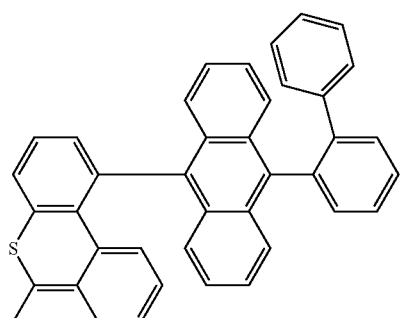
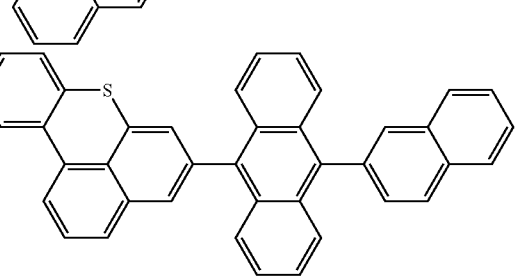
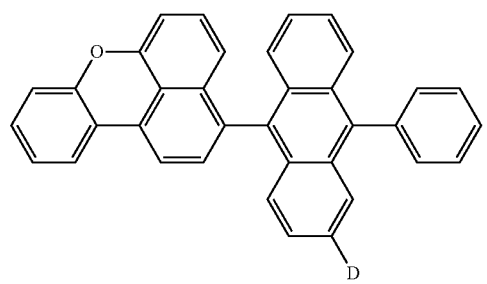
104
-continued
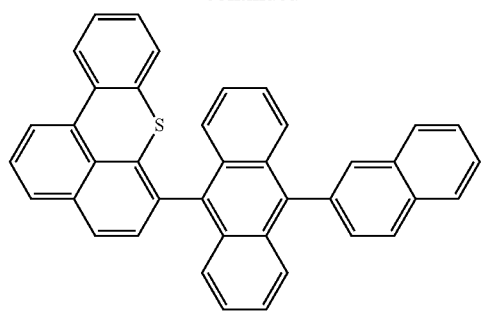
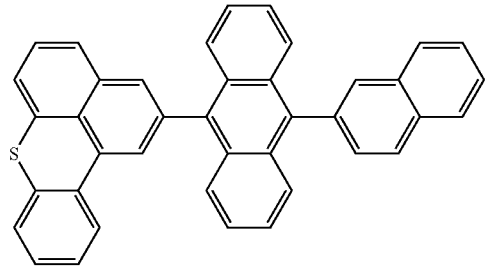
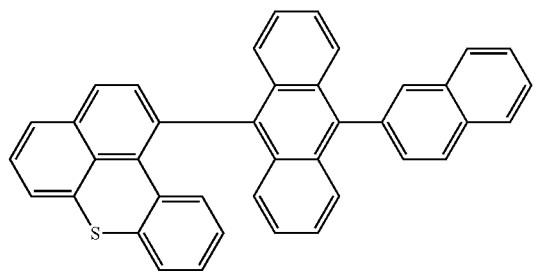
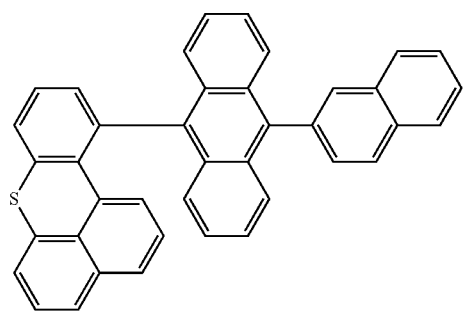
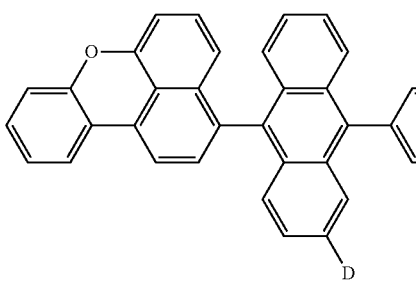

105
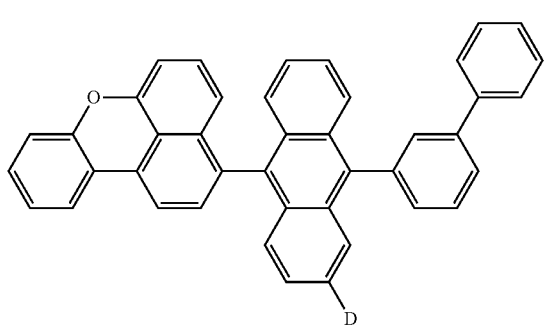
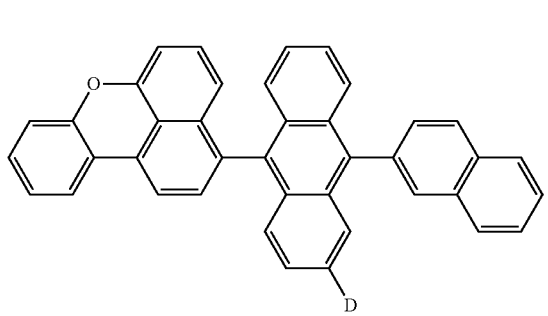
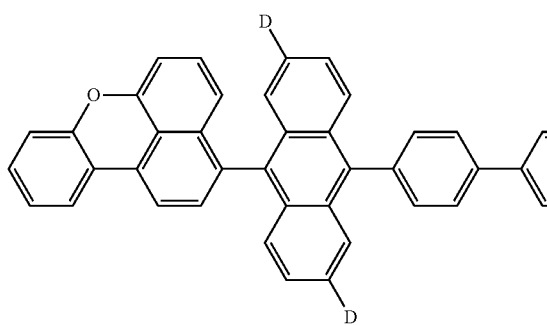
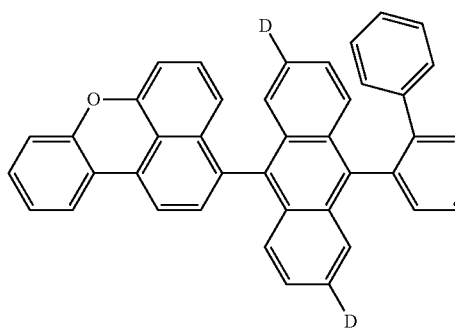
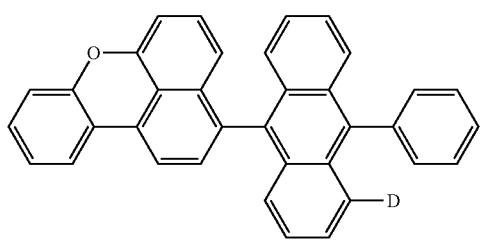
106
-continued
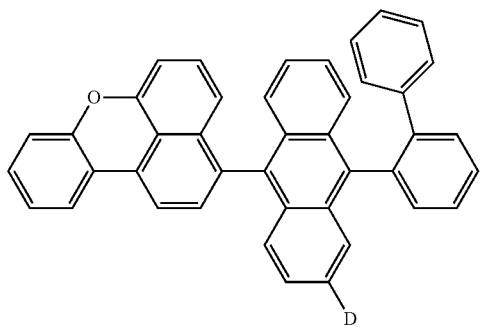
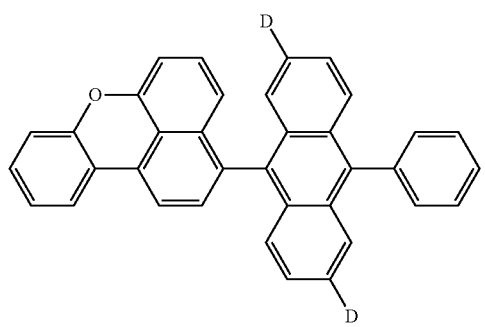
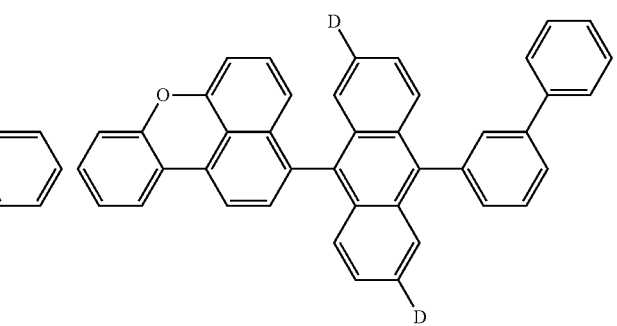
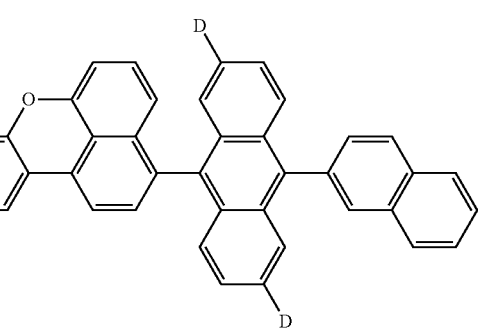
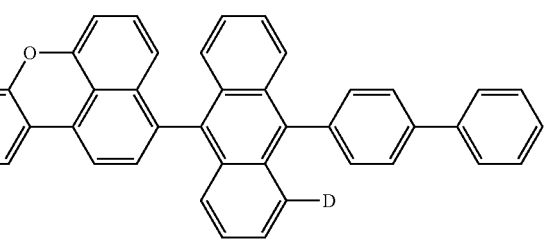

-continued
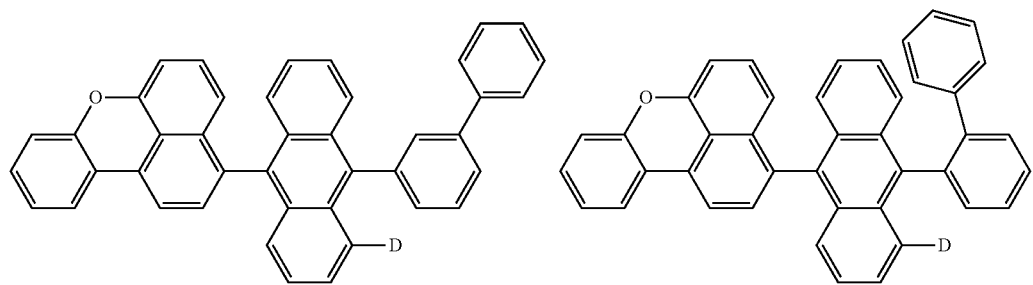
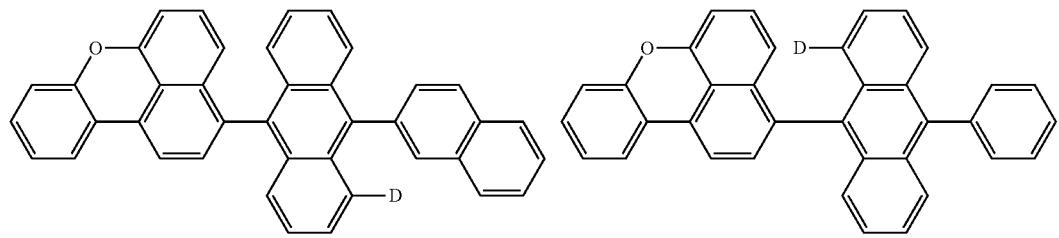
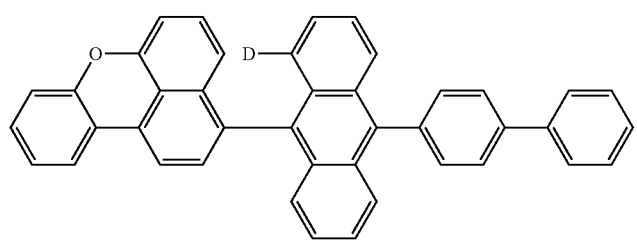
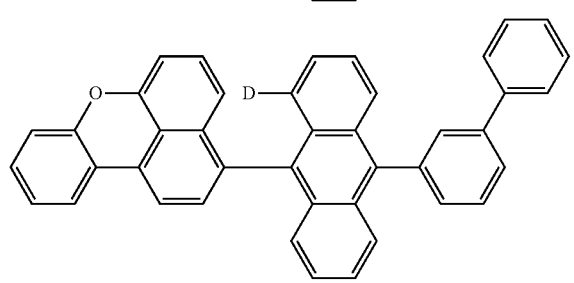
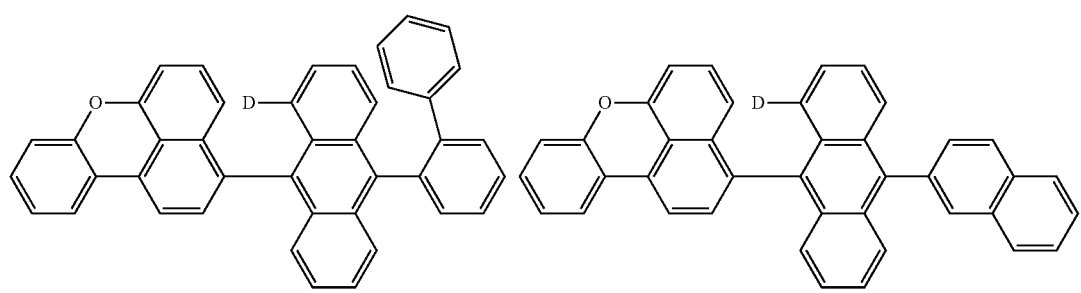
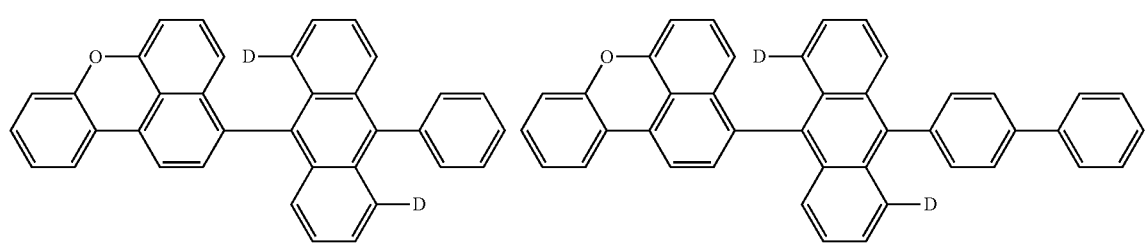

109 110
-continued
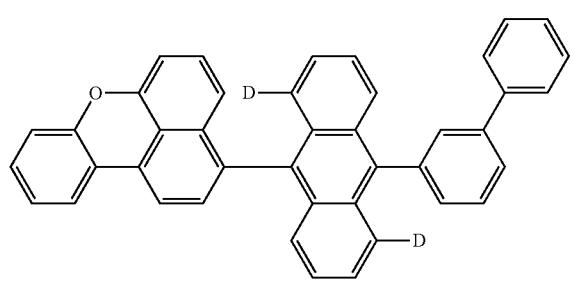
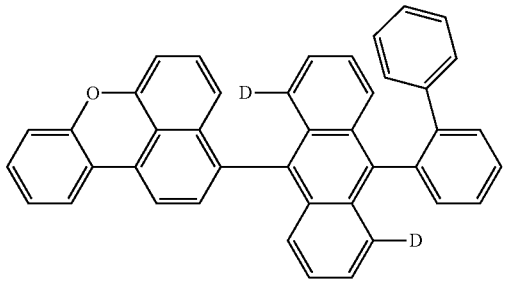
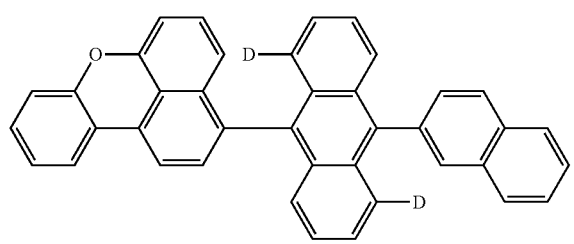
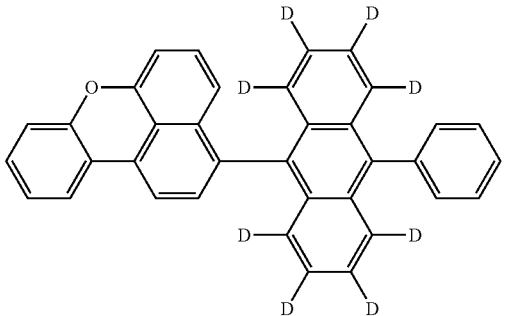
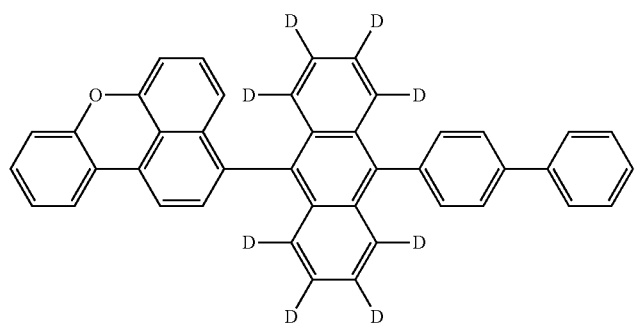
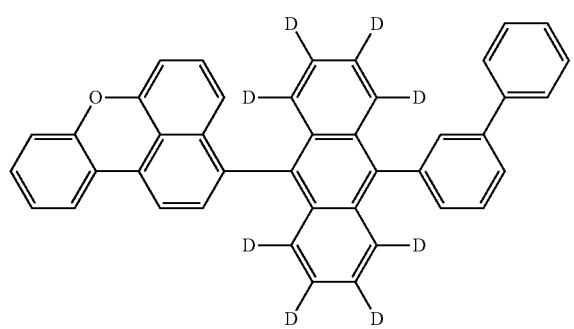
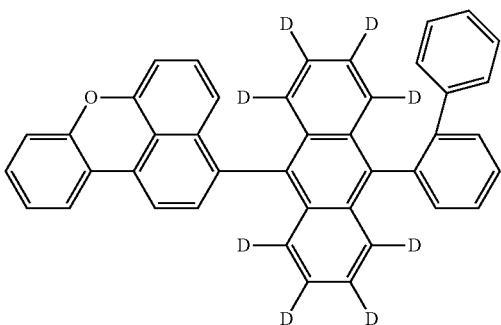
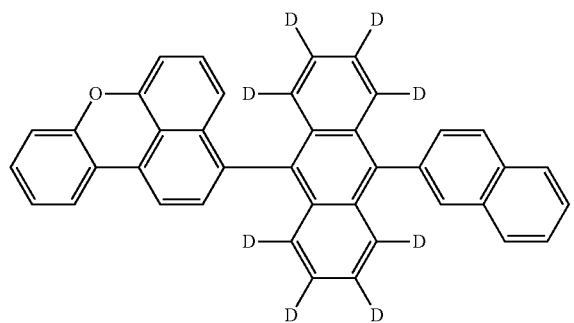

111 112
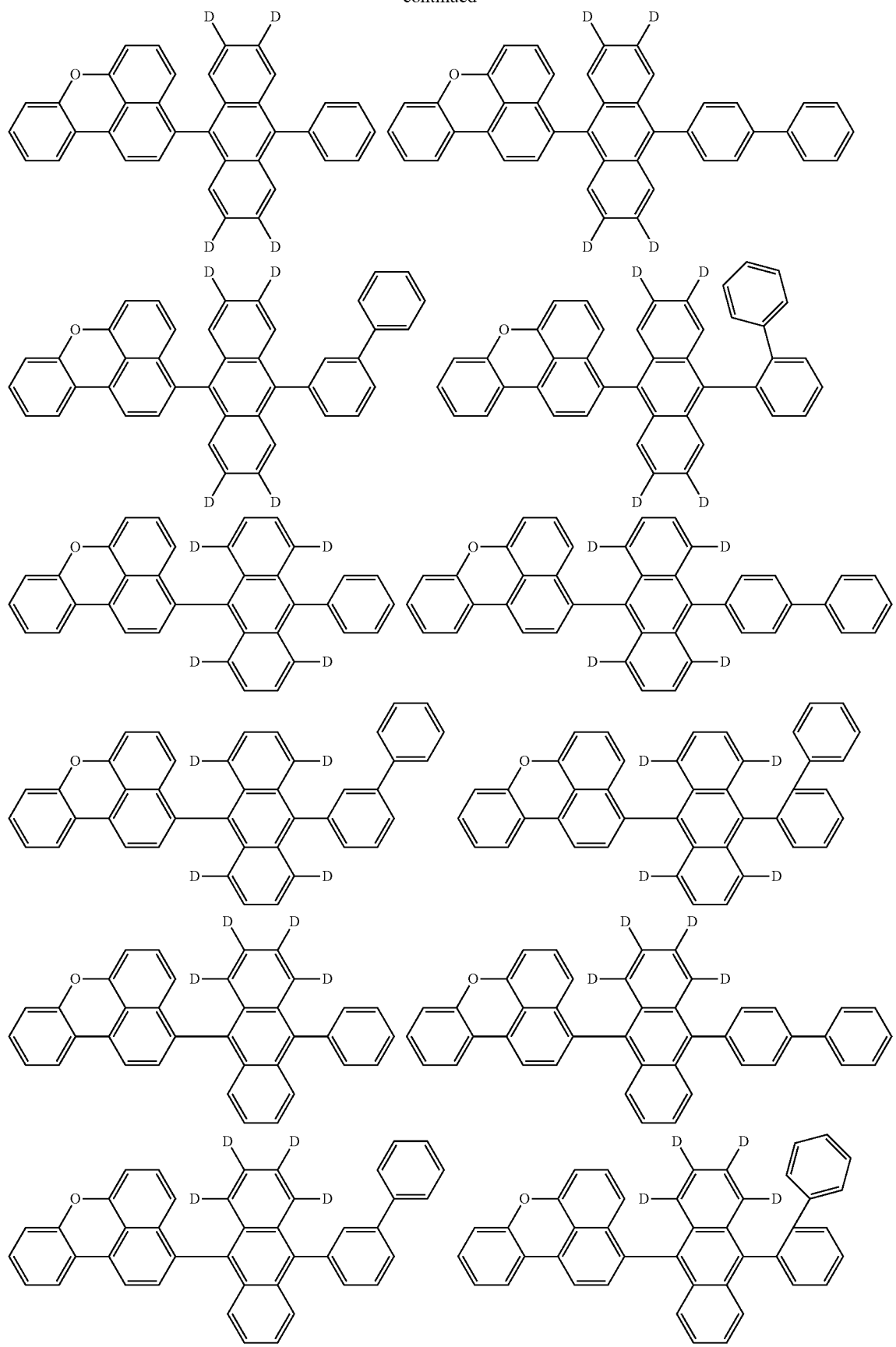

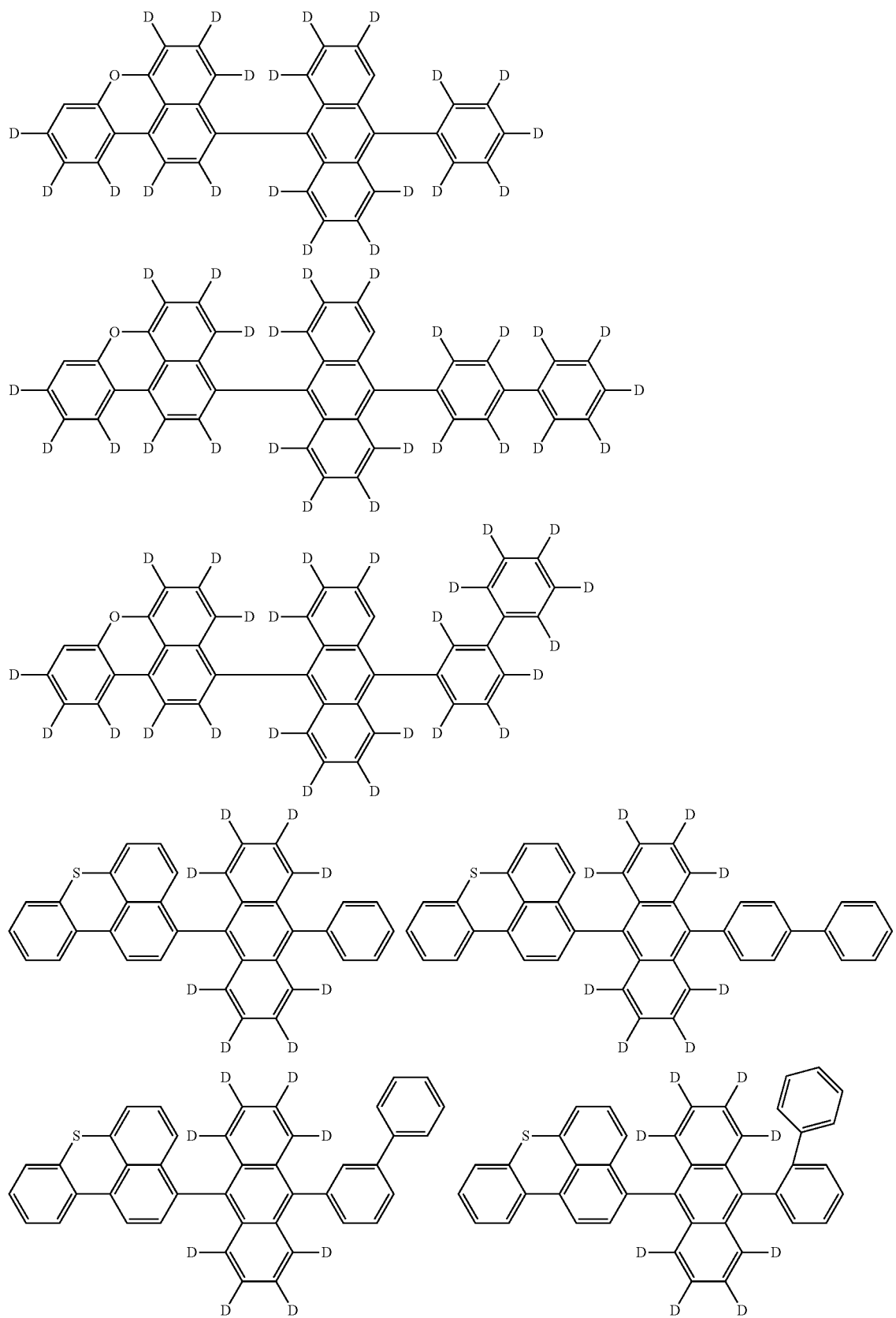

-continued
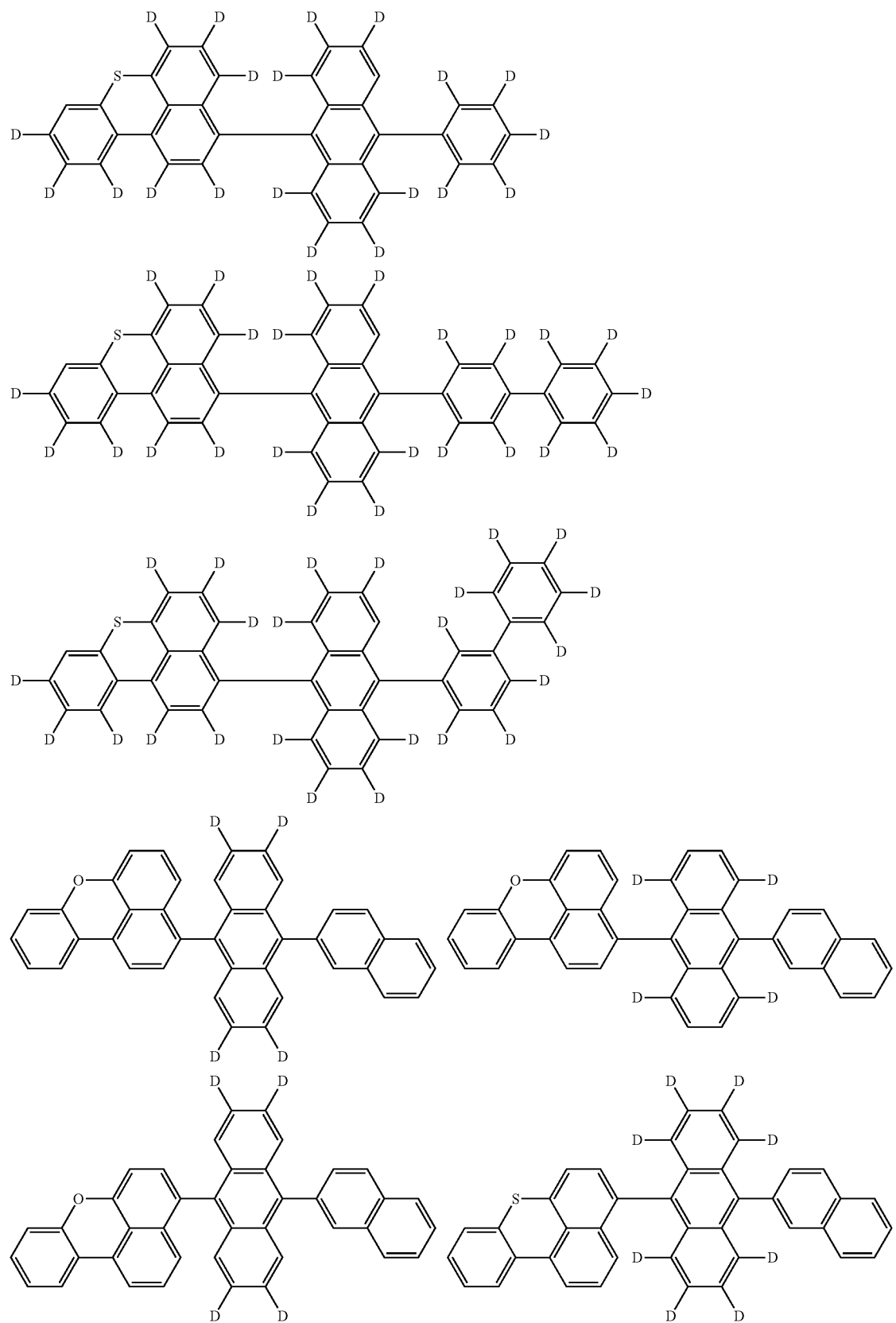

-continued
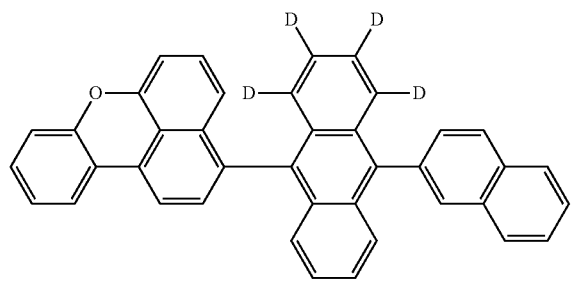
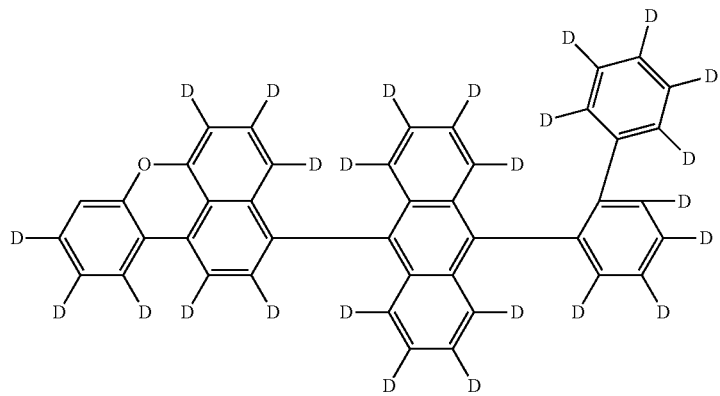
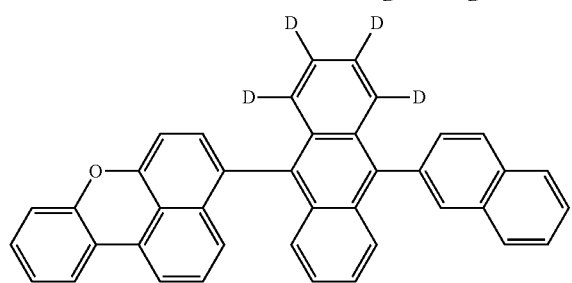
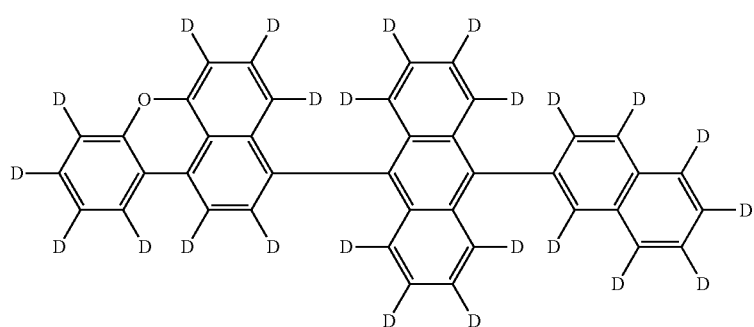
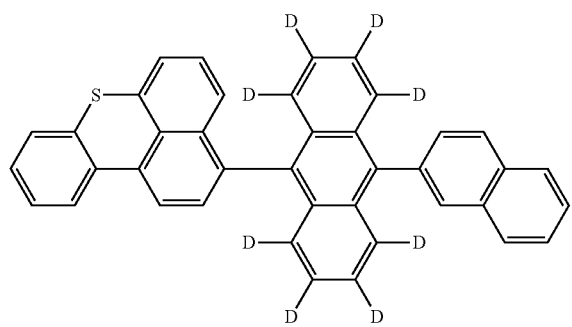

-continued
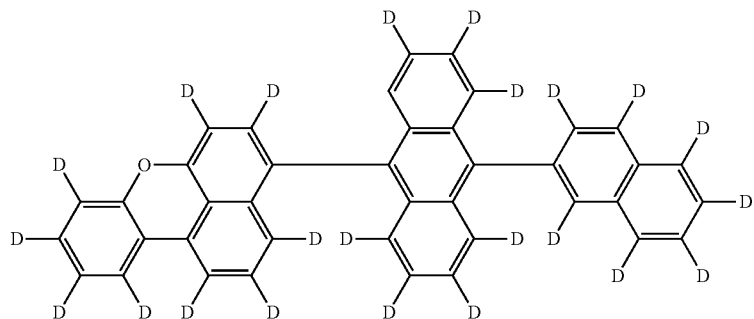
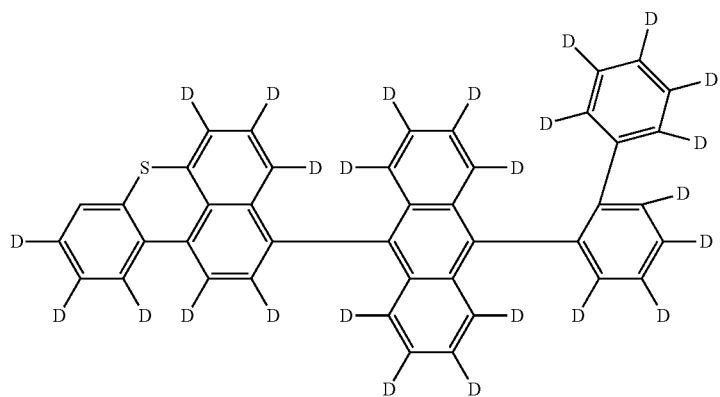
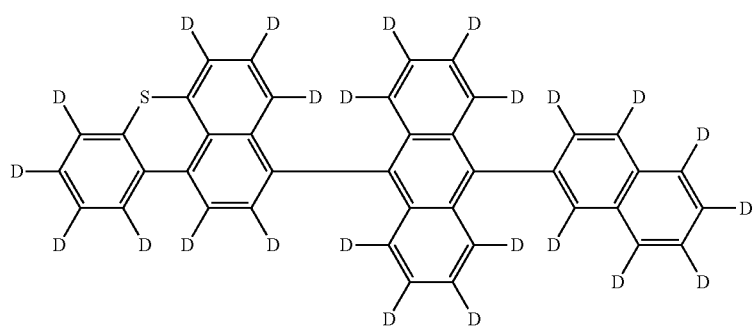
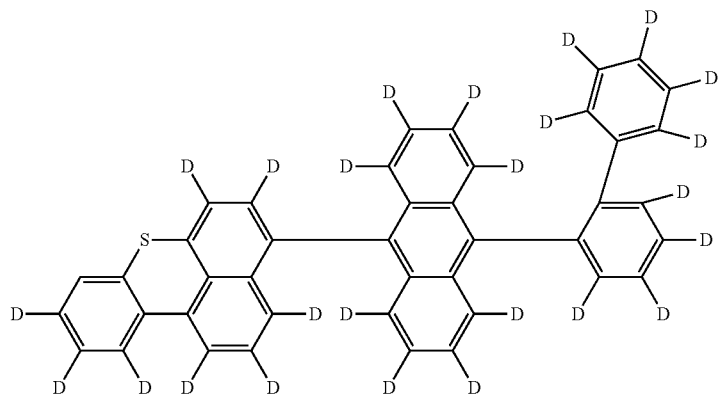

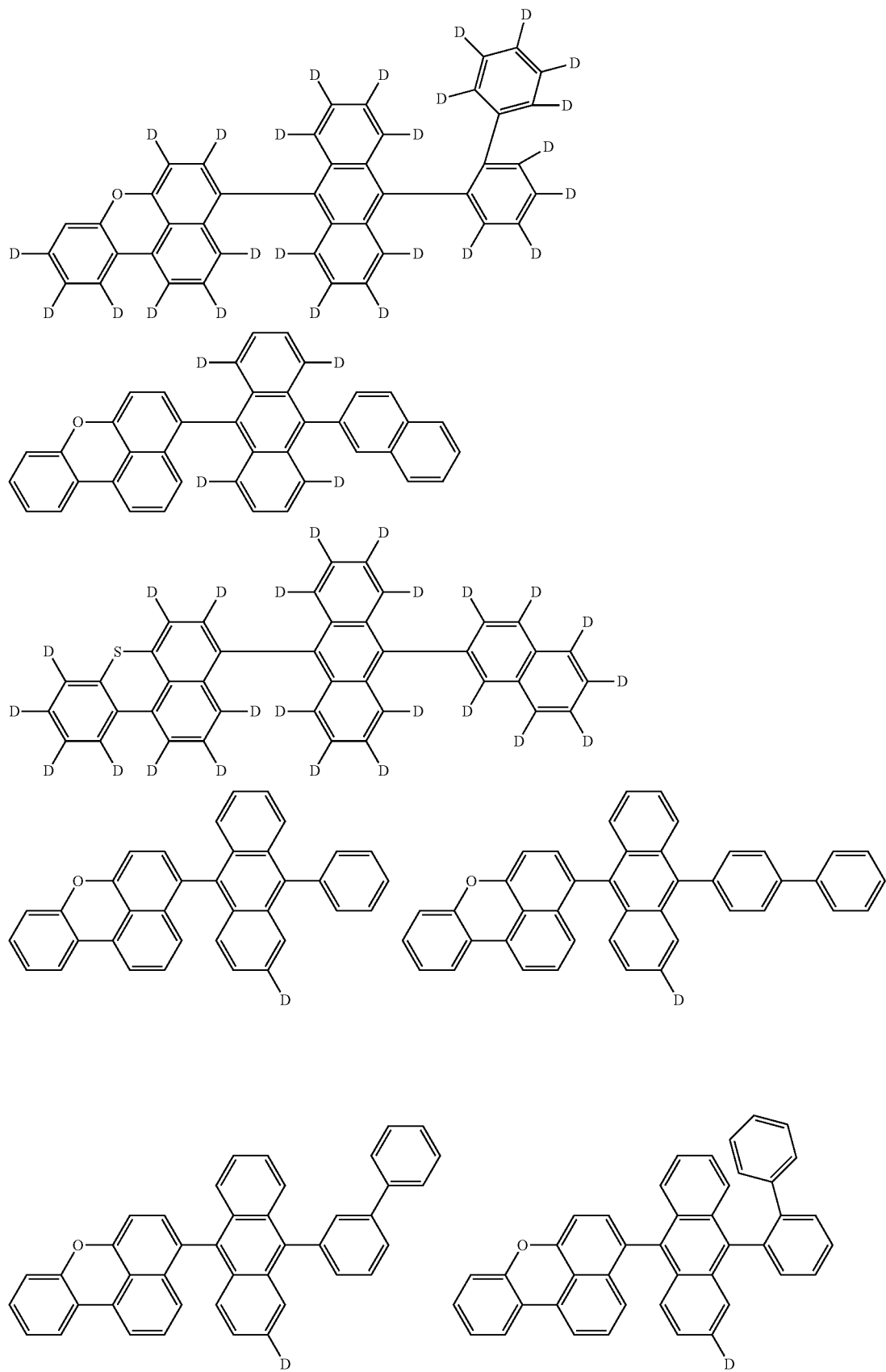

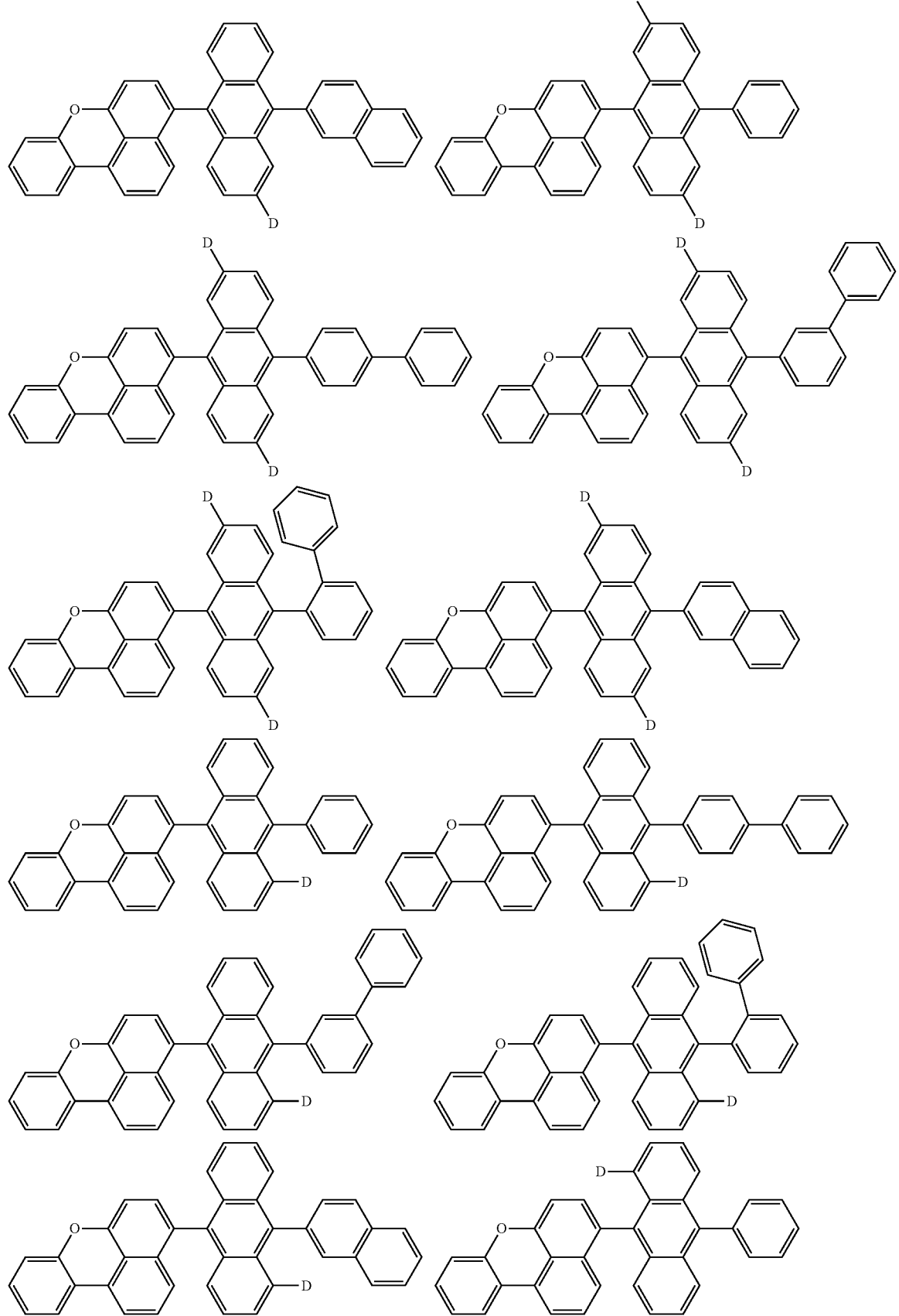

-continued
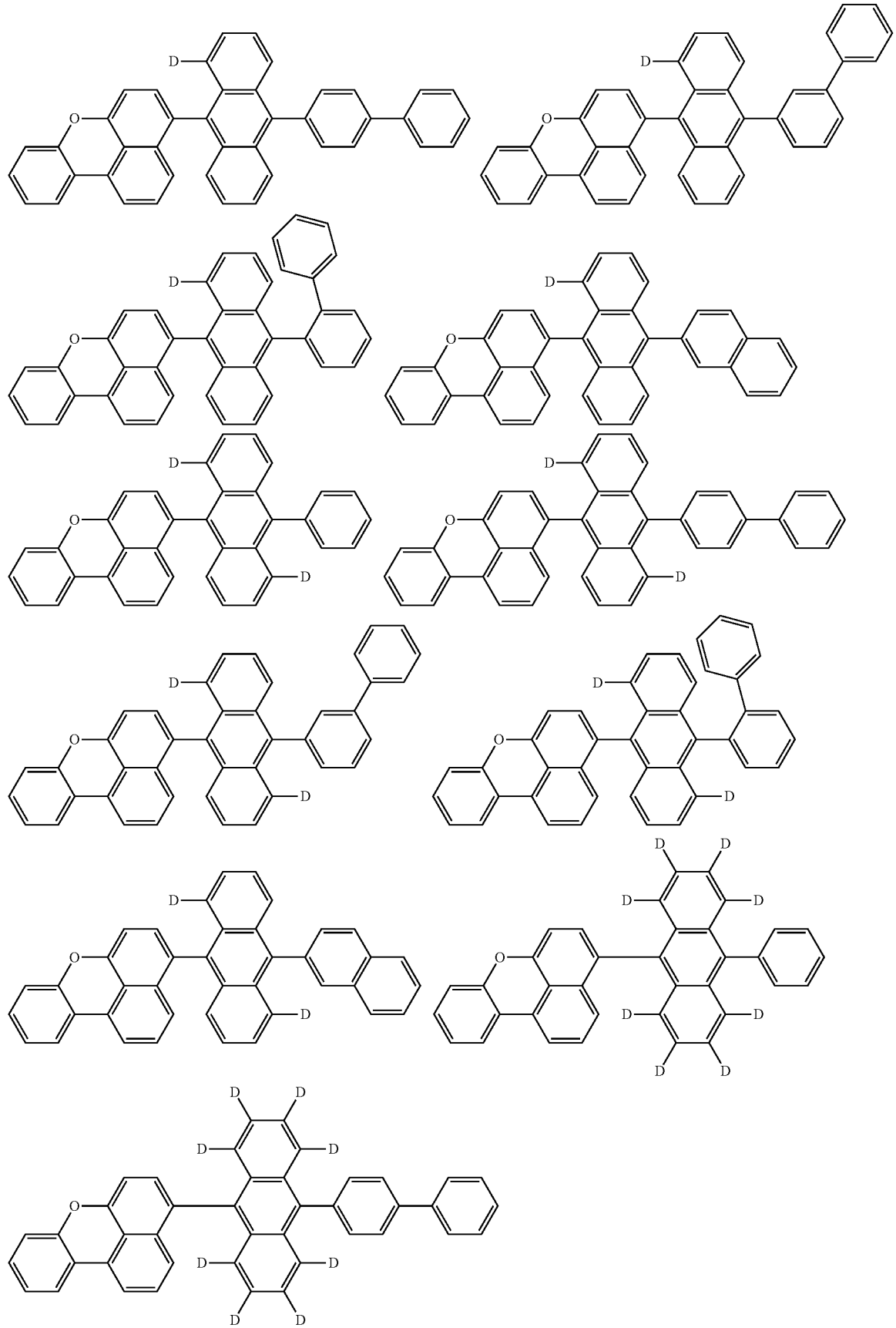

-continued
127 128
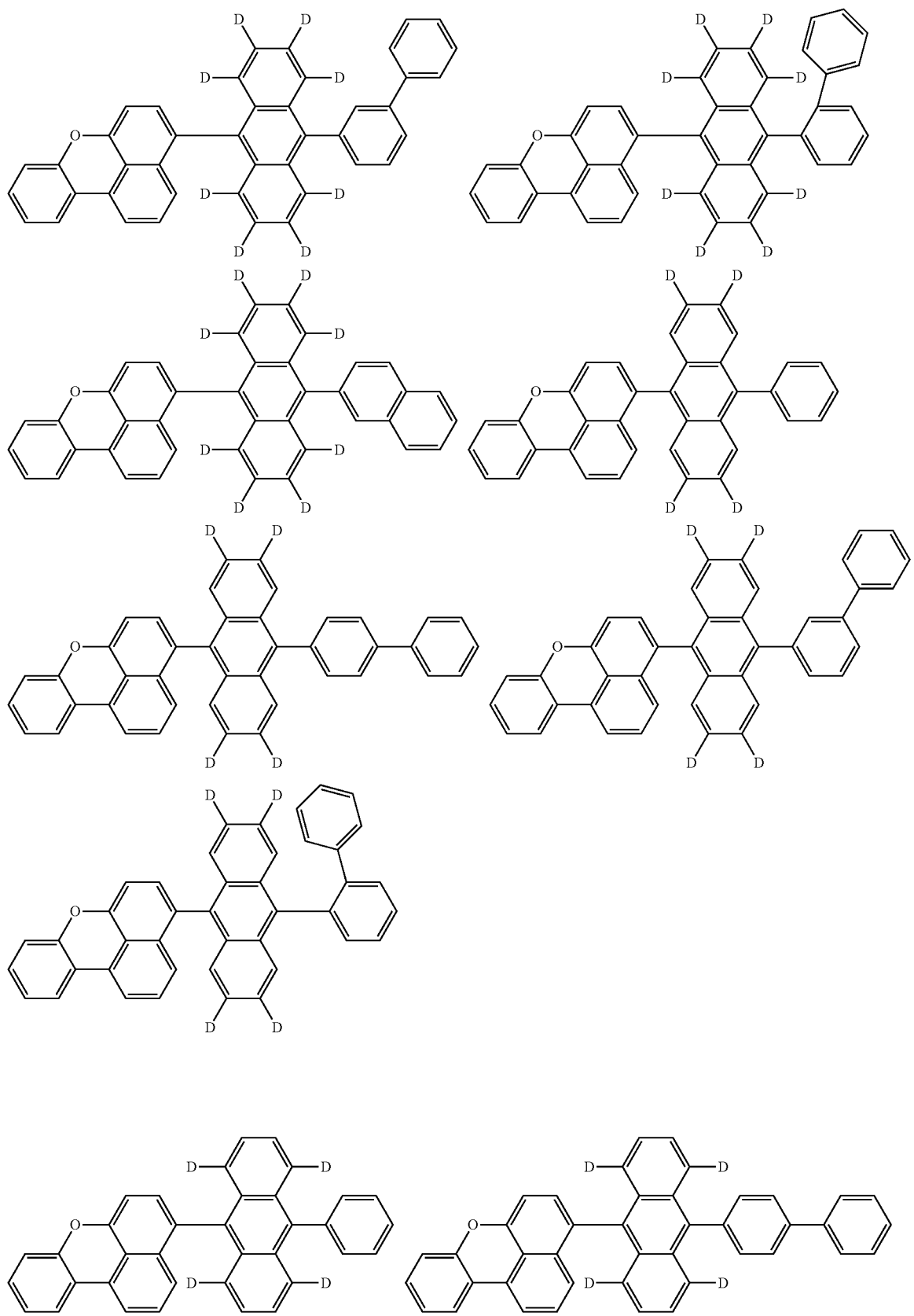

-continued
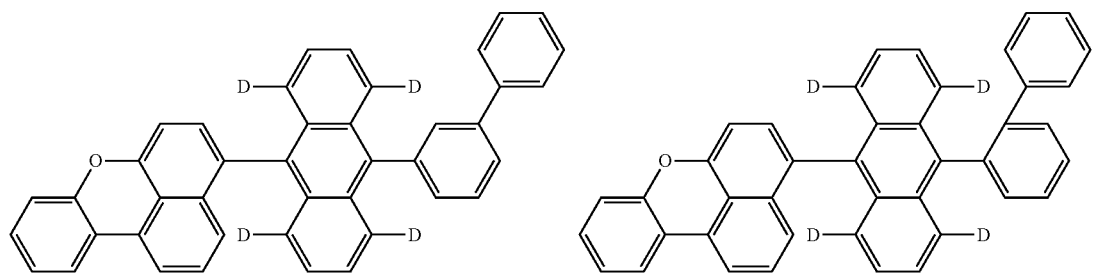
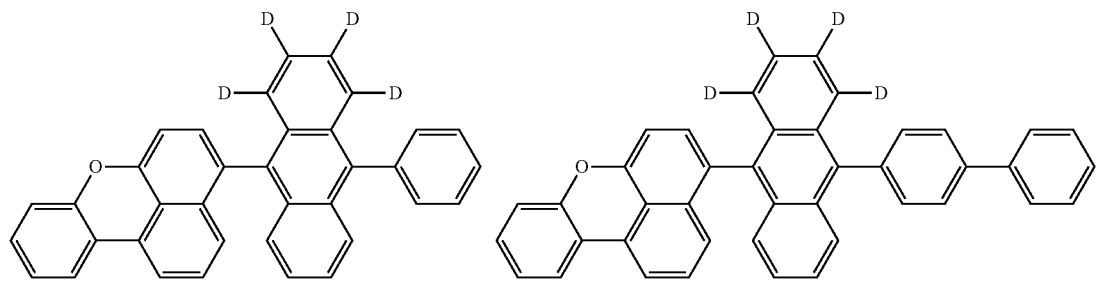
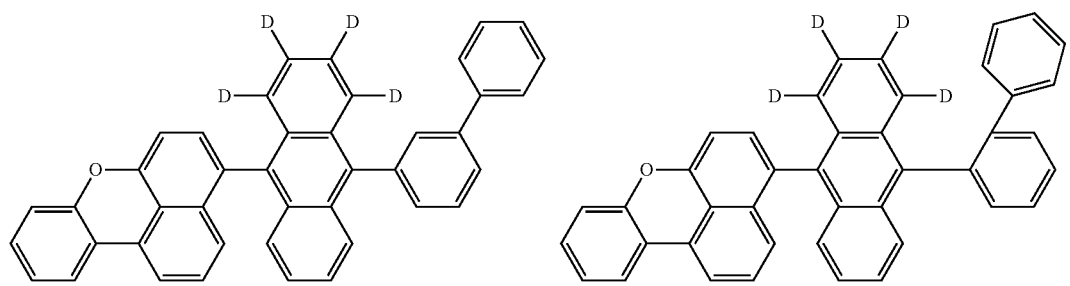
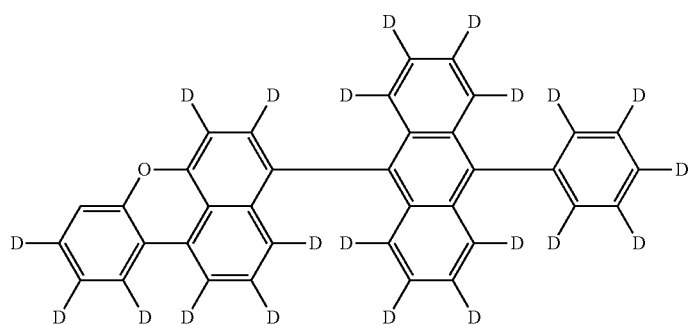
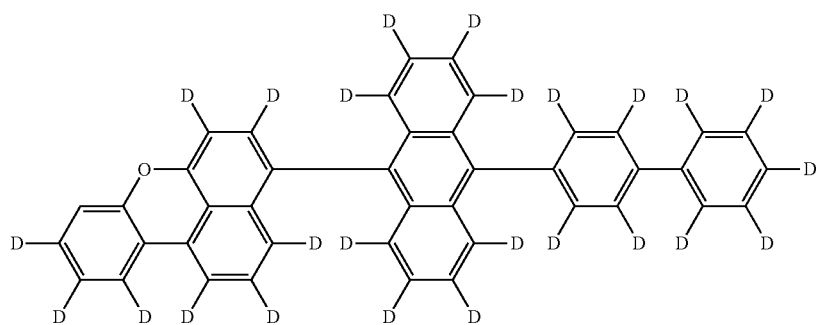

-continued
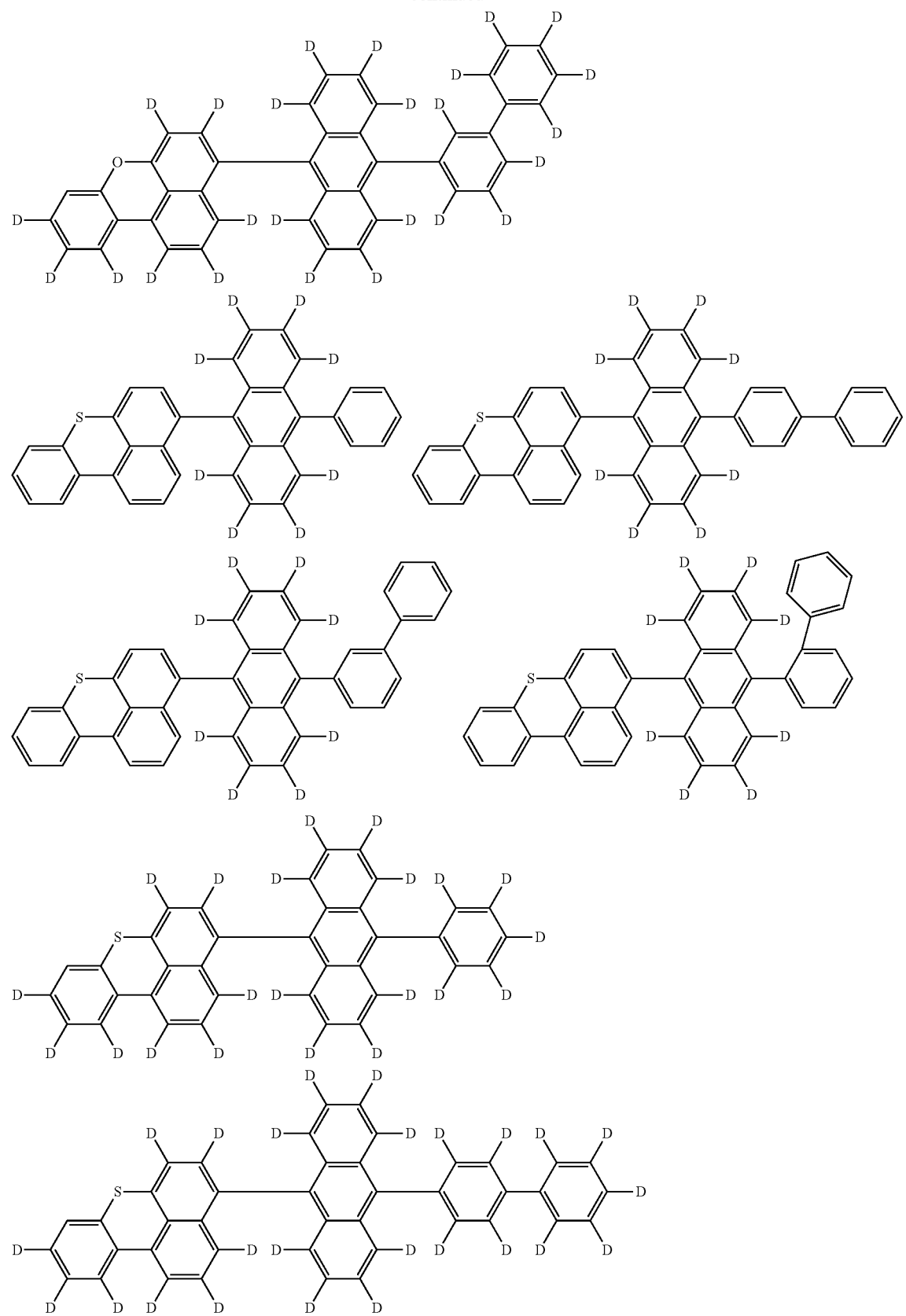

-continued
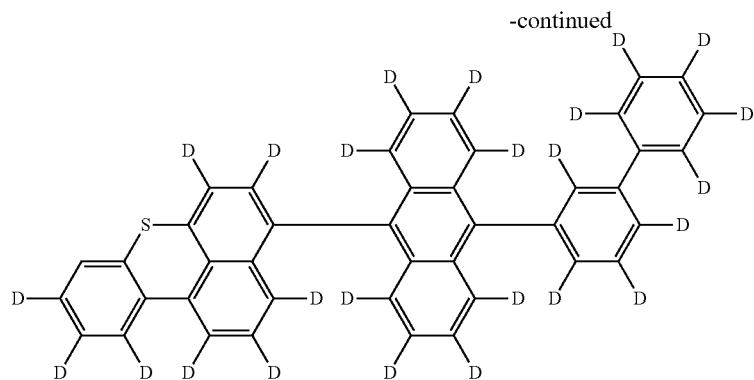
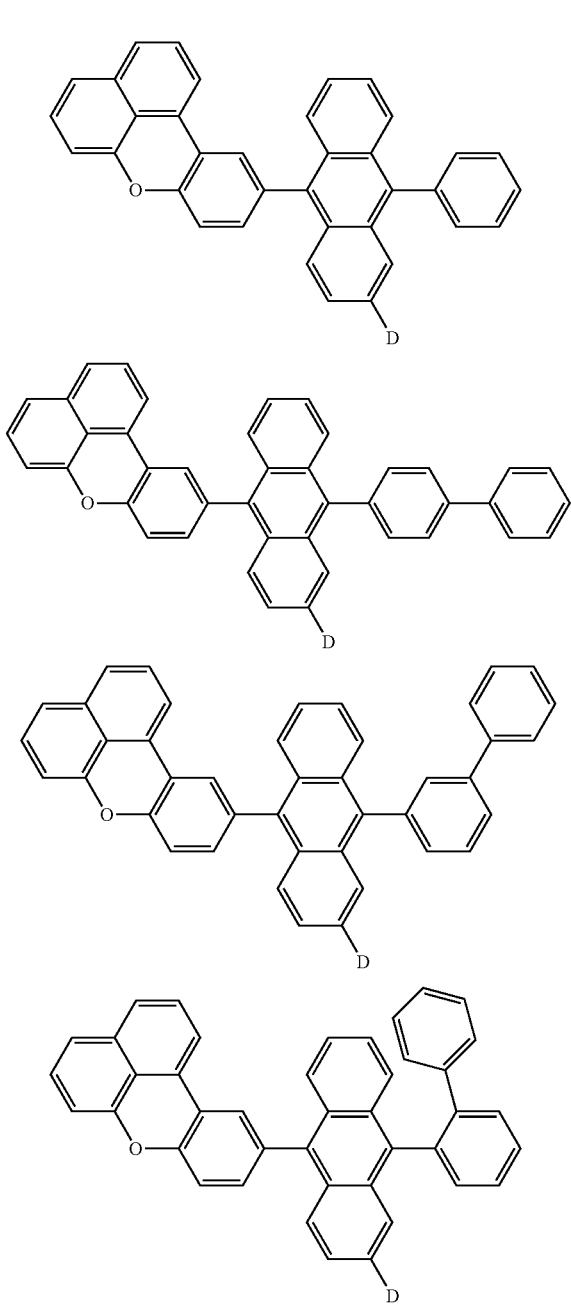
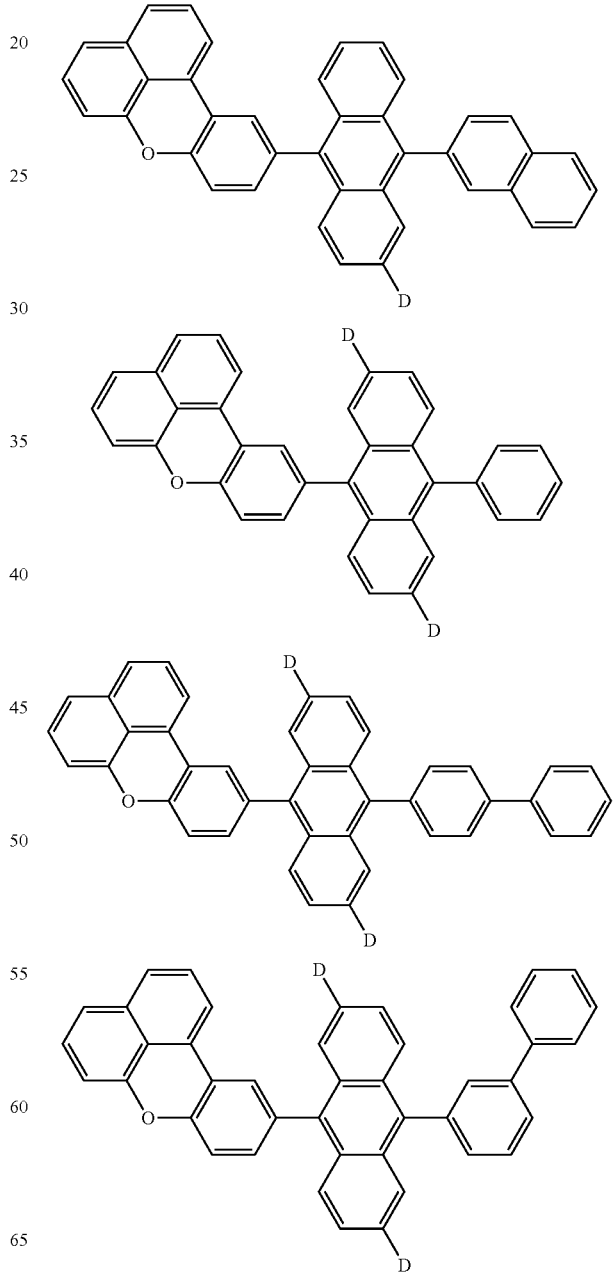

135
-continued
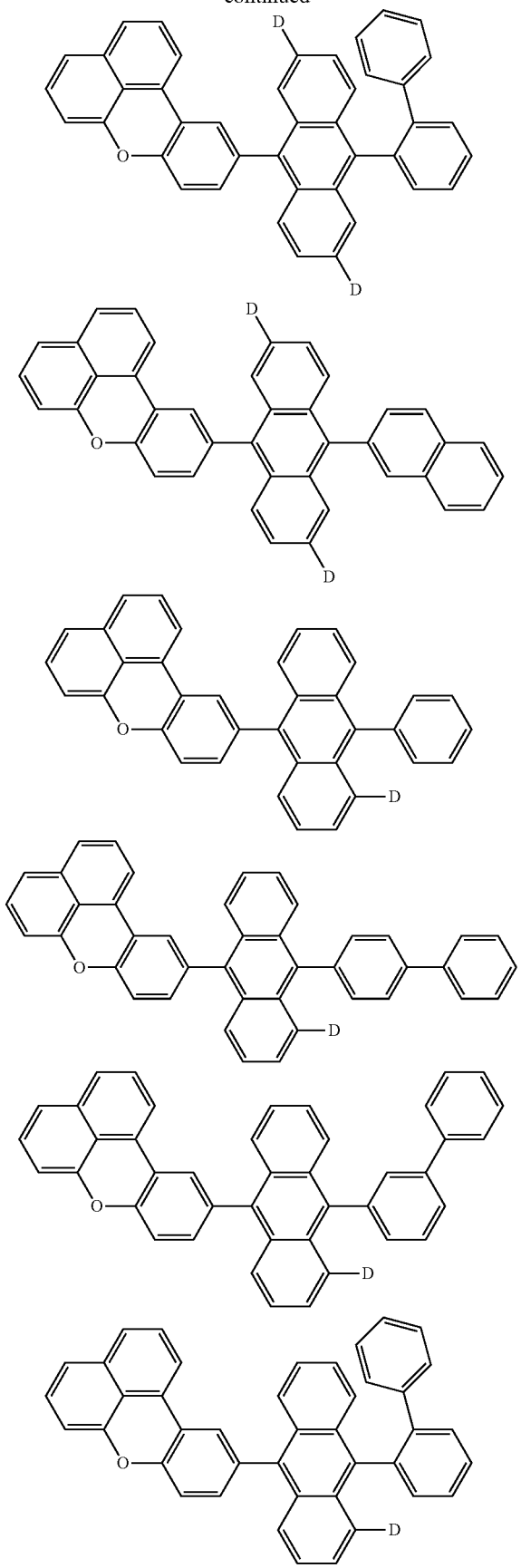
136
-continued
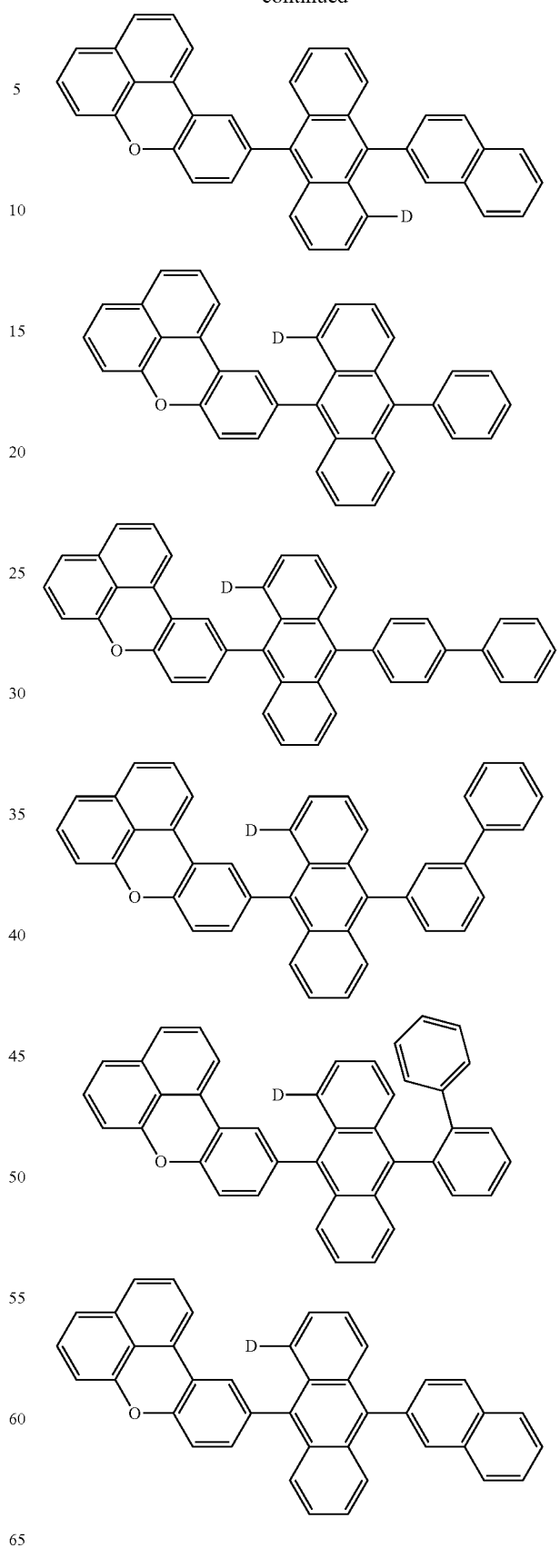

137
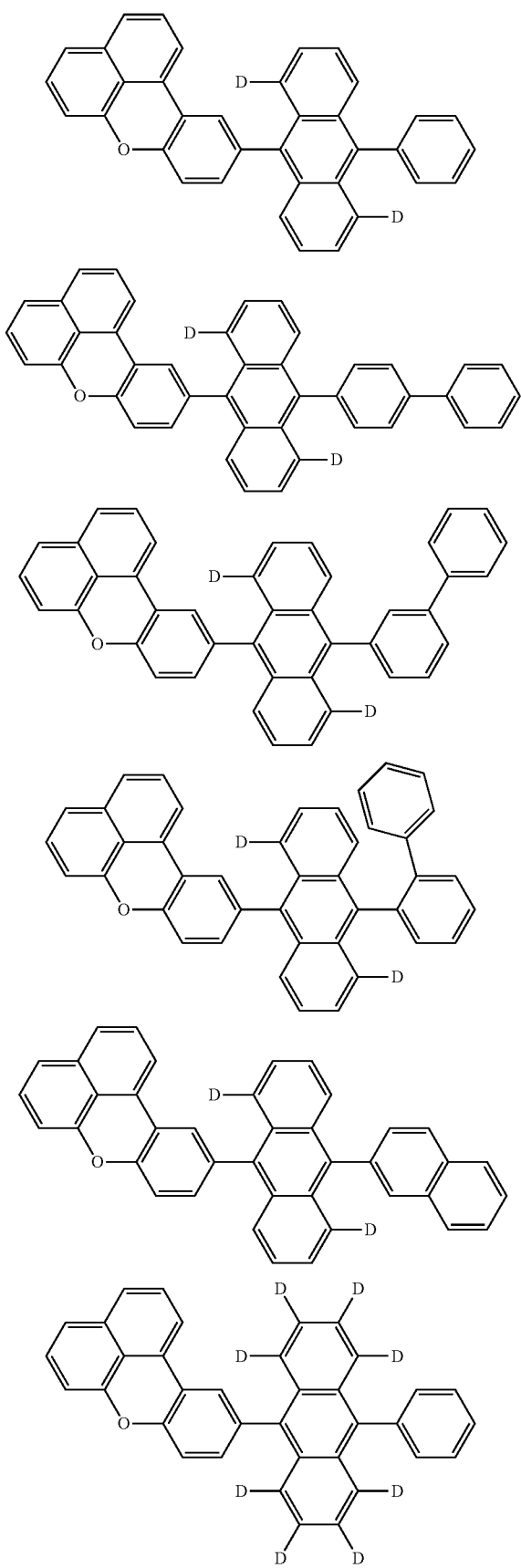
138
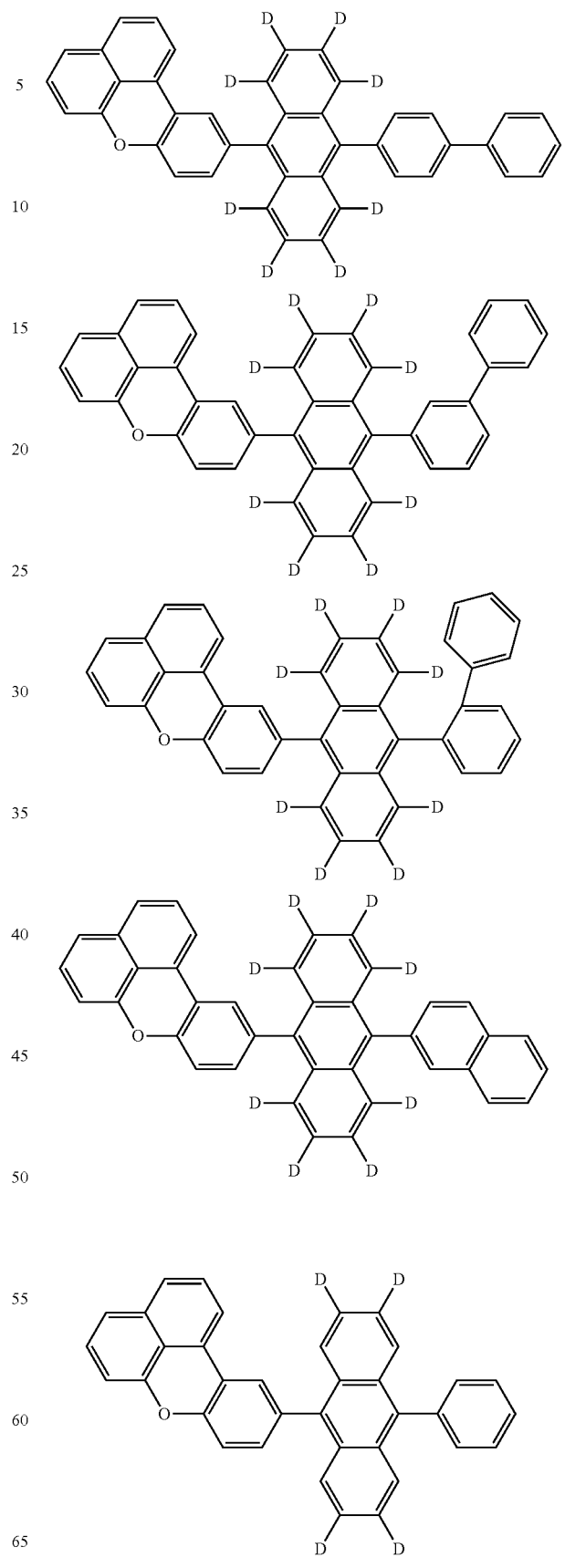

139
-continued
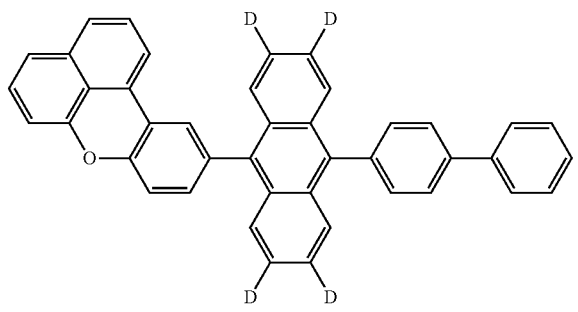
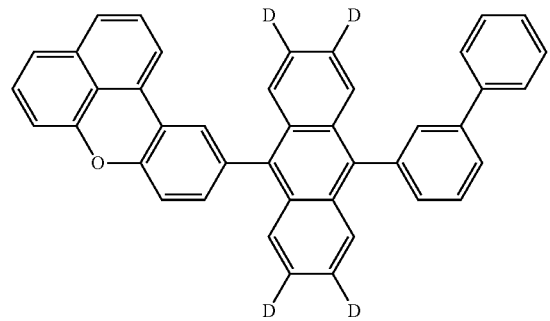
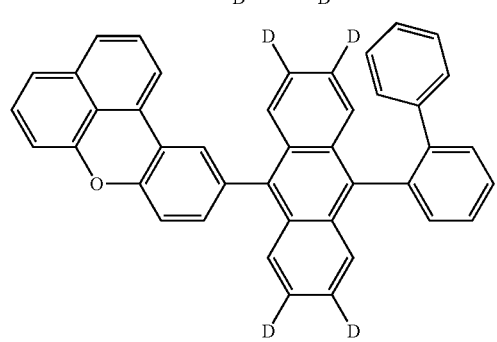
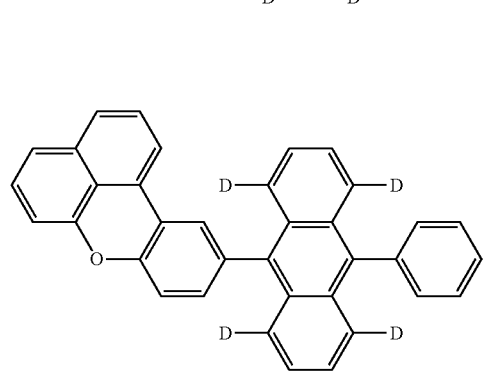
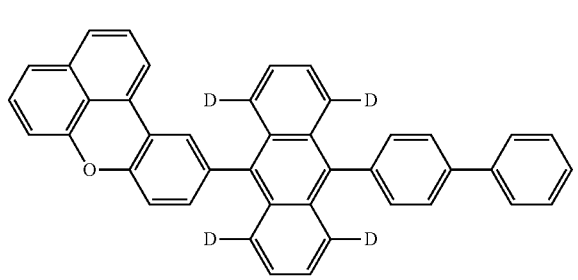
140
-continued
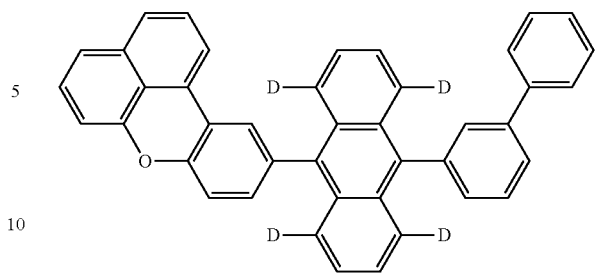
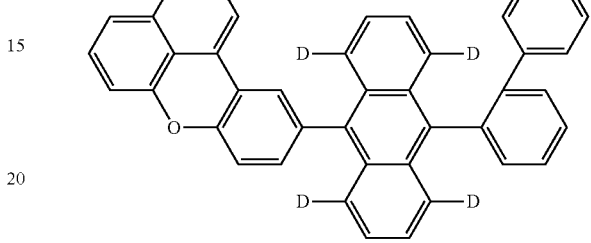
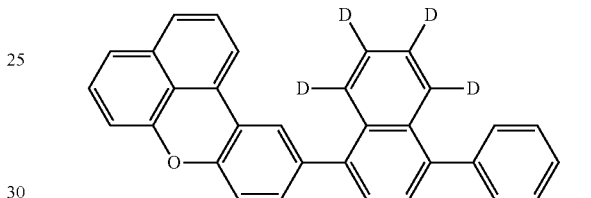
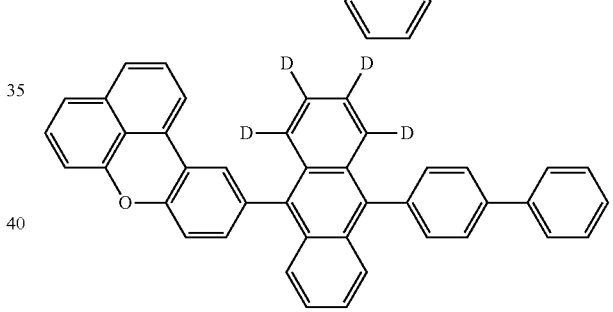
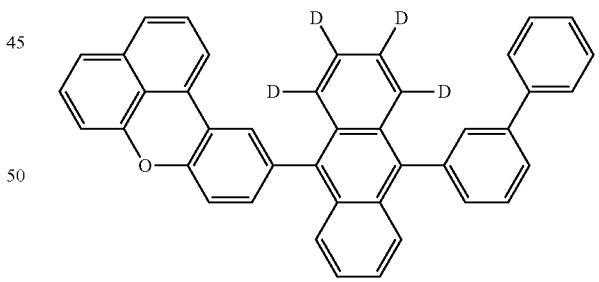
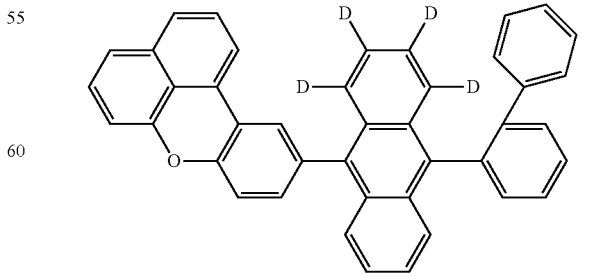

141
-continued
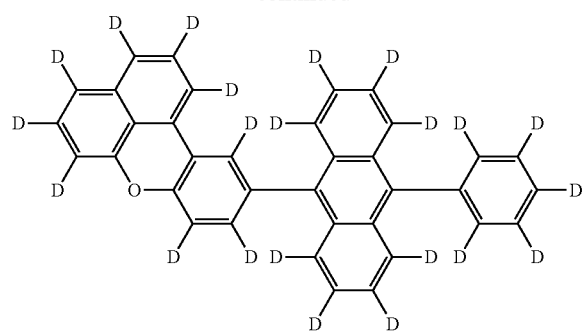
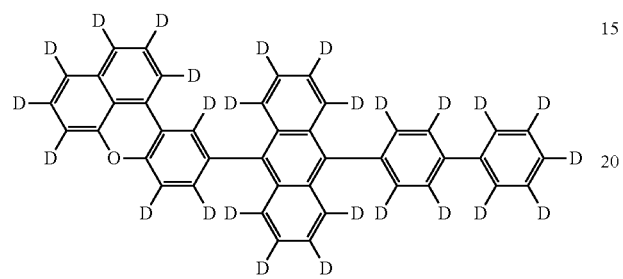
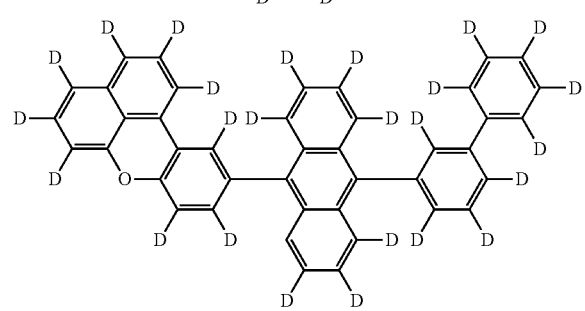
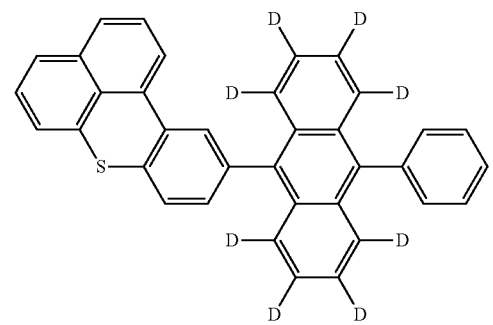
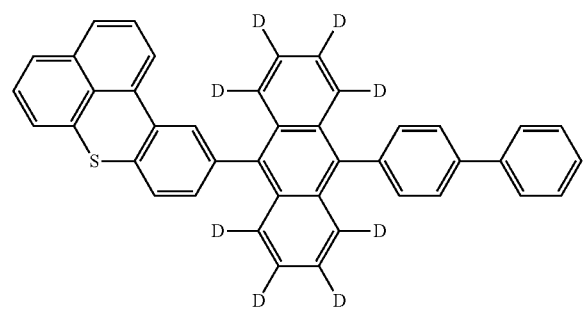
142
-continued
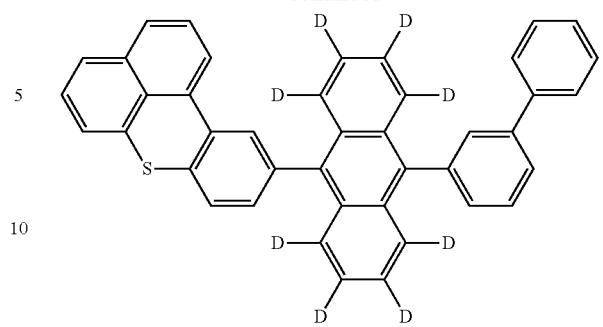
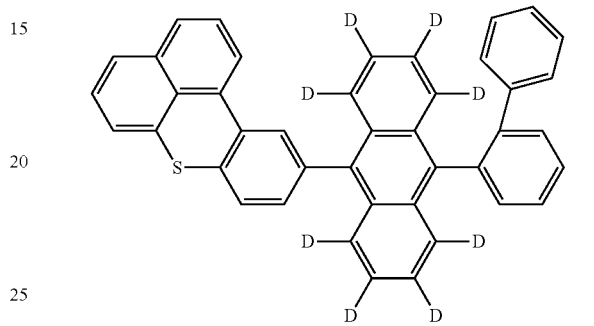
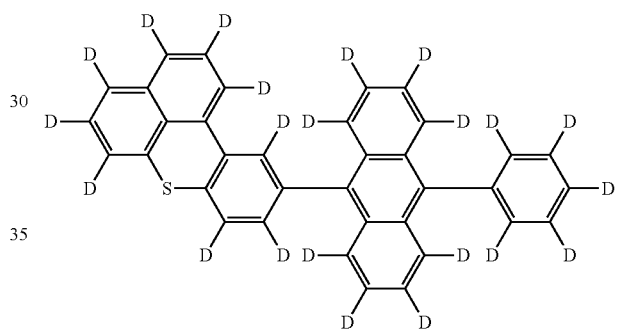
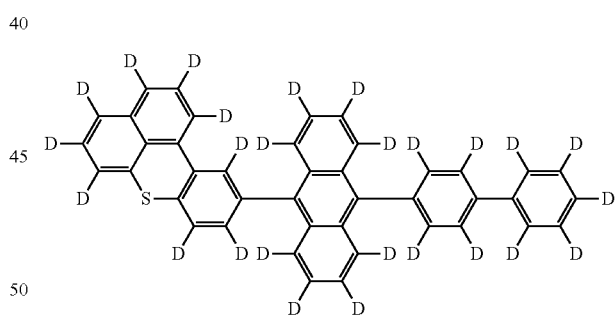
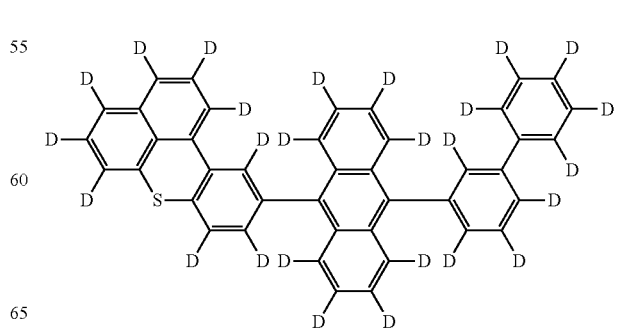

143
-continued
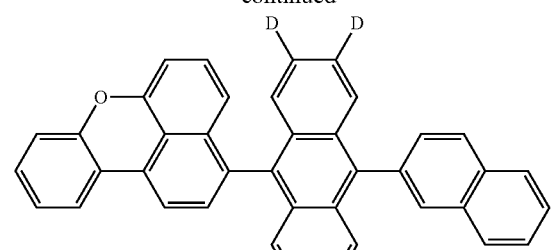
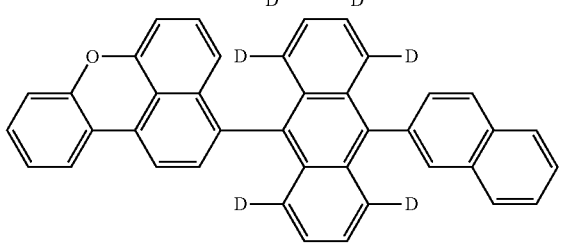
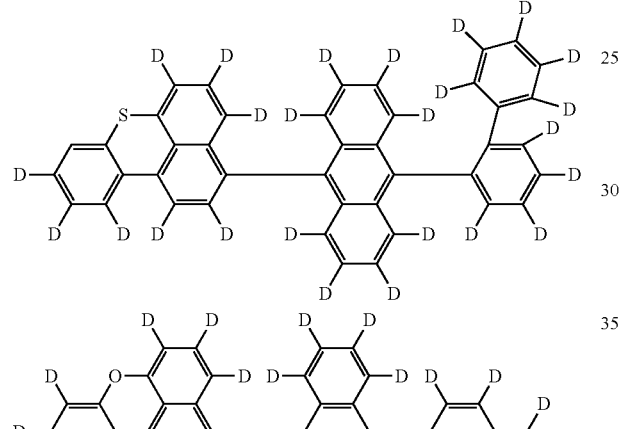
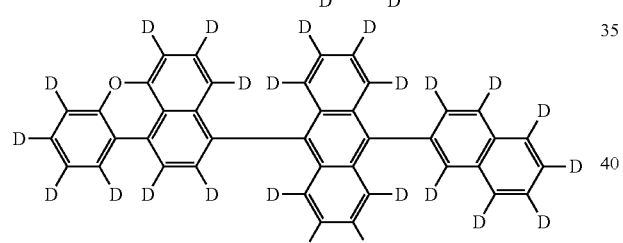
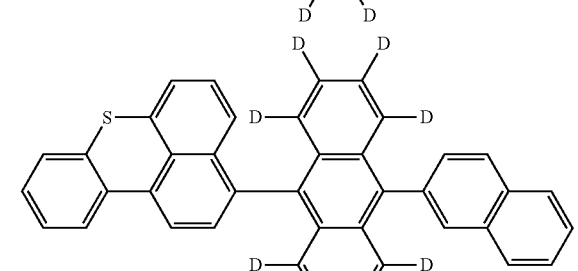
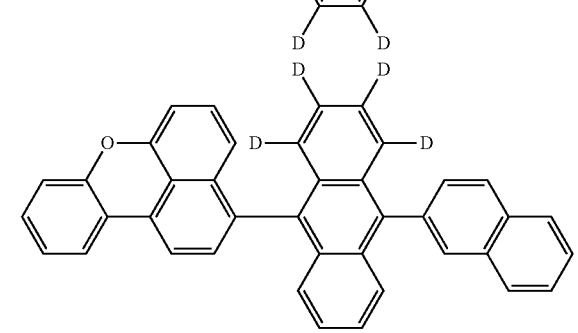
144
-continued
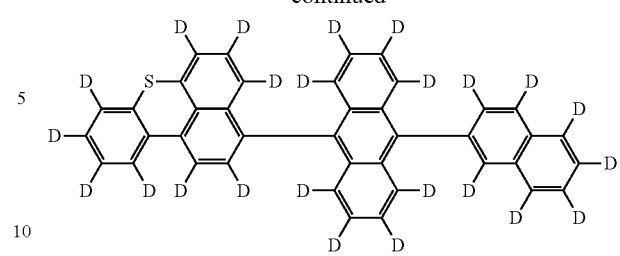
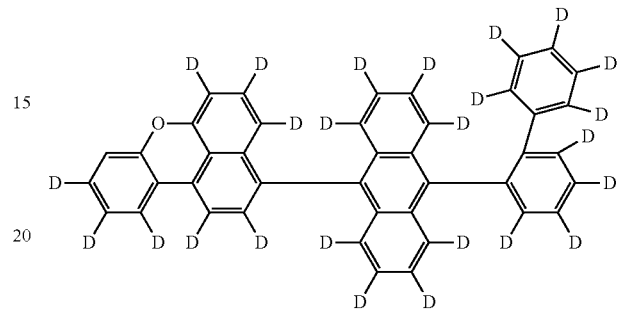
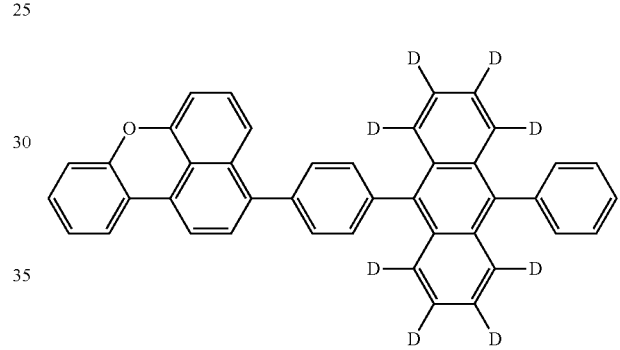
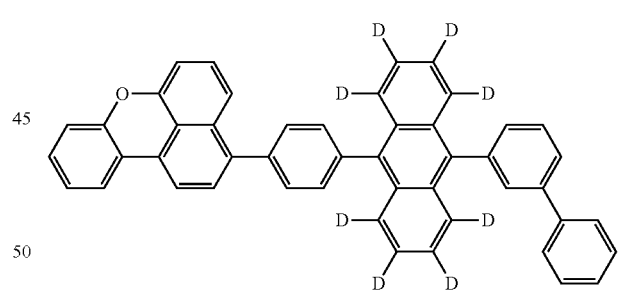
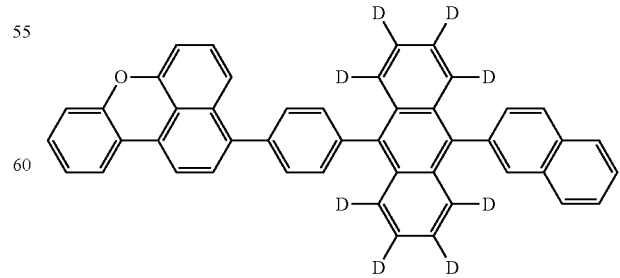

-continued
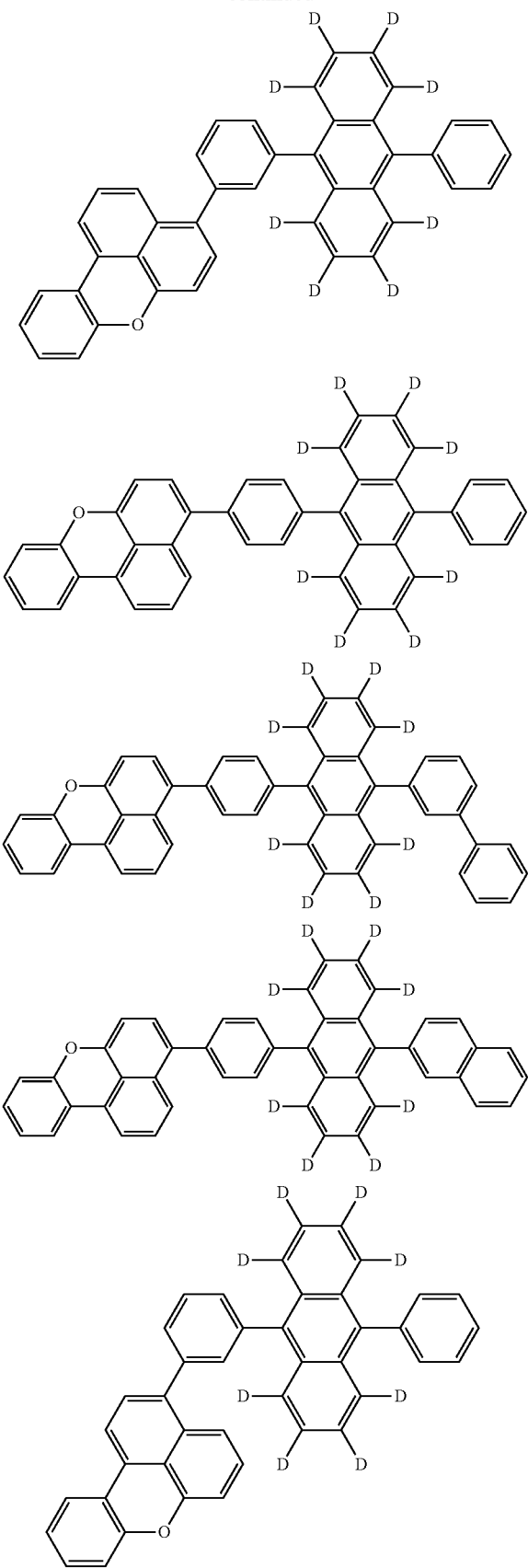
-continued
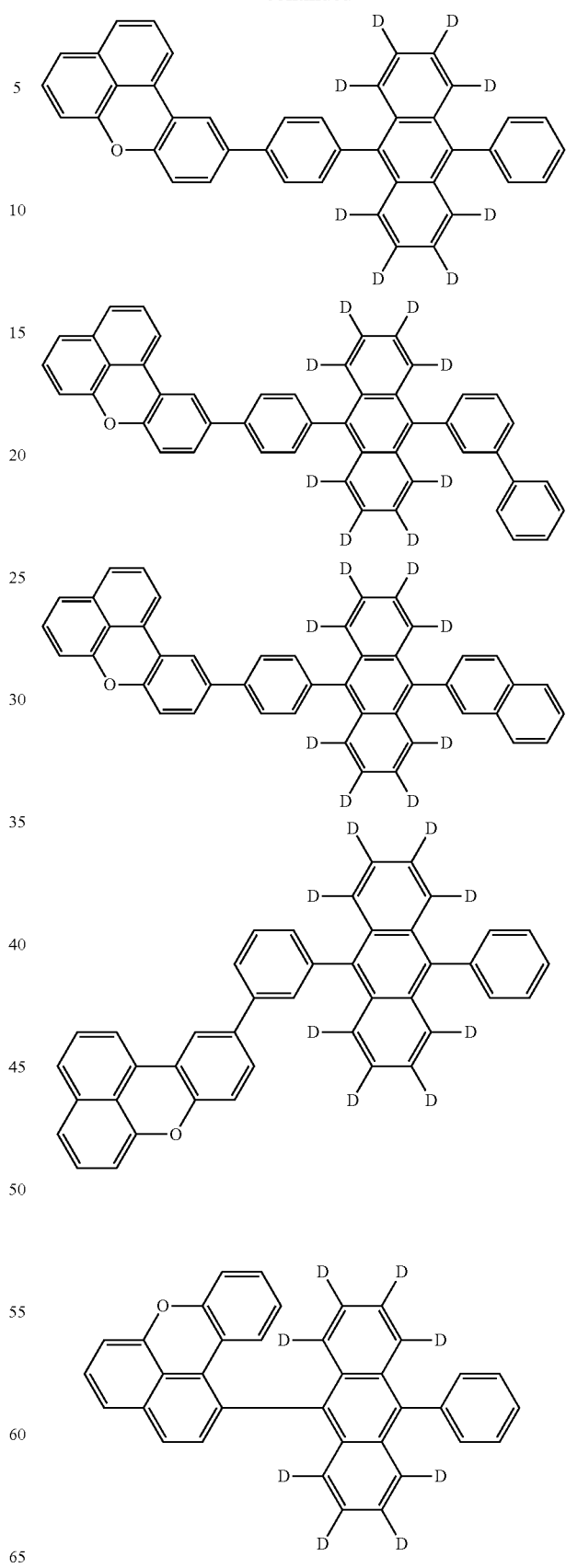

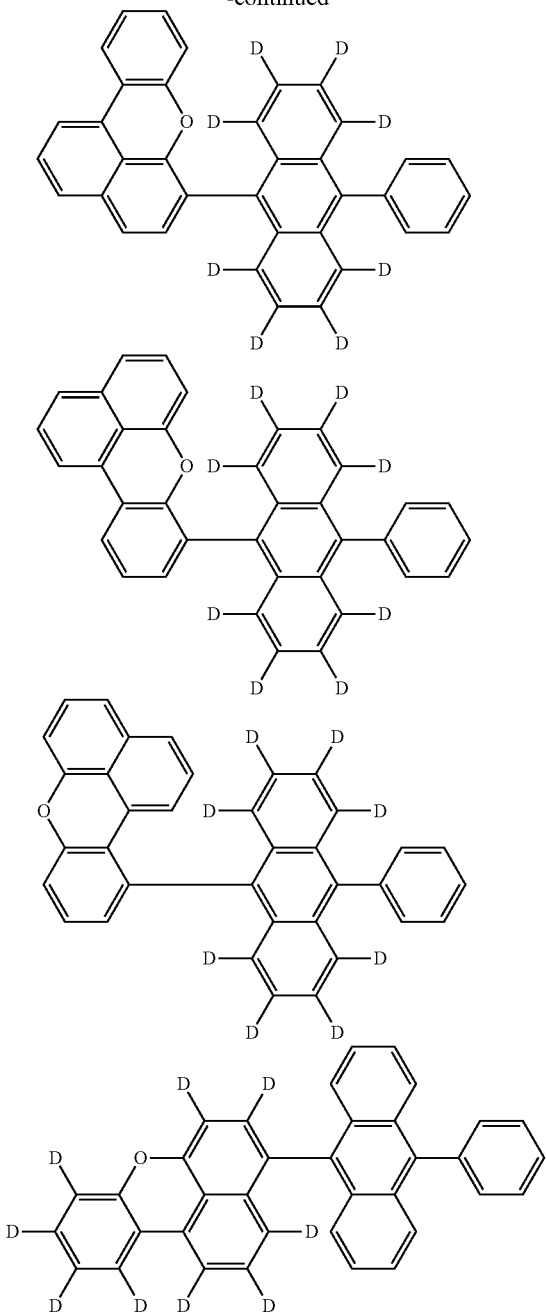

The compound represented by the formula (1) can be synthesized by using publicly known alternative reactions or materials corresponding to a target compound, for example, in accordance with the synthesis process of Examples described later.

[Material for an Organic EL Device]

A material for an organic electroluminescence device according to an aspect of the invention contains a compound represented by the formula (1).

The compound represented by the formula (1) is useful as a material for an organic EL device.

In addition to the compound represented by the formula (1), the material for an organic EL device according to an aspect of the invention may contain various materials if necessary. The content of the compound represented by the formula (1) in the material for an organic EL device is not particularly limited, and may be, for example, 50% by mass or more, 60% by mass or more, 70% by mass or more, 80% by mass or more, 90% by mass or more, 95% by mass or more, 98% by mass or more, 99% by mass or more, or 100% by mass.

[Organic EL Device]

The organic EL device according to an aspect of the invention contains
a cathode;
an anode; and
one or two or more organic layers disposed between the cathode and the anode, wherein
at least one of the organic layers contains a compound represented by the formula (1).

By using the compound represented by the formula (1) in the organic layer, the lifetime of the organic EL device can be improved.

In one embodiment, the organic layer contains an emitting layer.

In one embodiment, the emitting layer contains a compound represented by the formula (1).

When the compound represented by the formula (1) is contained in the emitting layer, in one embodiment, the compound represented by the formula (1) is used as a host material. When the compound represented by the formula (1) is used as a host material of an emitting layer, a dopant material (guest material) to be combined is not particularly limited.

A schematic configuration of an organic EL device will be described with reference to the FIGURE.

The organic EL device 1 contains a substrate 2, an anode 3, an emitting layer 5, a cathode 10, an organic layer 4 between the anode 3 and the emitting layer 5, and an organic layer 6 between the emitting layer 5 and the cathode 10.

The compound represented by the formula (1) is contained in the organic layers 4 to 6 between the anode 3 and the cathode 10, and is preferably contained in the emitting layer 5.

The compound represented by the formula (1) contained in the organic layer may be used alone, or in combination of two or more kinds.

In the organic EL device according to an aspect of the invention, conventionally-known materials and device configurations can be applied, as long as the effect of the invention is not impaired, except that the organic layer contains a compound represented by the formula (1).

Parts which can be used in the organic EL device according to an aspect of the invention, materials for forming respective layers, other than the above compounds, and the like, will be described below.

(Substrate)

A substrate is used as a support of an emitting device. As the substrate, glass, quartz, plastics or the like can be used, for example. Further, a flexible substrate may be used. The "flexible substrate" means a bendable (flexible) substrate, and specific examples thereof include a plastic substrate formed of polycarbonate, polyvinyl chloride, or the like.

(Anode)

For the anode formed on the substrate, metals, alloys, electrically conductive compounds, mixtures thereof, and the like, which have a large work function (specifically 4.0 eV or more) are preferably used. Specific examples thereof include indium-tin oxide (ITO: Indium Tin Oxide), indium-zinc oxide, indium-tin oxide containing silicon or silicon oxide, indium oxide containing zinc oxide, tungsten oxide, and graphene. In addition thereto, specific examples thereof include gold (Au), platinum (Pt), a nitride of a metallic material (for example, titanium nitride), and the like.

(Hole-Injecting Layer)

The hole-injecting layer is a layer containing a substance having high hole-injecting property. As such a substance having high hole-injecting property molybdenum oxide, titanium oxide, vanadium oxide, rhenium oxide, ruthenium oxide, chromium oxide, zirconium oxide, hafnium oxide, tantalum oxide, silver oxide, tungsten oxide, manganese oxide, an aromatic amine compound, or a polymer compound (oligomers, dendrimers, polymers, etc.) can be given.

(Hole-Transporting Layer)

The hole-transporting layer is a layer containing a substance having high hole-transporting property. For the hole-transporting layer, an aromatic amine compound, a carbazole derivative, an anthracene derivative, or the like can be used. A polymer compound such as poly(N-vinylcarbazole) (abbreviation: PVK) and poly(4-vinyltriphenylamine) (abbreviation: PVTPA) can also be used. However, a material other than the above-described materials may be used as long as the material has higher transporting properties of holes in comparison with electrons. It should be noted that the layer containing the material having high hole-transporting properties may be formed into not only a monolayer, but also a stacked layer in which two or more layers formed of the above-described materials are stacked.

(Guest Material for Emitting Layer)

The emitting layer is a layer containing a substance having a high emitting property, and various materials can be used for forming it. For example, as the substance having a high emitting property, a fluorescent compound which emits fluorescence or a phosphorescent compound which emits phosphorescence can be used. The fluorescent compound is a compound which can emit from a singlet excited state, and the phosphorescent compound is a compound which can emit from a triplet excited state.

As a blue fluorescent emitting material which can be used for an emitting layer, pyrene derivatives, styrylamine derivatives, chrysene derivatives, fluoranthene derivatives, fluorene derivatives, diamine derivatives, triarylamine derivatives, and the like can be used. As a green fluorescent emitting material which can be used for an emitting layer, aromatic amine derivatives and the like can be used. As a red fluorescent emitting material which can be used for an emitting layer, tetracene derivatives, diamine derivatives and the like can be used.

As a blue phosphorescent emitting material which can be used for an emitting layer, metal complexes such as iridium complexes, osmium complexes, platinum complexes and the like are used. As a green phosphorescent emitting material which can be used for an emitting layer, iridium complexes and the like are used. As a red phosphorescent emitting material which can be used for an emitting layer, metal complexes such as iridium complexes, platinum complexes, terbium complexes, europium complexes and the like are used.

(Host Material for Emitting Layer)

The emitting layer may have a constitution in which the substance having a high emitting property (guest material) is dispersed in another substance (host material). As a substance for dispersing the substance having a high emitting property, a variety of substances can be used in addition to the compound represented by the formula (1), and it is preferable to use a substance having a higher lowest unoccupied orbital level (LUMO level) and a lower highest occupied orbital level (HOMO level) than the substance having a high emitting property.

As a material (host material) for dispersing the substance having a high emitting property, 1) a metal complex such as an aluminum complex, a beryllium complex, or a zinc complex, 2) a heterocyclic compound such as an oxadiazole derivative, a benzimidazole derivative, or a phenanthroline derivative, 3) a condensed aromatic compound such as a carbazole derivative, an anthracene derivative, a phenanthrene derivative, a pyrene derivative, or a chrysene derivative, and 4) an aromatic amine compound such as a triarylamine derivative or a fused polycydic aromatic amine derivative are used.

(Electron-Transporting Layer)

An electron-transporting layer is a layer that comprises a substance having a high electron-transporting property. For the electron-transporting layer, 1) metal complexes such as aluminum complexes, beryllium complexes, zinc complexes, or the like; 2) heteroaromatic complexes such as imidazole derivatives, benzimidazole derivatives, azine derivatives, carbazole derivatives, phenanthroline derivatives, or the like; and 3) polymer compounds can be used.

(Electron-Injecting Layer)

An electron-injecting layer is a layer which contains a substance having a high electron-injecting property. For the electron injecting layer, a compound which can be used in the above-mentioned electron transporting layer, a metal complex compound such as lithium (Li), ytterbium (Yb), lithium fluoride (LiF), cesium fluoride (CsF), calcium fluoride ($CaF_2$), 8-hydroxyquinolinolato-lithium (Liq), an alkali metal such as lithium oxide ($LiO_x$), an alkaline earth metal, or a compound thereof can be used.

(Cathode)

For the cathode, metals, alloys, electrically conductive compounds, mixtures thereof, and the like having a small work function (specifically, 3.8 eV or less) are preferably used. Specific examples of such a cathode material include elements belonging to Group 1 or Group 2 of the Periodic Table of the Elements, i.e., alkali metals such as lithium (Li) and cesium (Cs), alkaline earth metals such as magnesium (Mg), calcium (Ca) and strontium (Sr), and alloys containing these metals (e.g., MgAg and AlLi); rare earth metals such as europium (Eu) and ytterbium (Yb), and alloys containing these metals.

In the organic EL device according to an aspect of the invention, the methods for forming the respective layers are not particularly limited. A conventionally-known method for forming each layer according to a vacuum deposition process, a spin coating process or the like can be used. Each layer such as the emitting layer can be formed by a known method such as a vacuum deposition process, a molecular beam deposition process (MBE process), or an application process such as a dipping process, a spin coating process, a casting process, a bar coating process and a roll coating process, using a solution prepared by dissolving the material in a solvent.

In the organic EL device according to an aspect of the invention, the thickness of each layer is not particularly limited, but is generally preferable that the thickness be in the range of several nm to 1 μm in order to suppress defects such as pinholes, to suppress applied voltages to be low, and to improve luminous efficiency.

[Electronic Apparatus]

The electronic apparatus according to an aspect of the invention is characterized in that the organic EL device according to an aspect of the invention is equipped with.

Specific examples of the electronic apparatus include display components such as an organic EL panel module, and the like; display devices for a television, a cellular phone, a personal computer, and the like; and emitting devices such as a light, a vehicular lamp, and the like.

EXAMPLES

Hereinafter, the invention will be described in more detail by describing Examples, Comparative Examples, and the like, and the invention is not limited in any way by these Examples.

<Compound>

Compounds represented by the formula (1) used as a host material for fabricating organic EL devices of Examples 1 to 25 are shown below.

BH-1

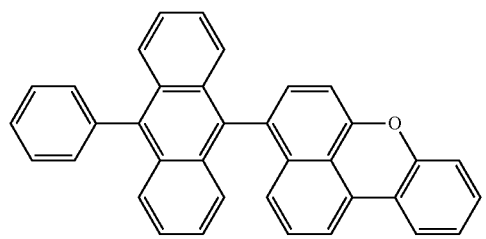

BH-2

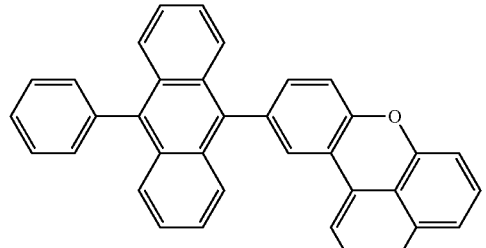

BH-4

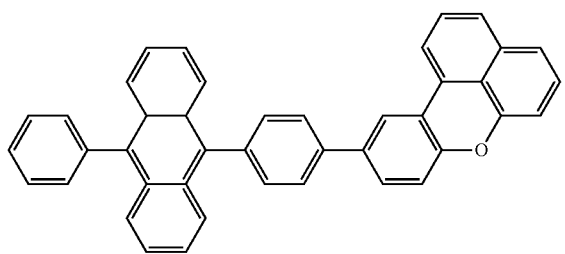

Compounds of the host material used for fabricating organic EL devices of Comparative Examples 1 to 23 are shown below

BH-R1

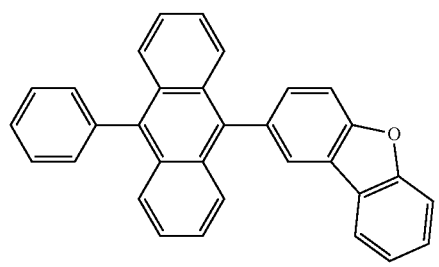

BH-R2

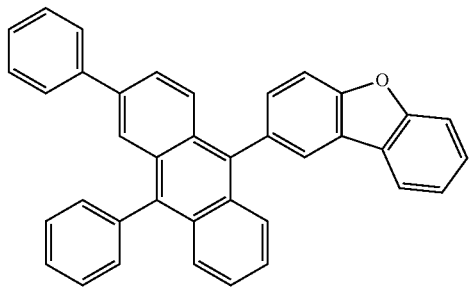

BH-R3

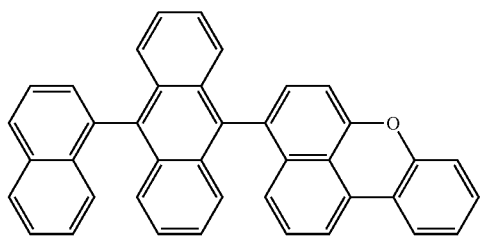

Compounds of the dopant materials used for fabricating organic EL devices of Examples 1 to 25 and Comparative Examples 1 to 23 are shown below.

BD-1

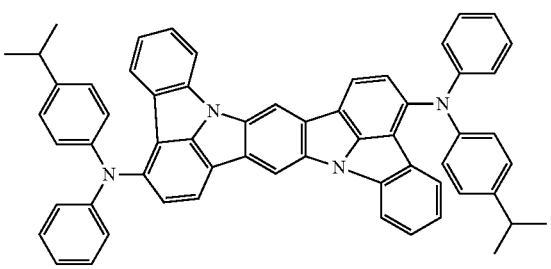

BD-2

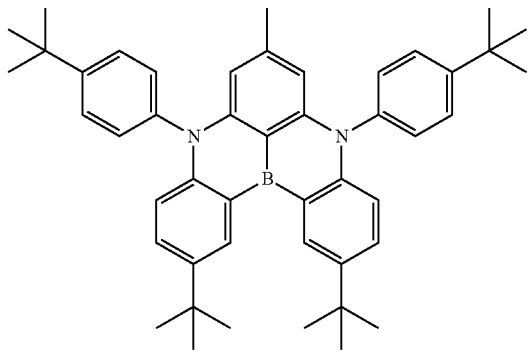

BD-3
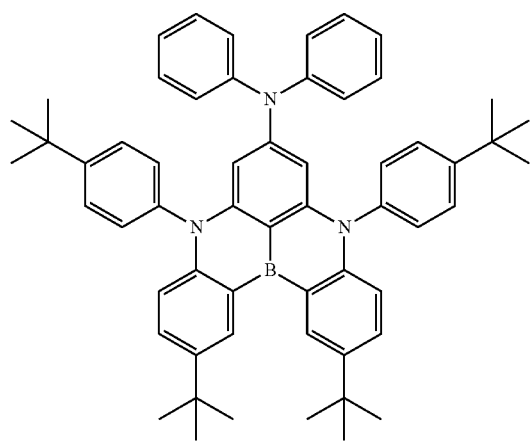
HI-2
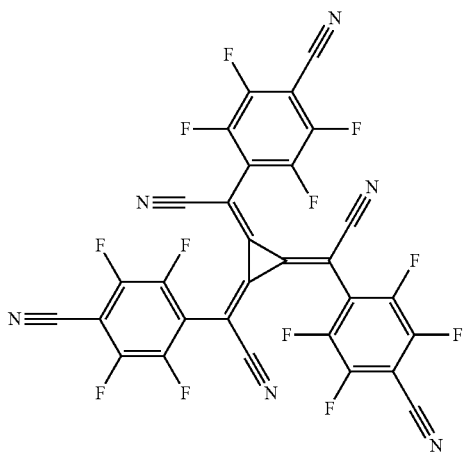
HT-1
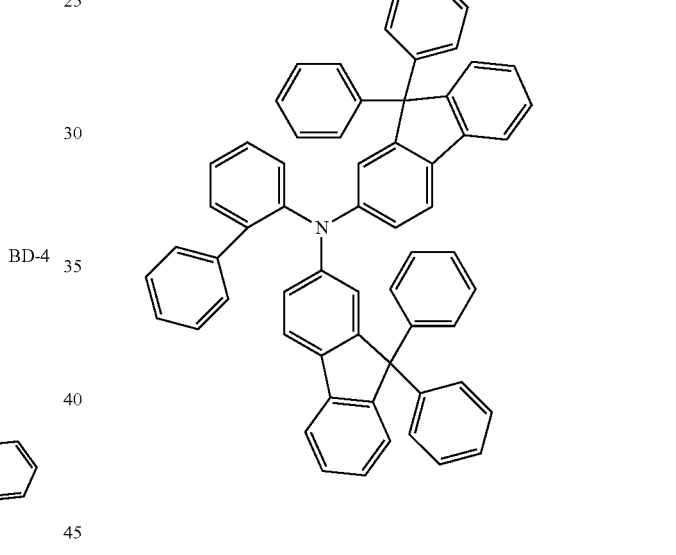
BD-4
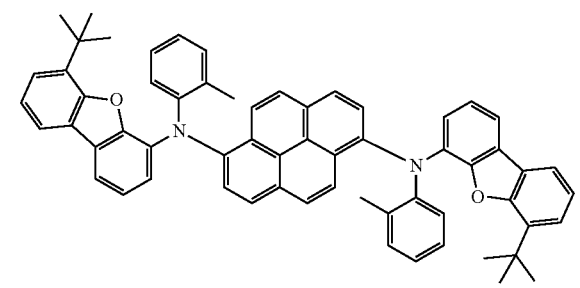
Other compounds used for fabricating organic EL devices of Examples 1 to 25 and Comparative Examples 1 to 23 are shown below.
HI-1
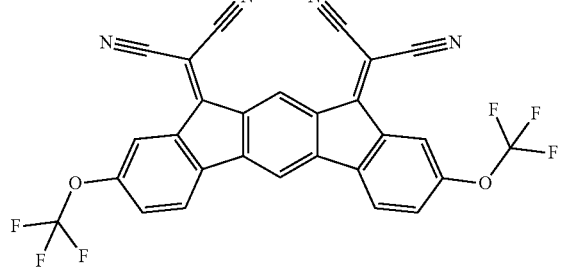
HT-2
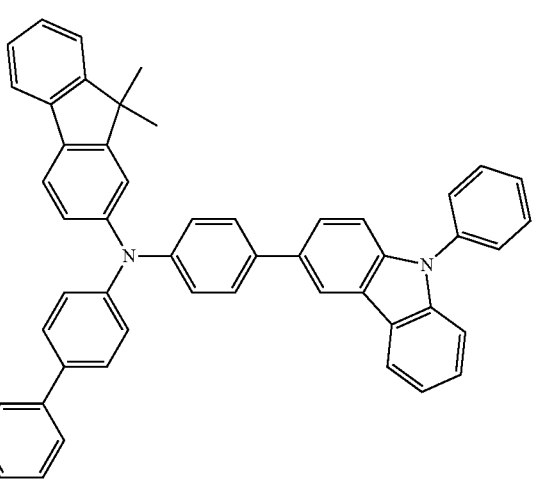

EBL-1

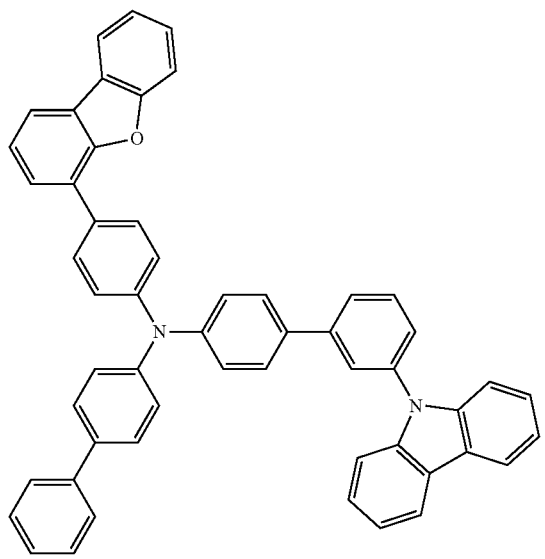

EBL-2

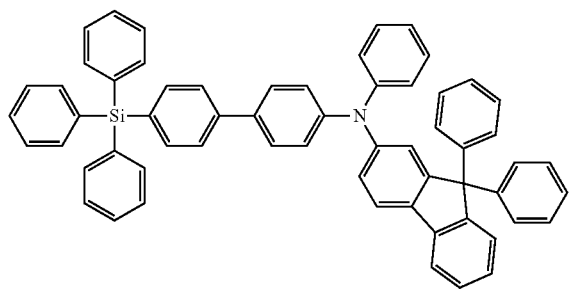

aET-1

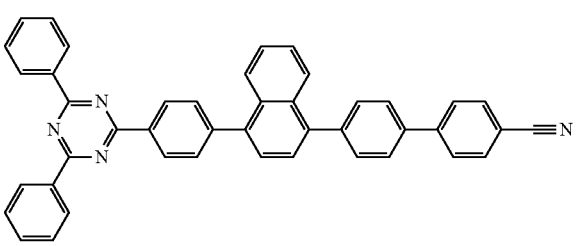

bET-1 bET-2

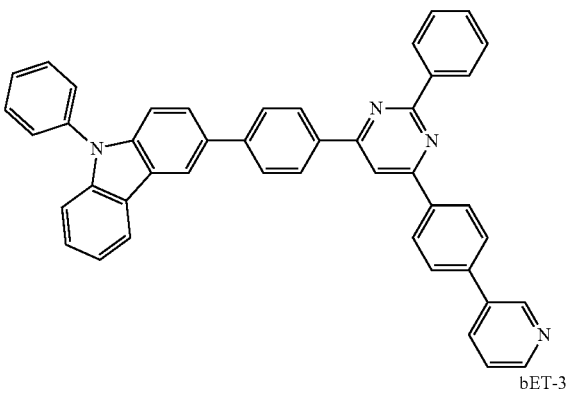

bET-3

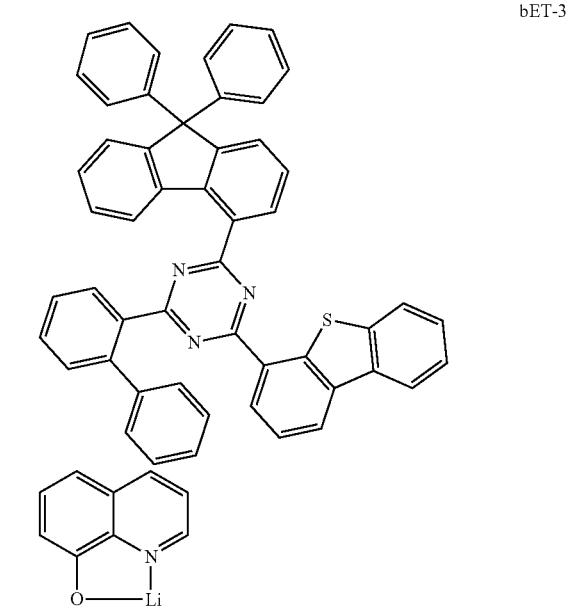

Liq

<Fabrication of Organic EL Device>

Organic EL devices were fabricated and evaluated as follows.

Example 1

(Fabrication of Organic EL Device)

A25 mm×75 mm×1.1 mm-thick glass substrate with an ITO transparent electrode (anode) (manufactured by GEO-MATEC Co., Ltd.) was subjected to ultrasonic cleaning in isopropyl alcohol for 5 minutes, and then subjected to UV-ozone cleaning for 30 minutes. The thickness of the ITO film was 130 nm.

The glass substrate with the transparent electrode after being cleaned was mounted onto a substrate holder in a vacuum vapor deposition apparatus. First, a compound HI-1 was deposited on a surface on the side on which the transparent electrode was formed so as to cover the transparent electrode to form a HI-1 film having a thickness of 5 nm. The HI-1 film functions as a hole-injecting layer.

Subsequent to the formation of the HI-1 film, a compound HT-1 was deposited thereon to form an HT-1 film having a thickness of 80 nm on the HI-1 film. The HT-1 film functions as a hole-transporting layer (first hole-transporting layer).

Subsequent to the formation of the HT-1 film, a compound EBL-1 was deposited thereon to form an EBL-1 film having a thickness of 10 nm on the HT-1 film. The EBL-1 film functions as an electron-blocking layer (second hole-transporting layer).

A compound BH-1 (host material) and a compound BD-1 (dopant material) were co-deposited on the EBL-1 film to be 4% by mass in a proportion of the compound BD-1 to form a BH-1:BD-1 film having a thickness of 25 nm. The BH-1:BD-1 film functions as an emitting layer.

A compound aET-1 was deposited on the emitting layer to form an aET-1 film having a thickness of 10 nm. This aET-1 film functions as a first electron-transporting layer.

A compound bET-1 and a compound Liq were co-evaporated on this aET-1 film to be 50% by mass in a proportion of the compound Liq to form a bET-1:Liq film having a thickness of 15 nm. This bET-1:Liq film functions as a second electron-transporting layer. LiF was deposited on this bET-1:Liq film to form a LiF film having a thickness of 1 nm. Al metal was deposited on the LiF film to form a metal cathode having a thickness of 80 nm to obtain an organic EL device.

The device configuration of the organic EL device of Example 1 is schematically shown as follows.

ITO(130)/HI-1(5)/HT-1(80)/EBL-1(10)/BH-1:BD-1 (25:4%)/a ET-1(10)/bET-1:Liq(15:50%)/LiF(1)/Al(80)

The numerical values in parentheses indicate the film thickness (unit: nm). The numerical value represented in percentages in parentheses indicates the proportion (% by mass) of the latter compound in the layer.

<Evaluation of an Organic EL Device>

A voltage was applied to the obtained organic EL device so that the current density became 50 mA/cm$^2$, and the time until the luminance became 95% of the initial luminance (LT95@50 mA/cm$^2$) was measured, and the result of the lifetime LT95 (hr) is shown in Table 1. In addition, in Table 1, the relative values of LT95 (hr) of the organic EL device fabricated in Example 1 and Comparative Example 1 described later are also shown when the value of LT95 (hr) of the organic EL device fabricated in Comparative Example 2 described later is taken as 100.

Comparative Examples 1 to 2

Organic EL devices of Comparative Examples 1 to 2 were fabricated and evaluated in the same manner as in Example 1, except that the host material contained in the emitting layer in Example 1 was replaced with materials described in Table 1. The results are shown in Table 1.

TABLE 1

| | Host | Dopant | LT95 (hr) | Relative values when LT95 of Comp. Ex. 2 is taken as 100 |
|---|---|---|---|---|
| Ex. 1 | BH-1 | BD-1 | 100 | 125 |
| Comp. Ex. 1 | BH-R1 | | 95 | 118.75 |
| Comp. Ex. 2 | BH-R2 | | 80 | 100 |

Example 2

An organic EL device of Example 2 was fabricated and evaluated in the same manner as in Example 1, except that the dopant material contained in the emitting layer in Example 1 was replaced with a material described in Table 2. The results are shown in Table 2.

Comparative Examples 3 to 4

Organic EL devices of Comparative Examples 3 to 4 were fabricated and evaluated in the same manner as in Example 2, except that the host material contained in the emitting layer in Example 2 was replaced with materials described in Table 2. The results are shown in Table 2.

TABLE 2

| | Host | Dopant | LT95 (hr) | Relative values when LT95 of Comp. Ex. 4 is taken as 100 |
|---|---|---|---|---|
| Ex. 2 | BH-1 | BD-2 | 120 | 184.6 |
| Comp. Ex. 3 | BH-R1 | | 75 | 115.4 |
| Comp. Ex. 4 | BH-R2 | | 65 | 100 |

Example 3

An organic EL device of Example 3 was fabricated and evaluated in the same manner as in Example 1, except that the dopant material contained in the emitting layer in Example 1 was replaced with a material described in Table 3. The results are shown in Table 3.

Comparative Examples 5 to 6

Organic EL devices of Comparative Examples 5 to 6 were fabricated and evaluated in the same manner as in Example 3, except that the host material contained in the emitting layer in Example 3 was replaced with materials described in Table 2. The results are shown in Table 3.

TABLE 3

| | Host | Dopant | LT95 (hr) | Relative values when LT95 of Comp. Ex. 6 is taken as 100 |
|---|---|---|---|---|
| Ex. 3 | BH-1 | BD-3 | 70 | 140 |
| Comp. Ex. 5 | BH-R1 | | 60 | 120 |
| Comp. Ex. 6 | BH-R2 | | 50 | 100 |

Example 4

EL device of Example 4 was fabricated and evaluated in the same manner as in Example 1, except that the dopant material contained in the emitting layer in Example 1 was replaced with a material described in Table 4. The results are shown in Table 4.

Comparative Example 7

An organic EL device of Comparative Example 7 was fabricated and evaluated in the same manner as in Example 4, except that the host material contained in the emitting layer in Example 4 was replaced with materials described in Table 4. The results are shown in Table 4.

TABLE 4

|  | Host | Dopant | LT95 (hr) | Relative values when LT95 of Comp. Ex. 7 is taken as 100 |
|---|---|---|---|---|
| Ex. 4 | BH-1 | BD-4 | 85 | 130.8 |
| Comp. Ex. 7 | BH-R1 |  | 65 | 100 |

From the results of Tables 1 to 4, it can be seen that, by using the compound BH-1 represented by the formula (1) for the host material, the devices of Examples 1 to 4 have a longlife compared with the case where a host material compound of the corresponding Comparative Example is used, even when any of dopant material compounds of BD-1 to BD-4 are used.

It is considered that a compound BH-1 represented by the formula (1) does not have a 5-membered ring structure in $Ar_1$ and is highly stable under excited states, unlike BH-R1 and BH-R2. In addition, since the energy of the excited singlet state ($S_1$) is smaller than those of BH-R1 and BH-R2, it is considered that the stability at the time of excitation is higher.

<Fabrication of Organic EL Devices>

Example 5

(Fabrication of an Organic EL Device)

A25 mm×75 mm×1.1 mm-thick glass substrate with an ITO transparent electrode (anode) (manufactured by GEO-MATEC Co., Ltd.) was subjected to ultrasonic cleaning in isopropyl alcohol for 5 minutes, and then subjected to UV-ozone cleaning for 30 minutes. The thickness of the ITO film was 130 nm.

The glass substrate with the transparent electrode after being cleaned was mounted onto a substrate holder in a vacuum vapor deposition apparatus. First, a compound HI-1 was deposited on a surface on the side on which the transparent electrode was formed so as to cover the transparent electrode to form a HI-1 film having a thickness of 5 nm. The HI-1 film functions as a hole-injecting layer.

Subsequent to the formation of the HI-1 film, a compound HT-1 was deposited thereon to form an HT-1 film having a thickness of 80 nm on the HI-1 film. The HT-1 film functions as a hole-transporting layer (first hole-transporting layer).

Subsequent to the formation of the HT-1 film, a compound EBL-1 was deposited thereon to form an EBL-1 film having a thickness of 10 nm on the HT-1 film. The EBL-1 film functions as an electron-blocking layer (secondary hole-transporting layer).

A compound BH-2 (host material) and a compound BD-2 (dopant material) were co-deposited on the EBL-1 film to be 2% by mass in a proportion of the compound BD-2 to form a BH-2:BD-2 film having a thickness of 25 nm. This BH-2:BD-2 film functions as an emitting layer.

A compound aET-1 was deposited on the emitting layer to form an aET-1 film having a thickness of 10 nm. This aET-1 film functions as a first electron-transporting layer.

A compound bET-3 and a compound Liq were co-evaporated on this aET-1 film to be 50% by mass in a proportion of the compound Liq to form a bET-3:Liq film having a thickness of 15 nm. This bET-3:Liq film functions as an electron-transporting layer. LiF was deposited on this bET-3:Liq film to form a LiF film having a thickness of 1 nm. Al metal was deposited on the LiF film to form a metal cathode having a thickness of 80 nm to obtain an organic EL device.

The device configuration of the organic EL device of Example 5 is schematically shown as follows.

ITO(130)/HI-1(5)/HT-1(80)/EBL-1(10)/BH-2:BD-2 (25:2%)/aET-1(10)/bET-3:Liq(15:50%)/LiF(1)/Al(80)

The numerical values in parentheses indicate the film thickness (unit: nm). The numerical value represented in percentages in parentheses indicates the proportion (% by mass) of the latter compound in the layer. The numerical values shown in percentages in the table below also indicate similar meanings.

The organic EL device obtained in Example 5 was evaluated in the same manner as in Example 1. The results are shown in Table 5.

Example 6 and Comparative Example 8

Organic EL devices were fabricated and evaluated in the same manner as in Example 5, except that compounds described in Table 5 were used, and the film thickness of each layer and the ratio of the compounds were changed as described in Table 5. The results are shown in Table 5.

In addition, Table 5 also shows the relative values of LT95 (hr) of the organic EL devices fabricated in Examples 5 and 6 when the value of LT95 (hr) of the organic EL device fabricated in Comparative Example 8 is taken as 100.

TABLE 5

| (Thickness: nm) | HI (5) | HT (80) | EBL (10) | BH (25) | BD (10) | BBL (15) | ET | LT95 (hr) | Relative values when LT95 of Comp. Ex. 8 is taken as 100 |
|---|---|---|---|---|---|---|---|---|---|
| Ex. 5 | HI-1 | HT-1 | EBL-1 | BH-2 | BD-2 | aET-1 | bET-3: Liq (50%) | 500 | 185 |
| Ex. 6 |  |  |  | BH-1 | (2%) |  |  | 360 | 133 |
| Comp. Ex. 8 |  |  |  | BH-R1 |  |  |  | 270 | 100 |

Example 7 and Comparative Example 9

Organic EL devices were fabricated and evaluated in the same manner as in Example 5, except that compounds described in Table 6 were used, and the film thickness of each layer and the ratio of the compounds were changed as described in Table 6. The results are shown in Table 6.

In addition, Table 6 also shows the relative values of LT95 (hr) of the organic EL device fabricated in Example 7 when the value of LT95 (hr) of the organic EL device fabricated in Comparative Example 9 is taken as 100.

TABLE 6

| (Thickness: nm) | HI (5) | HT (80) | EBL (10) | BH (25) | BD (10) | HBL | ET (15) | LT95 (hr) | Relative values when LT95 of Comp. Ex. 9 is taken as 100 |
|---|---|---|---|---|---|---|---|---|---|
| Ex. 7 | HI-1 | HT-1 | EBL-1 | BH-2 | BD-2 (2%) | aET-1 | bET-2: Liq (50%) | 380 | 127 |
| Comp. Ex. 9 | | | | BH-R1 | | | | 300 | 100 |

Examples 8 to 9 and Comparative Example 10

Organic EL devices were fabricated and evaluated in the same manner as in Example 5, except that compounds described in Table 7 were used, and the film thickness of each layer and the ratio of the compounds were changed as described in Table 7. The results are shown in Table 7.

In addition, Table 7 also shows the relative values of LT95 (hr) of the organic EL devices fabricated in Examples 8 and 9 when the value of LT95 (hr) of the organic EL device fabricated in Comparative Example 10 is taken as 100.

TABLE 7

| (Thickness: nm) | HI (5) | HT (80) | EBL (10) | BH (25) | BD (10) | HBL | ET (15) | LT95 (hr) | Relative values when LT95 of Comp. Ex. 10 is taken as 100 |
|---|---|---|---|---|---|---|---|---|---|
| Ex. 8 | HI-1 | HT-1 | EBL-1 | BH-2 | BD-2 (2%) | aET-1 | bET-1: Liq (50%) | 420 | 233 |
| Ex. 9 | | | | BH-1 | | | | 285 | 158 |
| Comp. Ex. 10 | | | | BH-R1 | | | | 180 | 100 |

Example 10 and Comparative Example 11

Organic EL devices were fabricated and evaluated in the same manner as in Example 5, except that compounds described in Table 8 were used, and the film thickness of each layer and the ratio of the compounds were changed as described in Table 8. The results are shown in Table 8.

In addition, Table 6 also shows the relative values of LT95 (hr) of the organic EL device fabricated in Example 10 when the value of LT95 (hr) of the organic EL device fabricated in Comparative Example 11 is taken as 100.

TABLE 8

| (Thickness: nm) | HI (5) | HT (80) | EBL (10) | BH (25) | BD (10) | HBL | ET (15) | LT95 (hr) | Relative values when LT95 of Comp. Ex. 11 is taken as 100 |
|---|---|---|---|---|---|---|---|---|---|
| Ex. 10 | HI-1 | HT-1 | EBL-1 | BH-2 | BD-4 (2%) | aET-1 | bET-3: Liq (50%) | 440 | 142 |
| Comp. Ex. 11 | | | | BH-R1 | | | | 310 | 100 |

Example 11 and Comparative Example 12

Organic EL devices were fabricated and evaluated in the same manner as in Example 5, except that compounds described in Table 9 were used, and the film thickness of each layer and the ratio of the compounds were changed as described in Table 9. The results are shown in Table 9.

In addition, Table 9 also shows the relative values of LT95 (hr) of the organic EL device fabricated in Example 11 when the value of LT95 (hr) of the organic EL device fabricated in Comparative Example 12 is taken as 100.

TABLE 9

| (Thickness: nm) | HI (5) | HT (80) | EBL (10) | BH (25) | BD (10) | HBL | ET (15) | LT95 (hr) | Relative values when LT95 of Comp. Ex. 12 is taken as 100 |
|---|---|---|---|---|---|---|---|---|---|
| Ex. 11 | HI-1 | HT-1 | EBL-1 | BH-2 | BD-4 (2%) | aET-1 | bET-2: Liq (50%) | 400 | 167 |
| Comp. Ex. 12 | | | | BH-R1 | | | | 240 | 100 |

Examples 12 to 13 and Comparative Example 13

Organic EL devices were fabricated and evaluated in the same manner as in Example 5, except that compounds described in Table 10 were used, and the film thickness of each layer and the ratio of the compounds were changed as described in Table 10. The results are shown in Table 10.

In addition, Table 10 also shows the relative values of LT95 (hr) of the organic EL devices fabricated in Examples 12 and 13 when the value of LT95 (hr) of the organic EL device fabricated in Comparative Example 13 is taken as 100.

TABLE 10

| (Thickness: nm) | HI (5) | HT (80) | EBL (10) | BH (25) | BD (10) | HBL | ET (15) | LT95 (hr) | Relative values when LT95 of Comp. Ex. 13 is taken as 100 |
|---|---|---|---|---|---|---|---|---|---|
| Ex. 12 | HI-1 | HT-1 | EBL-1 | BH-2 | BD-4 (2%) | aET-1 | bET-1: Liq (50%) | 440 | 232 |
| Ex. 13 | | | | BH-1 | | | | 280 | 147 |
| Comp. Ex. 13 | | | | BH-R1 | | | | 190 | 100 |

From the results shown in Tables 5 to 10, it can be seen that the devices of Examples 5 to 13 have a longer lifetime when a compound BH-1 or BH-2 represented by the formula (1) is used for the host material than the case when a host material compound of the corresponding Comparative Example is used, even when a dopant material compound of either BD-2 or BD-4 is used.

It is considered that compounds BH-1 and BH-2 represented by the formula (1) do not have 5-membered ring structures in $Ar_1$ and are highly stable under excited states, unlike BH-R1. In addition, since the energy of the excited singlet state (S1) is smaller than that of BH-R1, it is considered that the stability at the time of excitation is higher.

<Fabrication of Organic EL Devices>

Example 14

A 25 mm×75 mm×1.1 mm-thick glass substrate with an ITO transparent electrode (anode) (manufactured by GEO-MATEC Co., Ltd.) was subjected to ultrasonic cleaning in isopropyl alcohol for 5 minutes, and then subjected to UV-ozone cleaning for 30 minutes. The thickness of the ITO film was 130 nm.

The glass substrate with the transparent electrode after being cleaned was mounted onto a substrate holder in a vacuum vapor deposition apparatus. First, on a surface on the side on which the transparent electrode was formed, a compound HT-2 and a compound HI-2 were co-deposited to be 3% by mass in a proportion of the compound HI-2 to form a HT-2:HI-2 film having a thickness of 10 nm so as to cover the transparent electrode. This HT-2:HI-2 film functions as a hole-injecting layer.

Subsequent to the formation of the HT-2:HI-2 film, a compound HT-2 was deposited thereon to form an HT-2 film having a thickness of 80 nm on the HT-2:HI-2 film. The HT-2 film functions as a hole-transporting layer (first hole-transporting layer).

Subsequent to the formation of the HT-2 film, a compound EBL-2 was deposited thereon to form an EBL-2 film having a thickness of 5 nm on the HT-2 film. The EBL-2 film functions as an electron-blocking layer (secondary hole-transporting layer).

A compound BH-2 (host material) and a compound BD-1 (dopant material) were co-deposited on the EBL-2 film to be 1% by mass in a proportion of the compound BD-1 to form a BH-2:BD-1 film having a thickness of 20 nm. The BH-2:BD-1 film functions as an emitting layer.

A compound aET-1 was deposited on the emitting layers to form an aET-1 film having a thickness of 5 nm. This aET-1 film functions as a first electron-transporting layer.

A compound bET-2 and a compound Liq were co-evaporated on this aET-1 film to be 50% by mass in a proportion of the compound Liq to form a bET-2:Liq film having a thickness of 25 nm. This bET-2:Liq film functions as an electron-transporting layer. Yb was deposited on the bET-2:Liq film to form a Yb film having a thickness of 1 nm. Metal Al was deposited on this Yb film to form a metal cathode having a thickness of 80 nm, thereby an organic EL device was fabricated.

The device configuration of the organic EL device of Example 14 is schematically shown as follows.

ITO(130)/HT-2:HI-2(10;3%)/HT-2(80)/EBL-2(5)/
BH-2:BD-1(20:1%)/aET-1(5)/bET-2:Liq(25: 50%)/Yb(1)/Al(80)

The numerical values in parentheses indicate the film thickness (unit: nm). The numerical value represented in percentages in parentheses indicates the proportion (% by mass) of the latter compound in the layer. The numerical values shown in percentages in the table below also indicate similar meanings.

The organic EL device obtained in Example 14 was evaluated in the same manner as in Example 1.

The results are shown in Table 11.

Comparative Example 14

Organic EL devices were fabricated and evaluated in the same manner as in Example 14, except that compounds described in Table 11 were used, and the film thickness of each layer and the ratio of the compounds were changed as described in Table 11. The results are shown in Table 11.

In addition, Table 11 also shows the relative values of LT95 (hr) of the organic EL device fabricated in Example 14 when the value of LT95 (hr) of the organic EL device fabricated in Comparative Example 14 is taken as 100.

TABLE 11

| (Thickness: nm) | HI (5) | HT (80) | EBL (10) | BH (25) | | BD (10) | HBL | ET (15) | LT95 (hr) | Relative values when LT95 of Comp. Ex. 14 is taken as 100 |
|---|---|---|---|---|---|---|---|---|---|---|
| Ex. 14 | HT-2: H1-2 (3%) | HT-2 | EBL-2 | BH-2 BH-R2 | | BD-1 (1%) | aET-1 | bET-2: Liq (50%) | 236 | 337 |
| Comp. Ex. 14 | | | | | | | | | 70 | 100 |

From the results of Table 11, it can be seen that, by using the compound BH-1 represented by the formula (1) for the host material, the device of Example 14 has a longlife compared with the case where a host material compound BH-R2 of the corresponding Comparative Example 14 is used, even when a dopant material compound of BD-1 is used.

It is considered that a compound BH-2 represented by the formula (1) does not have a 5-membered ring structure and is highly stable under excited states, unlike BH-R1. In addition, since the energy of the excited singlet state (Si) is smaller than that of BH-R1, it is considered that the stability at the time of excitation is higher.

Examples 15 to 16 and Comparative Example 15

Organic EL devices were fabricated and evaluated in the same manner as in Example 5, except that compounds described in Table 12 were used, and the film thickness of each layer and the ratio of the compounds were changed as described in Table 12. The results are shown in Table 12.

In addition, Table 12 also shows the relative values of LT95 (hr) of the organic EL devices fabricated in Examples 15 and 16 when the value of LT95 (hr) of the organic EL device fabricated in Comparative Example 15 is taken as 100.

TABLE 12

| (Thickness: nm) | HI (5) | HT (80) | EBL (10) | BH (25) | BD (10) | HBL | ET (15) | LT95 (hr) | Relative values when LT95 of Comp. Ex. 15 is taken as 100 |
|---|---|---|---|---|---|---|---|---|---|
| Ex. 15 | HI-1 | HT-2 | EBL-1 | BH-2 | BD-1 (2%) | aET-1 | bET-1: Liq (50%) | 85 | 189 |
| Ex. 16 | | | | BH-1 | | | | 52 | 116 |
| Comp. Ex. 15 | | | | BH-R1 | | | | 45 | 100 |

Example 17 and Comparative Example 16

Organic EL devices were fabricated and evaluated in the same manner as in Example 5, except that compounds described in Table 13 were used, and the film thickness of each layer and the ratio of the compounds were changed as described in Table 13. The results are shown in Table 13.

In addition, Table 13 also shows the relative values of LT95 (hr) of the organic EL device fabricated in Example 17 when the value of LT95 (hr) of the organic EL device fabricated in Comparative Example 16 is taken as 100.

TABLE 13

| (Thickness: nm) | HI (5) | HT (80) | EBL (10) | BH (25) | BD (10) | HBL | ET (15) | LT95 (hr) | Relative values when LT95 of Comp. Ex. 16 is taken as 100 |
|---|---|---|---|---|---|---|---|---|---|
| Ex. 17 | HI-1 | HT-2 | EBL-1 | BH-2 | BD-1 (2%) | aET-1 | bET-2: Liq (50%) | 70 | 127 |
| Comp. Ex. 16 | | | | BH-R1 | | | | 55 | 100 |

Examples 18 to 19 and Comparative Example 17

Examples 15 to 16 and Comparative Example 15

Organic EL devices were fabricated and evaluated in the same manner as in Example 5, except that compounds described in Table 14 were used, and the film thickness of each layer and the ratio of the compounds were changed as described in Table 14. The results are shown in Table 14.

In addition, Table 14 also shows the relative values of LT95 (hr) of the organic EL devices fabricated in Examples 18 and 19 when the value of LT95 (hr) of the organic EL device fabricated in Comparative Example 17 is taken as 100.

TABLE 14

| (Thickness: nm) | HI (5) | HT (80) | EBL (10) | BH (25) | BD (10) | HBL | ET (15) | LT95 (hr) | Relative values when LT95 of Comp. Ex. 17 is taken as 100 |
|---|---|---|---|---|---|---|---|---|---|
| Ex. 18 | HI-1 | HT-2 | EBL-1 | BH-2 | BD-1 | aET-1 | bET-3: Liq (50%) | 70 | 140 |
| Ex. 19 |  |  |  | BH-1 | (2%) |  |  | 55 | 110 |
| Comp. Ex. 17 |  |  |  | BH-R1 |  |  |  | 50 | 100 |

Example 20 and Comparative Example 18

Organic EL devices were fabricated and evaluated in the same manner as in Example 5, except that compounds described in Table 15 were used, and the film thickness of each layer and the ratio of the compounds were changed as described in Table 15. The results are shown in Table 15.

In addition, Table 15 also shows the relative values of LT95 (hr) of the organic EL device fabricated in Example 20 when the value of LT95 (hr) of the organic EL device fabricated in Comparative Example 18 is taken as 100.

TABLE 15

| (Thickness: nm) | HI (5) | HT (80) | EBL (10) | BH (25) | BD (10) | HBL | ET (15) | LT95 (hr) | Relative values when LT95 of Comp. Ex. 18 is taken as 100 |
|---|---|---|---|---|---|---|---|---|---|
| Ex. 20 | HI-1 | HT-2 | EBL-1 | BH-2 | BD-2 | aET-1 | bET-1: Liq (50%) | 100 | 167 |
| Comp. Ex. 18 |  |  |  | BH-R1 | (2%) |  |  | 60 | 100 |

Example 21 and Comparative Example 19

Organic EL devices were fabricated and evaluated in the same manner as in Example 5, except that compounds described in Table 16 were used, and the film thickness of each layer and the ratio of the compounds were changed as described in Table 16. The results are shown in Table 16.

In addition, Table 16 also shows the relative values of LT95 (hr) of the organic EL device fabricated in Example 21 when the value of LT95 (hr) of the organic EL device fabricated in Comparative Example 19 is taken as 100.

TABLE 16

| (Thickness: nm) | HI (5) | HT (80) | EBL (10) | BH (25) | BD (10) | HBL | ET (15) | LT95 (hr) | Relative values when LT95 of Comp. Ex. 19 is taken as 100 |
|---|---|---|---|---|---|---|---|---|---|
| Ex. 21 | HI-1 | HT-2 | EBL-1 | BH-2 | BD-2 | aET-1 | bET-2: Liq (50%) | 90 | 150 |
| Comp. Ex. 19 |  |  |  | BH-R1 | (2%) |  |  | 60 | 100 |

Example 22 and Comparative Example 20

Organic EL devices were fabricated and evaluated in the same manner as in Example 5, except that compounds described in Table 17 were used, and the film thickness of each layer and the ratio of the compounds were changed as described in Table 17. The results are shown in Table 17.

In addition, Table 17 also shows the relative values of LT95 (hr) of the organic EL device fabricated in Example 22 when the value of LT95 (hr) of the organic EL device fabricated in Comparative Example 20 is taken as 100.

TABLE 17

| (Thickness: nm) | HI (5) | HT (80) | EBL (10) | BH (25) | BD (10) | HBL | ET (15) | LT95 (hr) | Relative values when LT95 of Comp. Ex. 20 is taken as 100 |
|---|---|---|---|---|---|---|---|---|---|
| Ex. 22 | HI-1 | HT-2 | EBL-1 | BH-2 | BD-2 (2%) | aET-1 | bET-3: Liq (50%) | 110 | 157 |
| Comp. Ex. 20 | | | | BH-R1 | | | | 70 | 100 |

Example 23 and Comparative Example 21

Organic EL devices were fabricated and evaluated in the same manner as in Example 5, except that compounds described in Table 18 were used, and the film thickness of each layer and the ratio of the compounds were changed as described in Table 18. The results are shown in Table 18.

In addition, Table 18 also shows the relative values of LT95 (hr) of the organic EL device fabricated in Example 23 when the value of LT95 (hr) of the organic EL device fabricated in Comparative Example 21 is taken as 100.

TABLE 18

| (Thickness: nm) | HI (5) | HT (80) | EBL (10) | BH (25) | BD (10) | HBL | ET (15) | LT95 (hr) | Relative values when LT95 of Comp. Ex. 21 is taken as 100 |
|---|---|---|---|---|---|---|---|---|---|
| Ex. 23 | HI-1 | HT-2 | EBL-2 | BH-2 | BD-1 (2%) | aET-1 | bET-1: Liq (50%) | 45 | 150 |
| Comp. Ex. 21 | | | | BH-R1 | | | | 30 | 100 |

From the results shown in Tables 12 to 18, it can be seen that the devices of Examples 15 to 23 have a longer lifetime when a compound BH-2 represented by the formula (1) is used for the host material than the case when a host material compound of the corresponding Comparative Example is used, even when a dopant material compound of either BD-1 or BD-2 is used.

It is considered that a compound BH-2 represented by the formula (1) does not have a 5-membered ring structure and is highly stable under excited states, unlike BH-R1. In addition, since the energy of the excited singlet state (Si) is smaller than that of BH-R1, it is considered that the stability at the time of excitation is higher.

Example 24 and Comparative Example 22

Organic EL devices were fabricated and evaluated in the same manner as in Example 5, except that compounds described in Table 19 were used, and the film thickness of each layer and the ratio of the compounds were changed as described in Table 19. The results are shown in Table 19.

In addition, Table 19 also shows the relative values of LT95 (hr) of the organic EL device fabricated in Example 24 when the value of LT95 (hr) of the organic EL device fabricated in Comparative Example 22 is taken as 100.

TABLE 19

| (Thickness: nm) | HI (5) | HT (80) | EBL (10) | BH (25) | BD (10) | HBL | ET (15) | LT95 (hr) | Relative values when LT95 of Comp. Ex. 22 is taken as 100 |
|---|---|---|---|---|---|---|---|---|---|
| Ex. 24 | HI-1 | HT-1 | EBL-1 | BH-4 | BD-2 (2%) | aET-1 | bET-3: Liq (50%) | 330 | 122 |
| Comp. Ex. 22 | | | | BH-R3 | | | | 270 | 100 |

Example 25 and Comparative Example 23

Organic EL devices were fabricated and evaluated in the same manner as in Example 5, except that compounds described in Table 20 were used, and the film thickness of each layer and the ratio of the compounds were changed as described in Table 20. The results are shown in Table 20.

In addition, Table 20 also shows the relative values of LT95 (hr) of the organic EL device fabricated in Example 25 when the value of LT95 (hr) of the organic EL device fabricated in Comparative Example 23 is taken as 100.

TABLE 20

| (Thickness: nm) | HI (5) | HT (80) | EBL (10) | BH (25) | BD (10) | HBL (15) | ET | LT95 (hr) | Relative values when LT95 of Comp. Ex. 23 is taken as 100 |
|---|---|---|---|---|---|---|---|---|---|
| Ex. 25 | HI-1 | HT-2 | EBL-1 | BH-4 | BD-1 | aET-1 | bET-1: Liq (50%) | 55 | 122 |
| Comp. Ex. 23 | | | | BH-R3 | (2%) | | | 45 | 100 |

From the results shown in Tables 19 and 20, it can be seen that the devices of Examples 24 and 25 have a longer lifetime when a compound BH-4 represented by the formula (1) is used for the host material than the case when a host material compound BH-R3 of the corresponding Comparative Example is used, even when a dopant material compound of either BD-2 or BD-1 is used. It is considered that since BH-R3 has a high electron-injecting property due to a naphthyl group, the recombination regions are on the HT layer side, and the materials of the HT layer are deteriorated, so that the lifetime is shortened.

Synthesis of Compounds

Synthesis Example 1: Synthesis of a Compound BH-1

A compound BH-1 was synthesized by the following synthetic route.

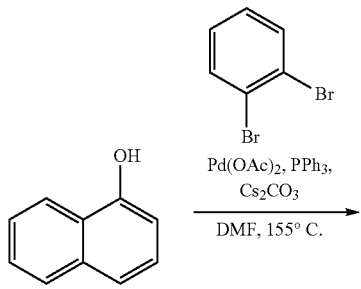

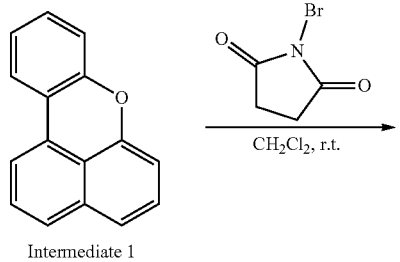

Intermediate 1

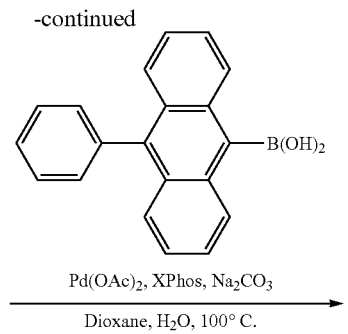

Intermediate 2

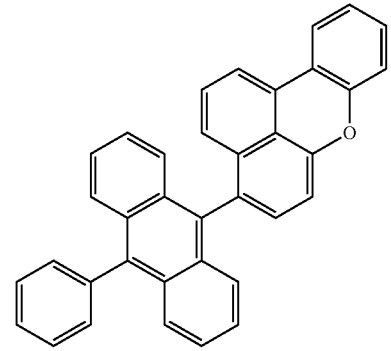

BH-1

(1) Synthesis of benzo[kl]xanthene (Intermediate 1)

Under an argon-atmosphere, 7.21 g of naphthalene-1-ol, 14.2 g of 1,2-dibromobenzene, 0.56 g of palladium(II) acetate (Pd(OAc)$_2$), 2.62 g of triphenylphosphine (PPh$_3$), 65.2 g of cesium carbonate, and 500 mL of N,N-dimethylformamide (DMF) (dehydrated) were charged into a flask, and the mixture was refluxed with heating and stirring for 5 hours. After cooling to room temperature, the reaction solution was extracted using ethyl acetate, and after removing the aqueous phase, the organic phase was washed with saturated brine. After drying with anhydrous sodium sulfate, the organic phase was concentrated, and the residue was purified by silica gel column chromatography to obtain 6.77 g (yield: 62%) of a white solid of benzo[kl]xanthene (Intermediate 1).

(2) Synthesis of 4-bromobenzo[kl]xanthene (Intermediate 2)

Under an argon atmosphere, 1.42 g of benzo[kl]xanthene (Intermediate 1) and 65 mL of dichloromethane (dehydrated) were placed in a flask and the mixture was cooled to 0° C. 1.18 g of N-bromosuccinimide was added to the flask and then the mixture was stirred at room temperature for 7 hours. After completion of the reaction, the reaction was deactivated with a sufficient amount of water. The solution was transferred to a separatory funnel, extracted with dichloromethane, and dried over anhydrous sodium sulfate, followed by removal of the origin impurity through a silica gel short column, and the solution was concentrated, and the obtained sample was dried under vacuum at room temperature for 3 hours to obtain 1.49 g (77%) of a white solid of 4-bromobenzo[kl]xanthene (Intermediate 2).

(5) Synthesis of an Anthracene Derivative (Compound BH-1)

Under an argon atmosphere, 6.00 g of 4-bromobenzo[kl]xanthene (Intermediate 2), 9.03 g of 10-phenylanthracene-9-boronic acid synthesized by a known process, 0.09 g of palladium(II) acetate (Pd(OAc)$_2$), 0.39 g of 2-dicyclohexylphosphino-2'4',6'-triisopropylbiphenyl (XPhos), 6.42 g of sodium carbonate, 270 mL of 1,4-dioxane, and 120 mL of ion-exchanged water were added to a flask, and the mixture was refluxed with stirring for 18 hours. After cooling to room temperature, the precipitated solid was collected by filtration. The obtained solid was washed with water, acetone, and then recrystallized with a mixed solvent of toluene and hexane to obtain 7.60 of a pale-yellow solid (80%). As a result of mass spectrometric analysis, this pale-yellow solid was identified as a compound BH-1, and m/e=471 fora molecular weight of 470.57.

Synthesis Example 2: Synthesis of a Compound BH-2

A compound BH-2 was synthesized by the following synthetic route.

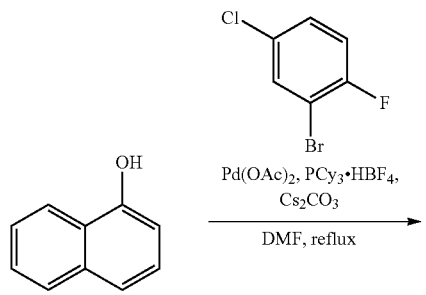

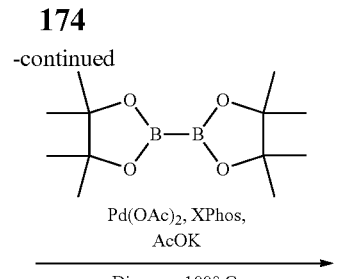

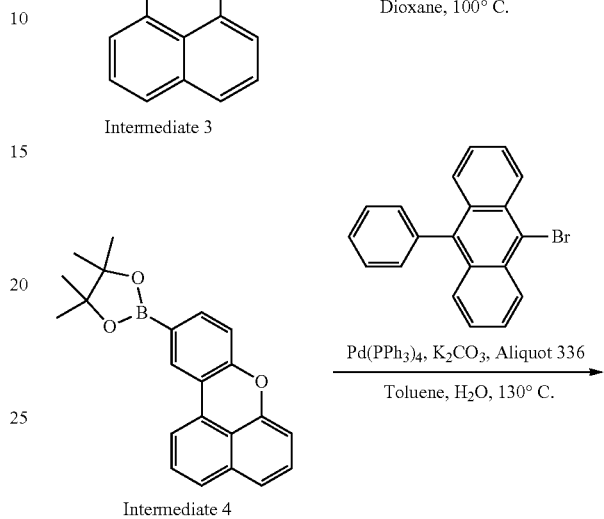

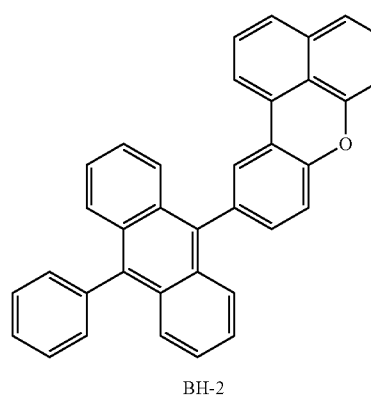

BH-2

(1) Synthesis of 10-chlorobenzo[kl]xanthene (Intermediate 3)

Under an argon atmosphere, 9.37 g of naphthalen-1-ol, 9.39 mL of 2-bromo-4-chloro-1-fluorobenzene, 1.46 g of palladium(II) acetate (Pd(OAc)$_2$), 4.79 g of tricyclohexylphosphonium naphthalene (PCy$_3$/HBF$_4$), 63.5 g of cesium carbonate, and 325 mL of N,N-dimethylformamide (DMF) (dehydrated) were charged into a flask, and the mixture was refluxed with heating for 7 hours. After cooling to room temperature, the reaction solution was extracted using ethyl acetate, and after removing the aqueous phase, the organic phase was washed with saturated brine. After drying with anhydrous sodium sulfate, the organic phase was concentrated, and the residue was purified by silica gel column chromatography to obtain 11.3 g (yield: 69%) of a pale-green solid of 10-chlorobenzo[kl]xanthene (Intermediate 3).

(2) Synthesis of 2-(benzo[kl]xanthene-10-yl)-4,4,5,5-tetramethyl-1,3,2-dioxaborane (Intermediate 4)

Under an argon atmosphere, 2.35 g of 10-chlorobenzo[kl]xanthene (Intermediate 3), 0.10 g of palladium(II) acetate (Pd(OAc)₂), 0.44 g of 2-dicyclohexylphosphino-2',4',6'-triisopropylbiphenyl (XPhos), 3.54 g of bis(pinacolato)diboron, 2.74 g of potassium acetate (AcOK), and 50 mL of 1,4-dioxane (Dioxane) (dehydrated) were placed in a flask, and then the mixture was stirred at 100° C. for 4 hours. After completion of the reaction, the reaction was deactivated with a sufficient amount of water. The solution was transferred to a separatory funnel, extracted with dichloromethane, and dried over anhydrous sodium sulfate, followed by removal of the origin impurity through a silica gel short column, and the solution was concentrated, and the obtained sample was dried under vacuum at room temperature for 3 hours to obtain 1.98 g (62%) of a white solid of 2-(benzo[kl]xanthen-10-yl)-4,4,5,5-tetramethyl-1,3,2-dioxaborane (Intermediate 4).

(5) Synthesis of an Anthracene Derivative (Compound BH-2)

Under an argon atmosphere, 1.87 g of 2-(benzo[kl]xanthen-10-yl)-4,4,5,5-tetramethyl-1,3,2-dioxaborane (Intermediate 4), 1.81 g of 9-bromo-10-anthracene synthesized by a known process, 0.25 g of tetrakis(triphenylphosphine)palladium(0) (Pd(PPh₃)₄), 0.25 mL of Aliquot 336, 60 mL of toluene, and 30 mL of ion-exchanged water were added to a flask, and the mixture was refluxed with stirring for 18 hours. After cooling to room temperature, the precipitated solid was collected by filtration. The resulting solid was washed with water, acetone, and then recrystallized with a mixed solvent of toluene and cydohexane to obtain 2.16 (85%) of a pale-yellow solid. As a result of mass spectrometric analysis, this pale-yellow solid was identified as a compound BH-2, and m/e=471 fora molecular weight of 470.57.

Synthesis Example 3: Synthesis of a Compound BH-3

A compound BH-3 was synthesized by the following synthetic route.

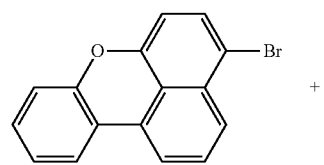

Intermediate 2

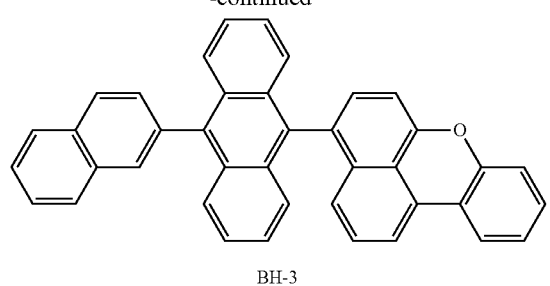

BH-3

Under an argon-atmosphere, 4.20 g of 4-bromobenzo[kl]xanthene (Intermediate 2), 7.38 g of (10-(naphthalene-2-yl)anthracene-9-yl)boronic acid synthesized by a known process, 0.06 g of palladium(II) acetate (Pd(OAc)₂), 0.27 g of 2-dicyclohexylphosphino-2',4',6'-triisopropylbiphenyl (XPhos), 4.49 g of sodium carbonate, 250 mL of 1,4-dioxane, and 100 mL of ion-exchanged water were added to a flask, and the mixture was refluxed with stirring at 100° C. for 18 hours. After cooling to room temperature, the precipitated solid was collected by filtration. The obtained solid was washed with water, acetone, and then recrystallized with a mixed solvent of toluene and hexane to obtain 5.67 (77%) of a pale-yellow solid. As a result of mass spectrometric analysis, this pale-yellow solid was identified as a compound BH-3, and m/e=521 fora molecular weight of 520.63.

Synthesis Example 4: Synthesis of a Compound BH-4

A compound BH-4 was synthesized by the following synthetic route.

Intermediate 4

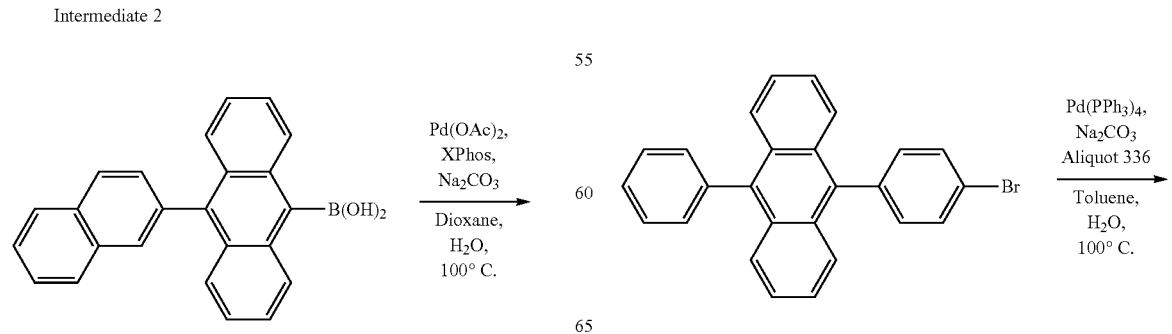

-continued

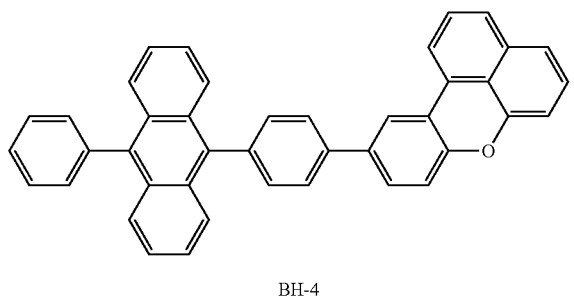

BH-4

0.66 g of 2-(benzo[kl]xanthen-10-yl)-4,4,5,5-tetramethyl-1,3,2-dioxaborane (Intermediate 4), 0.92 g of 9-(4-bromophenyl)-10-anthracene synthesized by a known process, 0.05 g of tetrakis(triphenylphosphine)palladium(0) (Pd $(PPh_3)_4$), 0.10 mL of Aliquot 336, 20 mL of toluene, and 1 mL of ion-exchanged water were added to a flask, and the mixture was refluxed with stirring at 100° C. for 18 hours. After cooling to room temperature, the precipitated solid was collected by filtration. The obtained solid was washed with water and then acetone, followed by recrystallization with a mixed solvent of toluene and cyclohexane to obtain 0.72 of a pale-yellow solid (66%). As a result of mass spectrometric analysis, this pale-yellow solid was identified as a compound BH-4, and m/e=547 for a molecular weight of 546.66.

Although only some exemplary embodiments and/or examples of this invention have been described in detail above, those skilled in the art will readily appreciate that many modifications are possible in the exemplary embodiments and/or examples without materially departing from the novel teachings and advantages of this invention. Accordingly, all such modifications are intended to be included within the scope of this invention.

The documents described in the specification and the specification of Japanese application(s) on the basis of which the present application claims Paris convention priority are incorporated herein by reference in its entirety.

The invention claimed is:

1. A compound, which is a compound represented by the following formula (1-1) or a compound represented by the following formula (1-2):

(1-1)

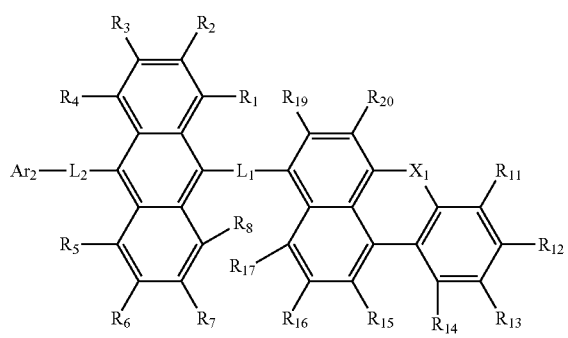

(1-2)

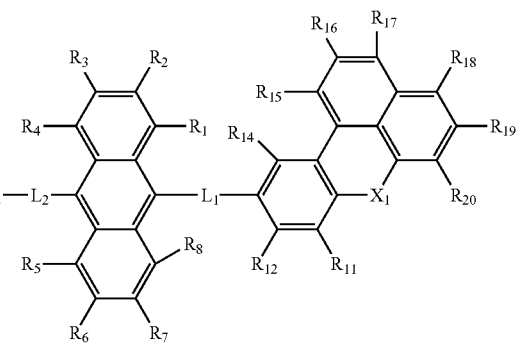

wherein in the formula (1-1) or (1-2),
one or more sets of adjacent two or more of $R_1$ to $R_8$ form a substituted or unsubstituted, saturated or unsaturated ring by bonding with each other, or do not form a substituted or unsubstituted, saturated or unsaturated ring;
$R_1$ to $R_8$ which do not form the substituted or unsubstituted, saturated or unsaturated ring are independently a hydrogen atom or a substituent R;
the substituent R is
a halogen atom,
a cyano group,
a nitro group,
a substituted or unsubstituted alkyl group including 1 to 50 carbon atoms,
a substituted or unsubstituted alkenyl group including 2 to 50 carbon atoms,
a substituted or unsubstituted alkynyl group including 2 to 50 carbon atoms,
a substituted or unsubstituted cycloalkyl group including 3 to 50 ring carbon atoms,
—Si($R_{901}$)($R_{902}$)($R_{903}$),
—O—($R_{904}$),
—S—($R_{905}$),
—N($R_{906}$)($R_{907}$),
a substituted or unsubstituted aryl group including 6 to 50 ring carbon atoms, or
a substituted or unsubstituted monovalent heterocyclic group including 5 to 50 ring atoms;
$R_{901}$ to $R_{907}$ are independently
a hydrogen atom,
a substituted or unsubstituted alkyl group including 1 to 50 carbon atoms,
a substituted or unsubstituted cycloalkyl group including 3 to 50 ring carbon atoms,
a substituted or unsubstituted aryl group including 6 to 50 ring carbon atoms, or
a substituted or unsubstituted monovalent heterocyclic group including 5 to 50 ring atoms; when two or more of each of $R_{901}$ to $R_{907}$ are present, the two or more of each of $R_{901}$ to $R_{907}$ may be the same as or different from each other;
$L_1$ is
a linking group having a structure represented by any one of formulas (L-1) to (L-4);
$L_2$ is
a single bond, or
a linking group having a structure represented by one of formulas (L-1), (L-2) or (L-4);

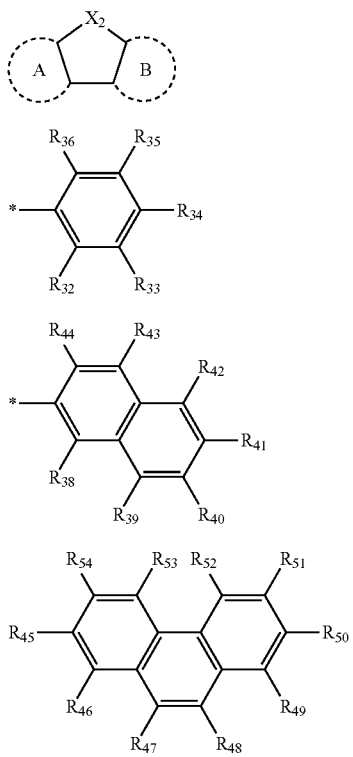

(L-1)

(L-2)

(L-3)

(L-4)

wherein in the formula (L-1),
a ring A and a ring B are independently
a substituted or unsubstituted aromatic hydrocarbon ring including 6 to 14 ring carbon atoms, or
a substituted or unsubstituted heterocycle including 5 to 50 ring atoms;
$X_2$ is O, S, $N(R_{1a})$, or $C(R_{2a})(R_{3a})$;
one of $R_{1a}$ to $R_{3a}$ and an atom which constitutes the aromatic hydrocarbon ring or the heterocycle of the ring A and the ring B and which may form a single bond is a single bond bonding with an anthracene skeleton, or is bonded with the anthracene skeleton by a single bond, and one of the remaining is a single bond bonding with $Ar_1$ or $Ar_2$, or is bonded with $Ar_1$ or $Ar_2$ by a single bond;
atoms which are not single-bonded with the anthracene skeleton and $Ar_1$ or $Ar_2$, which constitute the aromatic hydrocarbon ring or the heterocycle of a ring A and a ring B, and which may form a single bond are independently bonded with a hydrogen atom or a substituent R;
$R_{1a}$ to $R_{3a}$ which are not the single bond are independently a hydrogen atom or a substituent R;
the substituent R is as defined above;
wherein in the formula (L-2),
* is a single bond bonding with an anthracene skeleton;
one of $R_{32}$ to $R_{36}$ is a single bond bonding with $Ar_1$ or $Ar_2$;
$R_{32}$ to $R_{36}$ which are not single bonds bonding with $Ar_1$ or $Ar_2$ are independently a hydrogen atom or a substituent R;
the substituent R is as defined above;
wherein in the formula (L-3),
* is a single bond bonding with an anthracene skeleton;
one of $R_{38}$ to $R_{44}$ is a single bond bonding with $Ar_1$ or $Ar_2$;
$R_{38}$ to $R_{44}$ which are not single bonds bonding with the anthracene skeleton and $Ar_1$ or $Ar_2$ are independently a hydrogen atom or a substituent R;
the substituent R is as defined above;
wherein in the formula (L-4),
one of $R_{45}$ to $R_{54}$ is a single bond bonding with the anthracene skeleton, and one of the remaining is a single bond bonding with $Ar_1$ or $Ar_2$,
$R_{45}$ to $R_{54}$ which are not single bonds bonding with an anthracene skeleton and $Ar_1$ or $Ar_2$ are independently a hydrogen atom or a substituent R;
the substituent R is as defined above;
$X_1$ is O;
one of $R_{11}$ to $R_{20}$ is a single bond bonding with $L_1$;
one or more sets of adjacent two or more of $R_{11}$ to $R_{14}$ and one or more sets of adjacent two or more of $R_{15}$ to $R_{20}$ which are not single bonds bonding with $L_1$ do not form a substituted or unsubstituted, saturated or unsaturated ring;
$R_{11}$ to $R_{20}$ which are not single bonds bonding with $L_1$ and do not form the substituted or unsubstituted, saturated or unsaturated ring are independently a hydrogen atom or a substituent R;
the substituent R is as defined above;
$Ar_2$ is a monovalent group having a structure represented by any one of the following formulas ($Ar_2$-11) to ($Ar_2$-13):

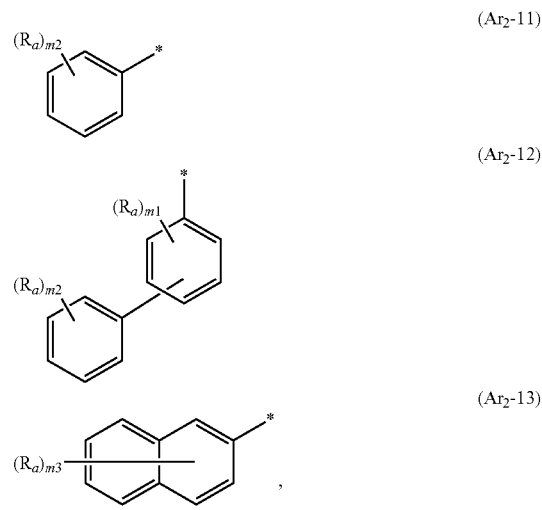

($Ar_2$-11)

($Ar_2$-12)

($Ar_2$-13)

wherein in the formulas ($Ar_2$-11) to ($Ar_2$-13),
* is bonded with $L_2$;
$R_a$ is a substituent;
the substituent $R_a$ is
a halogen atom,
a cyano group,
a nitro group,
a substituted or unsubstituted alkyl group including 1 to 50 carbon atoms,
a substituted or unsubstituted alkenyl group including 2 to 50 carbon atoms,
a substituted or unsubstituted alkynyl group including 2 to 50 carbon atoms,
a substituted or unsubstituted cycloalkyl group including 3 to 50 ring carbon atoms, —Si($R_{901}$)($R_{902}$)($R_{903}$),
—O—($R_{904}$),
—S—($R_{905}$),
—N($R_{906}$)($R_{907}$), a substituted or unsubstituted aryl group including 6 to 50 ring carbon atoms, or a substituted or unsubstituted monovalent heterocyclic group including 5 to 50 ring atoms; and each of $m_1$, $m_2$ and $m_3$ is 0.

2. The compound according to claim 1, wherein one of $R_{12}$ to $R_{20}$ in the formula (2) is a single bond bonding with $L_1$.

3. The compound according to claim 1, wherein $L_2$ is a linking group having a structure represented by the formula (L-1), (L-2), or (L-4).

4. The compound according to claim 1, wherein $L_2$ is a single bond.

5. The compound according to claim 1, wherein $Ar_2$-$L_2$- is
   a substituted or unsubstituted phenyl group,
   a substituted or unsubstituted 2-naphthyl group,
   a substituted or unsubstituted phenylnaphthyl group,
   a substituted or unsubstituted biphenyl group,
   a substituted or unsubstituted naphthylphenyl group,
   a substituted or unsubstituted fluorenyl group,
   a substituted or unsubstituted phenanthryl group,
   a substituted or unsubstituted phenylphenanthryl group,
   a substituted or unsubstituted benzophenanthryl group,
   a substituted or unsubstituted benzotriphenylenyl group,
   a substituted or unsubstituted chrysenyl group,
   a substituted or unsubstituted dibenzofuranyl group,
   a substituted or unsubstituted phenyldibenzofuranyl group,
   a substituted or unsubstituted naphthobenzofuranyl group,
   a substituted or unsubstituted carbazolyl group,
   a substituted or unsubstituted carbazolyl-phenyl group, or
   a substituted or unsubstituted benzo[def]carbazolyl-phenyl group.

6. The compound according to claim 1, wherein $R_1$ to $R_8$, and $R_{11}$ to $R_{20}$ which are not single bonds bonding with $L_1$ and which does not form the substituted or unsubstituted, saturated or unsaturated ring are hydrogen atoms.

7. The compound according to claim 1, wherein one or more of $R_1$ to $R_8$ which are hydrogen atoms,
   $R_{11}$ to $R_{20}$ which are hydrogen atoms,
   hydrogen atoms possessed by the substituted or unsubstituted, saturated or unsaturated ring formed by bonding one or more sets of adjacent two or more of $R_1$ to $R_8$,
   hydrogen atoms possessed by $R_1$ to $R_8$ which are substituents R,
   hydrogen atoms possessed by the substituted or unsubstituted, saturated or unsaturated ring formed by bonding one or more sets of adjacent two or more of $R_{11}$ to $R_{20}$,
   hydrogen atoms possessed by $R_{11}$ to $R_{20}$ which are substituents R,
   hydrogen atoms possessed by $L_1$,
   hydrogen atoms possessed by $L_2$, and
   hydrogen atoms possessed by $Ar_2$
   are deuterium atoms.

8. The compound according to claim 1, which is a material for an organic electroluminescence device.

9. A material for an organic electroluminescence device, comprising a compound according to claim 1.

10. An organic electroluminescence device comprising: a cathode;
    an anode; and
    one or two or more organic layers disposed between the cathode and the anode, wherein
    at least one of the organic layers comprises a compound according to claim 1.

11. The organic electroluminescence device according to claim 10, wherein the organic layer comprises an emitting layer, and
    the emitting layer comprises the compound.

12. An electronic apparatus, comprising the organic electroluminescence device according to claim 10.

* * * * *